United States Patent
Nakamura et al.

(10) Patent No.: US 7,355,887 B2
(45) Date of Patent: Apr. 8, 2008

(54) NON-VOLATILE SEMICONDUCTOR MEMORY DEVICE HAVING NON-SELECTED WORD LINES ADJACENT TO SELECTED WORD LINES BEING CHARGED AT DIFFERENT TIMING FOR PROGRAM DISTURB CONTROL

(75) Inventors: Hiroshi Nakamura, Fujisawa (JP); Tomoharu Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

(21) Appl. No.: 11/104,599

(22) Filed: Apr. 13, 2005

(65) Prior Publication Data

US 2005/0237829 A1    Oct. 27, 2005

(30) Foreign Application Priority Data

Apr. 15, 2004 (JP) ............................ 2004-120368
Jan. 20, 2005 (JP) ............................ 2005-013063

(51) Int. Cl.
*G11C 11/34* (2006.01)
(52) U.S. Cl. ............................ 365/185.02; 365/185.18
(58) Field of Classification Search ....... 365/185.02 O, 365/185.17, 185.18 X, 185.19, 185.25, 189.01, 365/233, 185.02, 185.18
See application file for complete search history.

(56) References Cited

U.S. PATENT DOCUMENTS

| | | | | |
|---|---|---|---|---|
| 6,046,935 A | * | 4/2000 | Takeuchi et al. | ....... 365/185.03 |
| 6,064,611 A | | 5/2000 | Tanaka et al. | |
| 6,456,528 B1 | * | 9/2002 | Chen | ....... 365/185.03 |
| 6,614,688 B2 | * | 9/2003 | Jeong et al. | ....... 365/185.18 |
| 6,859,397 B2 | * | 2/2005 | Lutze et al. | ....... 365/185.28 |

FOREIGN PATENT DOCUMENTS

JP    10-283788    10/1998

\* cited by examiner

*Primary Examiner*—VanThu Nguyen
(74) *Attorney, Agent, or Firm*—Oblon, Spivak, McClelland, Maier & Neustadt, P.C.

(57) ABSTRACT

A non-volatile semiconductor memory device comprises a memory cell array of data-rewritable non-volatile memory cells or memory cell units containing the memory cells, and a plurality of word lines each commonly connected to the memory cells on the same row in the memory cell array. In write pulse applying during data writing, a high voltage for writing is applied to a selected word line, and an intermediate voltage for writing is applied to at least two of non-selected word lines. The beginning of charging a first word line located between the selected word line and a source line to a first intermediate voltage for writing is followed by the beginning of charging a second word line located between the selected word line and a bit line contact to a second intermediate voltage for writing.

20 Claims, 113 Drawing Sheets

Writing High Voltage (VPP) Generator

VM1 Generator
(Part of Writing Intermediate Voltage Generator)

VM2 Generator
(Part of Writing Intermediate Voltage Generator)

VM Waveform (Dashed Line) and
VM-Applied WL Waveform-2 (Solid Line)

VM Waveform (Dashed Line) and
VM-Applied WL Waveform-3 (Solid Line)

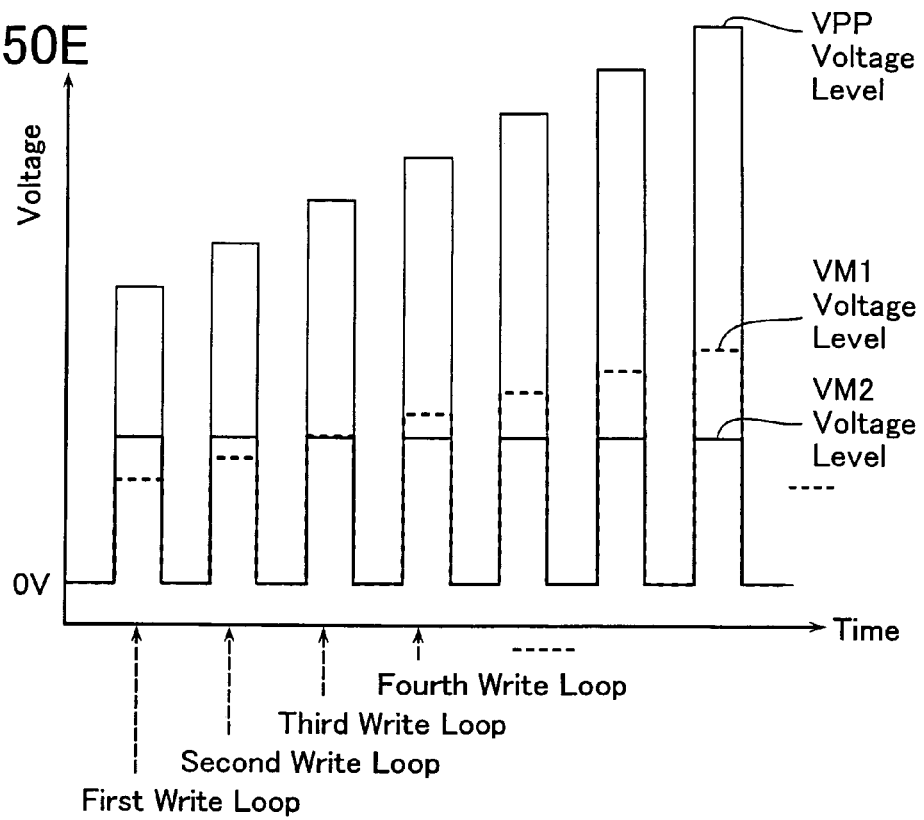
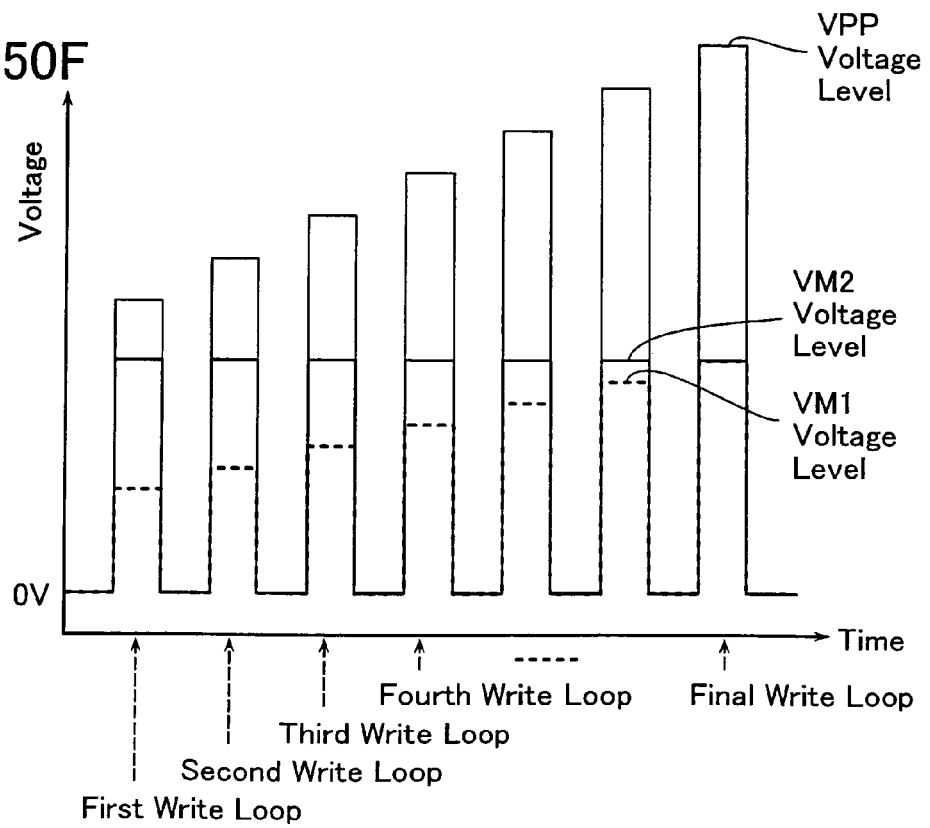

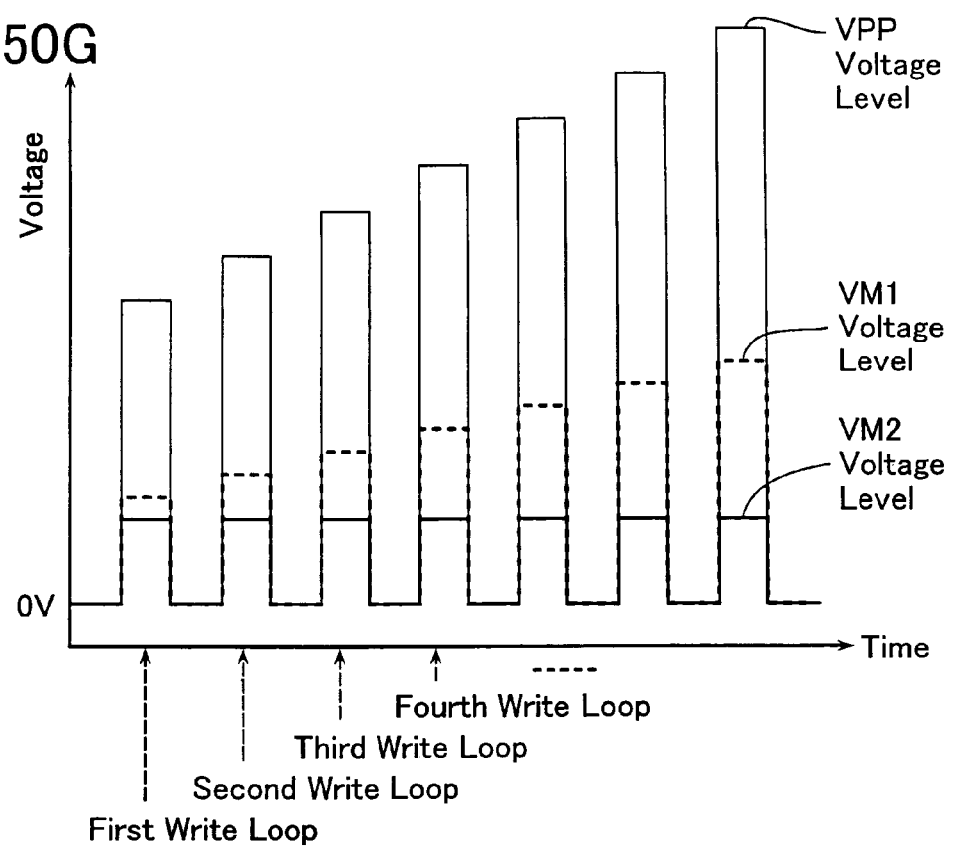
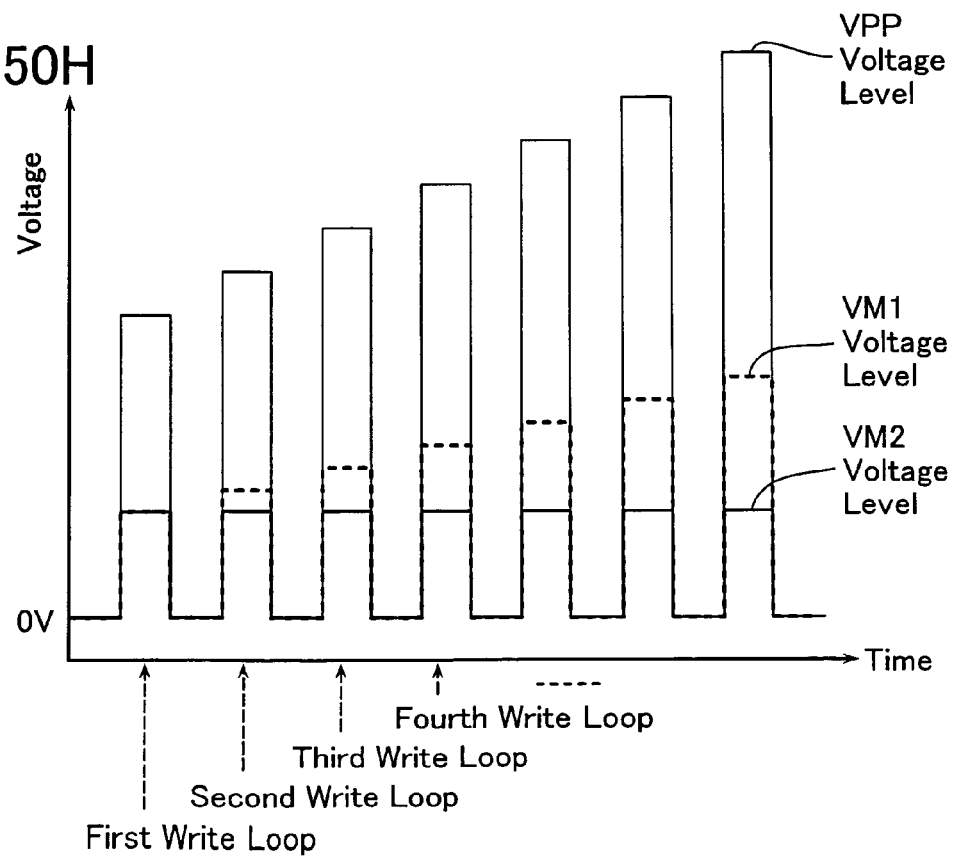

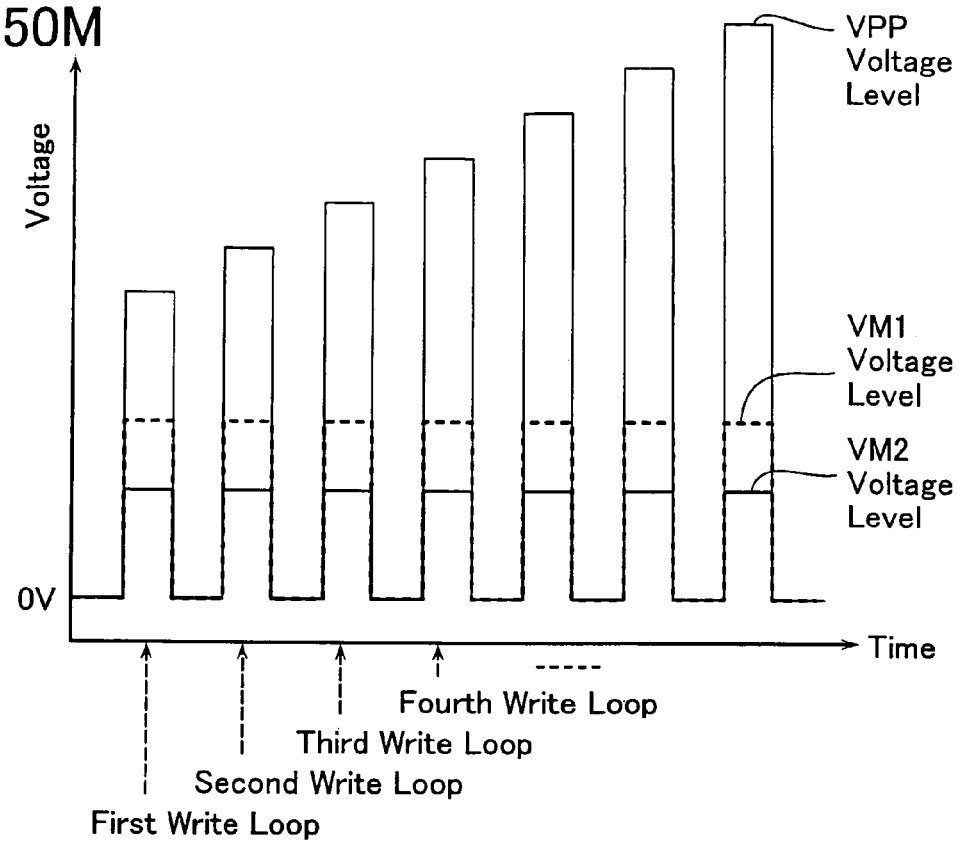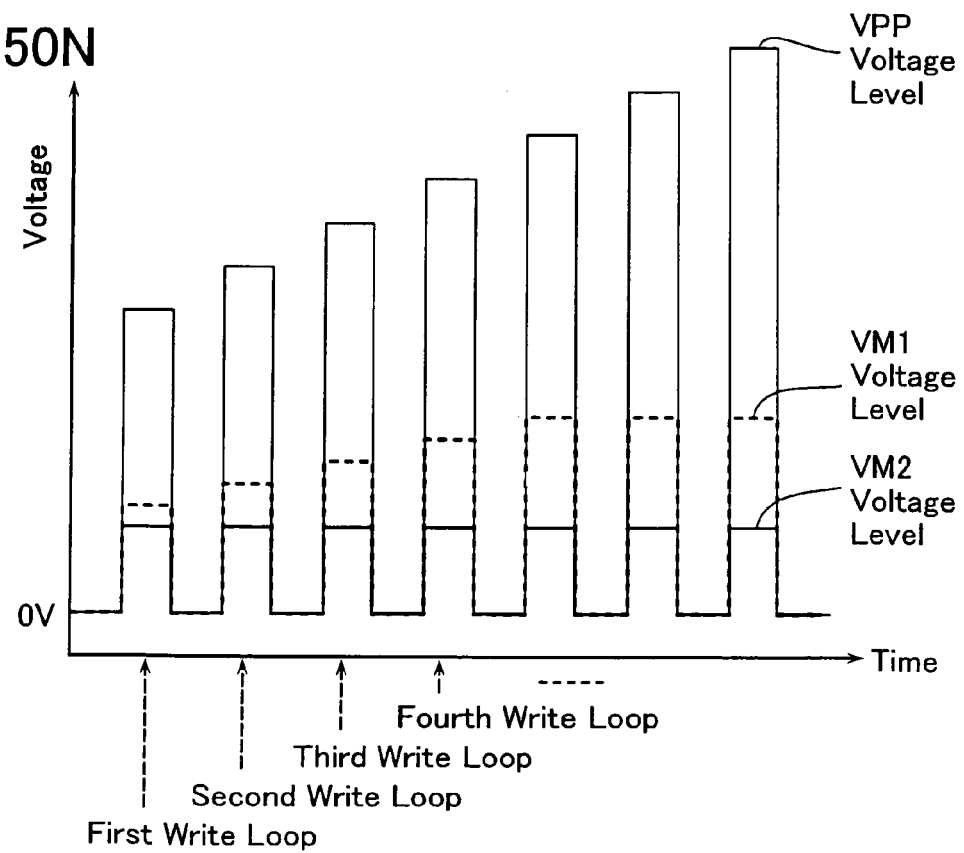

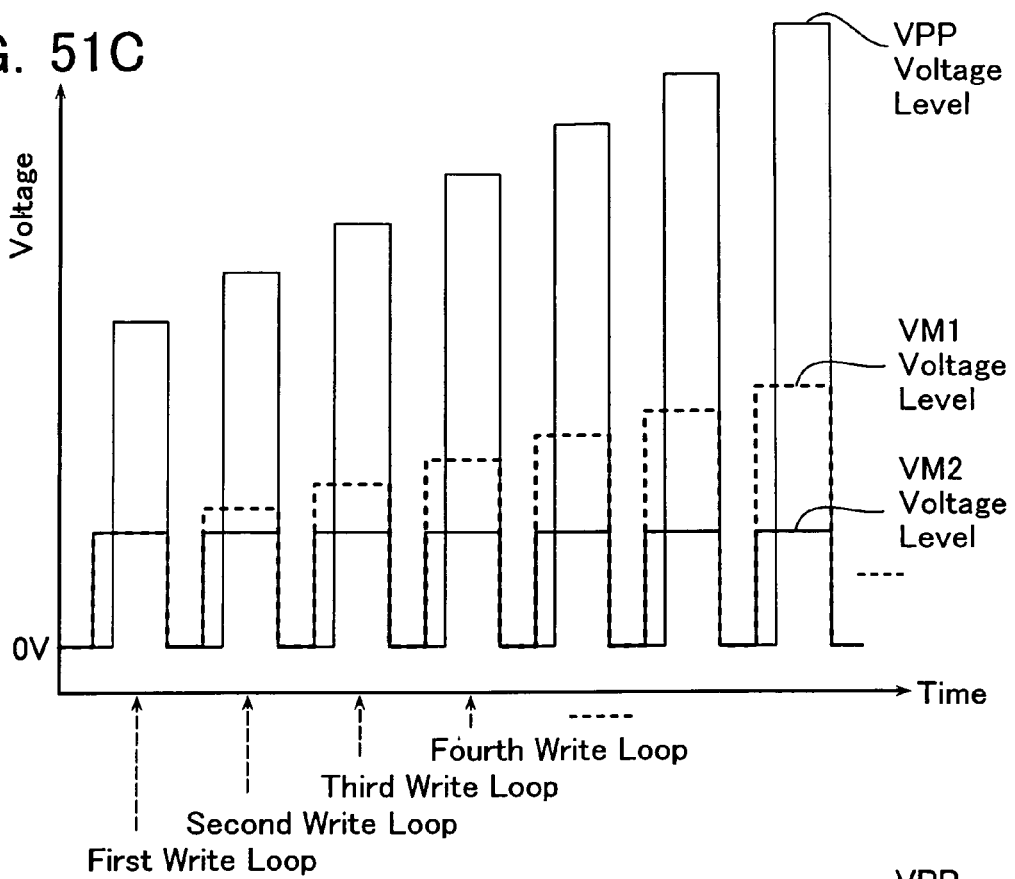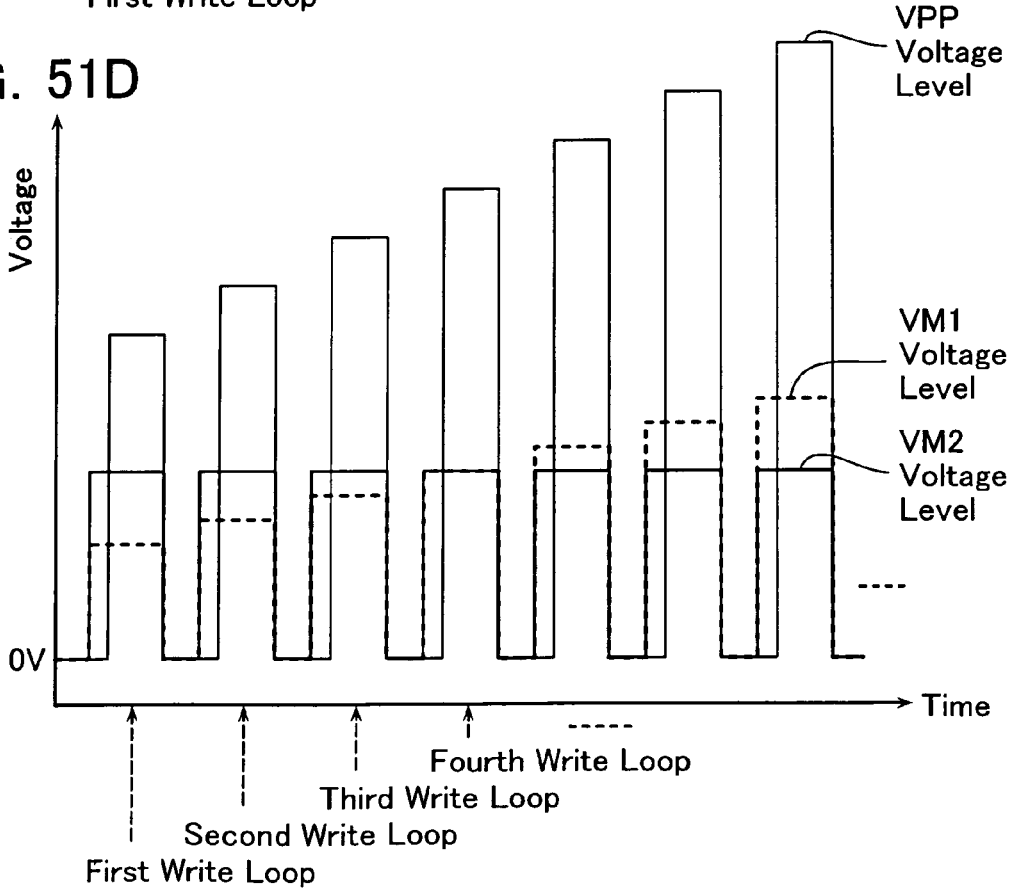

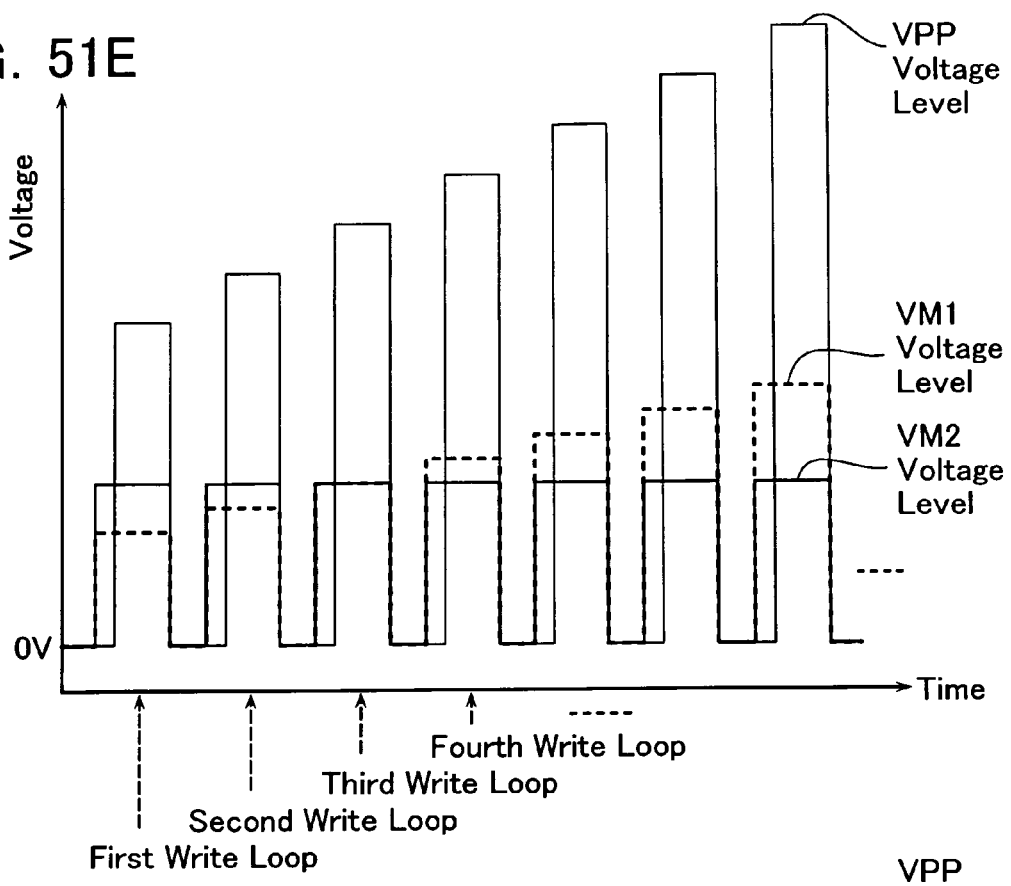
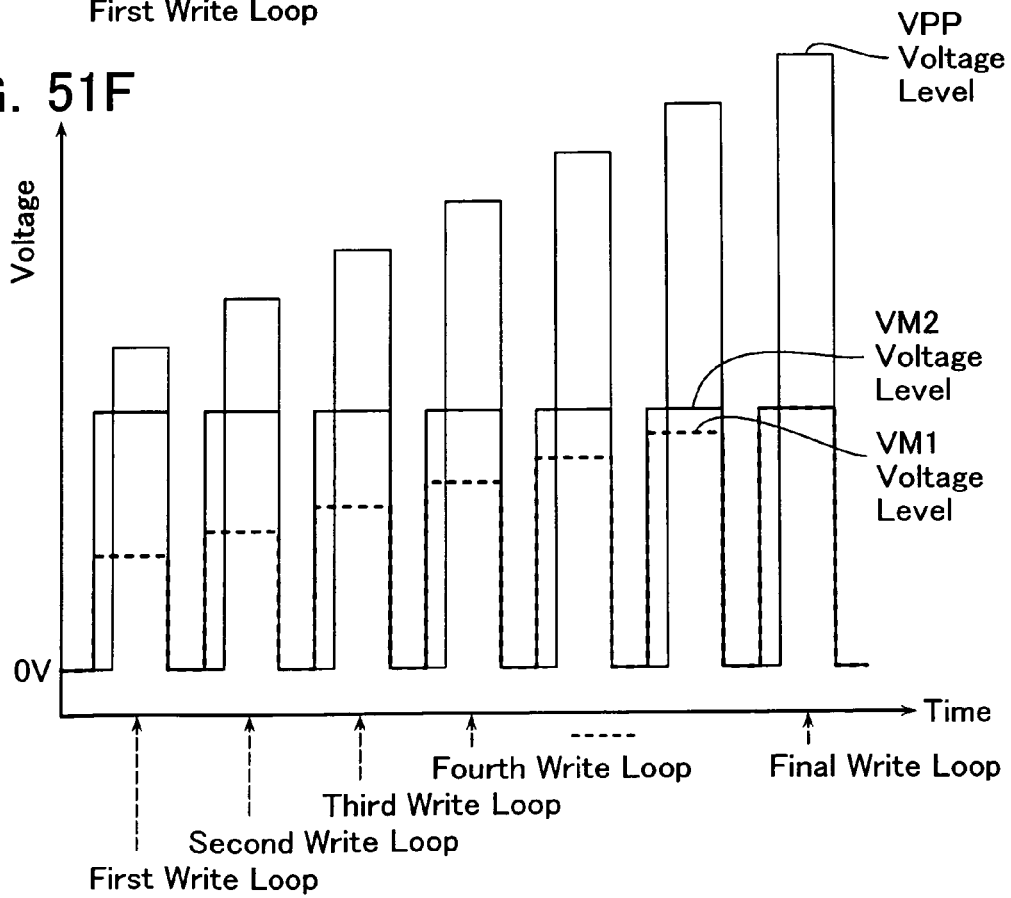

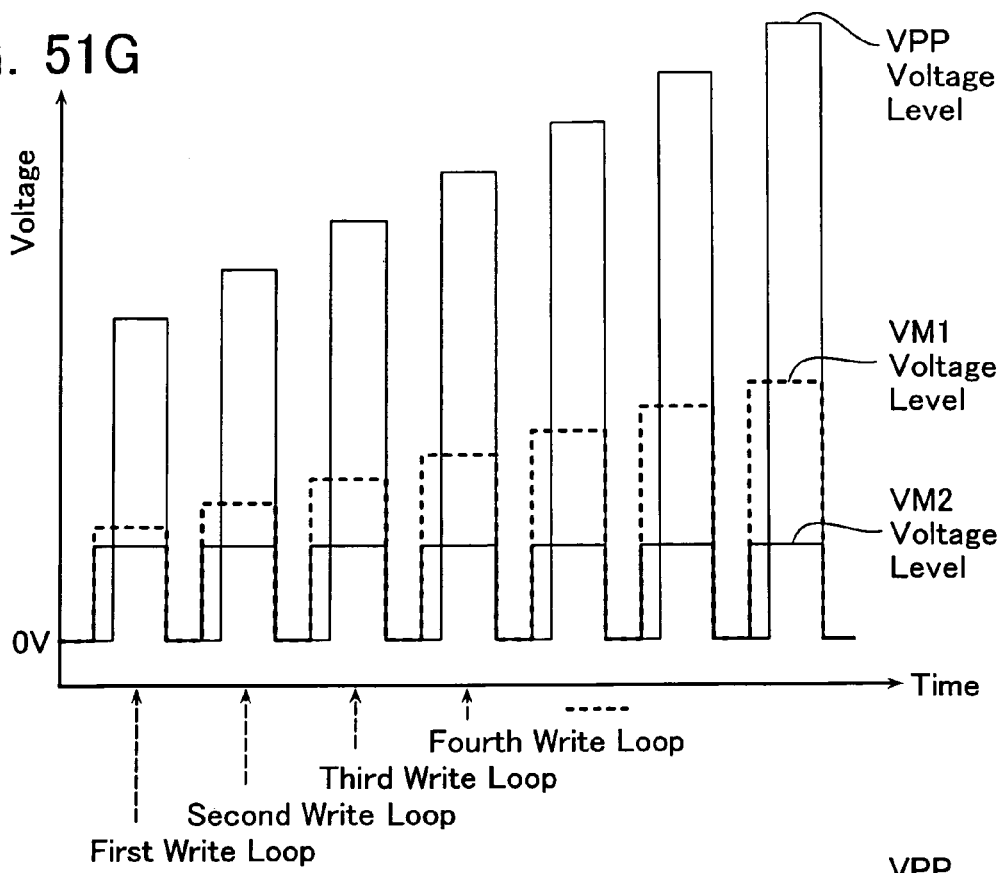
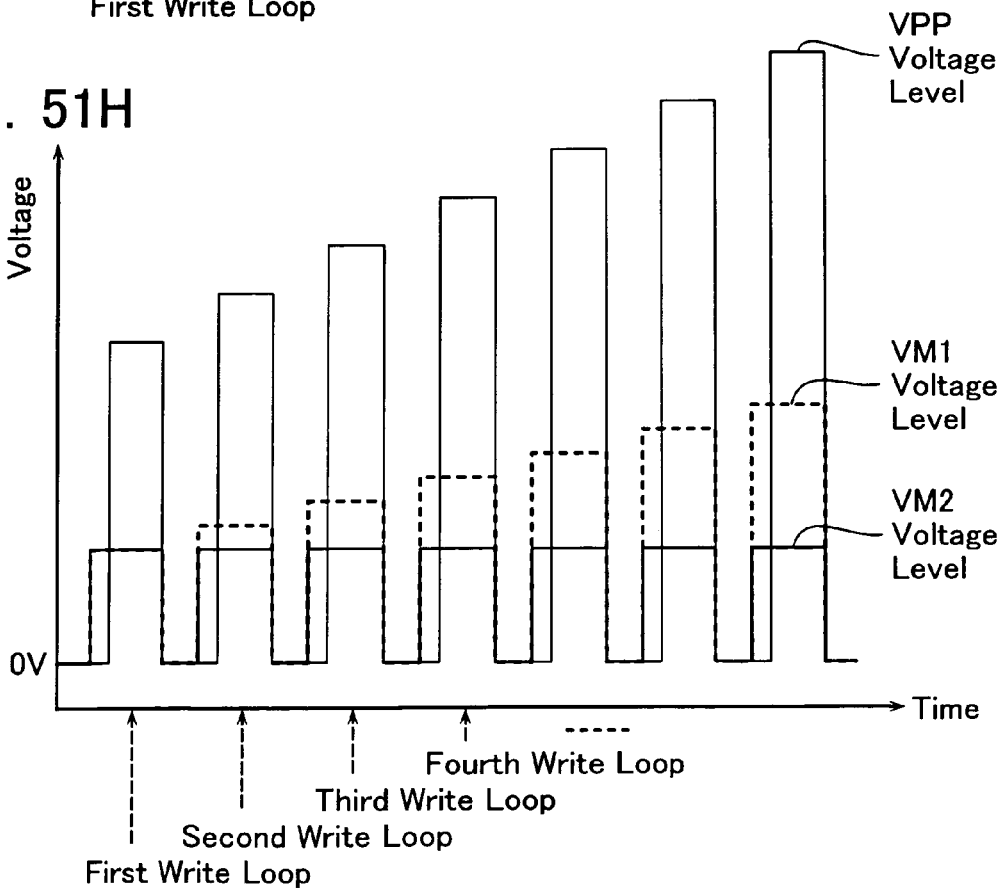

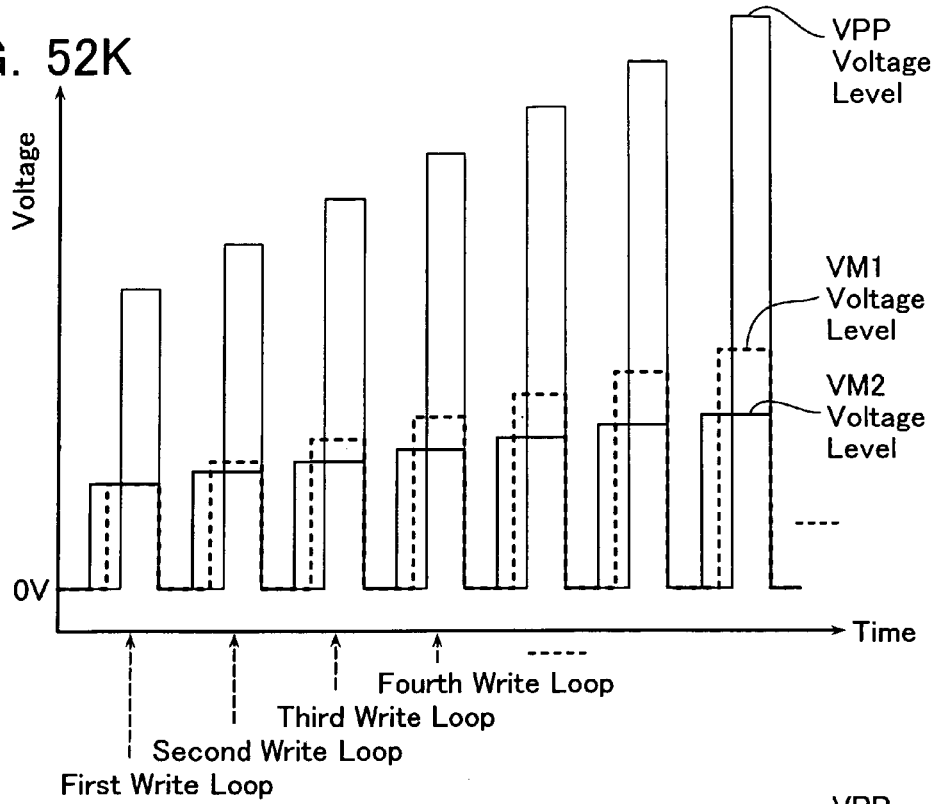
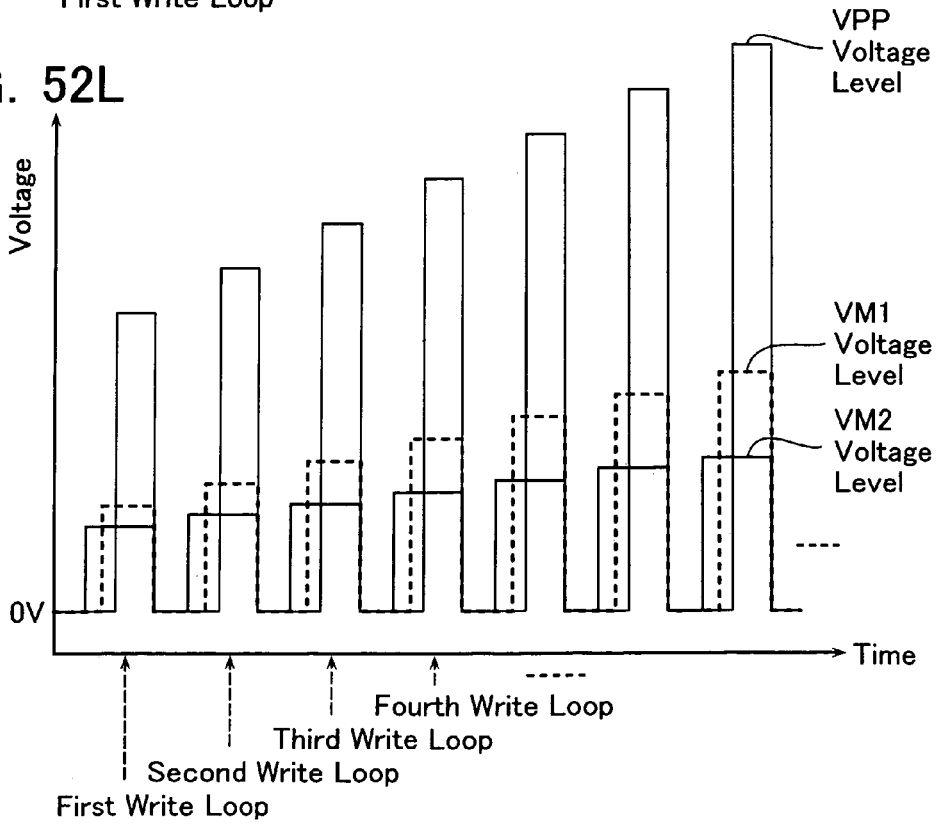

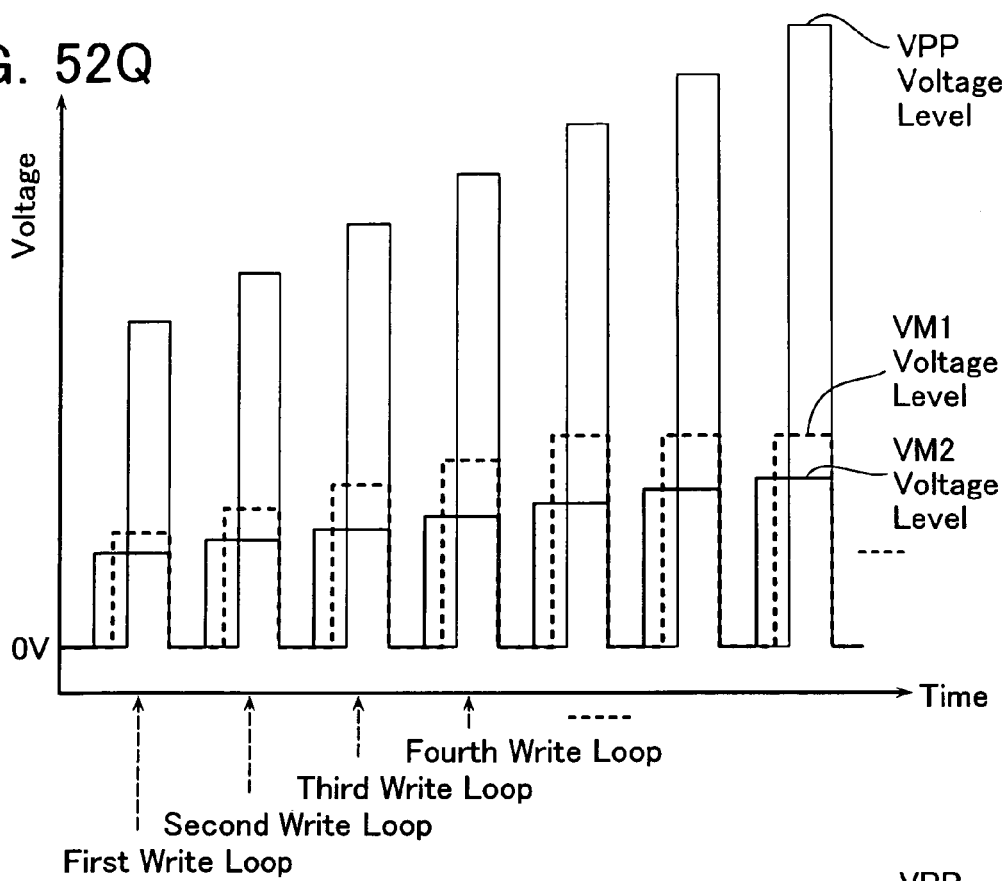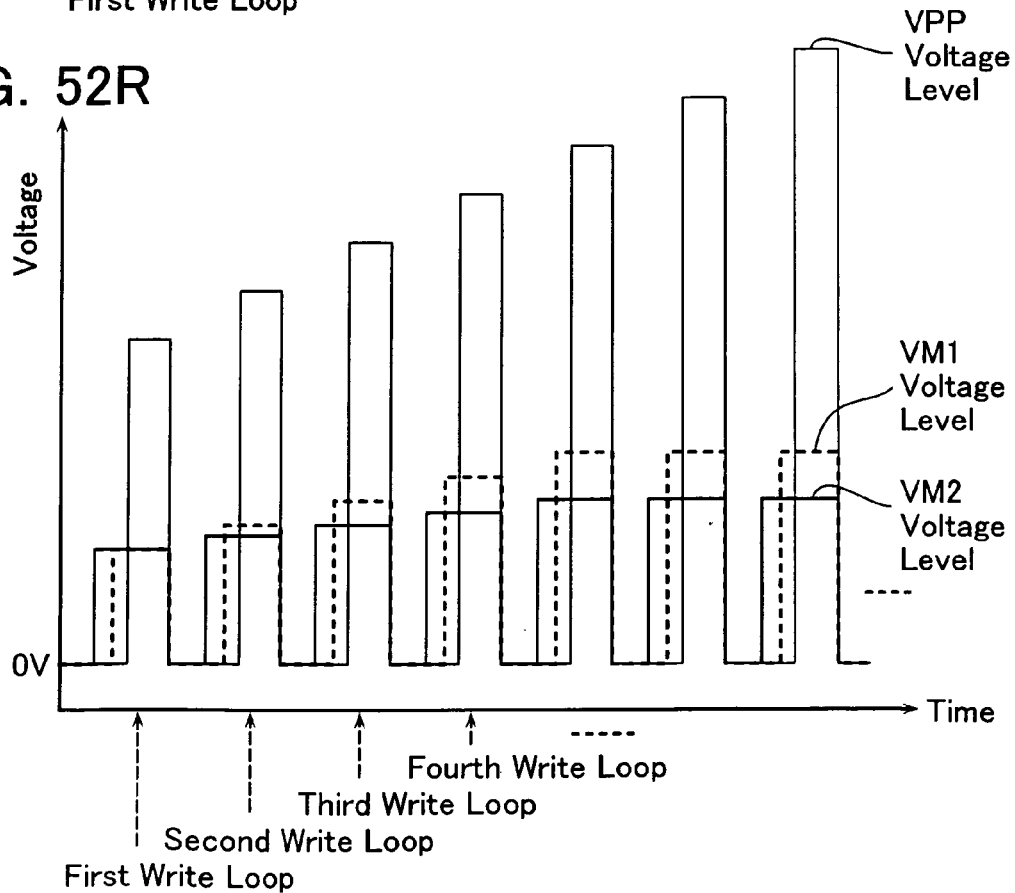

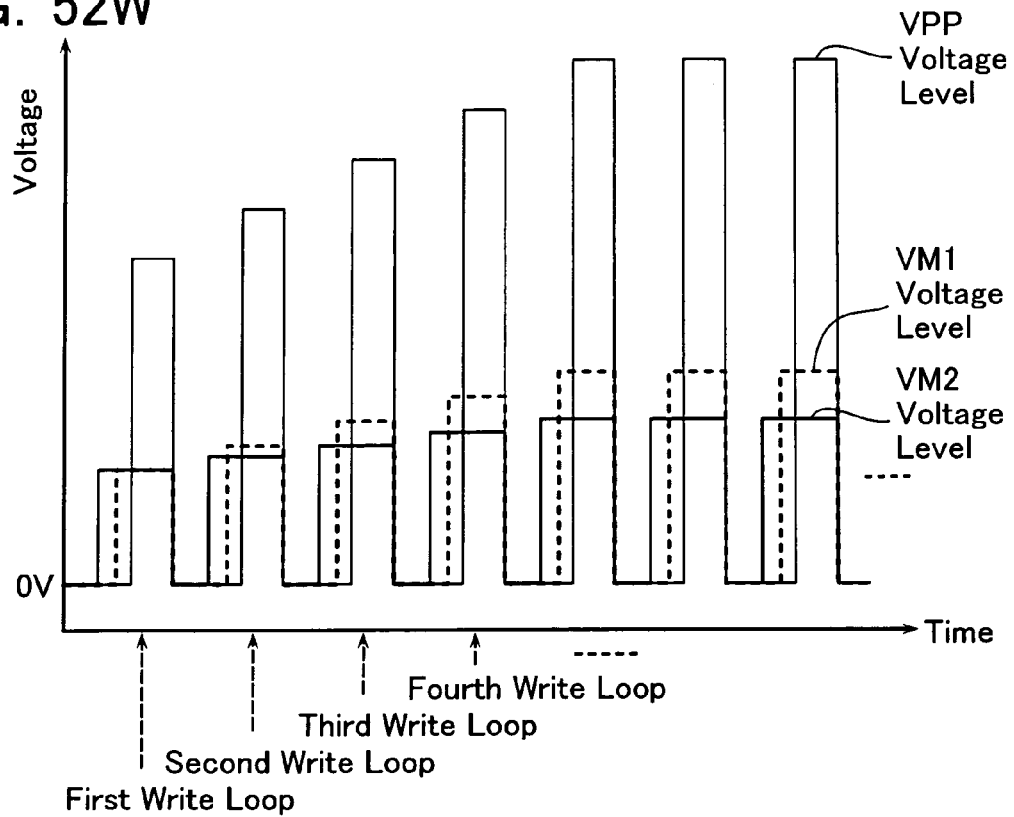
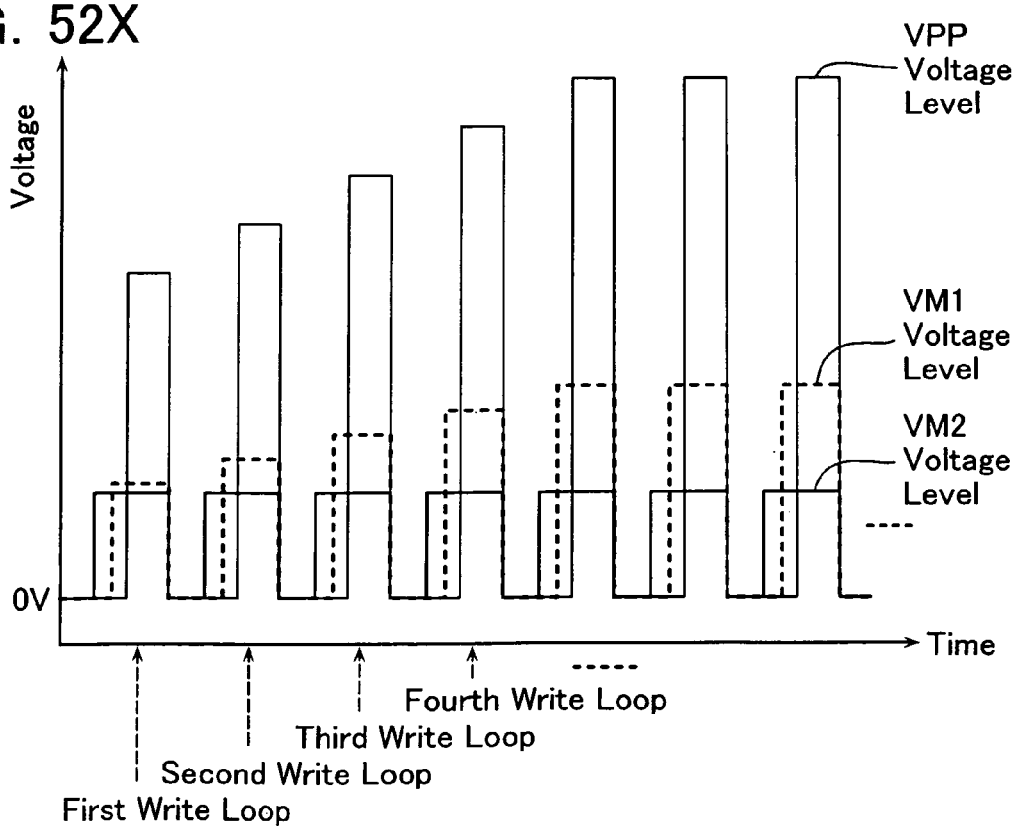

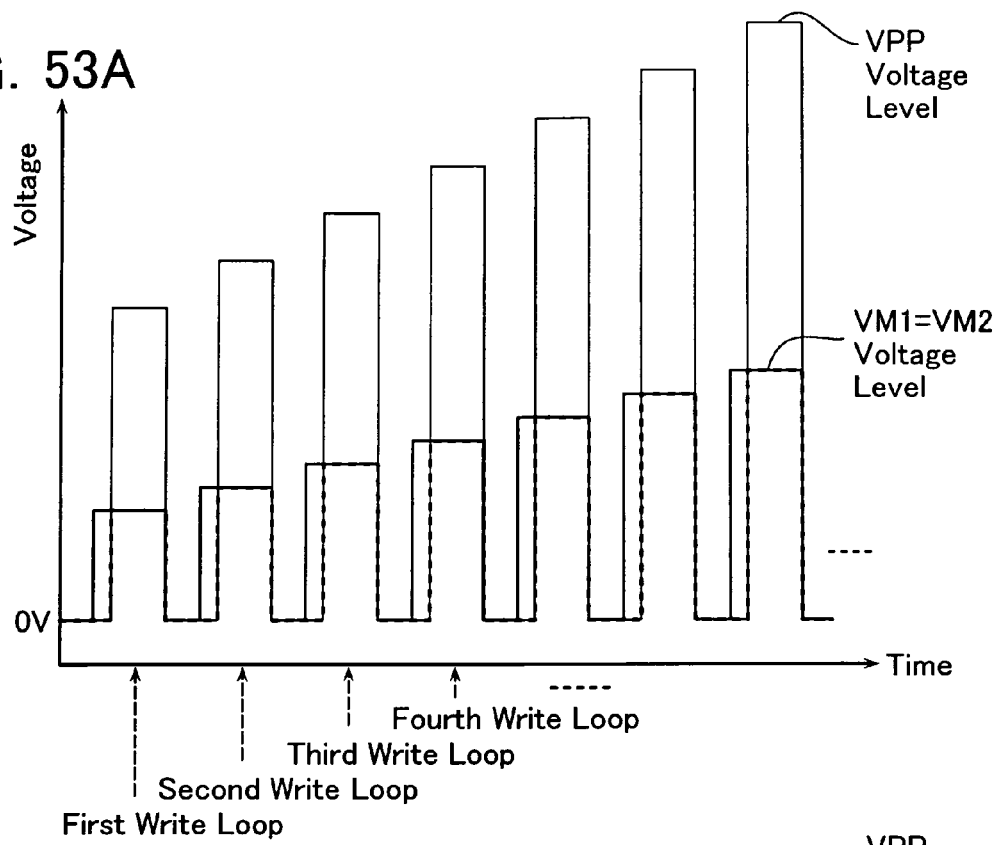
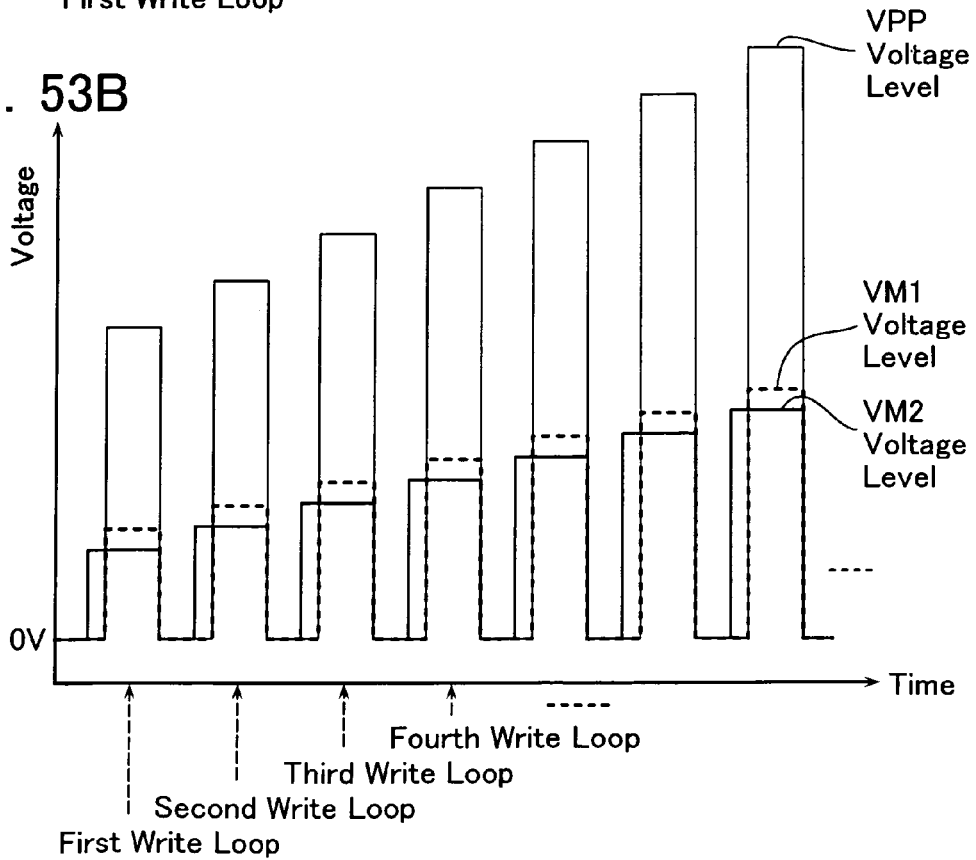

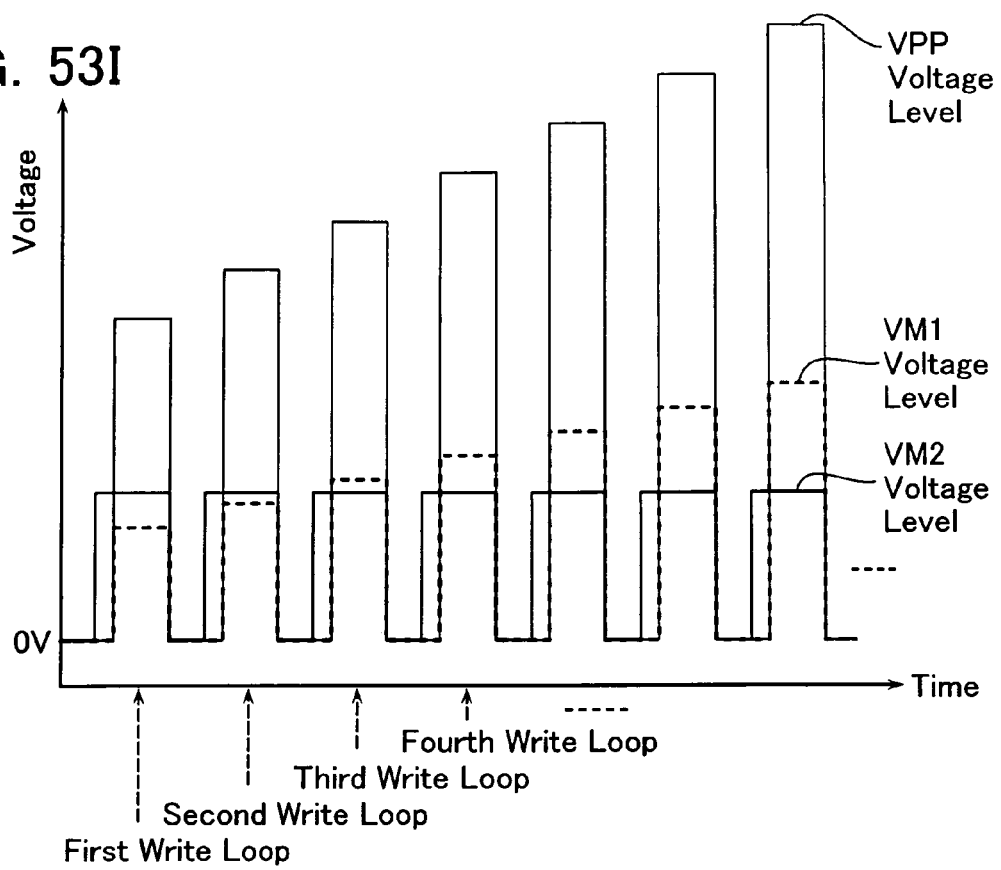
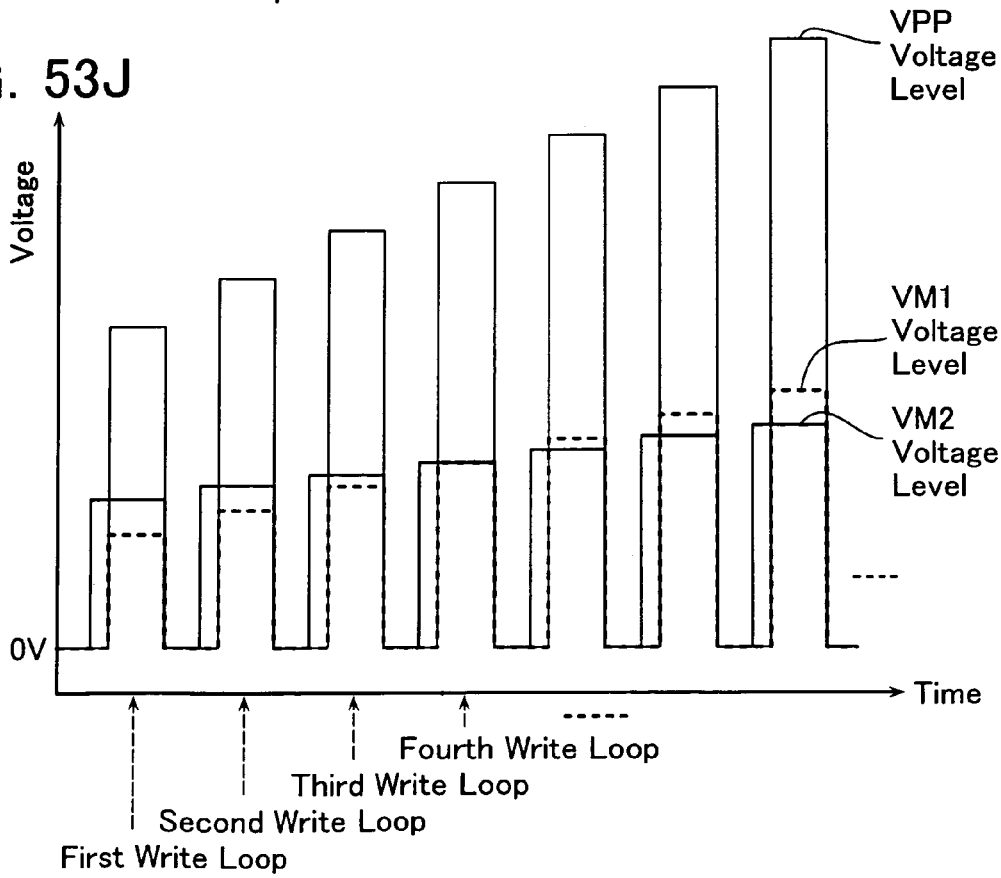

FIG. 54B  VM1 Waveform (Dashed Line) and VM1-Applied WL Waveform-1 (Solid Line)
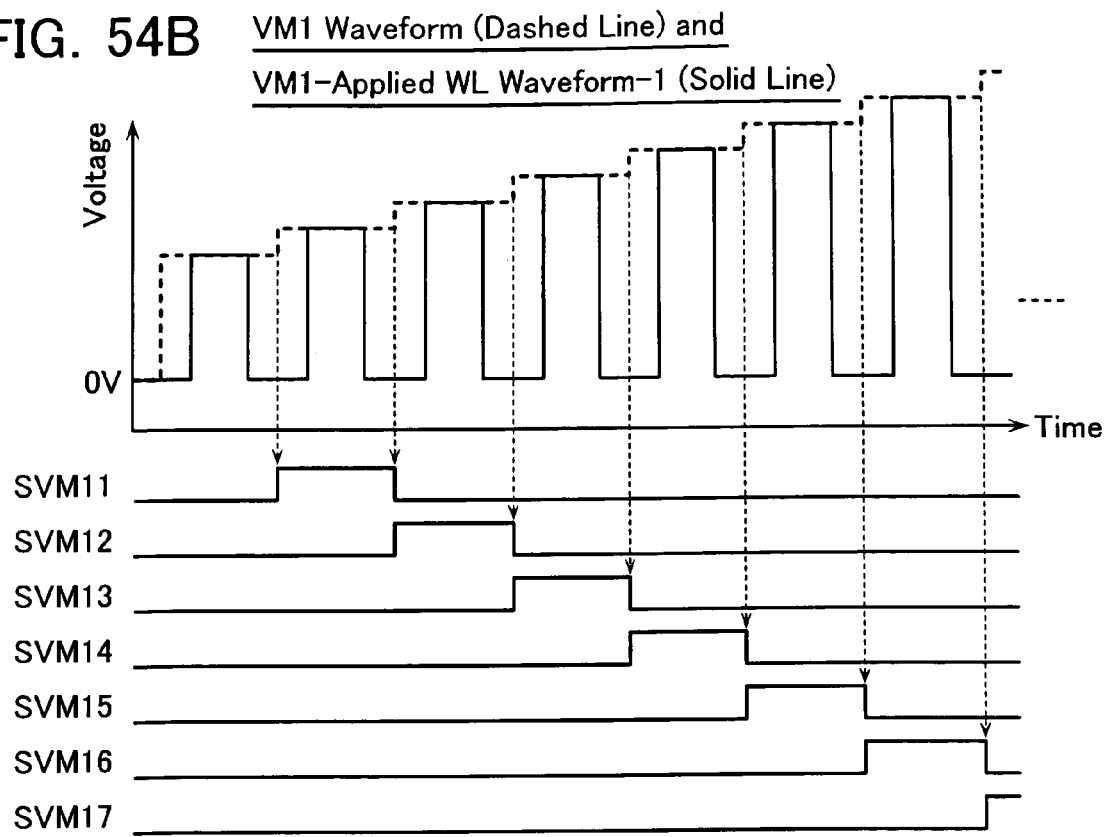
FIG. 54C  VM2 Waveform (Dashed Line) and VM2-Applied WL Waveform-2 (Solid Line)
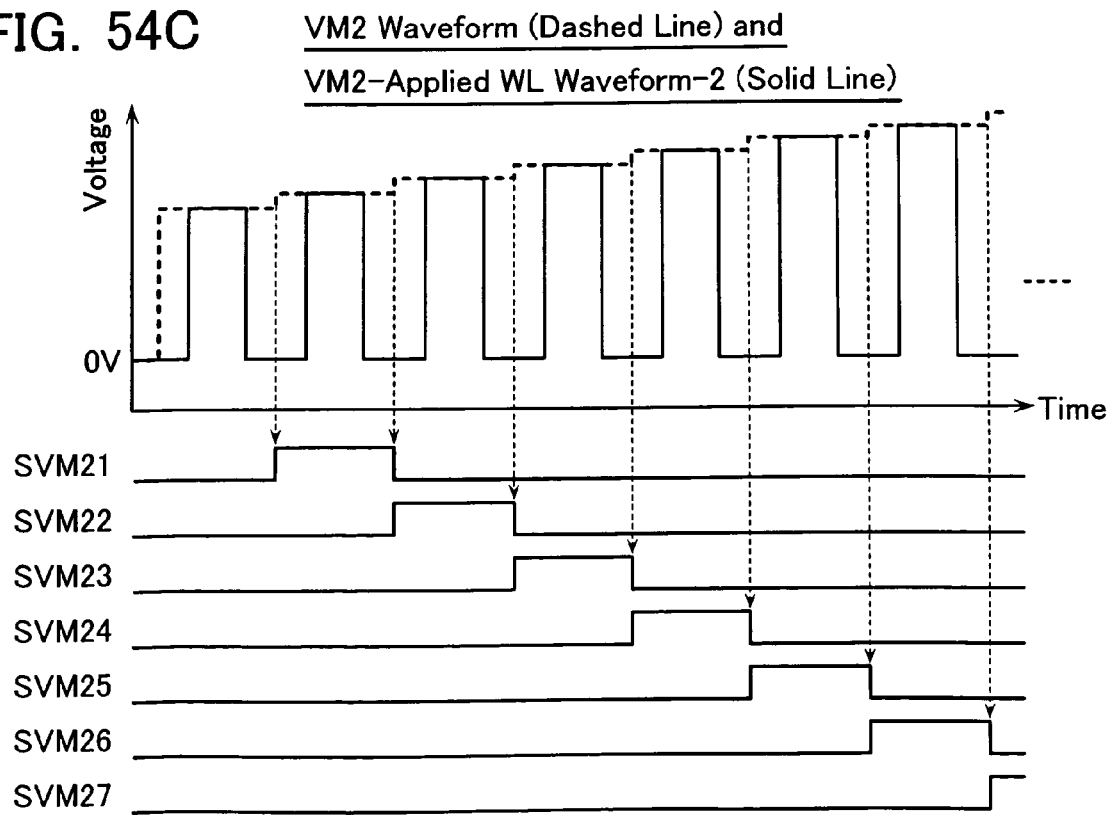

FIG. 54F   VM2 Waveform (Dashed Line) and VM2-Applied WL Waveform-2 (Solid Line)
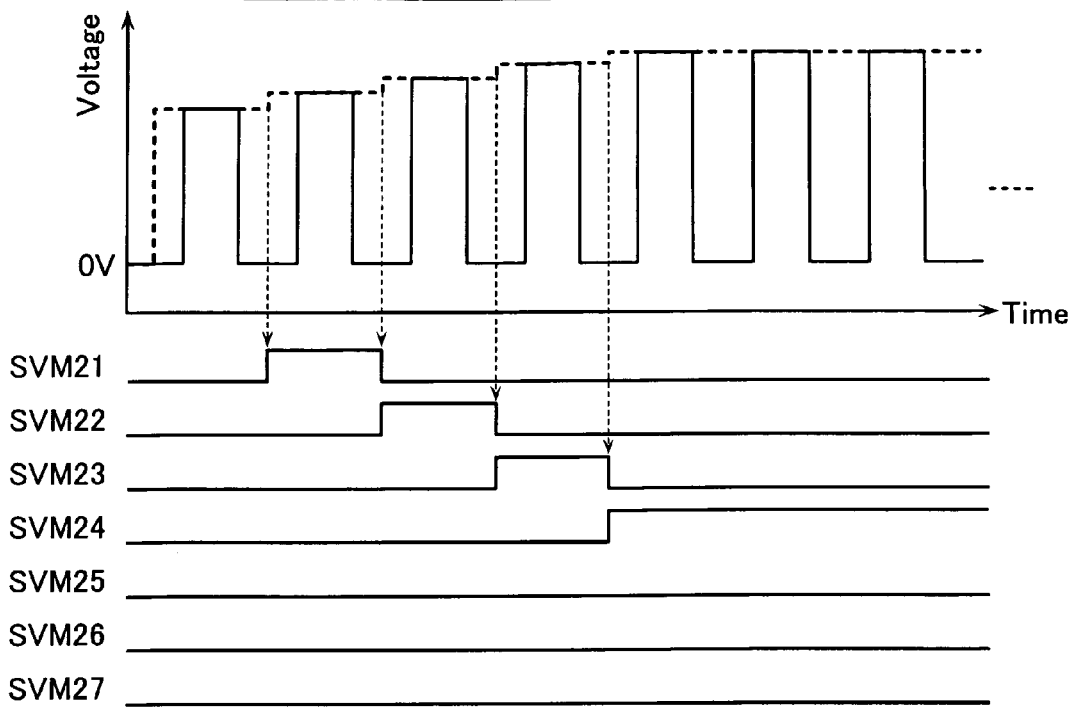
FIG. 54G   VM1 Waveform (Dashed Line) and VM1-Applied WL Waveform-1 (Solid Line)
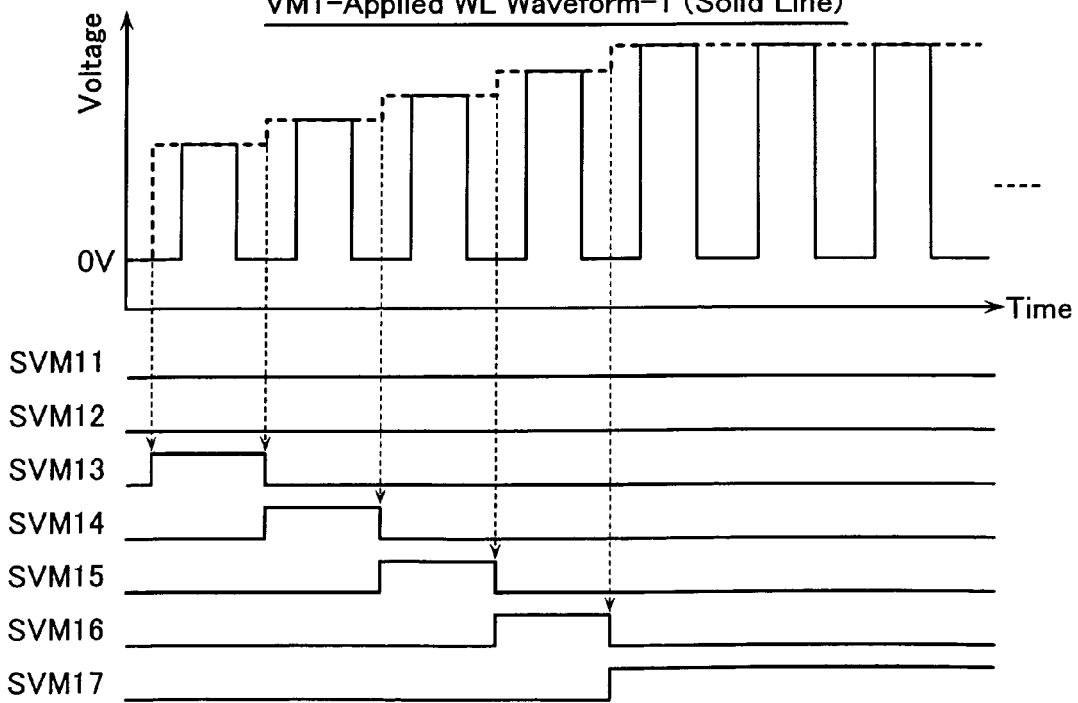

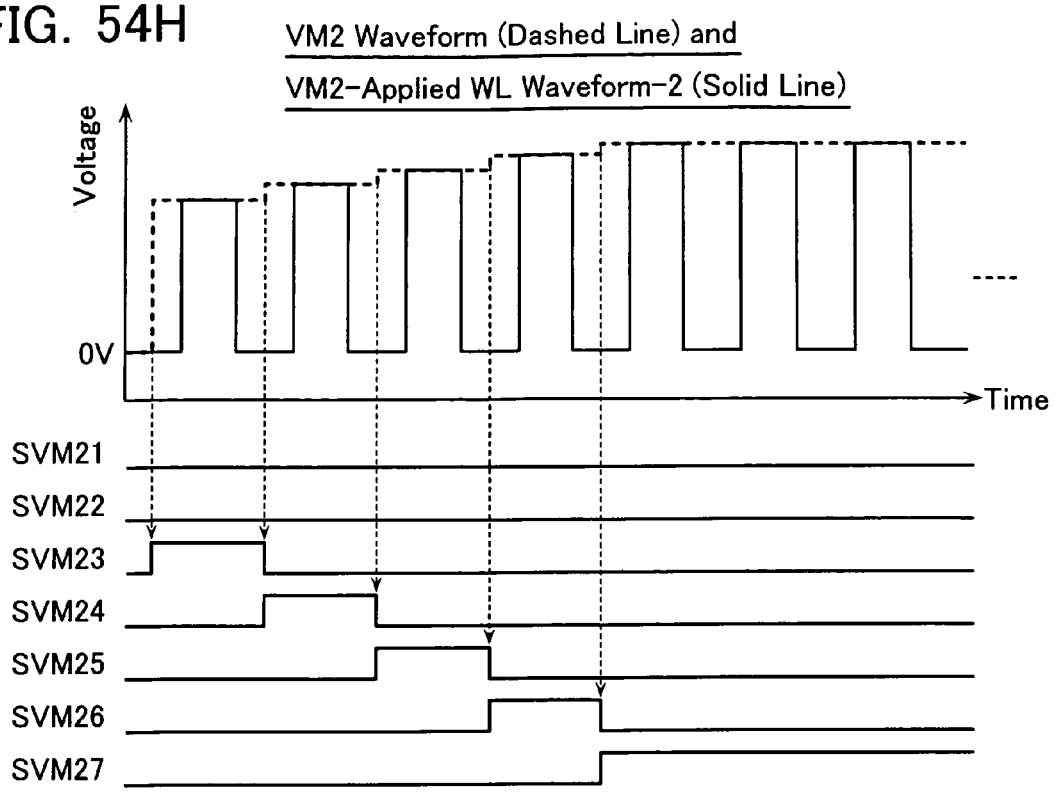
FIG. 54H  VM2 Waveform (Dashed Line) and VM2-Applied WL Waveform-2 (Solid Line)
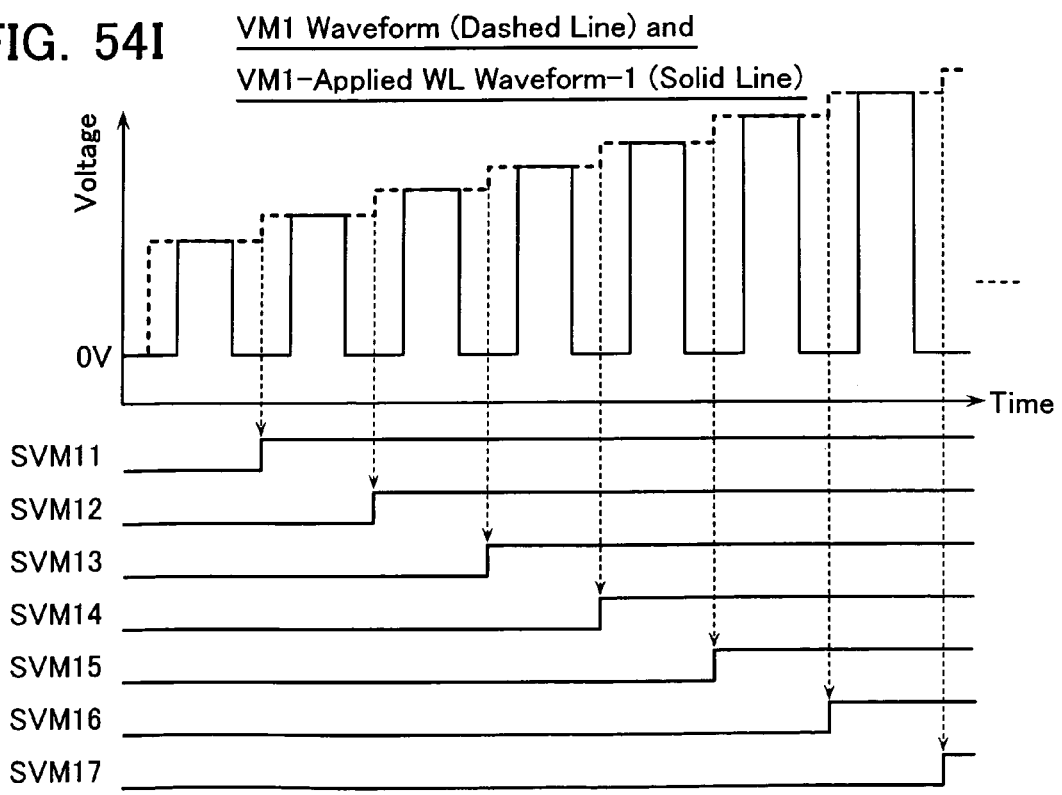
FIG. 54I  VM1 Waveform (Dashed Line) and VM1-Applied WL Waveform-1 (Solid Line)

NON-VOLATILE SEMICONDUCTOR MEMORY DEVICE HAVING NON-SELECTED WORD LINES ADJACENT TO SELECTED WORD LINES BEING CHARGED AT DIFFERENT TIMING FOR PROGRAM DISTURB CONTROL

CROSS-REFERENCE TO RELATED APPLICATIONS

This application is based upon and claims the benefit of priority from the prior Japanese Patent Application No. 2004-120368, filed on Apr. 15, 2004 and No. 2005-013063, filed on Jan. 20, 2005; the entire contents of which are incorporated herein by reference.

BACKGROUND OF THE INVENTION

1. Field of the Invention

The present invention relates to a data-rewritable non-volatile semiconductor memory device. It also relates to an electronic card with the non-volatile semiconductor memory device mounted thereon. It further relates to an electronic device that employs the electronic card. The non-volatile semiconductor memory device includes, for example, an NAND-type EEPROM.

2. Description of the Related Art

An electrically erasable programmable EEPROM has been known in the art as one of semiconductor memories. For example, an NAND-type EEPROM including NAND cells has received attention because it can be highly integrated. Each NAND cell includes a plurality of serially connected memory cells, each of which is the unit of one bit memory. The NAND-type is utilized, for example, in a memory card to store image data output from a digital still camera.

A memory cell in the NAND cell-type EEPROM has a MOSFET structure that includes a floating gate (charge storage layer) and a control gate stacked on an insulator film formed over a semiconductor substrate. A plurality of memory cells are serially connected such that adjacent ones share a source/drain to configure a NAND cell, which is connected as a unit to a bit line. Such NAND cells are arrayed in matrix to configure a memory cell array. The memory cell array is integrally formed in a p-type-well (or p-type substrate).

NAND cells arranged in the column direction of the memory cell array are commonly connected at one end (drain side) to a bit line via respective selection gate transistors and connected at the other end (source side) to a common source line via respective selection gate transistors as well. Control gates of memory transistors are commonly connected as a word line (or control gate line) and gate electrodes of selection gate transistors as a selection gate line in the row direction of the memory cell.

Such the NAND cell-type EEPROM operates as follows.

Data writing is shown in FIG. 12. As shown, after write data is input, operations of write pulse applying and write-verify are repeated, and when completion of writing is detected immediately after the write-verify operation, the data writing is finished.

Data writing is performed sequentially from a memory cell located farthest from a bit line contact, that is, a memory cell located closest to a source line. In write pulse applying (see FIG. 6), a high voltage VPP (=approximately 18 V) is applied to a control gate of a selected memory cell. An intermediate potential VM (=approximately 10 V) is applied to the control gate of a memory cell located closer to the bit line contact than the selected memory cell. A voltage of 0 V or a supply voltage VCC is applied to the bit line depending on the data. In this case, the supply voltage VCC is applied to the selection gate on the bit line contact side, and 0 V to the selection gate on the source line side. When 0 V is applied to the bit line, its potential is transmitted to the channel in the selected memory cell. In this case, a difference in voltage between the selected word line and the channel in the selected memory cell is as large as VPP. Accordingly, electrons are injected from the channel of the selected memory cell into the floating gate by tunnel current to shift the threshold of the selected memory cell to a positive value. This state is regarded as "0", for example.

When the supply voltage VCC is applied to the bit line, the voltage at the selection gate on the bit line contact side is equal to VCC. Accordingly, VCC-$V_{tsg}$ is transferred to the channel in the NAND cell to bring it into a floating state ($V_{tsg}$ is the threshold voltage of the selection gate transistor). Thereafter, the word line is charged up to VPP, VM. On charging up to VPP, VM, the capacitive coupling between the word line and the channel in the NAND cell boosts the voltage at the channel in the NAND cell from VCC-$V_{tsg}$ to $V_{boost}$ (approximately 8 V) (see FIG. 11). In this case, the difference in voltage between the selected word line and the channel in the selected memory cell is as small as VPP-$V_{boost}$. Accordingly, electron injection can not occur and thus the threshold makes no change and holds a negative value. This state is regarded as "1".

Data erasing is performed simultaneously to all memory cells in a selected NAND cell block. Namely, all word lines (that is, control gates) in the selected NAND cell block are kept at 0 V, and a high voltage VERA (=approximately 22 V) is applied to the p-type well (or p-type substrate) to bring the bit lines, the source line, and all word lines and all selection gate lines in non-selected NAND cell blocks into a floating state. Accordingly, in every memory cell in the selected NAND cell block, electrons are released from the floating gate to the p-type well (or p-type substrate) by tunnel current to shift the threshold voltage to a negative value.

Data reading is performed by detecting whether current flows in the selected memory cell on condition that the control gate of the selected memory cell is kept at 0 V. In addition, other word lines (that is, control gates of memory cells) and selection gates are set at an intermediate voltage for reading, VREAD, slightly higher than the supply voltage. (Generally, a voltage level equal to or lower than 2-times VCC and having a value of 5 V or below is employed).

A conventional timing example of write pulse applying to the above NAND cell-type EEPROM is shown in FIG. 6. Another known conventional example of write pulse applying is described as writing operation in JP-A 10-283788.

The use of conventional data writing methods may cause no problem on the reliability of products. Recently, however, a further improvement in the reliability of data writing is desired, and the further improved reliability leads to an improved product yield.

On data writing, an erroneous write failure may occur in a memory cell to be "1"-WRITE (a failure associated with erroneous write of "0" data when VPP is applied to the selected word line during write pulse applying). In order to achieve a further improvement in the reliability against such the failure, it is effective to elevate the $V_{boost}$ voltage level. The higher the $V_{boost}$ voltage level, the lower the risk of the erroneous write failure can be reduced, which is caused from the electron injection into the floating gate by tunnel current. Therefore, it is desirable to employ such data writing in products that can elevate the $V_{boost}$ voltage level more than the operation shown in FIG. 6 or the above JP-A 10-283788.

BRIEF SUMMARY OF THE INVENTION

In an aspect the present invention provides a non-volatile semiconductor memory device, which comprises a memory cell array of memory cell units each including data-rewritable non-volatile memory cells and first and second selection transistors; a plurality of word lines each commonly connected to the memory cells on the same row in the memory cell array; a first gate line commonly connected to gates of the first selection transistors on the same row in the memory cell array; and a second gate line commonly connected to gates of the second selection transistors on the same row in the memory cell array. In write pulse applying during data writing, a high voltage for writing is applied to a selected word line, and first and second intermediate voltages for writing are applied to at least two of non-selected word lines. The beginning of charging a first word line located between the selected word line and the first selection gate line to the first intermediate voltage for writing is followed by the beginning of charging a second word line located between the selected word line and the second selection gate line to the second intermediate voltage for writing.

In another aspect the present invention provides a non-volatile semiconductor memory device, which comprises a memory cell array of data-rewritable non-volatile memory cells or memory cell units containing the memory cells; and a plurality of word lines each commonly connected to the memory cells on the same row in the memory cell array. In write pulse applying during data writing, a high voltage for writing is applied to a selected word line, and first and second intermediate voltages for writing are applied to at least two of non-selected word lines. The beginning of charging a first word line located between the selected word line and a source line to the first intermediate voltage for writing is followed by the beginning of charging a second word line located between the selected word line and a bit line contact to the second intermediate voltage for writing.

In yet another aspect the present invention provides a non-volatile semiconductor memory device, which comprises a memory cell array of data-rewritable, non-volatile memory cells or memory cell units containing the memory cells; and a plurality of word lines each commonly connected to the memory cells on the same row in the memory cell array. In write pulse applying during data writing, a first intermediate voltage for writing is applied to a first word line located between a selected word line and a bit line contact, and a second intermediate voltage for writing is applied to a second word line located between the selected word line and a source line. The first intermediate voltage for writing is different from the second intermediate voltage for writing in charge timing.

BRIEF DESCRIPTION OF THE DRAWINGS

FIG. 50E shows the word line waveforms during the same operation (part 5);

FIG. 50F shows the word line waveforms during the same operation (part 6);

FIG. 50G shows the word line waveforms during the same operation (part 7);

FIG. 50H shows the word line waveforms during the same operation (part 8);

FIG. 50M shows the word line waveforms during the same operation (part 13);

FIG. 50N shows the word line waveforms during the same operation (part 14);

FIG. 51T shows the word line waveforms during the same operation (part 20);

FIG. 51U shows the word line waveforms during the same operation (part 21);

FIG. 51V shows the word line waveforms during the same operation (part 22);

FIG. 51W shows the word line waveforms during the same operation (part 23);

FIG. 51X shows the word line waveforms during the same operation (part 24);

FIG. 52A shows different word line waveforms during an operation of data writing according to the embodiment of the present invention (part 1);

FIG. 52B shows the word line waveforms during the same operation (part 2);

FIG. 52C shows the word line waveforms during the same operation (part 3);

FIG. 52D shows the word line waveforms during the same operation (part 4);

FIG. 52E shows the word line waveforms during the same operation (part 5);

FIG. 52F shows the word line waveforms during the same operation (part 6);

FIG. 52G shows the word line waveforms during the same operation (part 7);

Figure 52A:
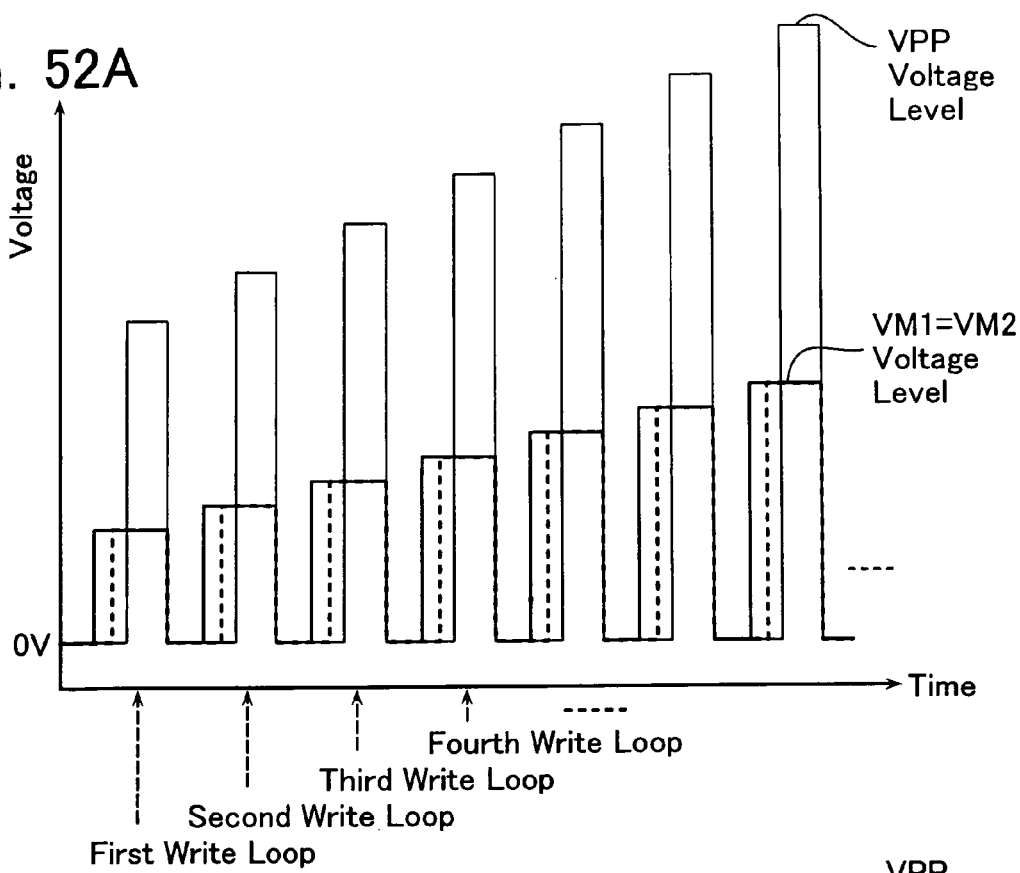
Figure 52B:
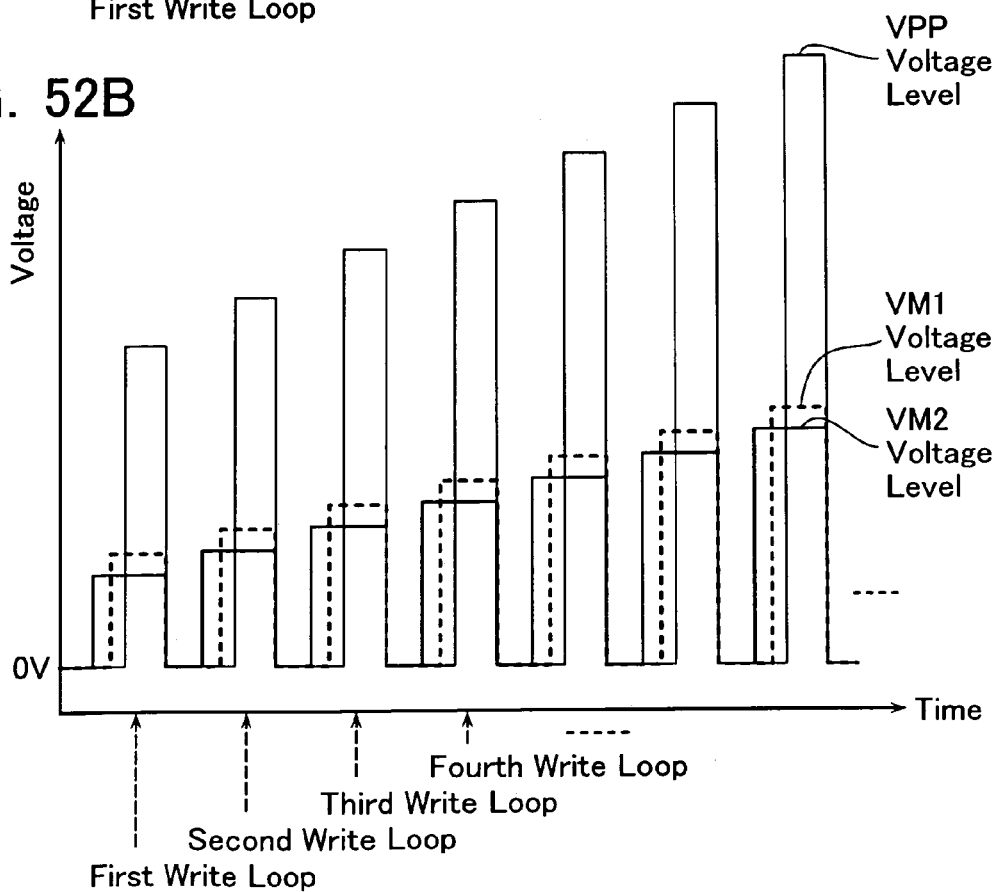
Figure 52C:
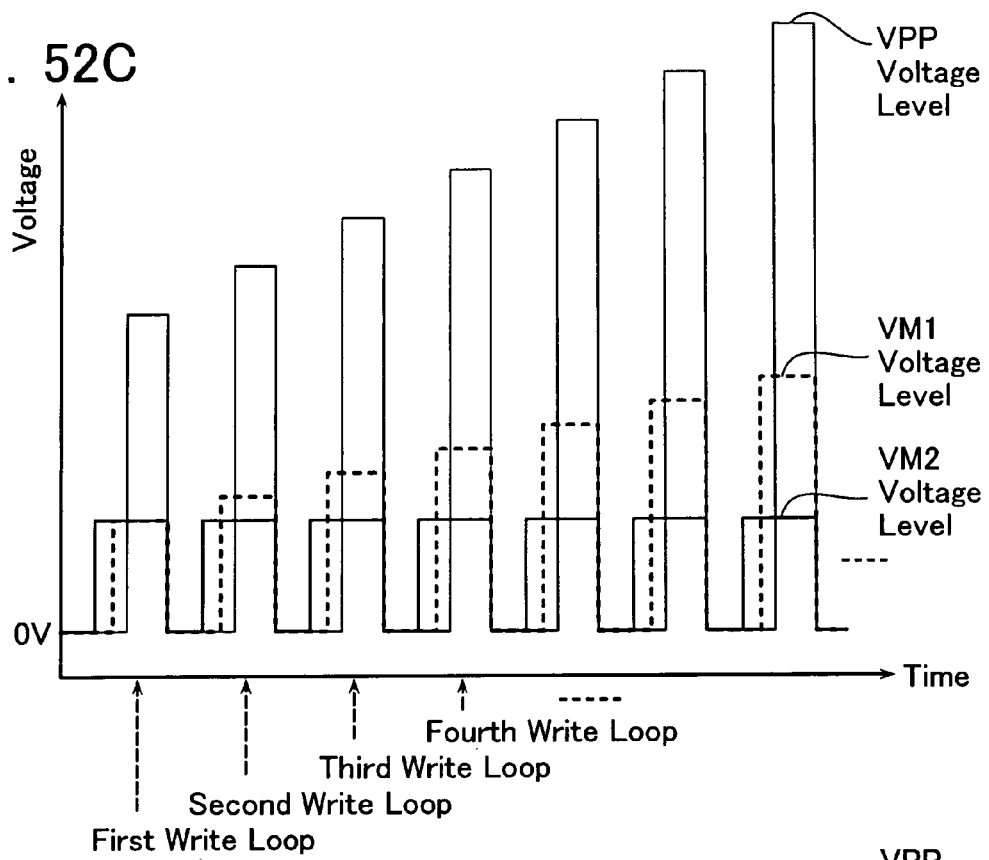
Figure 52D:
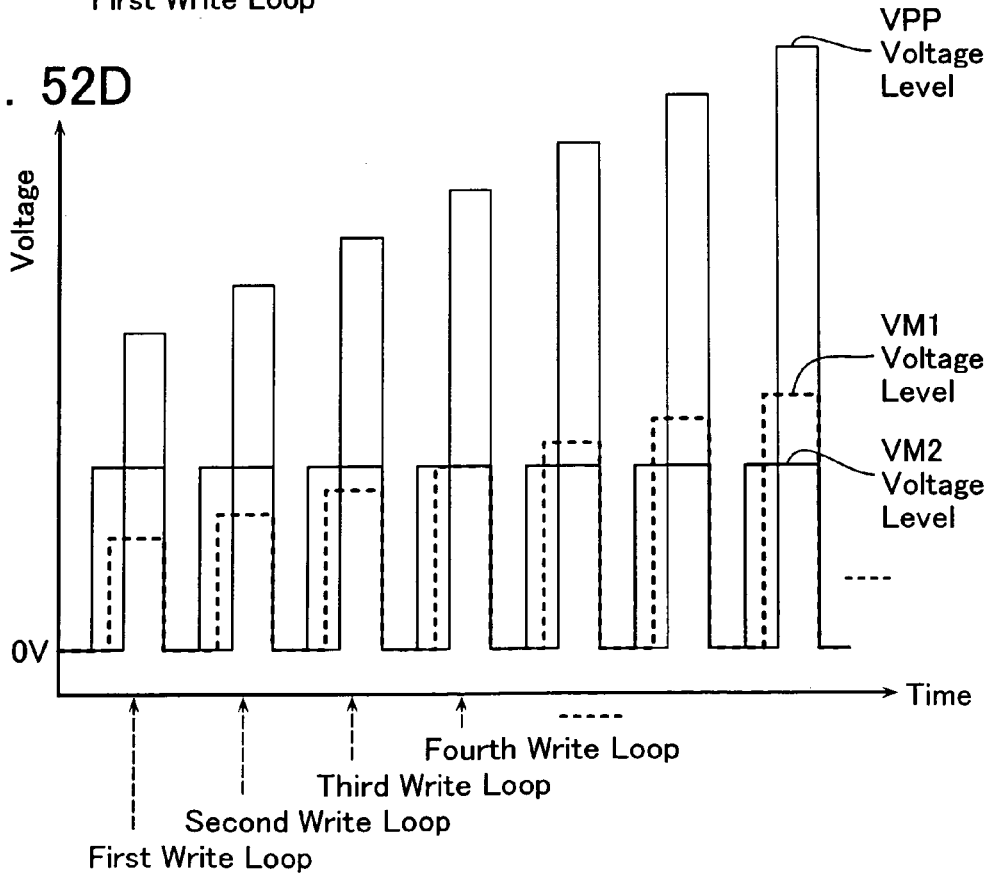
Figure 52E:
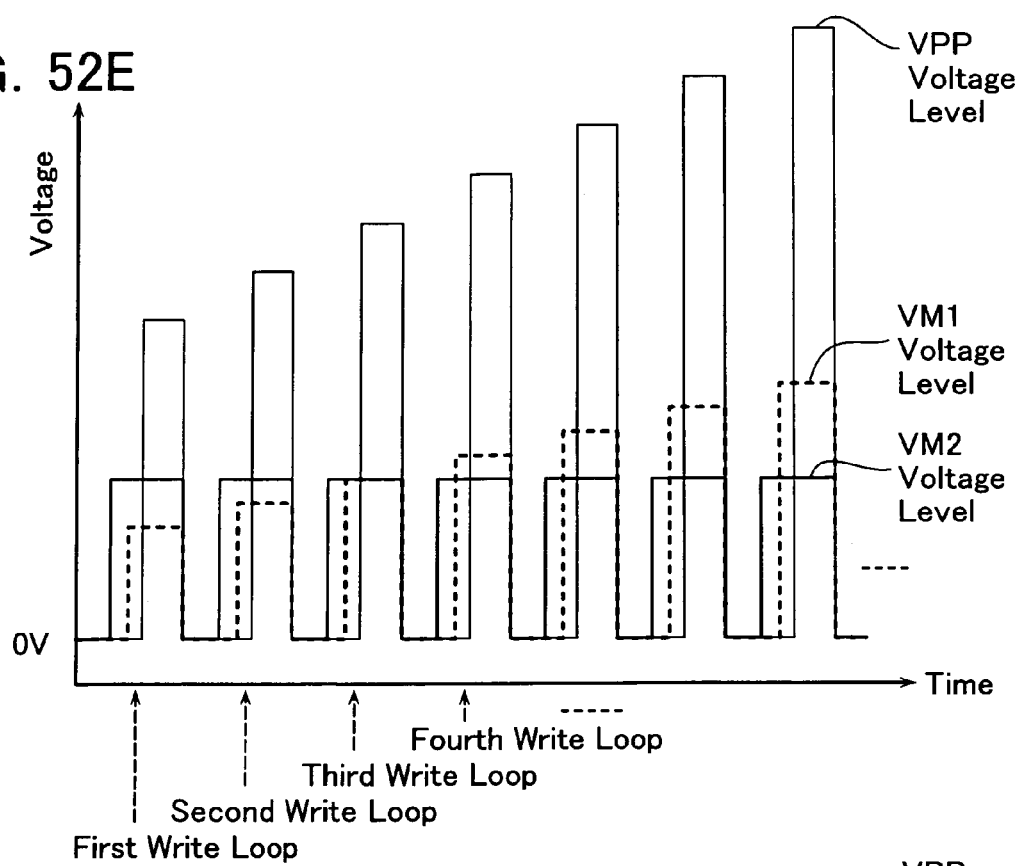
Figure 52F:
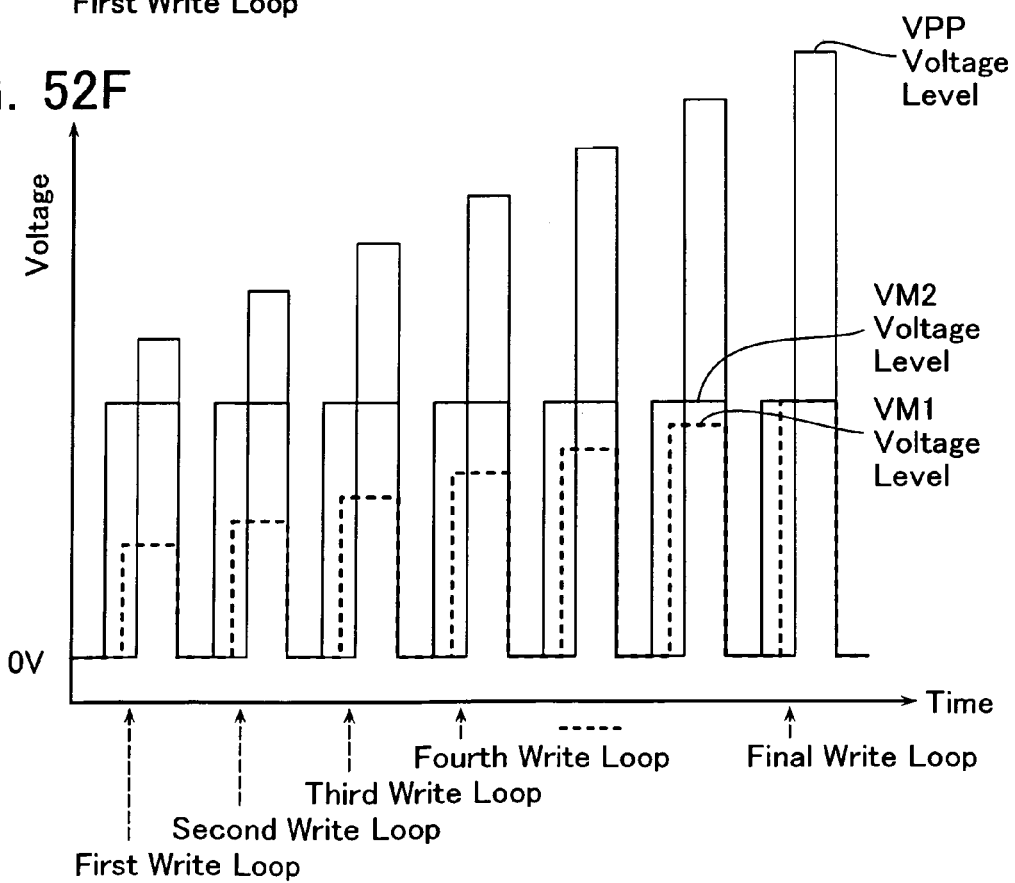
Figure 52G:
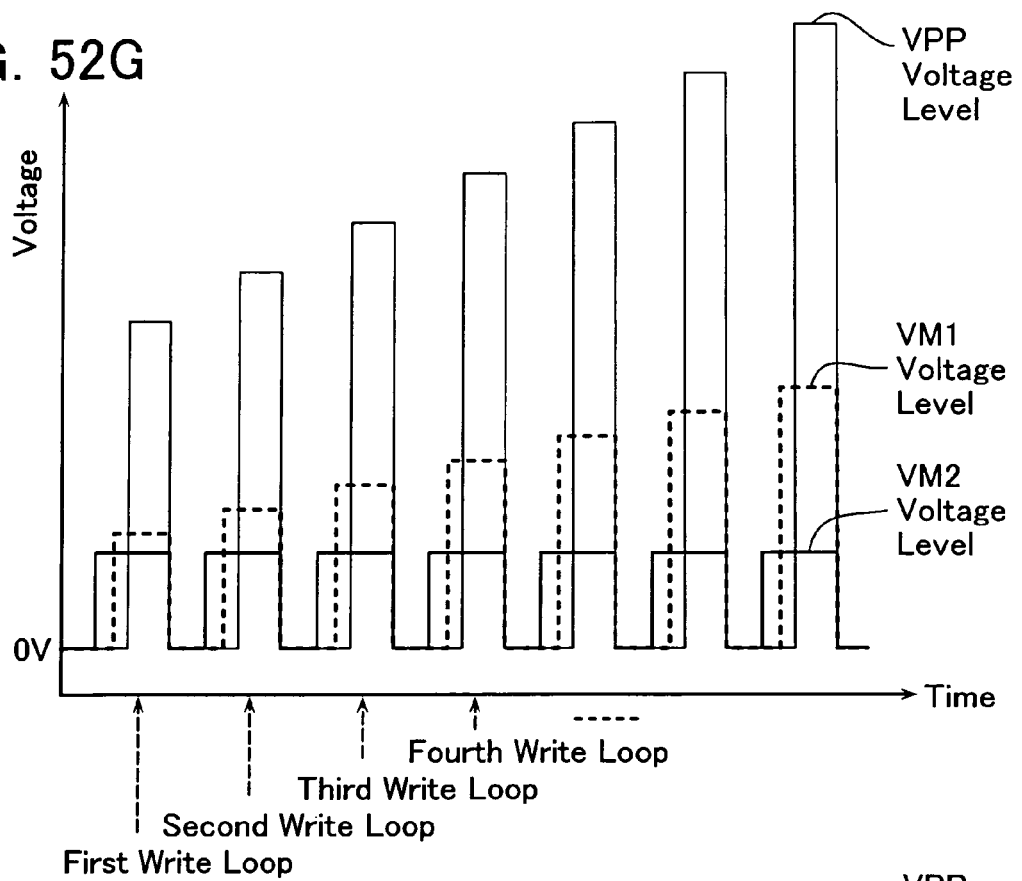
Figure 52H:
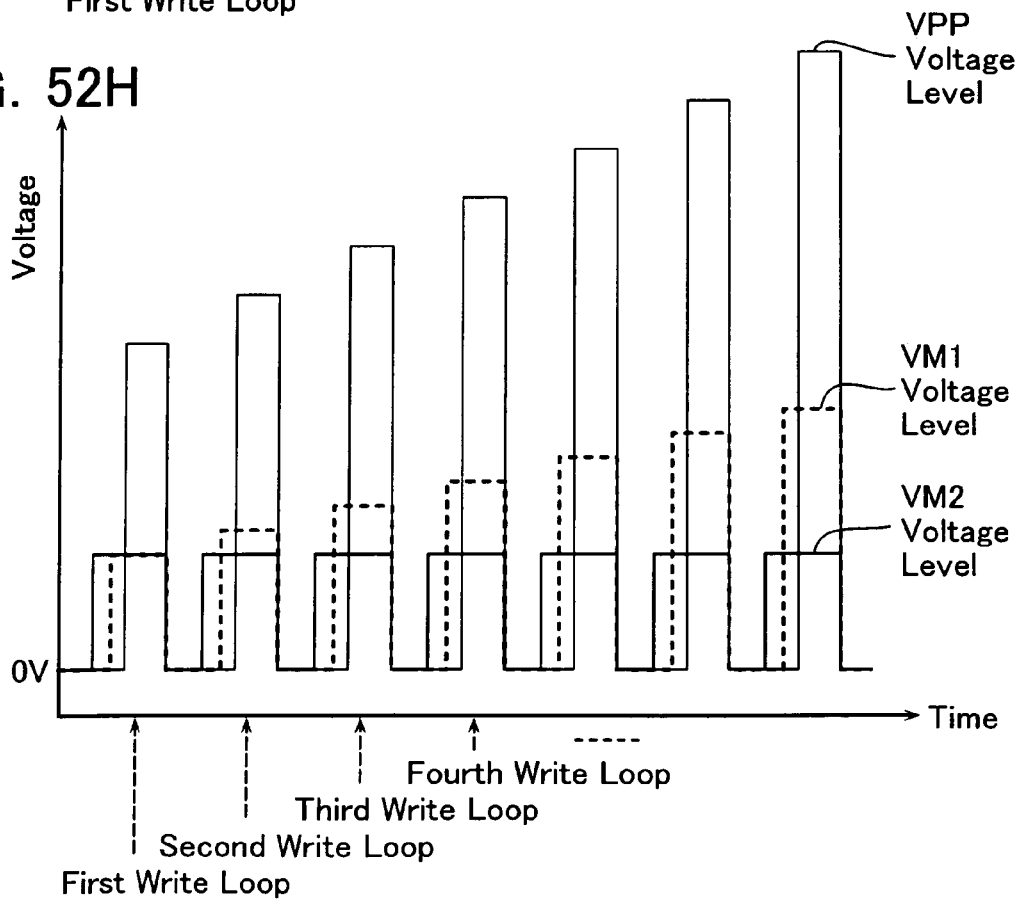
Figure 52I:
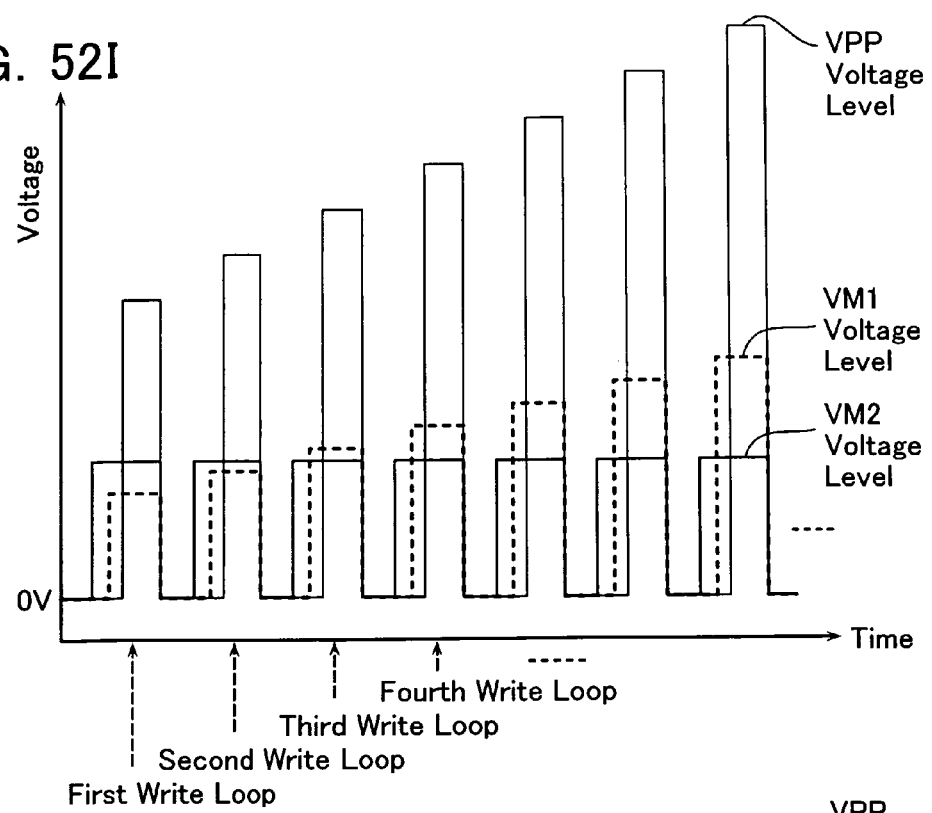
Figure 52J:
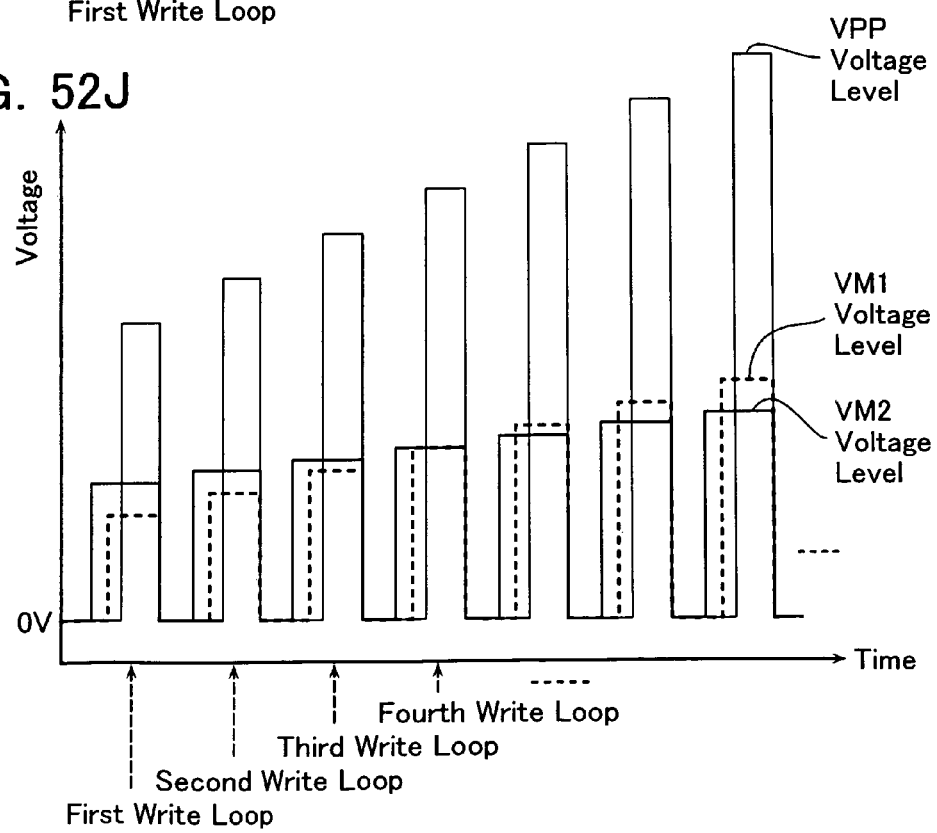
Figure 52M:
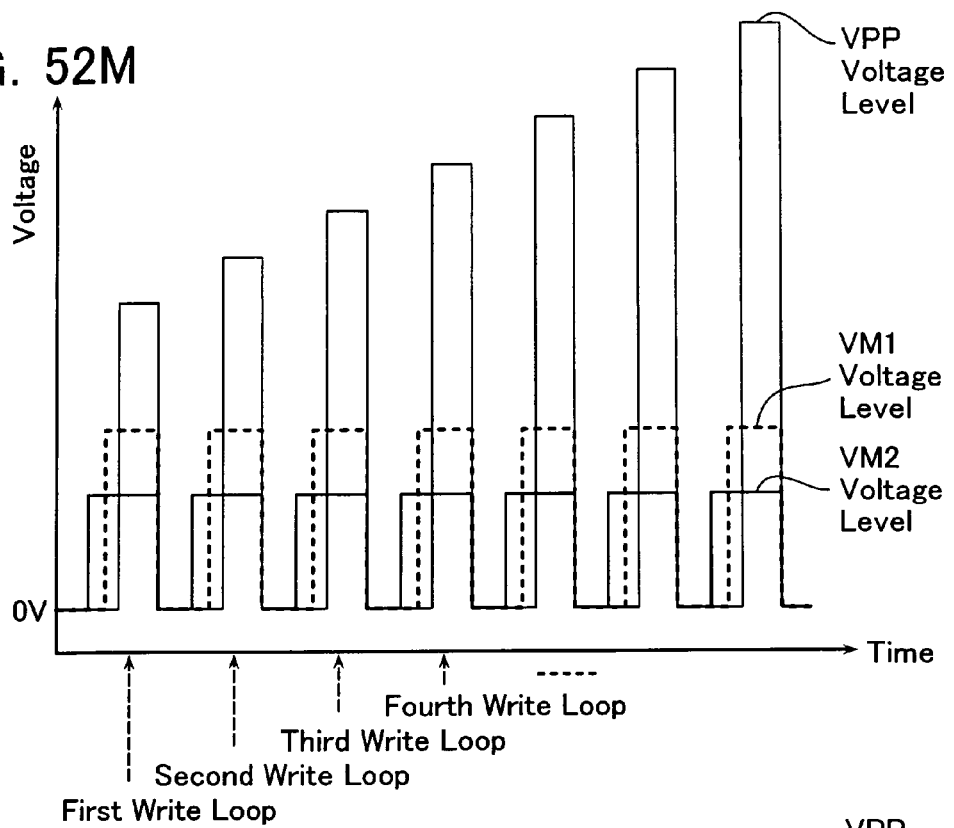
Figure 52N:
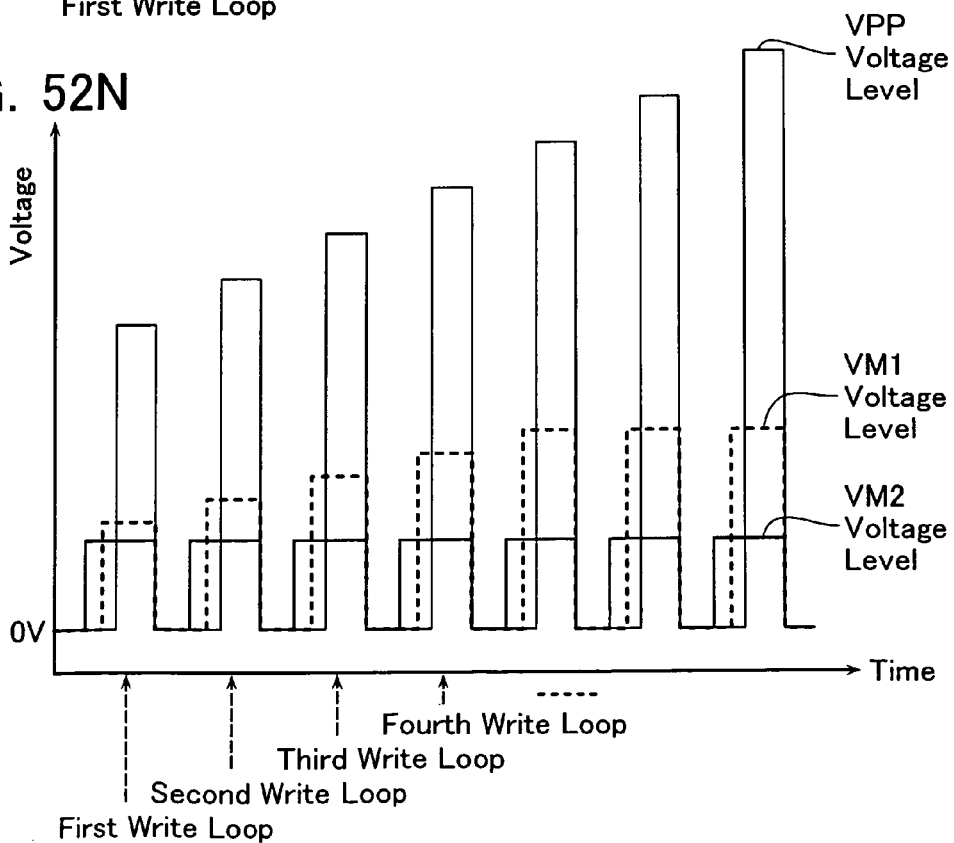
Figure 52O:
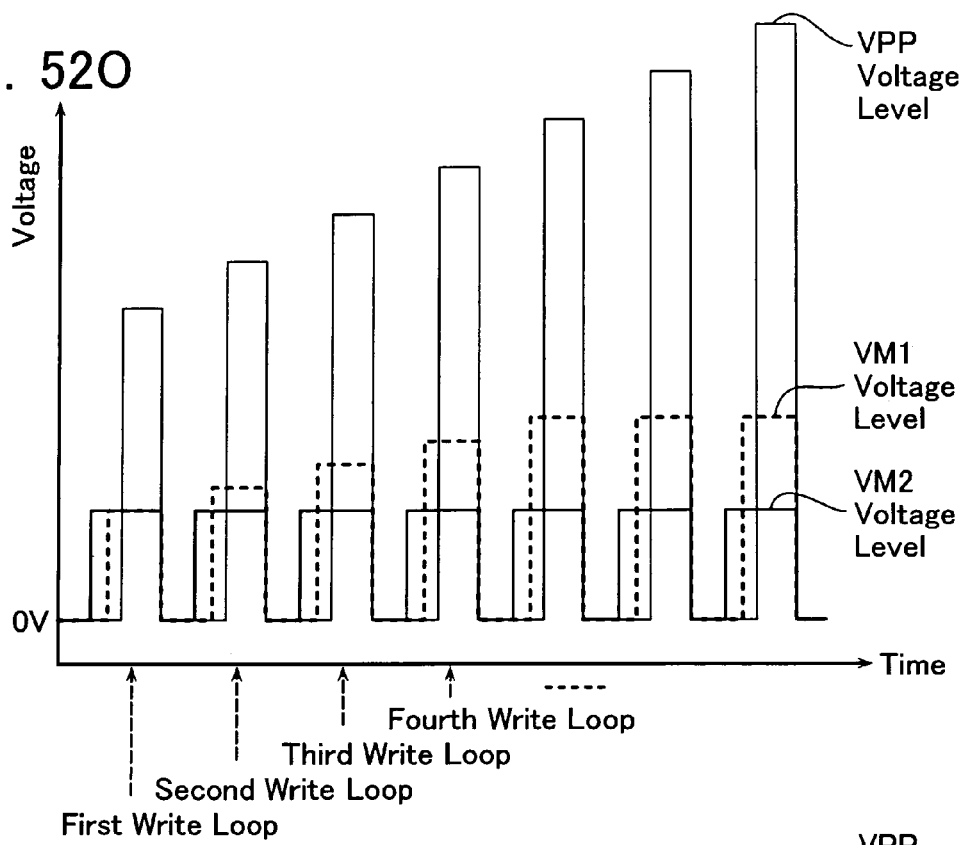
Figure 52P:
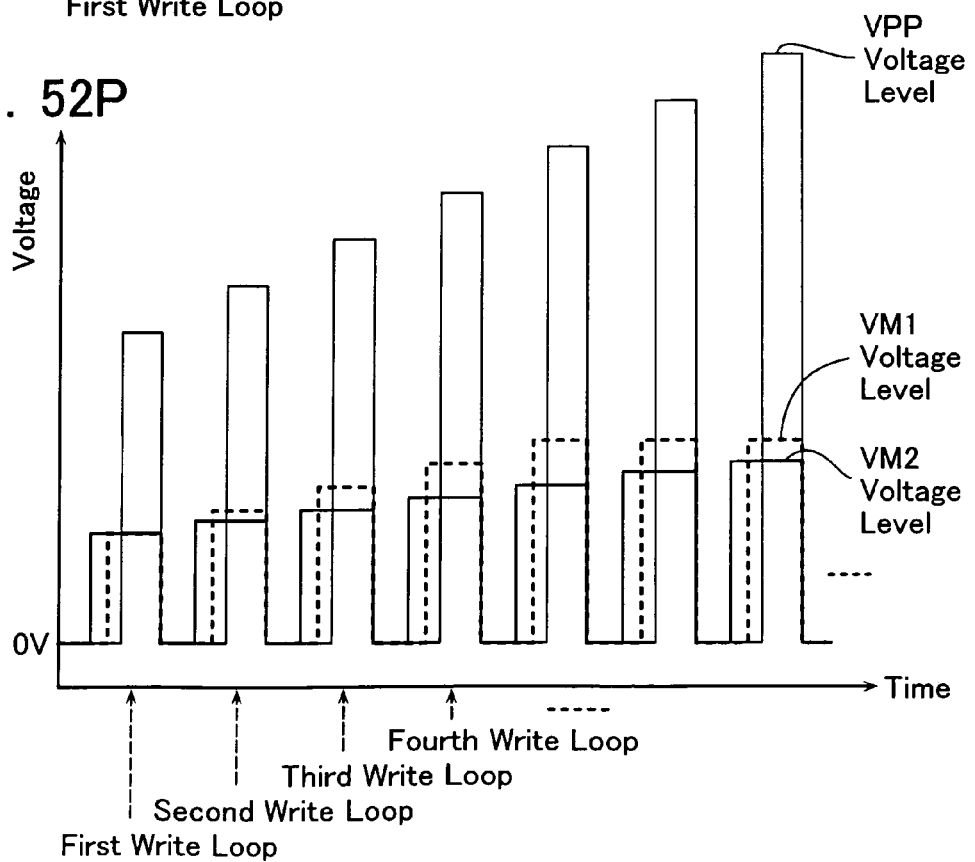
Figure 52S:
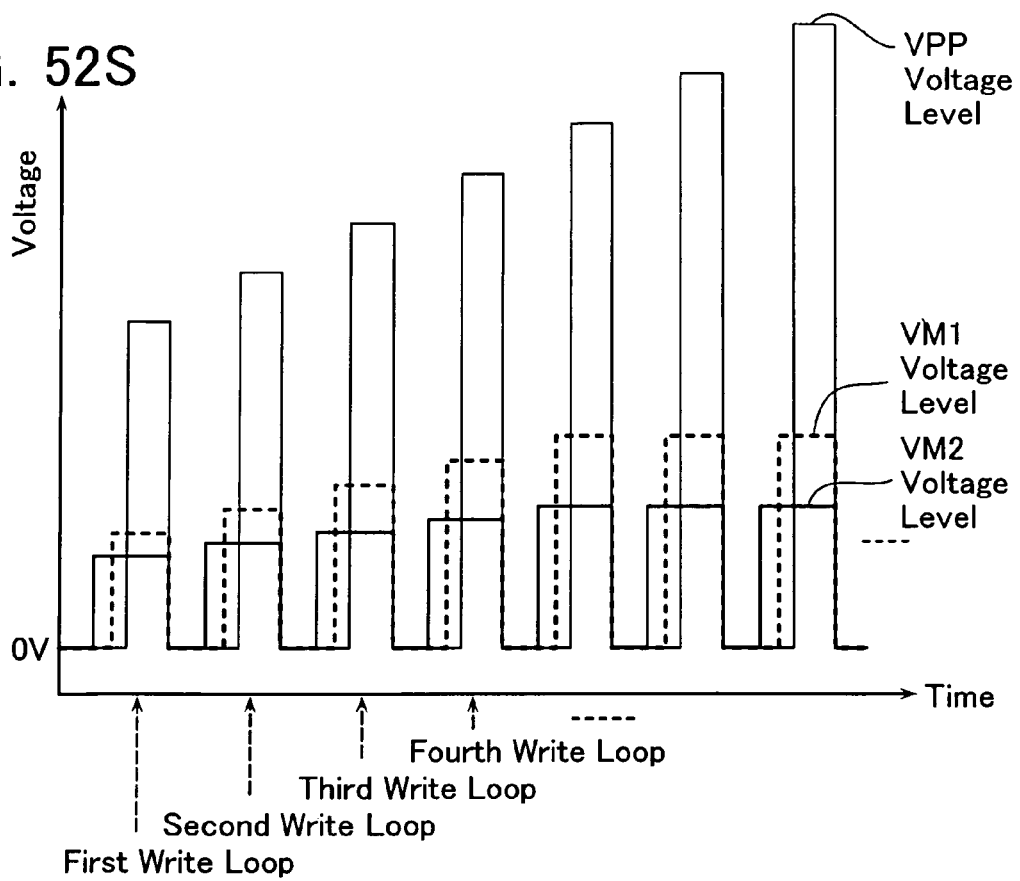
Figure 52T:
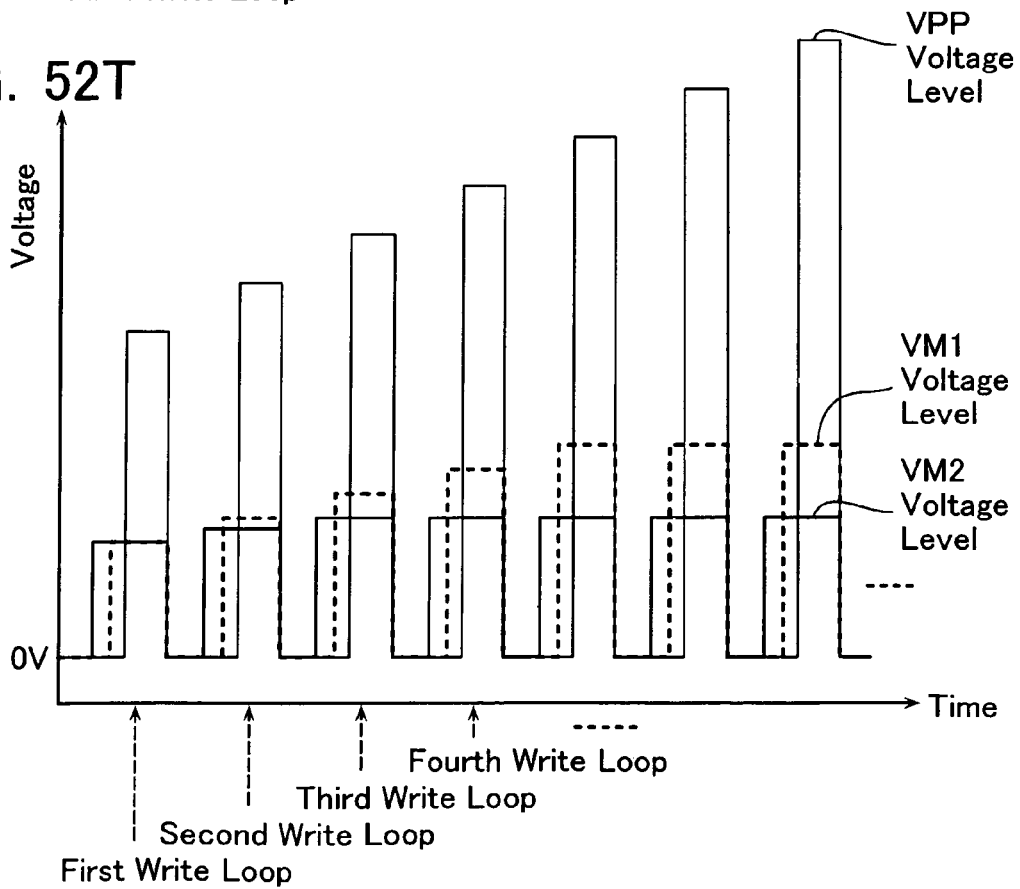
Figure 52U:
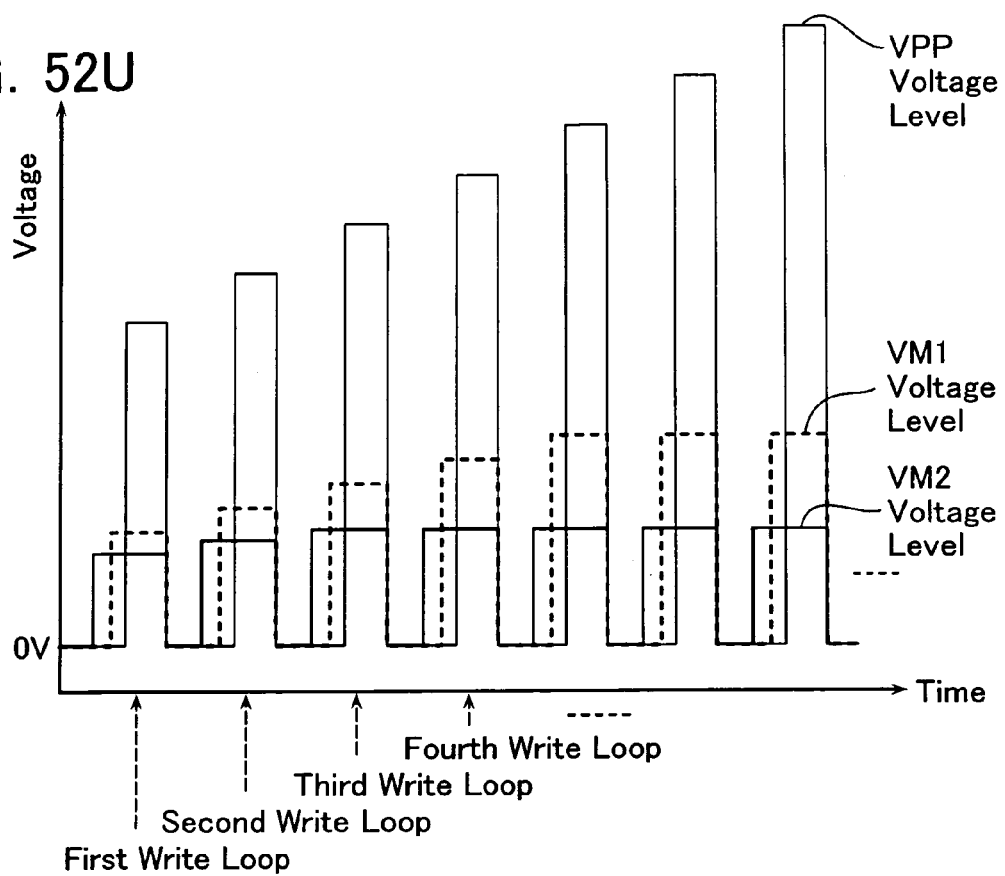
Figure 52V:
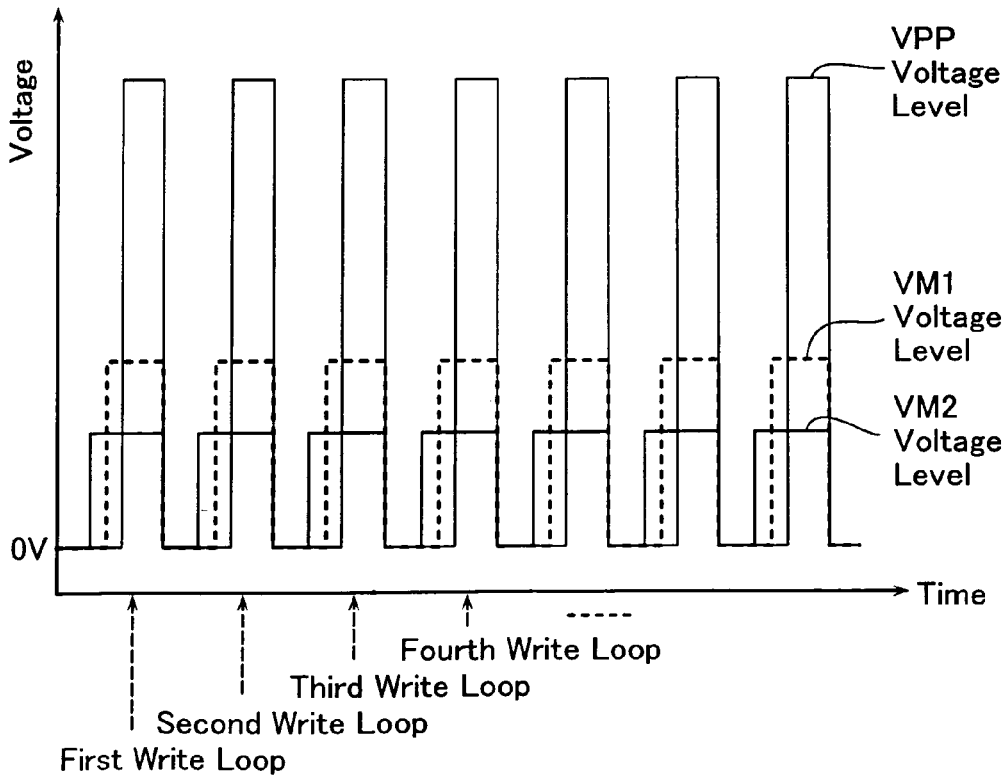
Figure 53C:
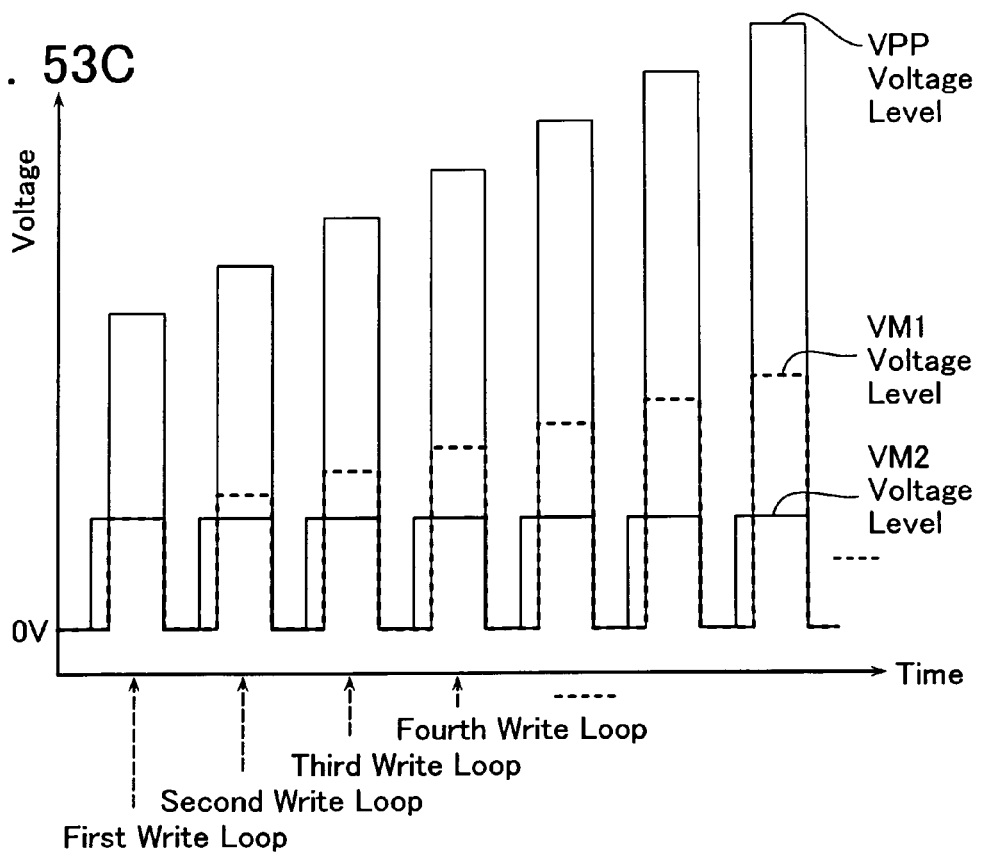
Figure 53D:
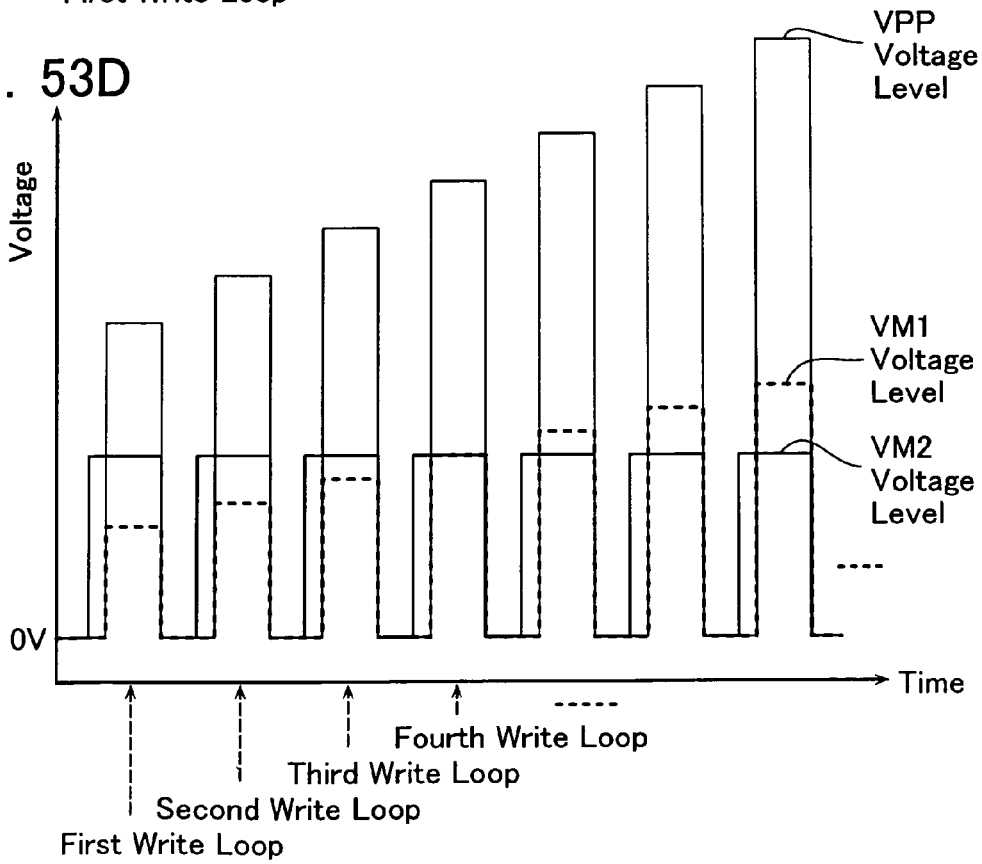
Figure 53E:
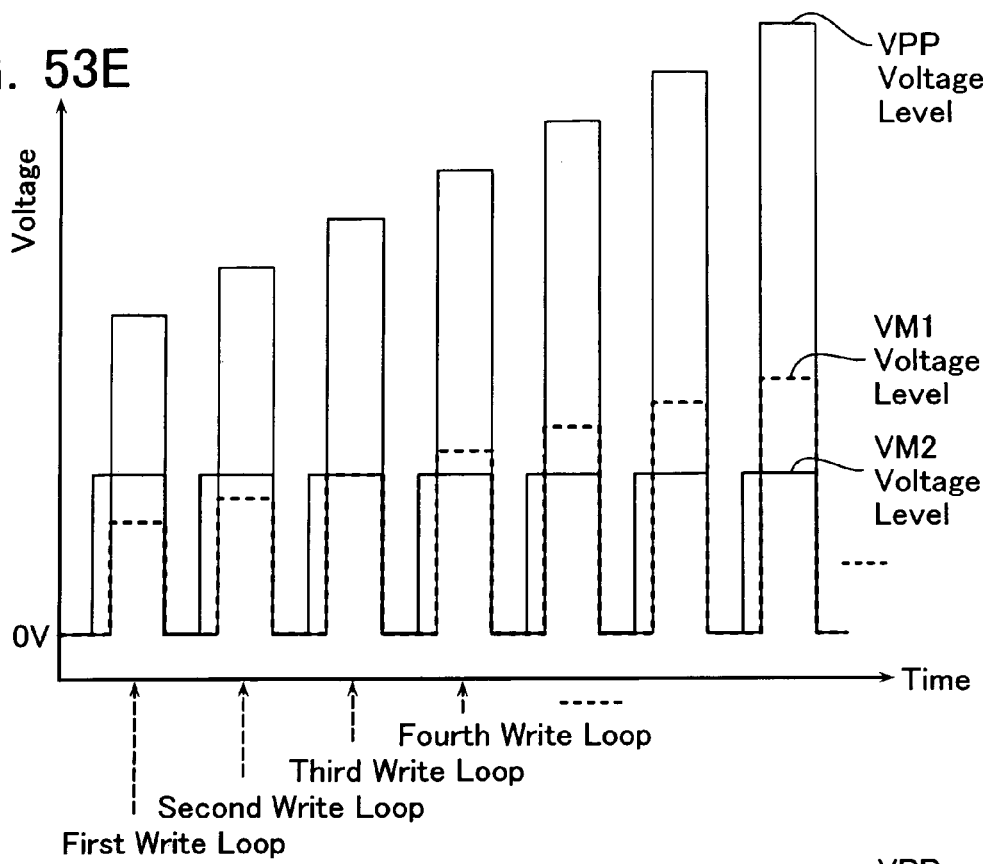
Figure 53F:
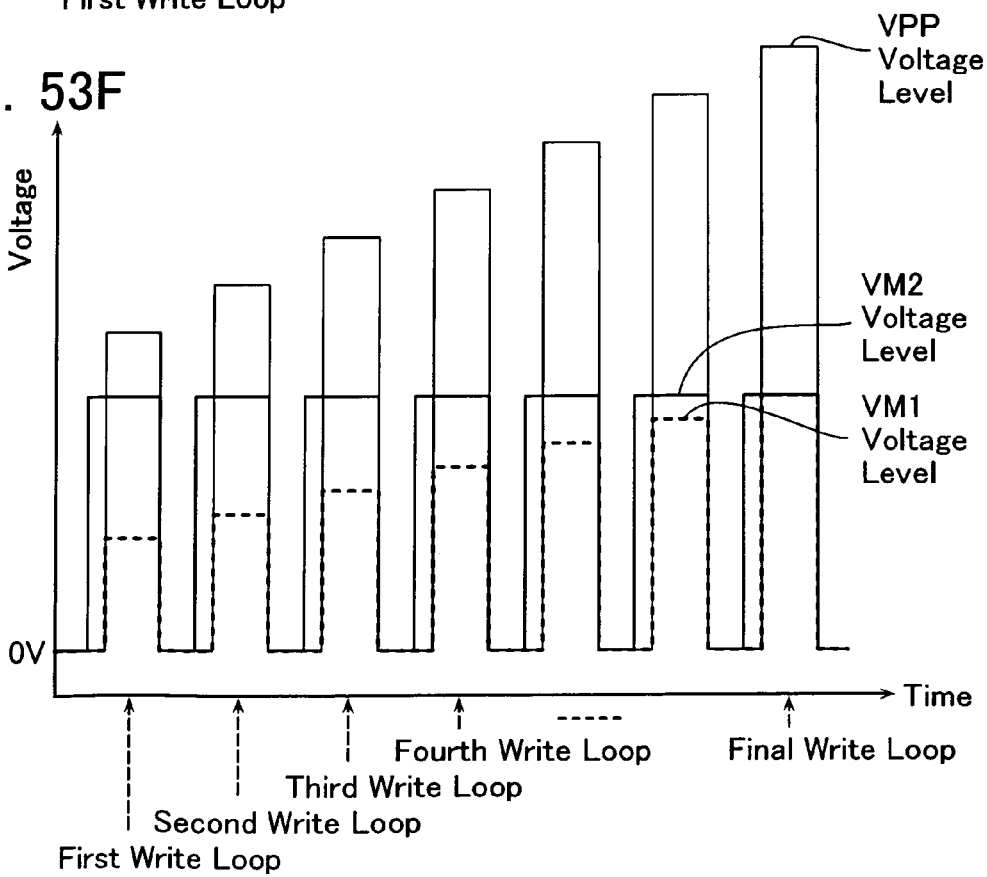
Figure 53G:
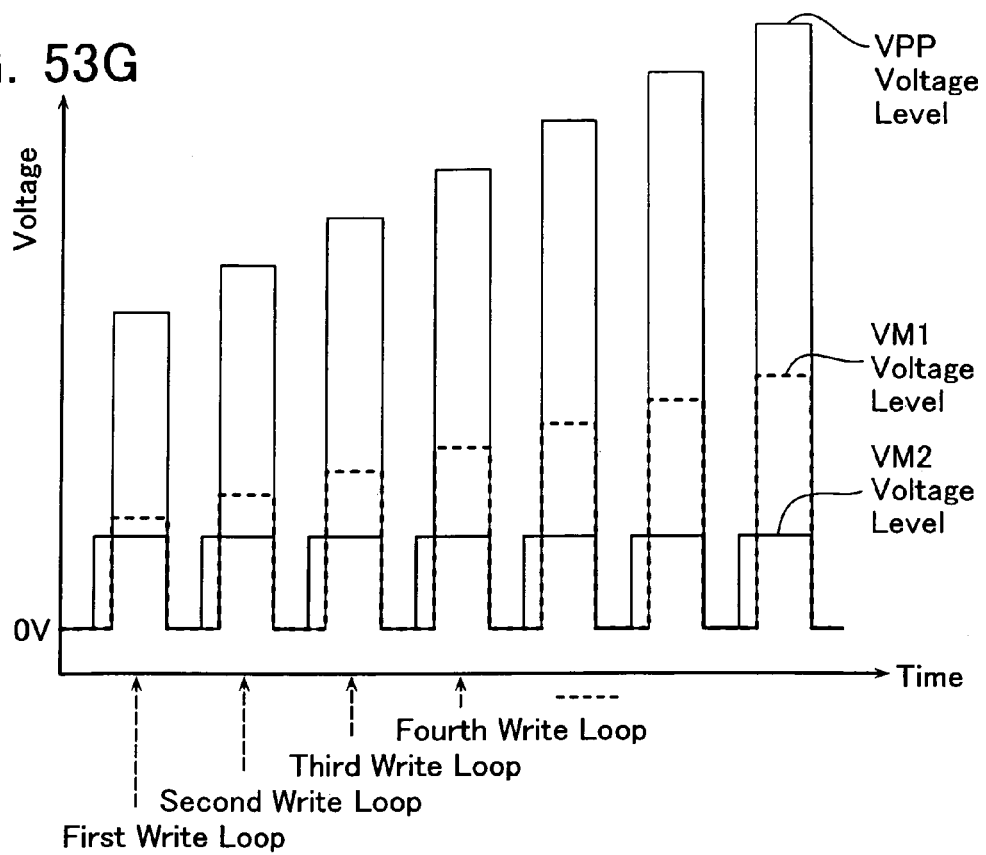
Figure 53H:
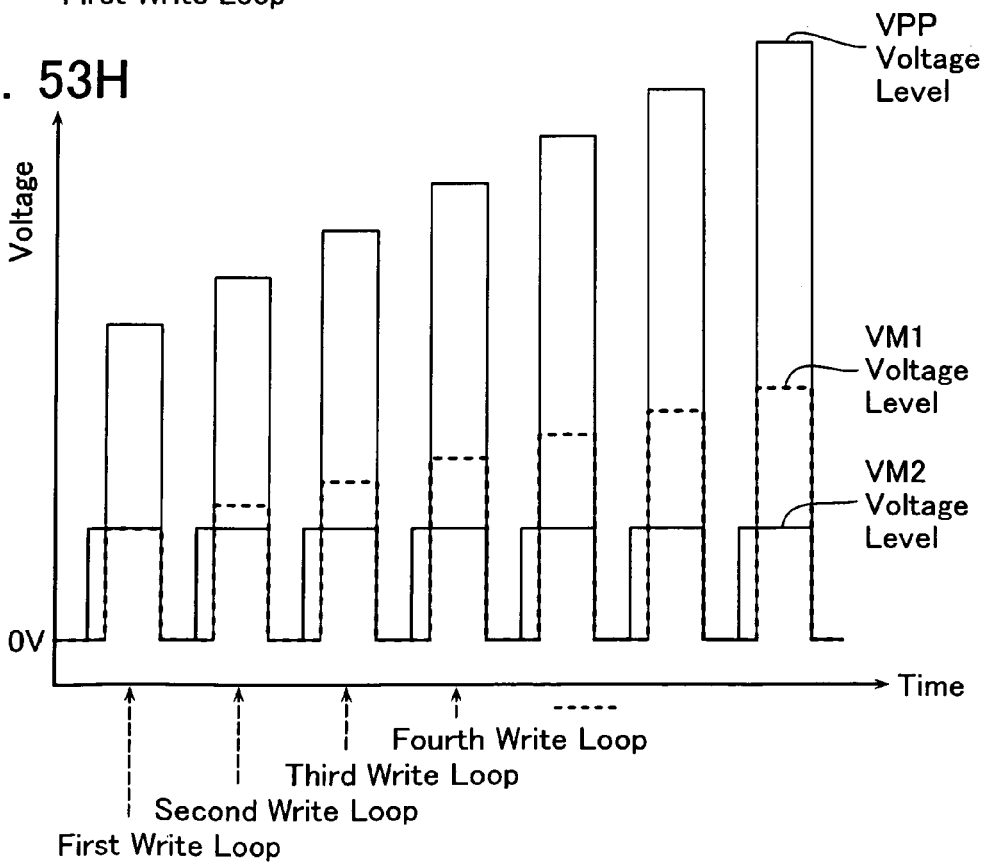
Figure 53K:
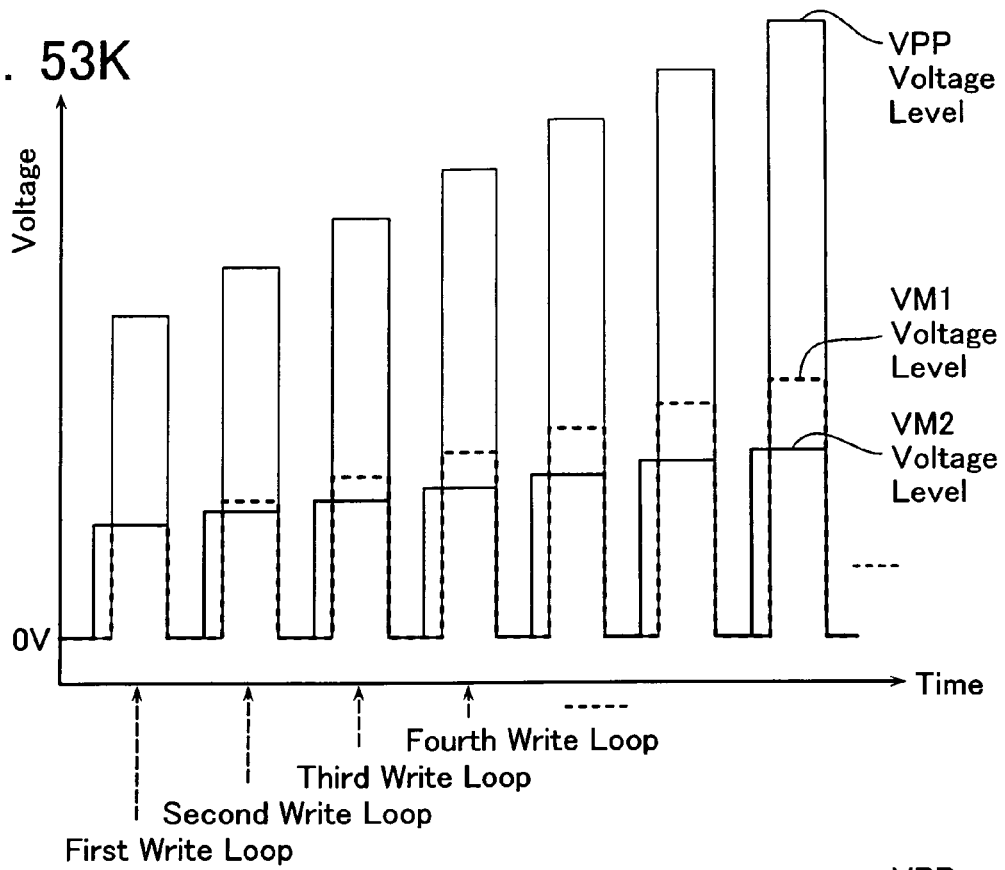
Figure 53L:
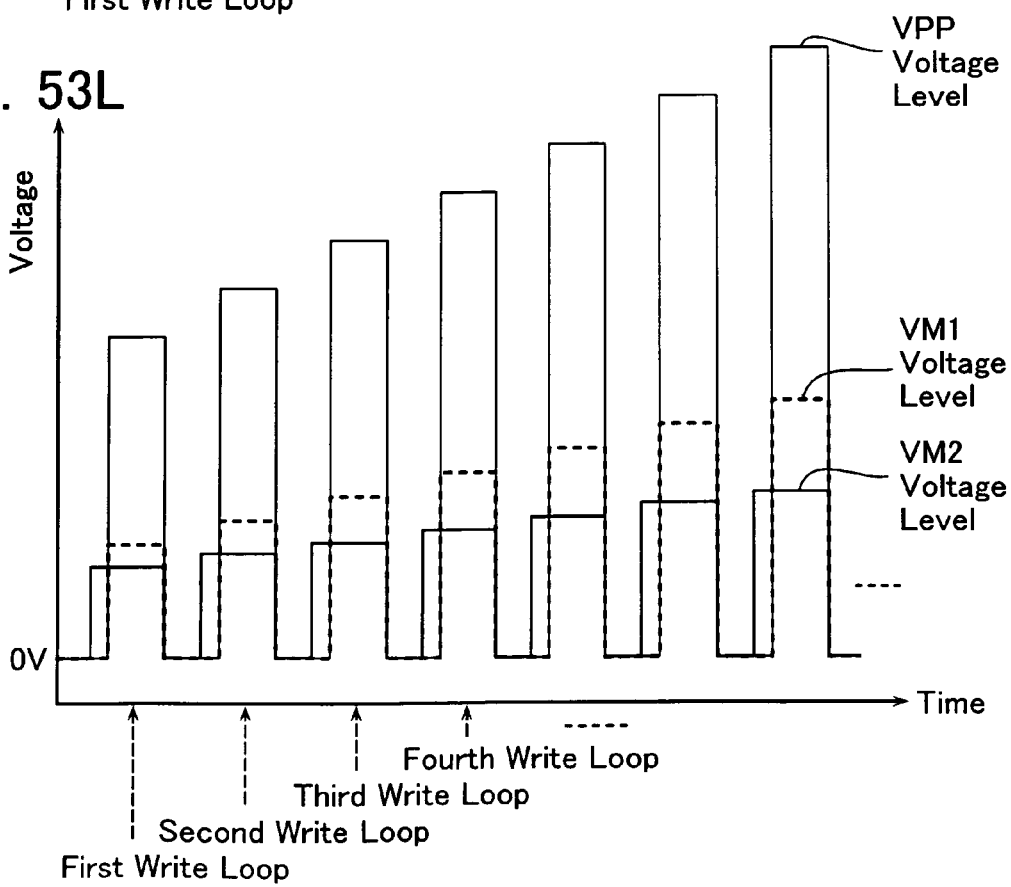
Figure 53M:
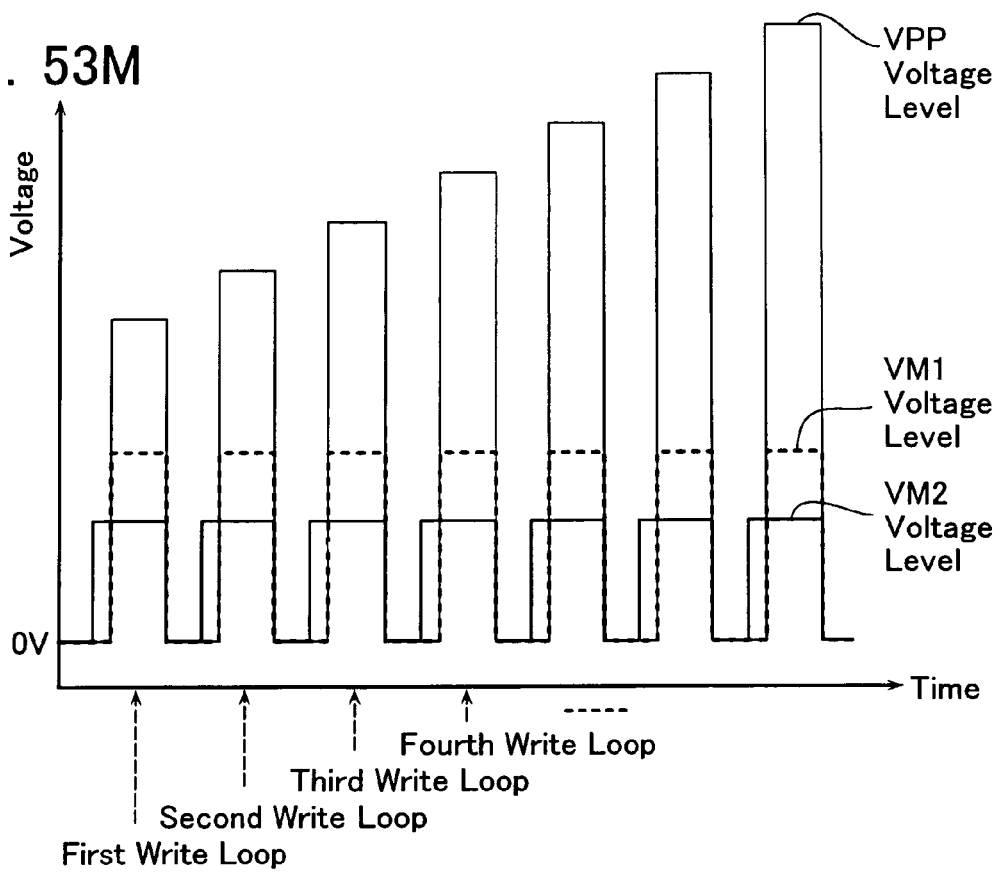
Figure 53N:
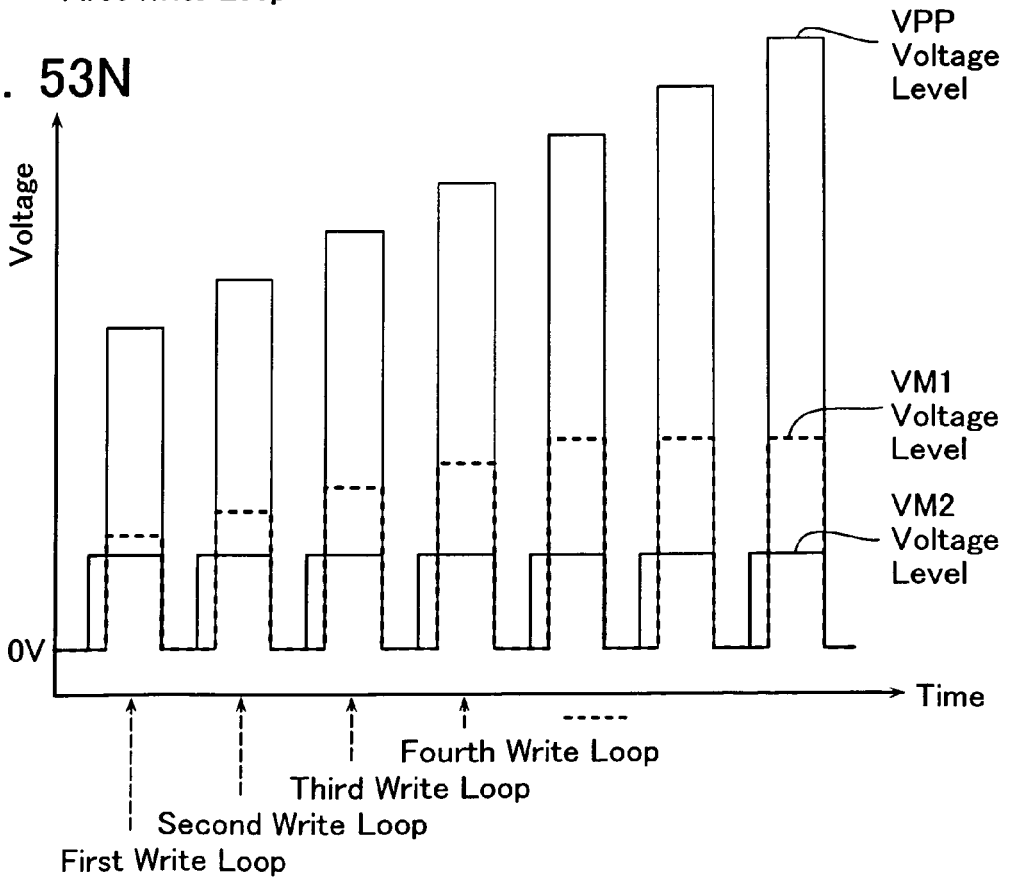
Figure 53O:
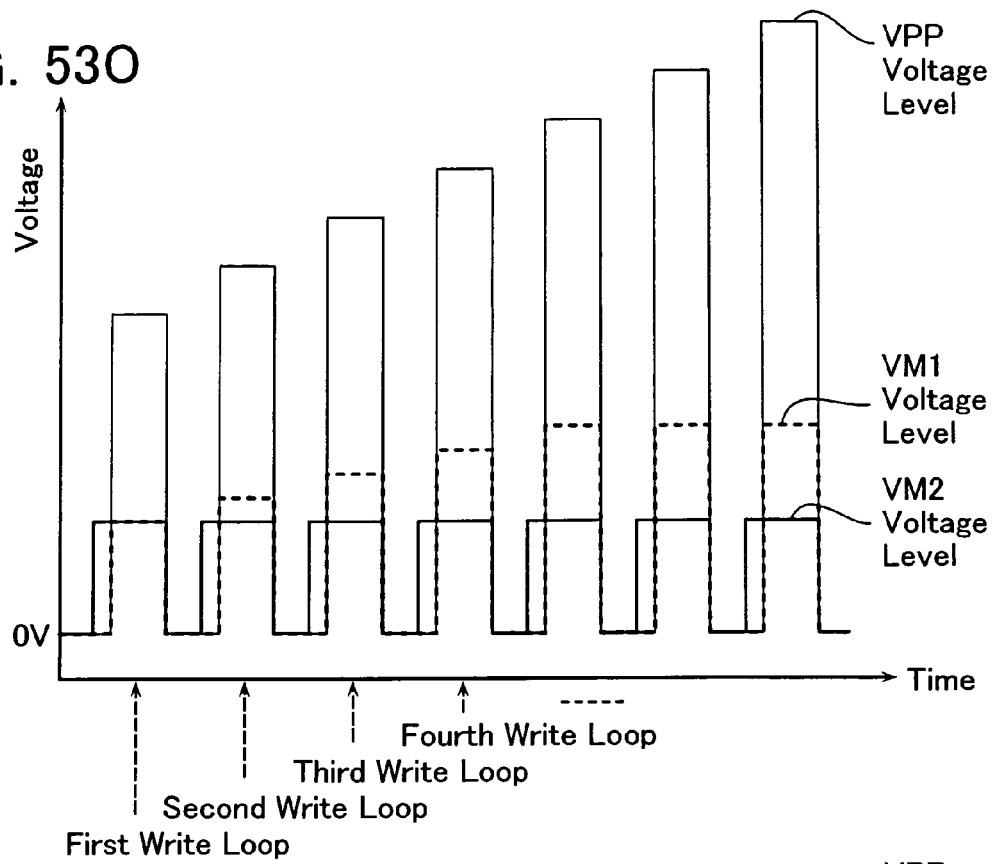
Figure 53P:
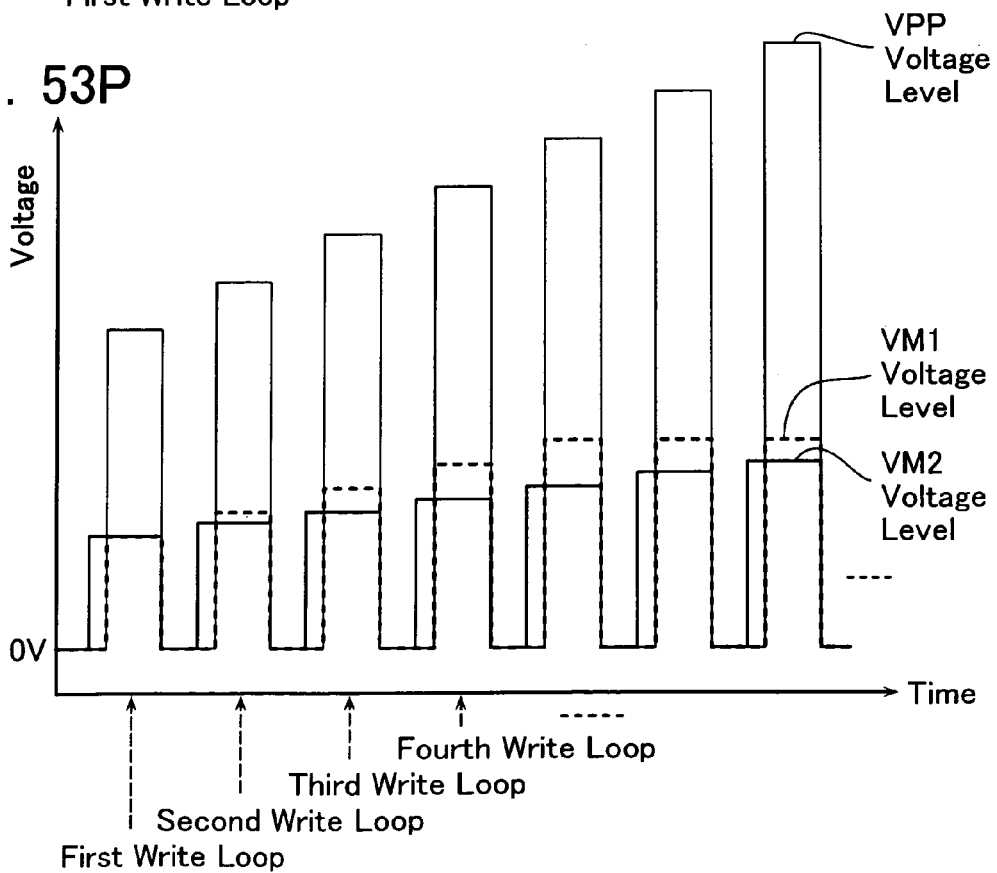
Figure 53Q:
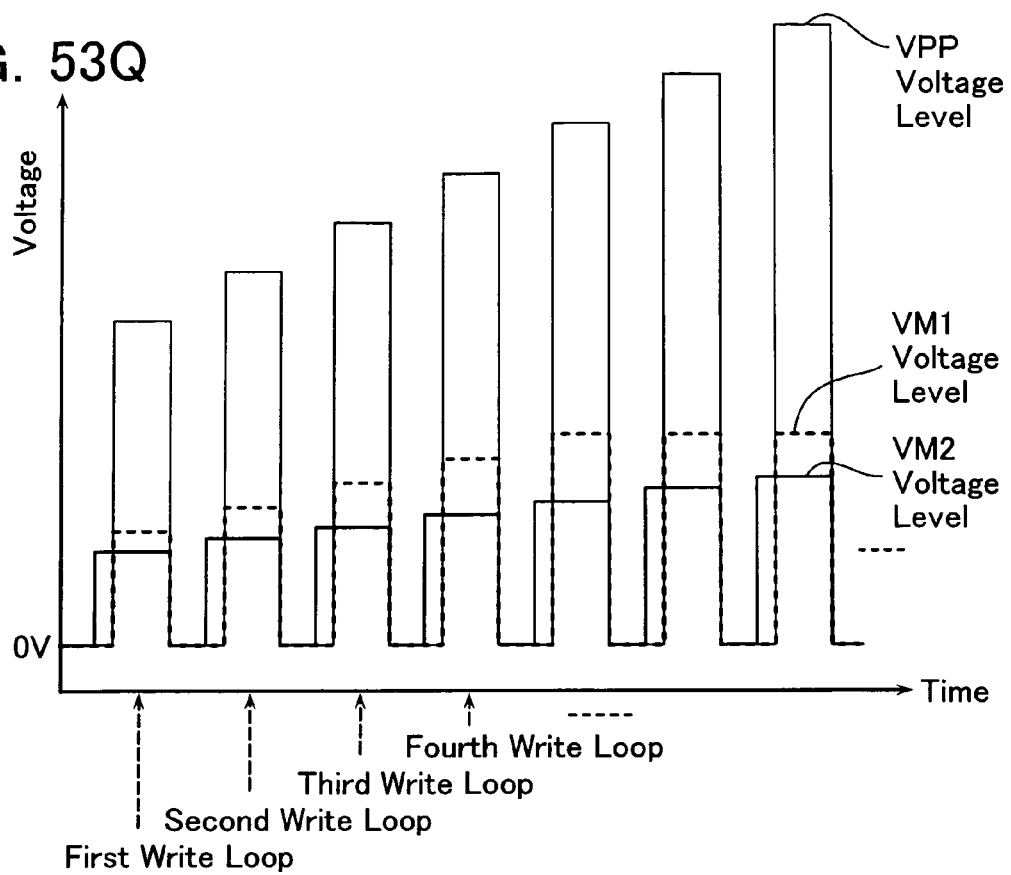
Figure 53R:
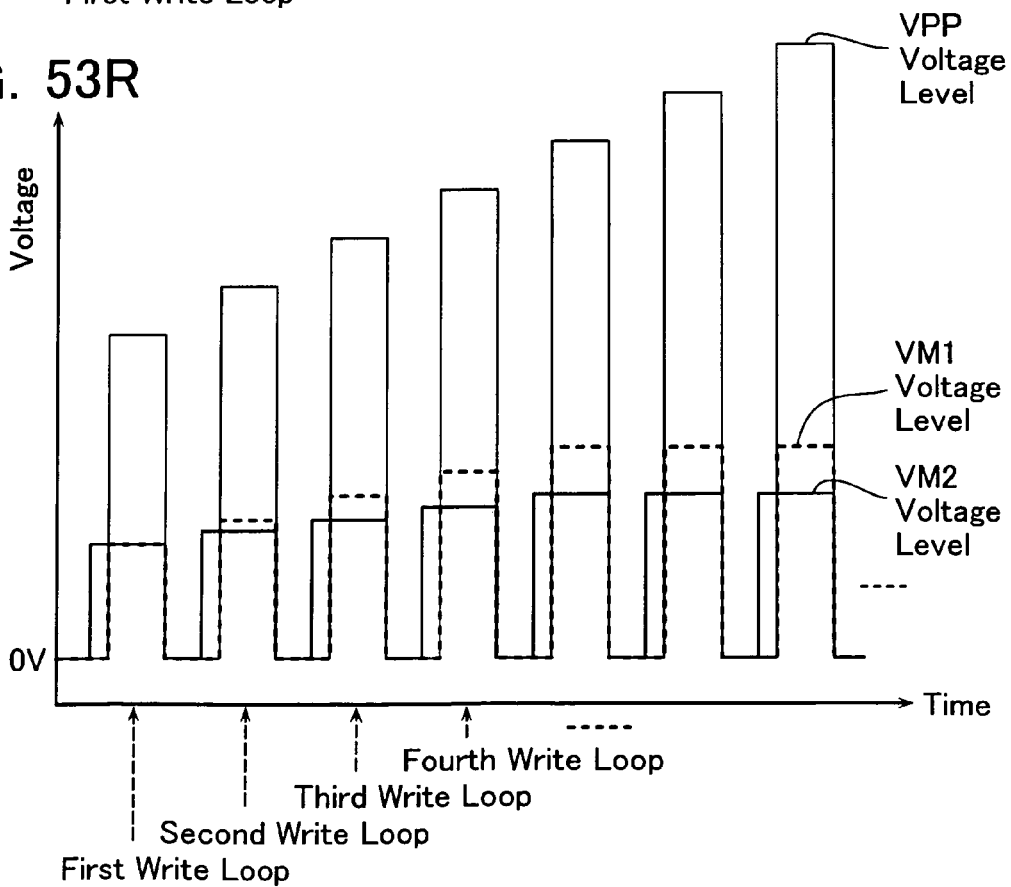
Figure 53S:
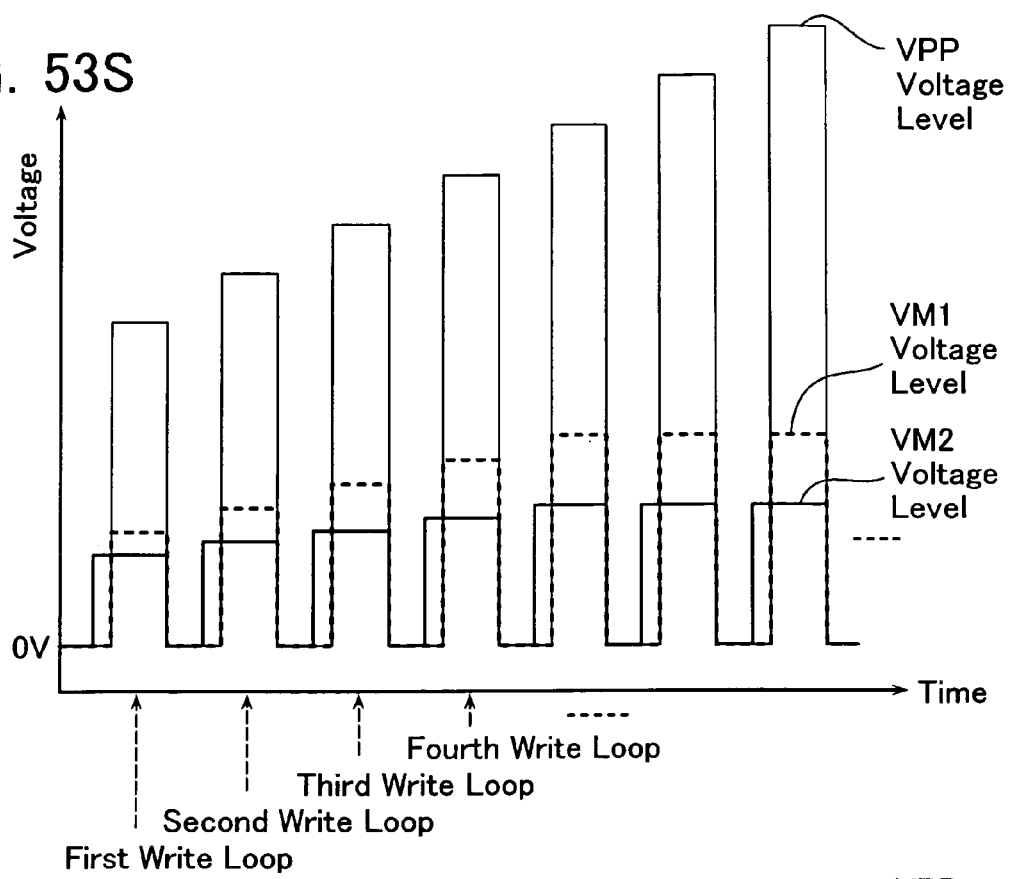
Figure 53T:
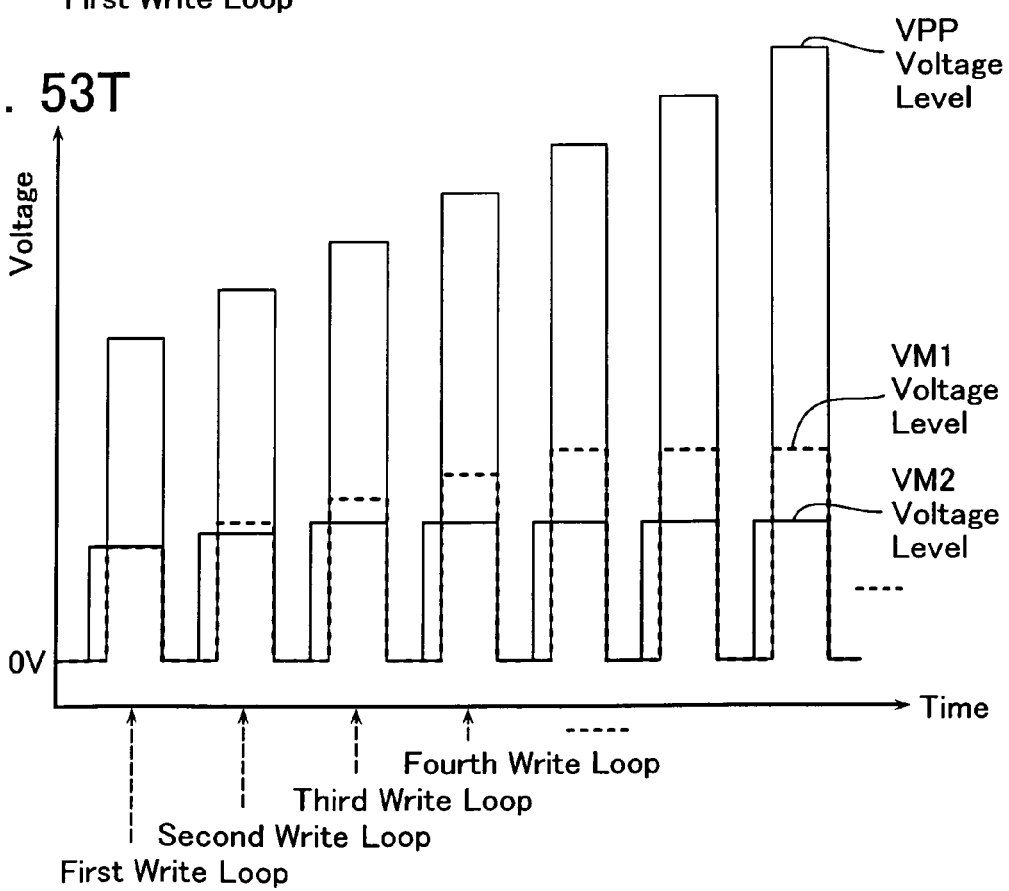
Figure 53U:
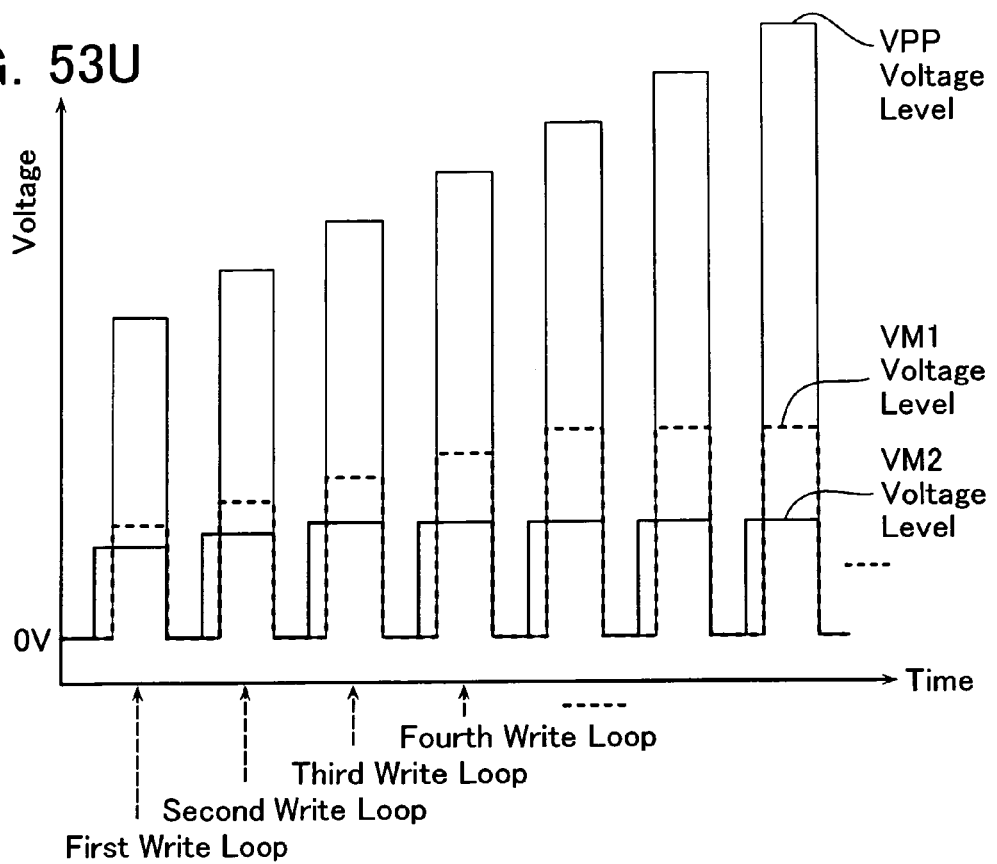
Figure 53V:
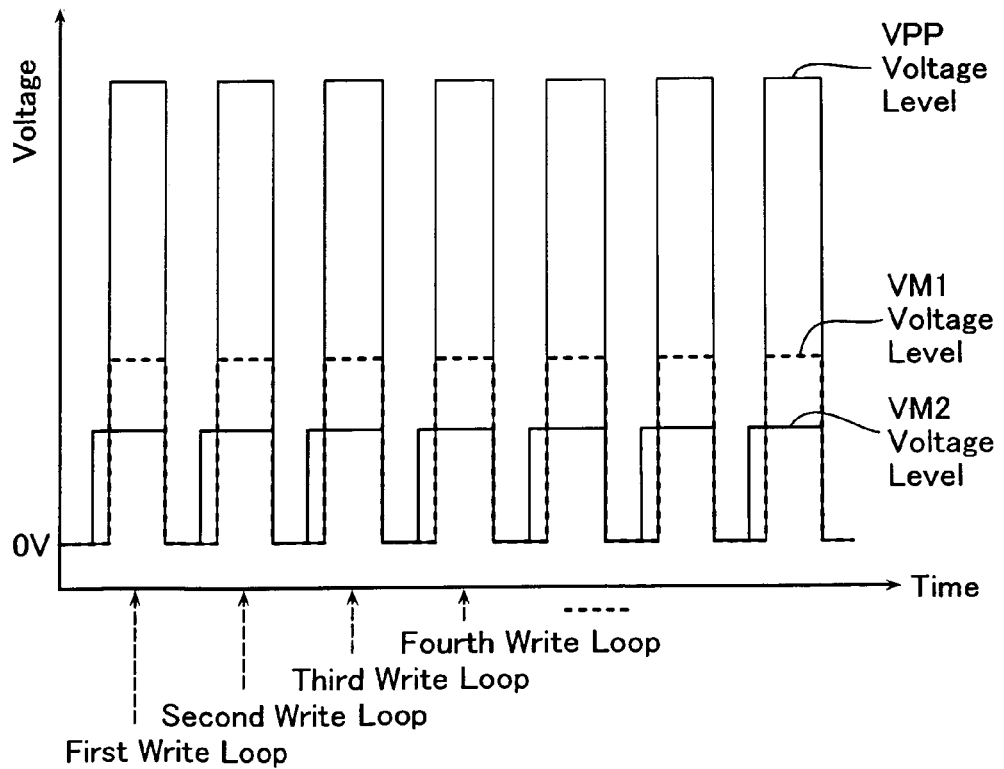
Figure 53W:
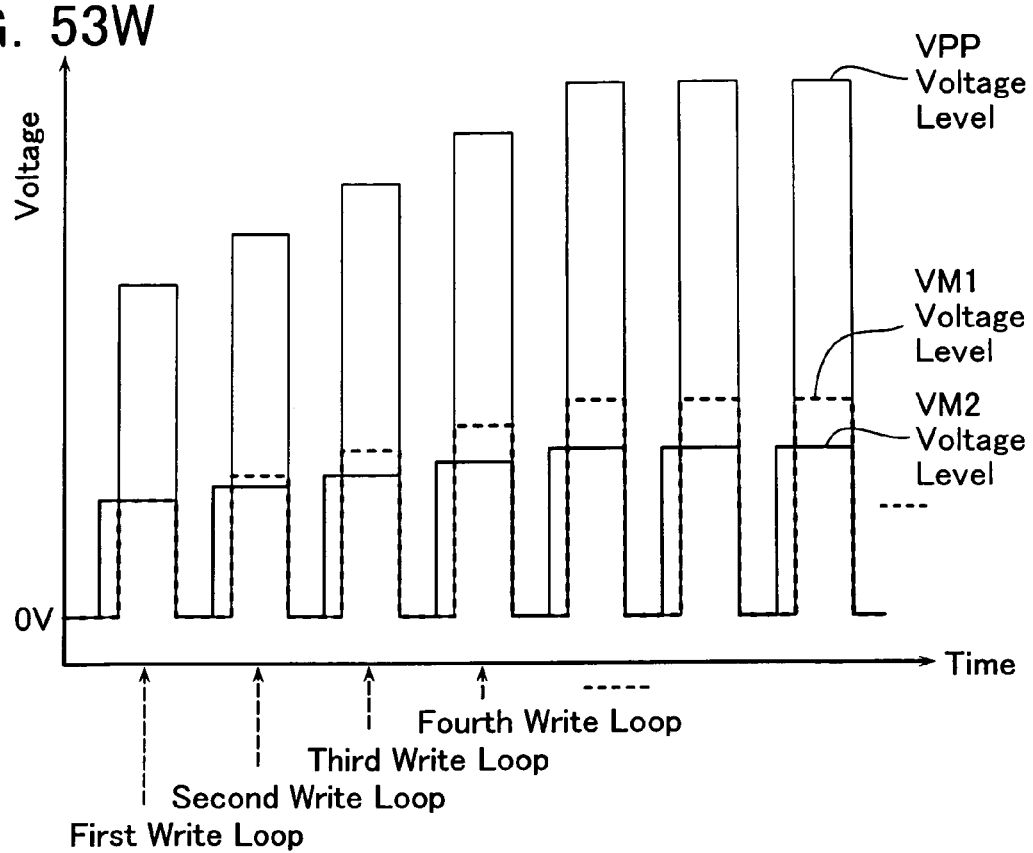
Figure 53X:
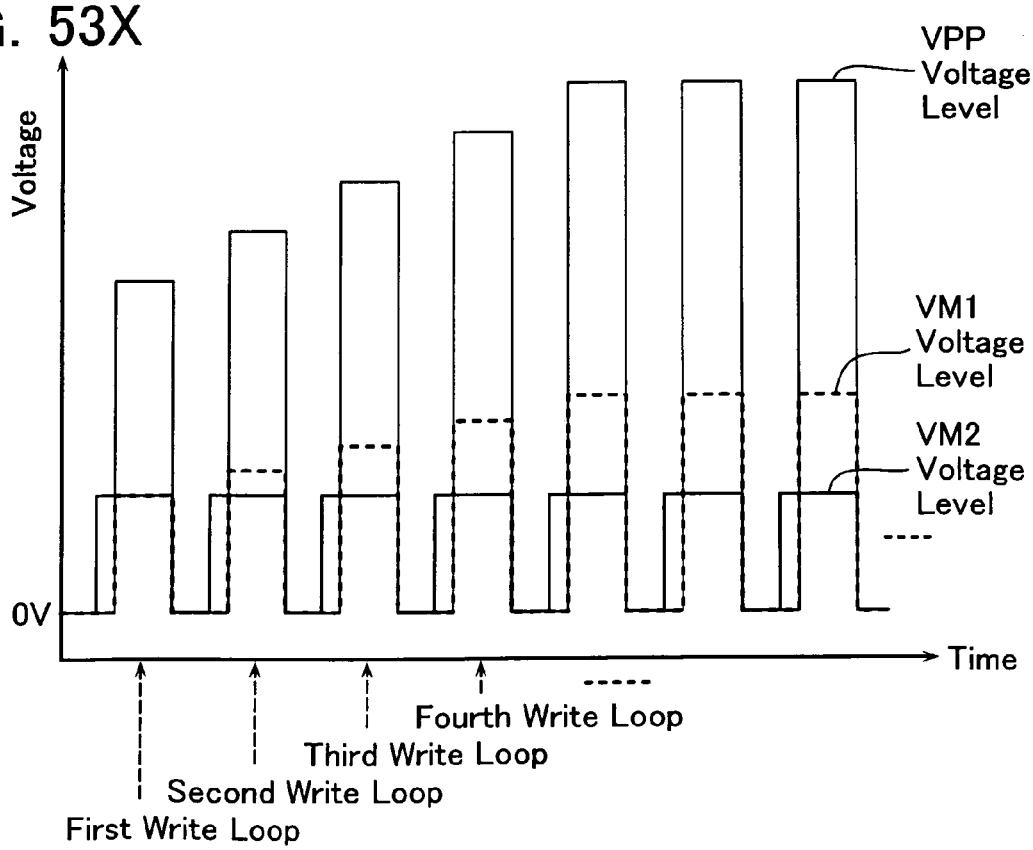
Figure 54A:
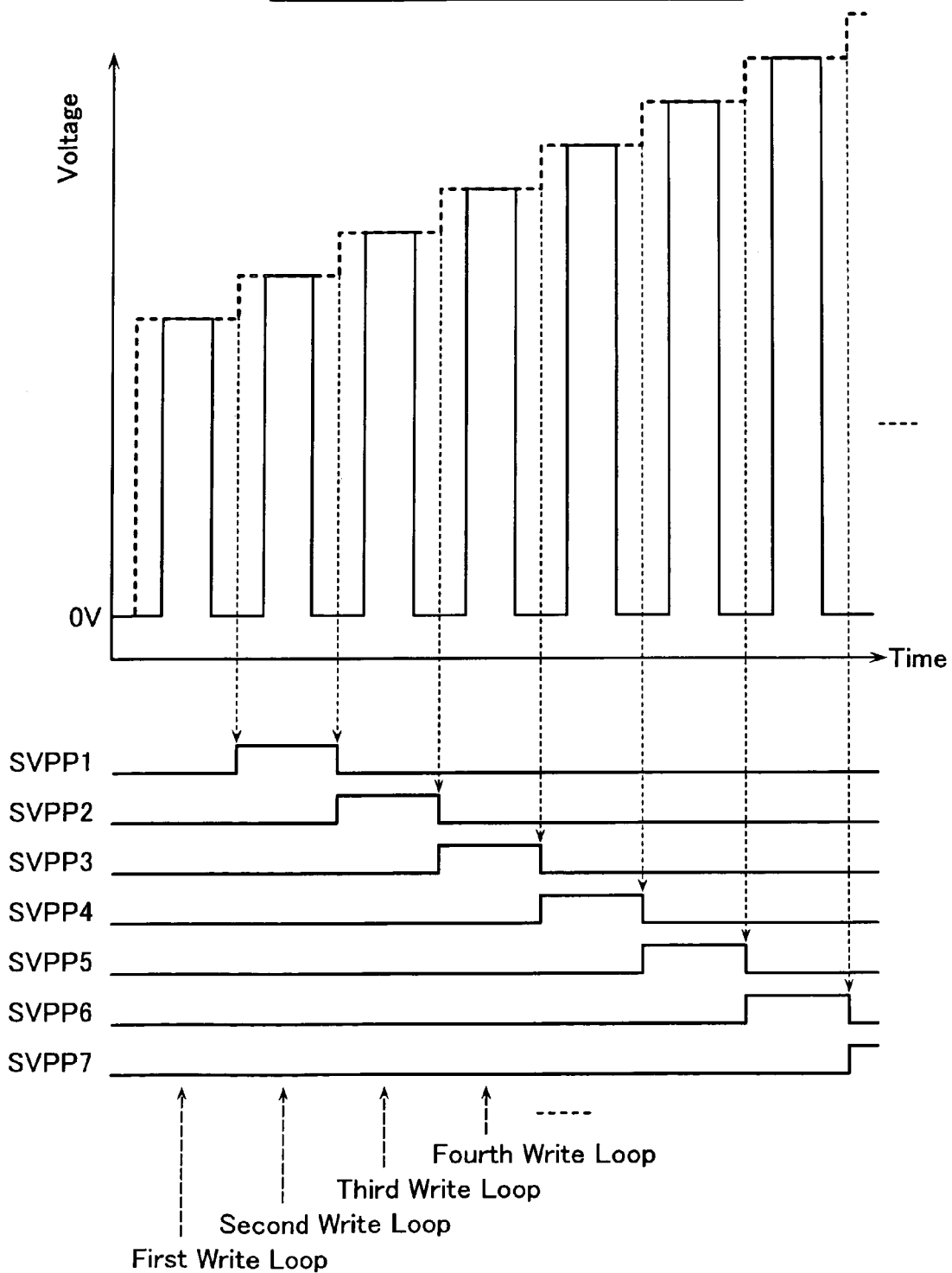
Figure 54D:
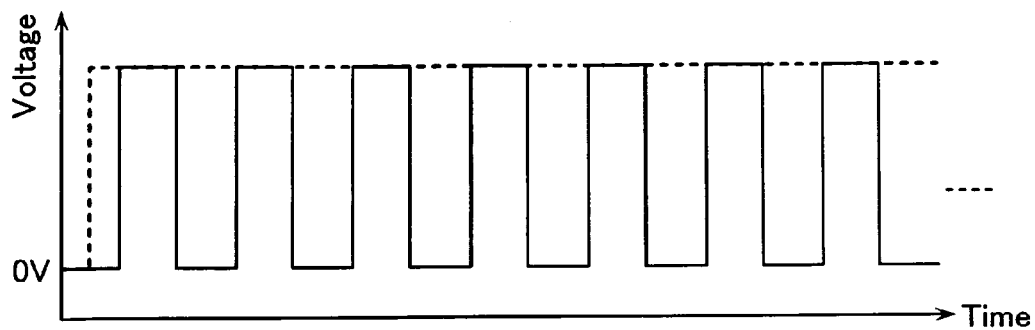
Figure 54E:
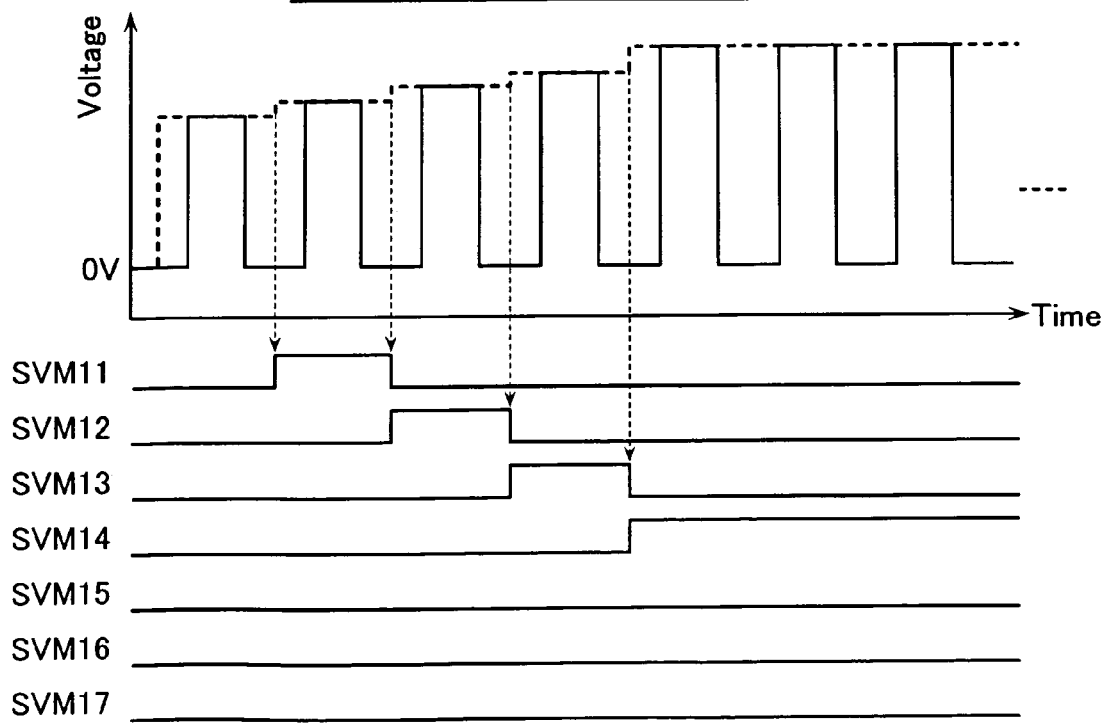
Figure 54J:
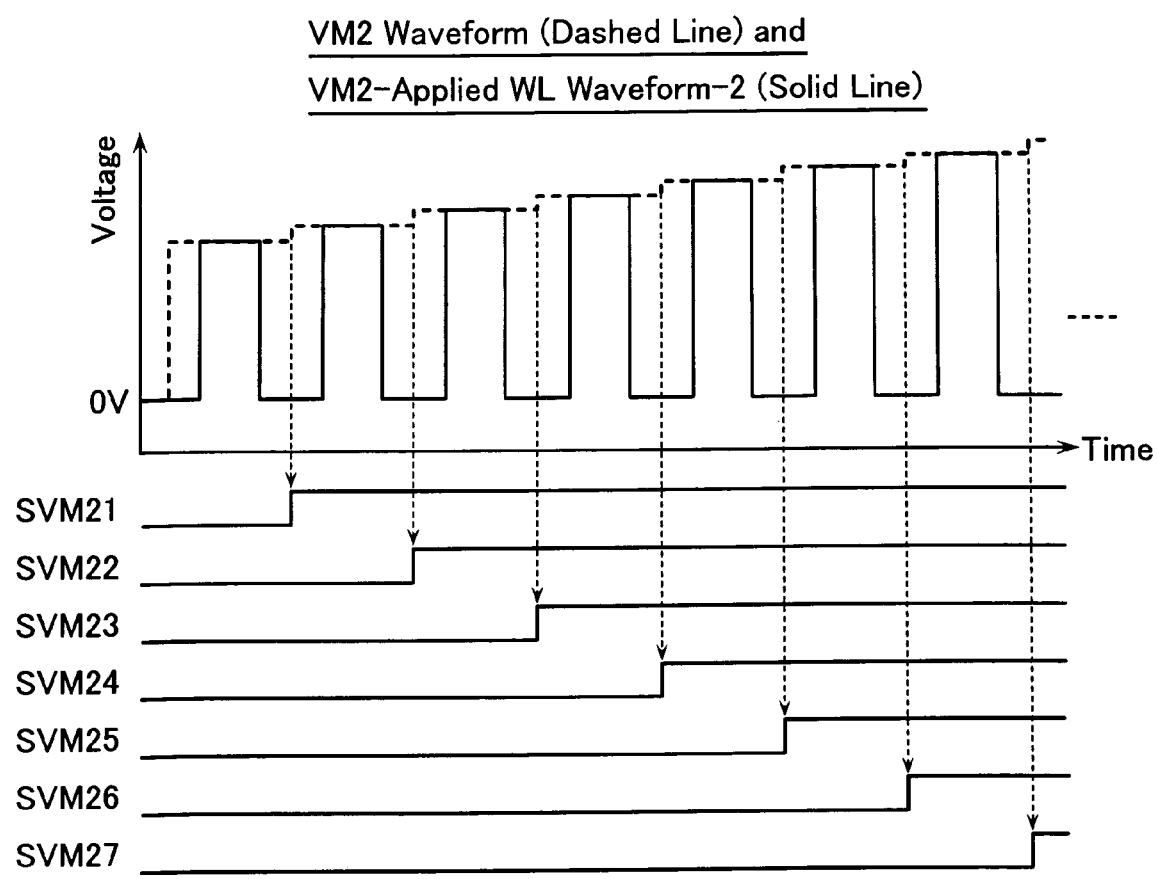
Figure 55A:
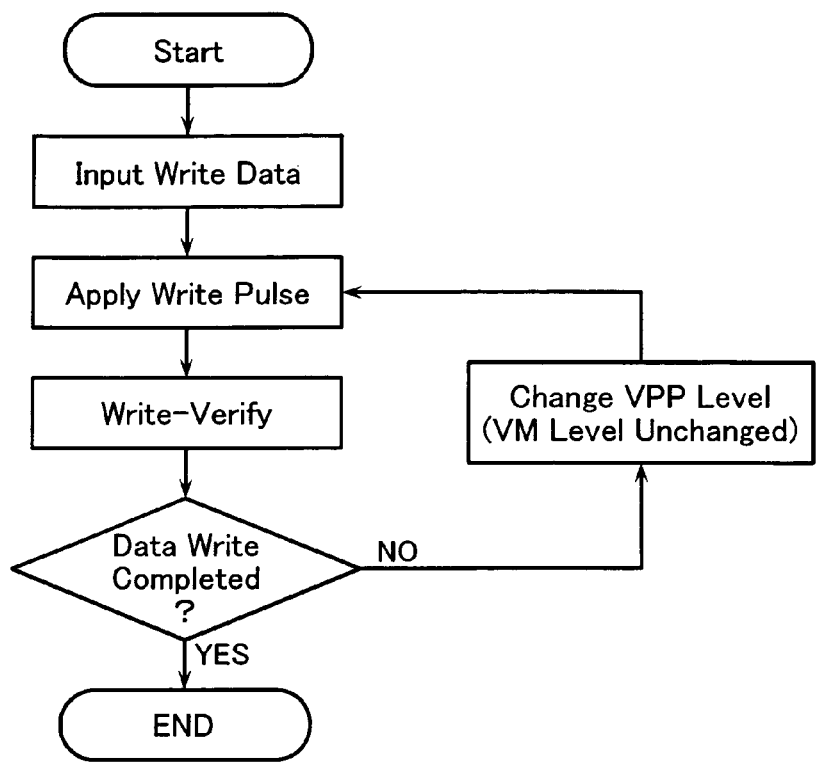
Figure 55B:
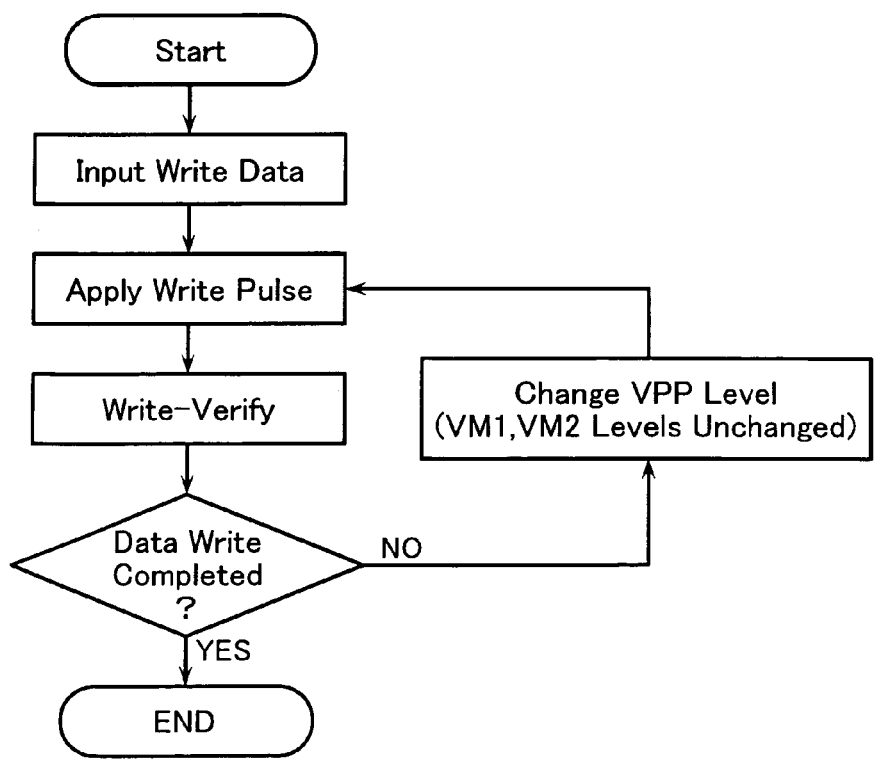
Figure 55C:
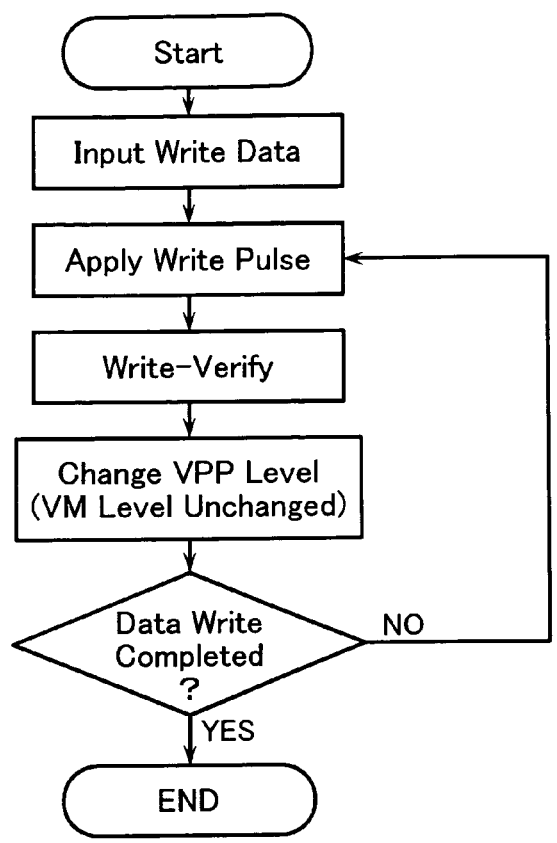
Figure 55D:
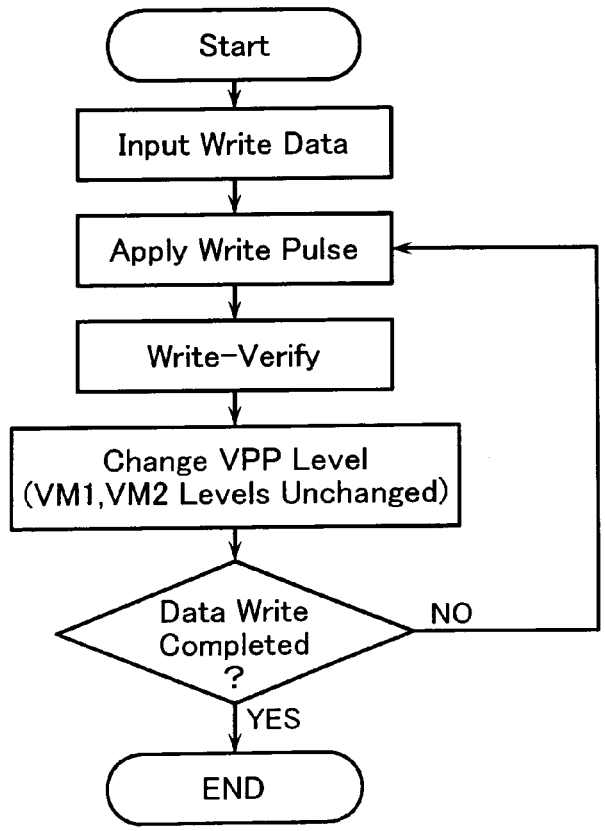
Figure 55E:
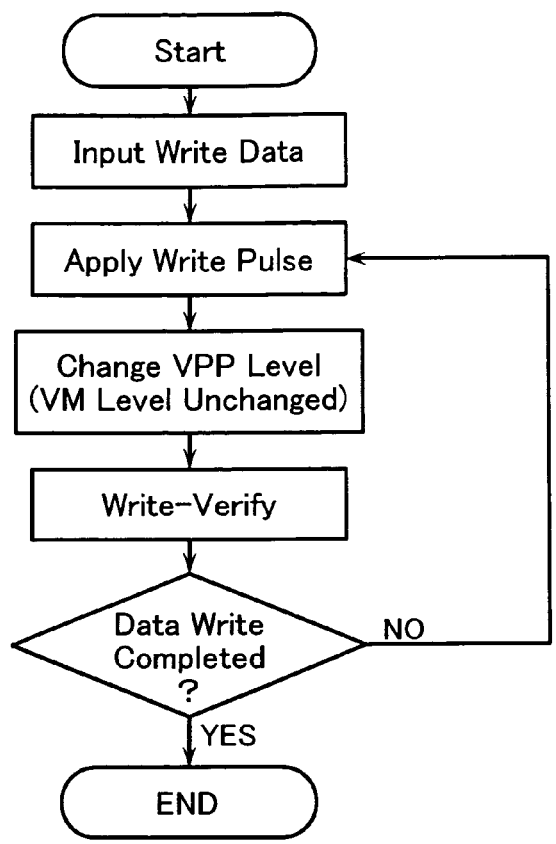
Figure 55F:
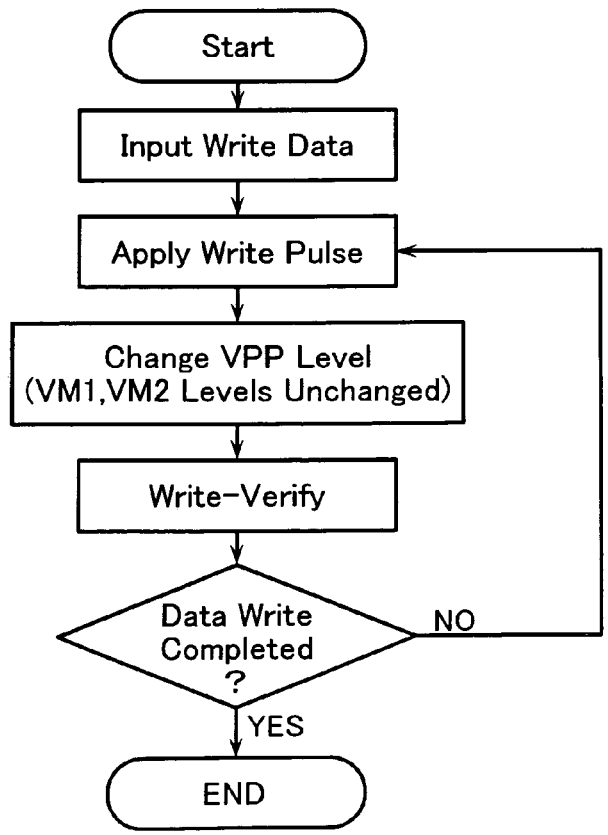
Figure 55G:
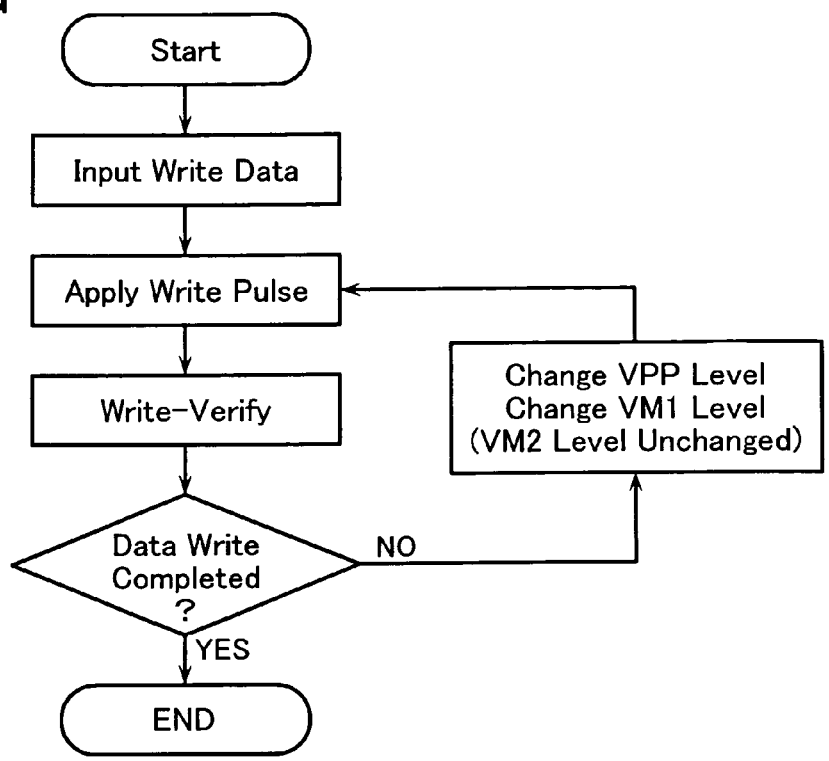
Figure 55H:
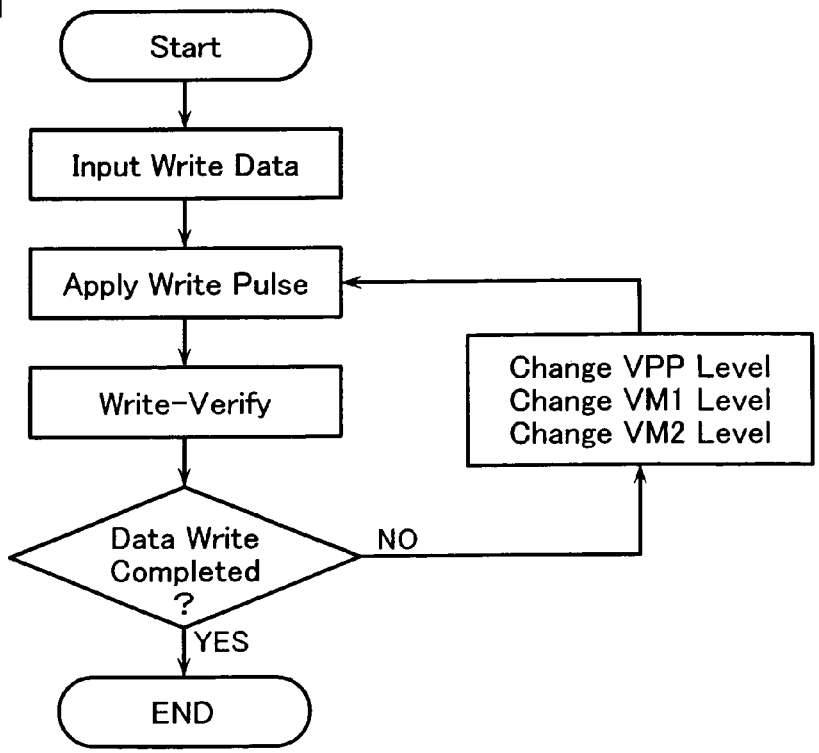
Figure 55I:
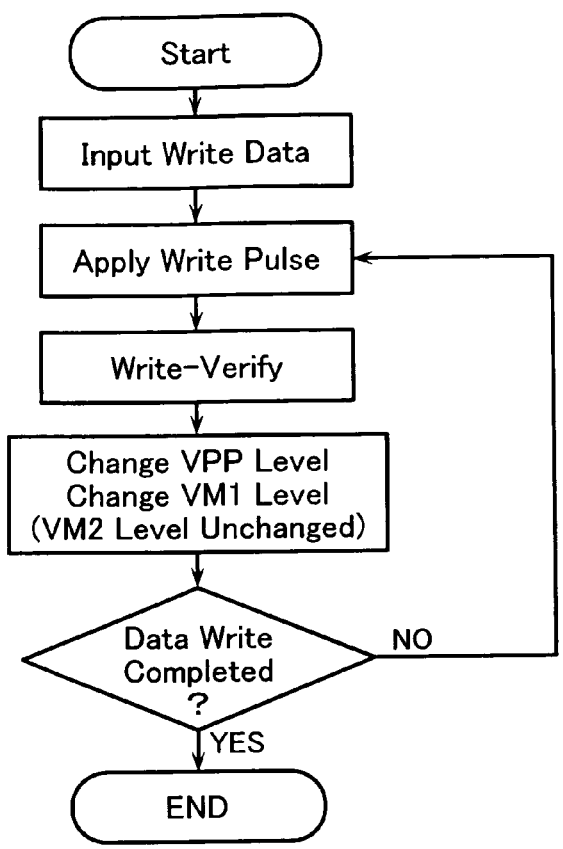
Figure 55J:
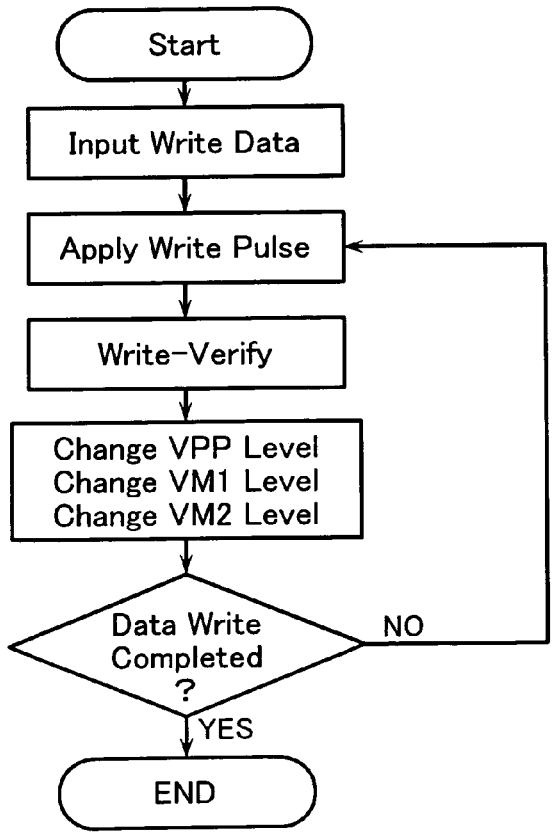
Figure 55K:
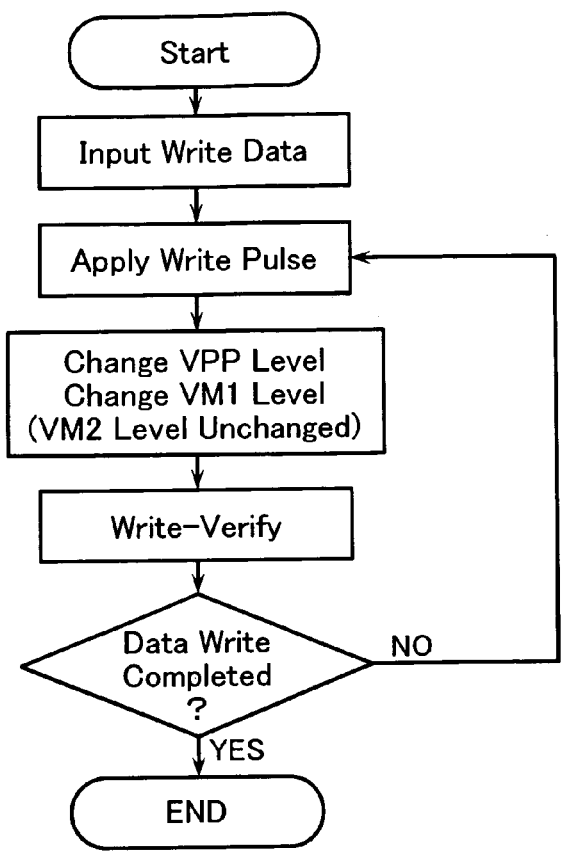
Figure 55L:
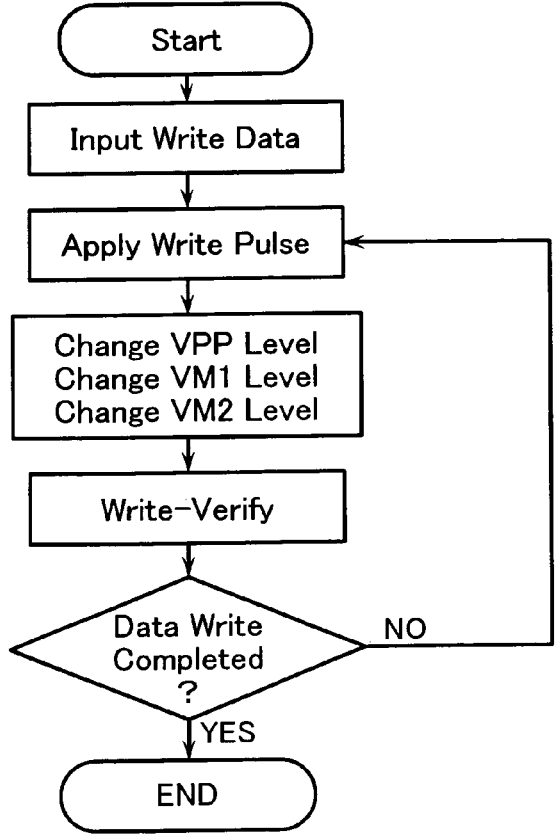
Figure 56:
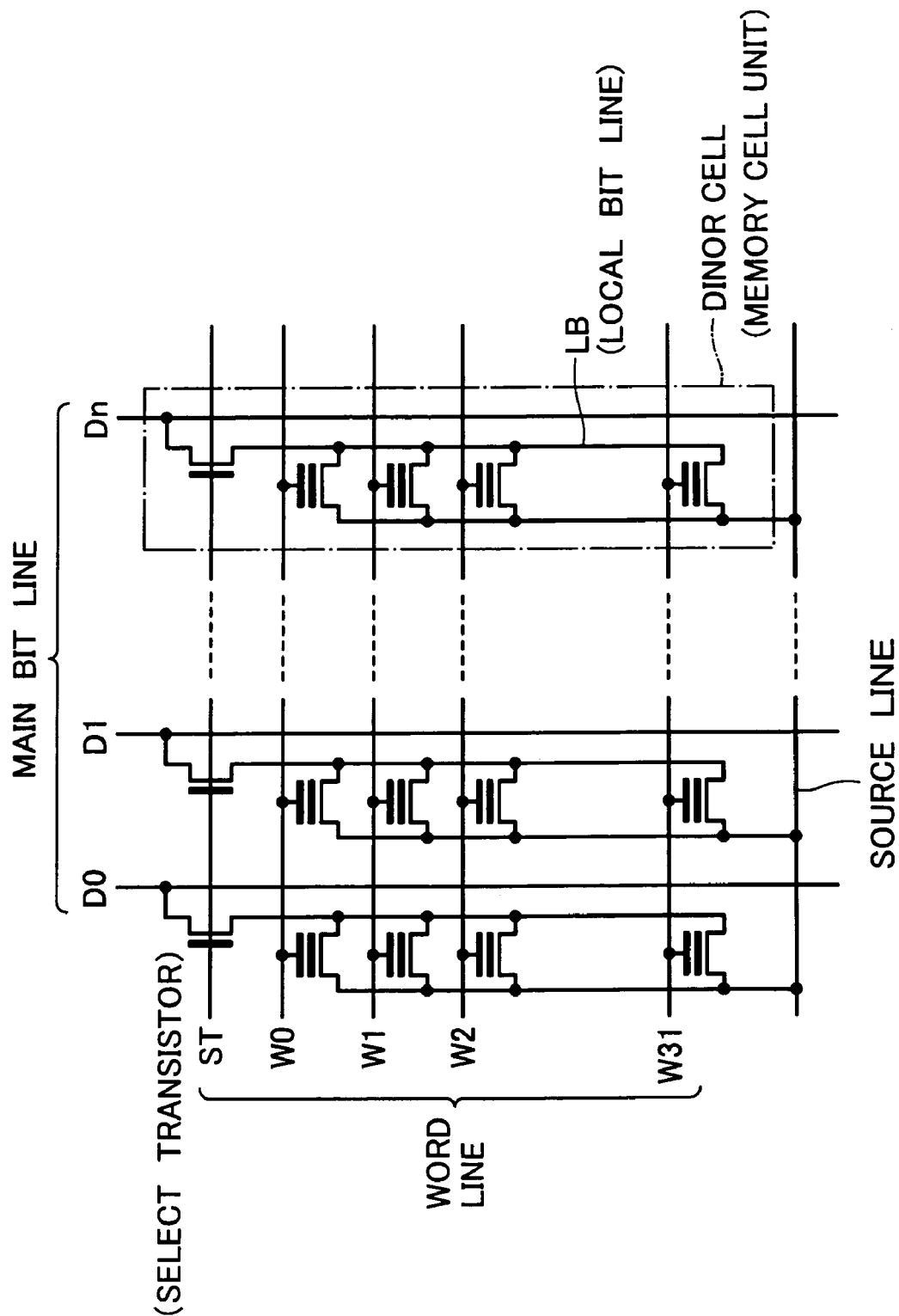
Figure 57:
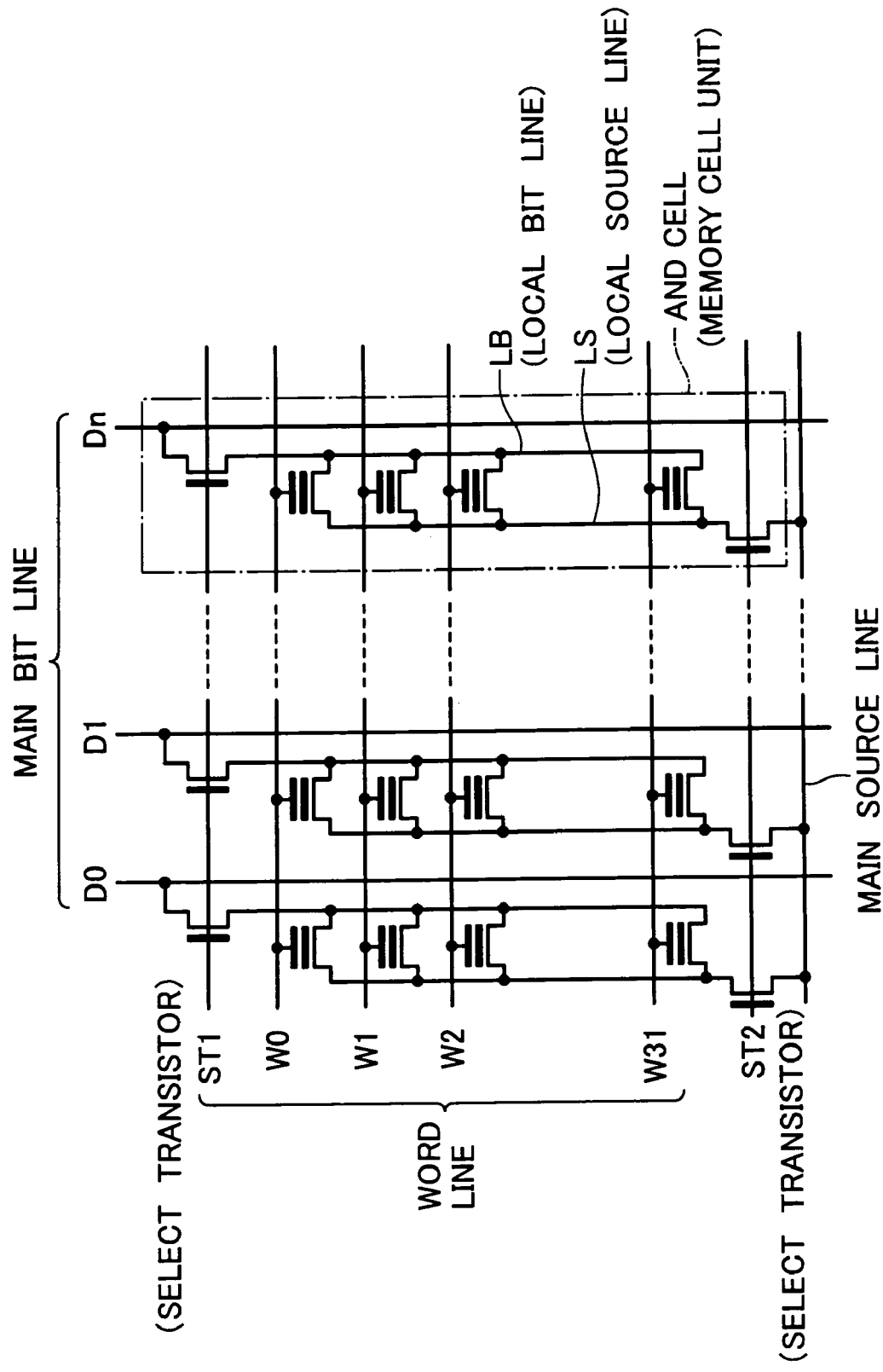
Figure 58:
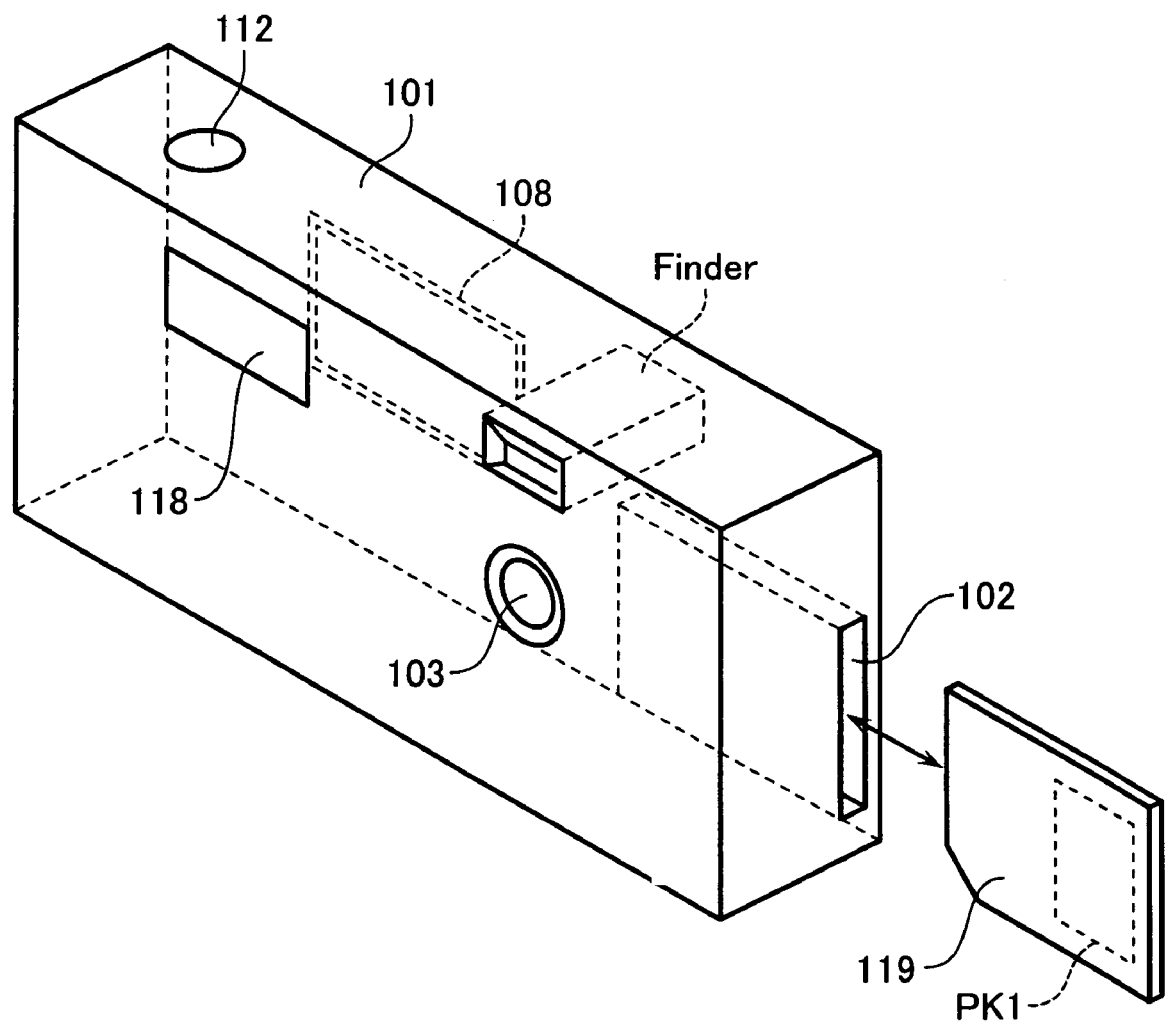
Figure 59:
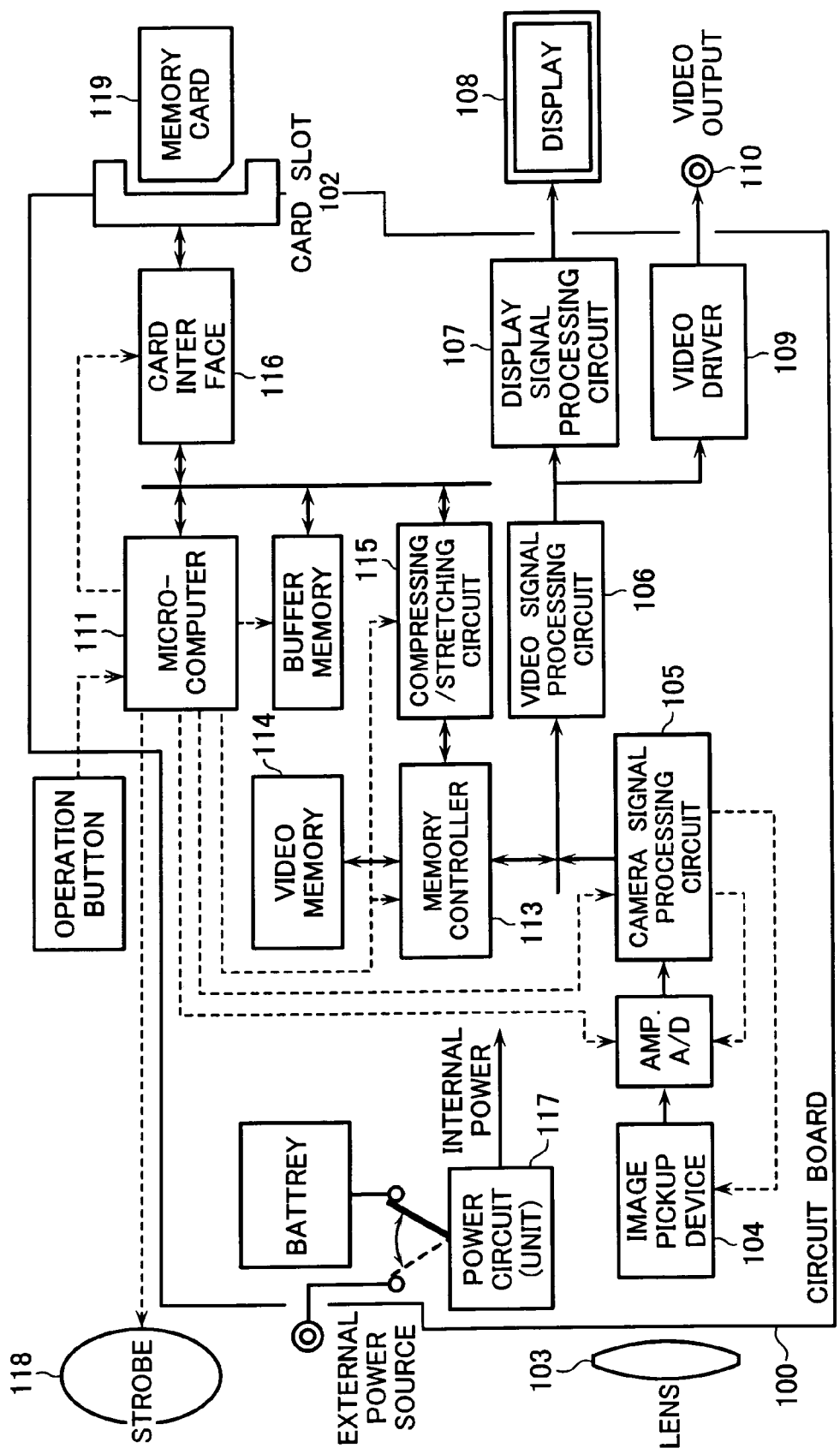
Figure 60A:
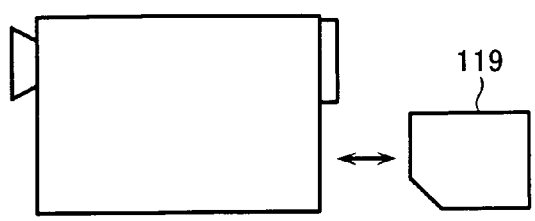
Figure 60F:
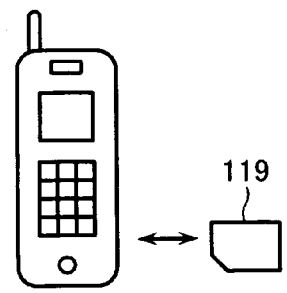
Figure 60B:
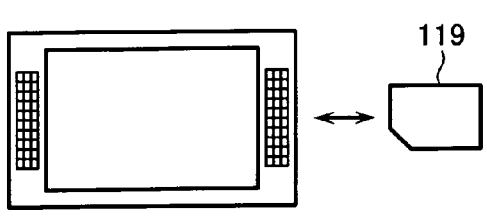
Figure 60G:
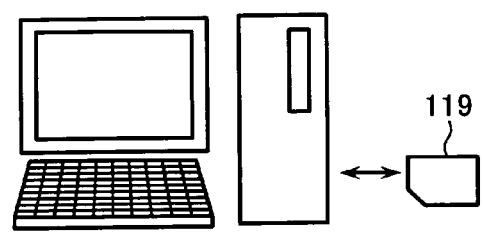
Figure 60C:
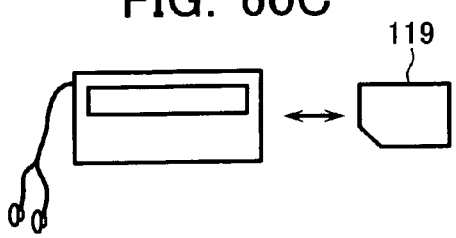
Figure 60H:
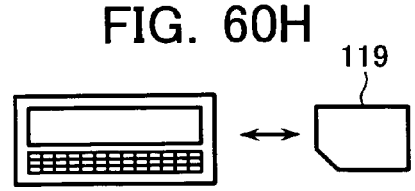
Figure 60D:
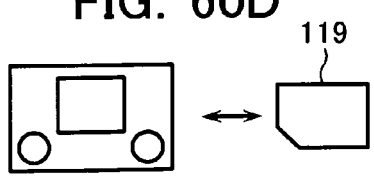
Figure 60I:
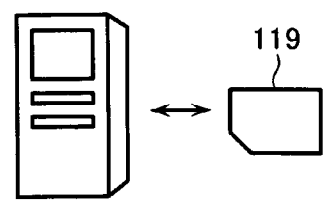
Figure 60E:
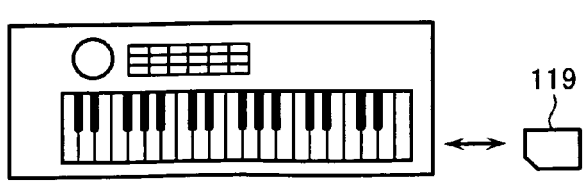
Figure 60J:
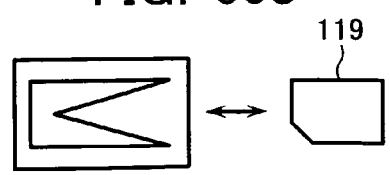

FIG. 52H shows the word line waveforms during the same operation (part 8);

FIG. 52I shows the word line waveforms during the same operation (part 9);

FIG. 52J shows the word line waveforms during the same operation (part 10);

FIG. 52K shows the word line waveforms during the same operation (part 11);

FIG. 52L shows the word line waveforms during the same operation (part 12);

FIG. 52M shows the word line waveforms during the same operation (part 13);

FIG. 52N shows the word line waveforms during the same operation (part 14);

FIG. 52O shows the word line waveforms during the same operation (part 15);

FIG. 52P shows the word line waveforms during the same operation (part 16);

FIG. 52Q shows the word line waveforms during the same operation (part 17);

FIG. 52R shows the word line waveforms during the same operation (part 18);

FIG. 52S shows the word line waveforms during the same operation (part 19);

FIG. 52T shows the word line waveforms during the same operation (part 20);

FIG. 52U shows the word line waveforms during the same operation (part 21);

FIG. 52V shows the word line waveforms during the same operation (part 22);

FIG. 52W shows the word line waveforms during the same operation (part 23);

FIG. 52X shows the word line waveforms during the same operation (part 24);

FIG. 53A shows another word line waveforms during an operation of data writing according to the embodiment of the present invention (part 1);

FIG. 53B shows the word line waveforms during the same operation (part 2);

FIG. 53C shows the word line waveforms during the same operation (part 3);

FIG. 53D shows the word line waveforms during the same operation (part 4);

FIG. 53E shows the word line waveforms during the same operation (part 5);

FIG. 53F shows the word line waveforms during the same operation (part 6);

FIG. 53G shows the word line waveforms during the same operation (part 7);

FIG. 53H shows the word line waveforms during the same operation (part 8);

FIG. 53I shows the word line waveforms during the same operation (part 9);

FIG. 53J shows the word line waveforms during the same operation (part 10);

FIG. 53K shows the word line waveforms during the same operation (part 11);

FIG. 53L shows the word line waveforms during the same operation (part 12);

FIG. 53M shows the word line waveforms during the same operation (part 13);

FIG. 53N shows the word line waveforms during the same operation (part 14);

FIG. 53O shows the word line waveforms during the same operation (part 15);

FIG. 53P shows the word line waveforms during the same operation (part 16);

FIG. 53Q shows the word line waveforms during the same operation forms (part 17);

FIG. 53R shows the word line waveforms during the same operation (part 18);

FIG. 53S shows the word line waveforms during the same operation (part 19);

FIG. 53T shows the word line waveforms during the same operation (part 20);

FIG. 53U shows the word line waveforms during the same operation (part 21);

FIG. 53V shows the word line waveforms during the same operation (part 22);

FIG. 53W shows the word line waveforms during the same operation (part 23);

FIG. 53X shows the word line waveforms during the same operation (part 24);

FIG. 54A shows another waveforms of the word line, the writing high and intermediate voltages, and the level control signal for the writing high and intermediate voltages during an operation of data writing according to the embodiment of the present invention (part 1);

FIG. 54B shows the waveforms during the same operation (part 2);

FIG. 54C shows the waveforms during the same operation (part 3);

FIG. 54D shows the waveforms during the same operation (part 4);

FIG. 54E shows the waveforms during the same operation (part 5);

FIG. 54F shows the waveforms during the same operation (part 6);

FIG. 54G shows the waveforms during the same operation (part 7);

FIG. 54H shows the waveforms during the same operation (part 8);

FIG. 54I shows the waveforms during the same operation (part 9);

FIG. 54J shows the waveforms during the same operation (part 10);

FIG. 55A shows a flowchart of an operation of data writing according to the embodiment of the present invention (part 1);

FIG. 55B shows a flowchart of the same operation (part 2);

FIG. 55C shows a flowchart of the same operation (part 3);

FIG. 55D shows a flowchart of the same operation (part 4);

FIG. 55E shows a flowchart of the same operation (part 5);

FIG. 55F shows a flowchart of the same operation (part 6);

FIG. 55G shows a flowchart of the same operation (part 7);

FIG. 55H shows a flowchart of the same operation (part 8);

FIG. 55I shows a flowchart of the same operation (part 9);

FIG. 55J shows a flowchart of the same operation (part 10);

FIG. 55K shows a flowchart of the same operation (part 11);

FIG. 55L shows a flowchart of the same operation (part 12);

FIG. 56 is an equivalent circuit diagram of a memory cell array in a DINOR cell-type EEPROM to which the embodiment of the present invention is applicable;

FIG. 57 is an equivalent circuit diagram of a memory cell array in an AND cell-type EEPROM to which the embodiment of the present invention is applicable;

FIG. 58 is a structural view of an electronic card and an electronic device according to the embodiment of the present invention;

FIG. 59 is a fundamental block diagram of a digital still camera, which is a first example of the electronic device according to the embodiment of the present invention;

FIG. 60A shows a video camera, which is a second example of the electronic device according to the embodiment of the present invention;

FIG. 60B shows a television set, which is a third example of the electronic device according to the embodiment of the present invention;

FIG. 60C shows an audio apparatus, which is a fourth example of the electronic device according to the embodiment of the present invention;

FIG. 60D shows a game apparatus, which is a fifth example of the electronic device according to the embodiment of the present invention;

FIG. 60E shows an electronic musical instrument, which is a sixth example of the electronic device according to the embodiment of the present invention;

FIG. 60F shows a cell phone, which is a seventh example of the electronic device according to the embodiment of the present invention;

FIG. 60G shows a personal computer, which is an eighth example of the electronic device according to the embodiment of the present invention;

FIG. 60H shows a personal digital assistant (PDA), which is a ninth example of the electronic device according to the embodiment of the present invention;

FIG. 60I shows a voice recorder, which is a tenth example of the electronic device according to the embodiment of the present invention; and FIG. 60J shows a PC card, which is an eleventh example of the electronic device according to the embodiment of the present invention.

DETAILED DESCRIPTION OF THE INVENTION

In the embodiments of the present invention, a novel word line voltage control method and timing is employed in data writing to an EEPROM of the NAND cell-type, for example. This is effective in an NAND to be "1"-WRITE to boost the voltage $V_{boost}$ at the channel of a selected memory cell higher than the conventional data writing. Therefore, the reliability against the erroneous write failure can be improved more greatly over the prior art. Thus, the embodiments of the present invention can be utilized to achieve a highly reliable chip together with an improved product yield over the prior art.

The embodiments of the present invention can therefore provide a non-volatile semiconductor memory device capable of inexpensive and reliable writing, an electronic card with the memory device mounted thereon, and an electronic device that utilizes the electronic card.

The embodiments of the present invention will be described with reference to the drawings and in order of "1. Description of Structure of NAND Cell", "2. Description of Operation of NAND Cell", "3. Description of General Configuration and Circuitry of NAND-type EEPROM", and "4. Applications to Other Non-volatile Semiconductor Memory Devices, Electronic Cards and Electronic Devices".

1. Description of Structure of NAND Cell

Figure 1:
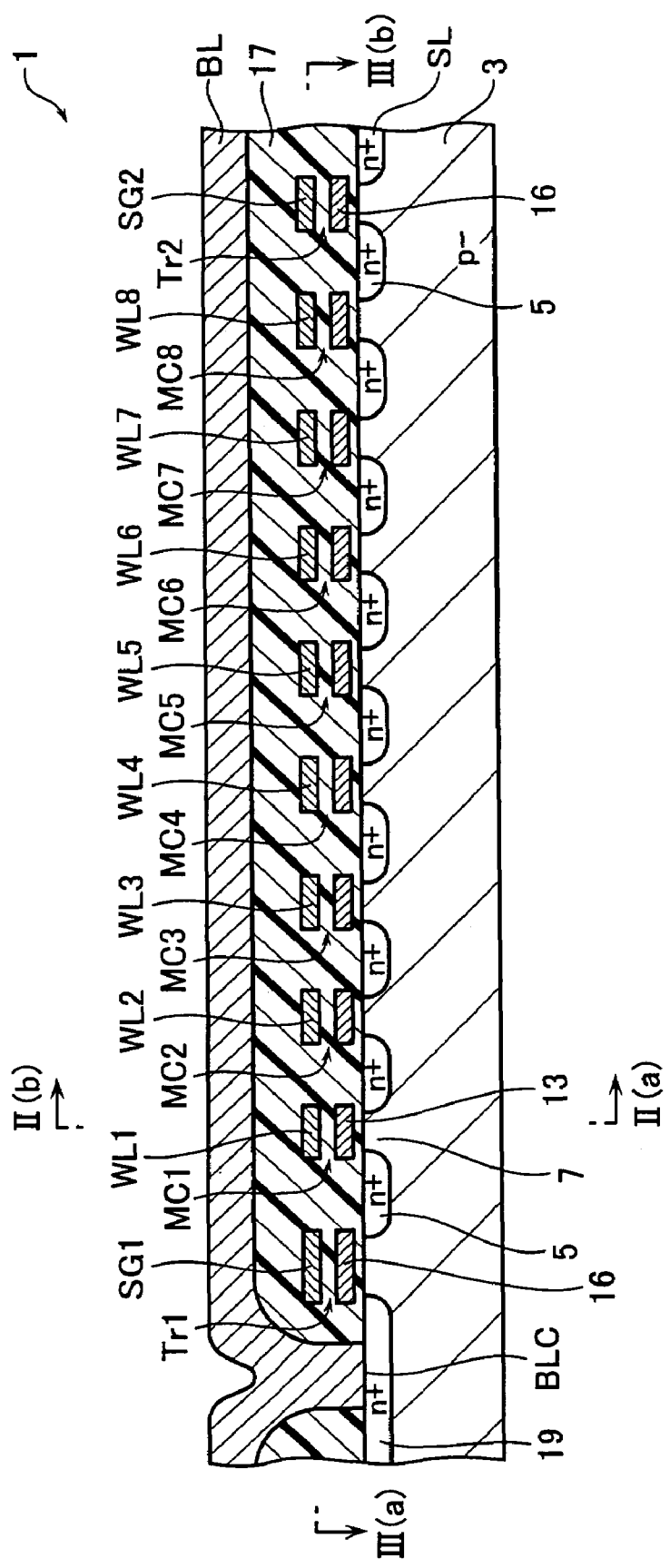
FIG. 1 is a schematic section view of an NAND cell according to the embodiment of the present invention.
Figure 2:
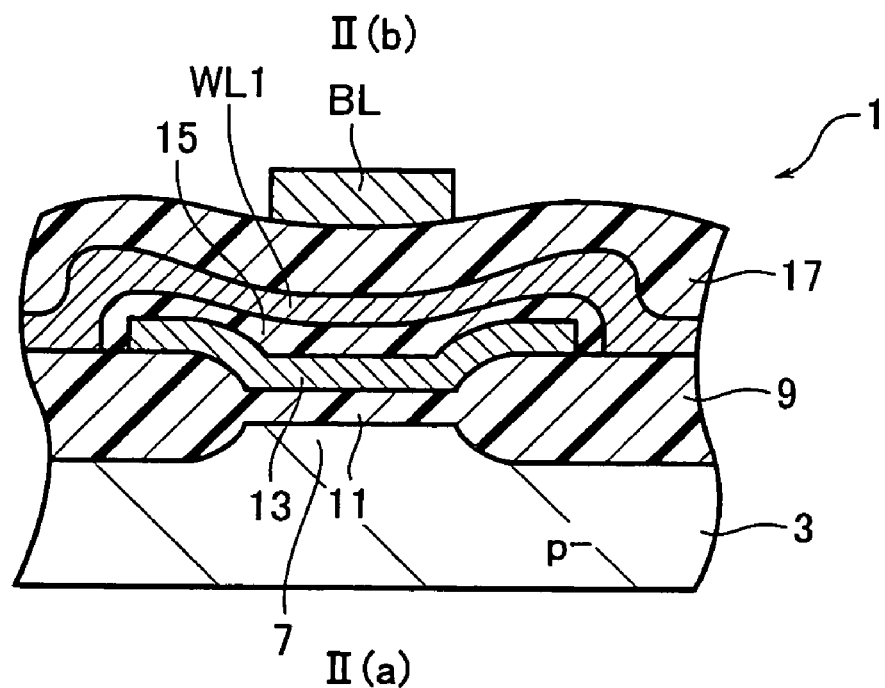
FIG. 2 is a schematic view of II(a)-II(b) section in FIG. 1.
Figure 3:
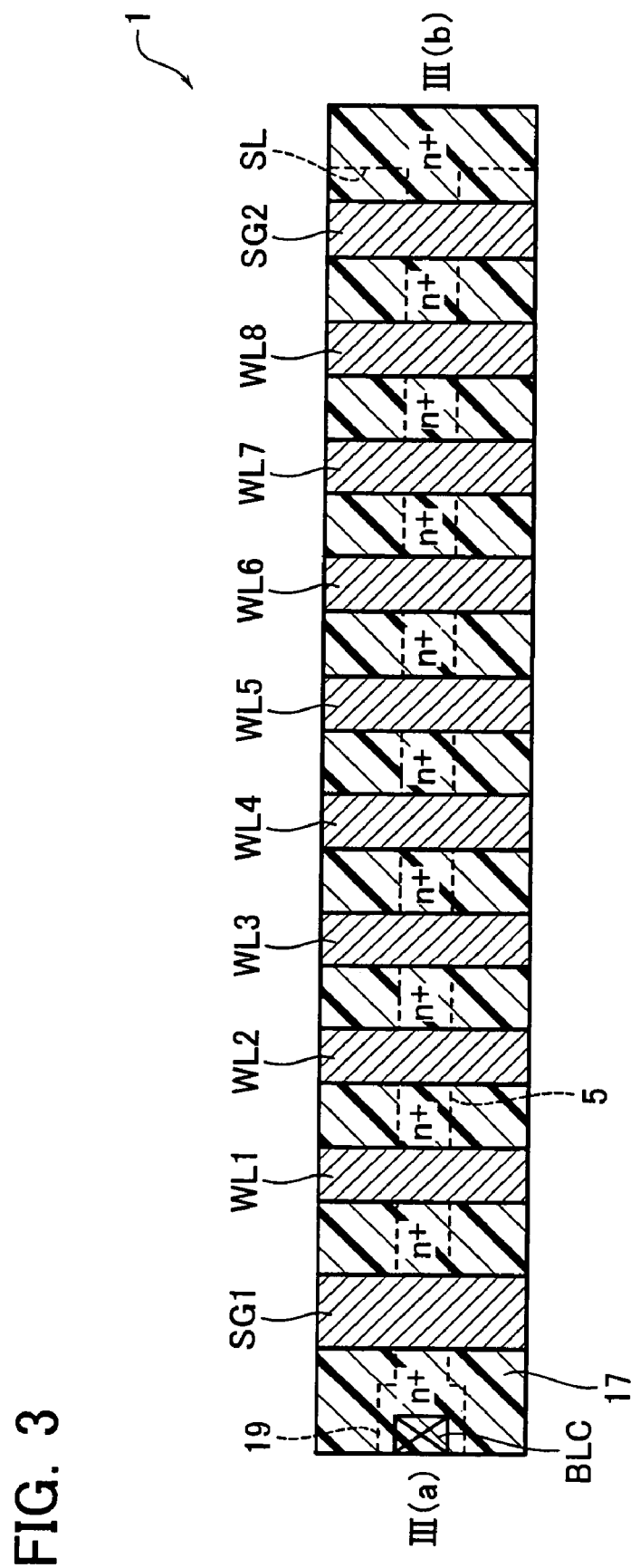
FIG. 3 is a schematic view of III(a)-III(b) section in FIG. 1.
Figure 4:
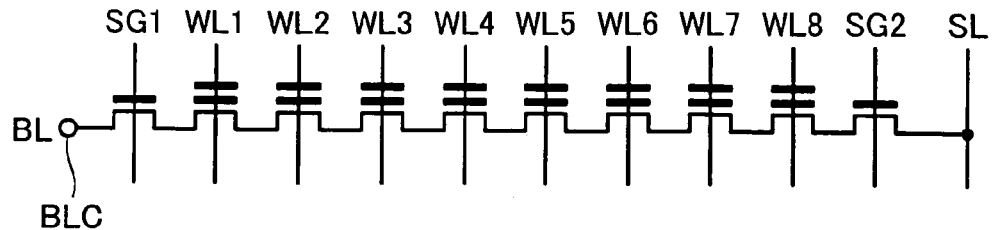
FIG. 4 is an equivalent circuit diagram of the NAND cell of FIG. 1.

FIG. 1 is a schematic section view of an NAND cell according to the embodiment of the present invention. FIG. 2 is a schematic view of II(a)-II(b) section in FIG. 1. FIG. 3 is a schematic view of III(a)-III(b) section in FIG. 1. FIG. 4 is an equivalent circuit diagram of the NAND cell of FIG. 1.

As shown in FIGS. 1-4, the NAND cell 1 is structured to include eight memory cells MC1-8 formed in a p⁻-type semiconductor substrate 3 (or p⁻-type well 3). The memory cells are electrically data-rewritable non-volatile cells. Every cell has the same structure. For example, the memory cell MC1 includes n⁺-type impurity regions 5 (source/drain) formed in the surface of the substrate (or well) 3 at a certain interval; a channel region 7 located between the impurity regions 5 in the substrate (or well) 3; a device isolation insulator film 9 formed around the regions 5 and 7; a floating gate 13 formed on a gate insulator film 11 above the channel region 7; and a word line WL1 formed on an insulator film 15 above the floating gate 13. A portion of the word line WL1 located on the floating gate 13 serves as a control gate.

The NAND cell 1 is configured by serially connecting the 8 memory cells in such a manner that adjacent ones share a source/drain. The number of the memory cells that configure the NAND cell 1 described in the following embodiments is mainly equal to 8. The present invention is similarly effective to other cases, for example, where the number of the memory cells that configure the NAND cell 1 is equal to 3, 4, 16, 32 or 64.

Formed close to the memory cell MC8 is a selection transistor Tr2, which is connected via the impurity region 5 to the memory cell MC8 and having a selection gate line SG2. The selection transistor Tr2 controls connection and disconnection between the memory cell in the NAND cell 1 and a source line SL that is an n⁺-type impurity region formed in the substrate 3 (or well 3).

Formed close to the memory cell MC1 on the other hand is a selection transistor Tr1, which has a selection gate line SG1. The selection transistor Tr1 is connected via the impurity region 5 to the memory cell MC1. The selection transistor Tr1 controls connection and disconnection between the memory cell in the NAND cell 1 and a bit line BL. Beneath the selection gate lines SG1-2, there is a conductive film 16, which is patterned simultaneously with the floating gate 13. The selection gate lines SG1-2 are connected to the conductive film 16 via through-holes, not shown. Therefore, the selection gate line SG1 and the conductive film 16 located beneath SG1 are at the same potential. In addition, the selection gate line SG2 and the conductive film 16 located beneath SG2 are at the same potential as well. Accordingly, the conductive film 16 is generally referred to as the selection gate line.

An interlayer insulator film 17 is formed over the memory cells MC1-8 and the selection transistors Tr1-2. Formed on the interlayer insulator film 17 is a bit line BL extending in a direction perpendicular to the word lines WL1-8. The bit line BL is connected to the selection transistor Tr1, that is, an n⁺-type impurity region 19 formed in the substrate 3 (or well 3), at a point called bit line contact BLC.

Figure 5:
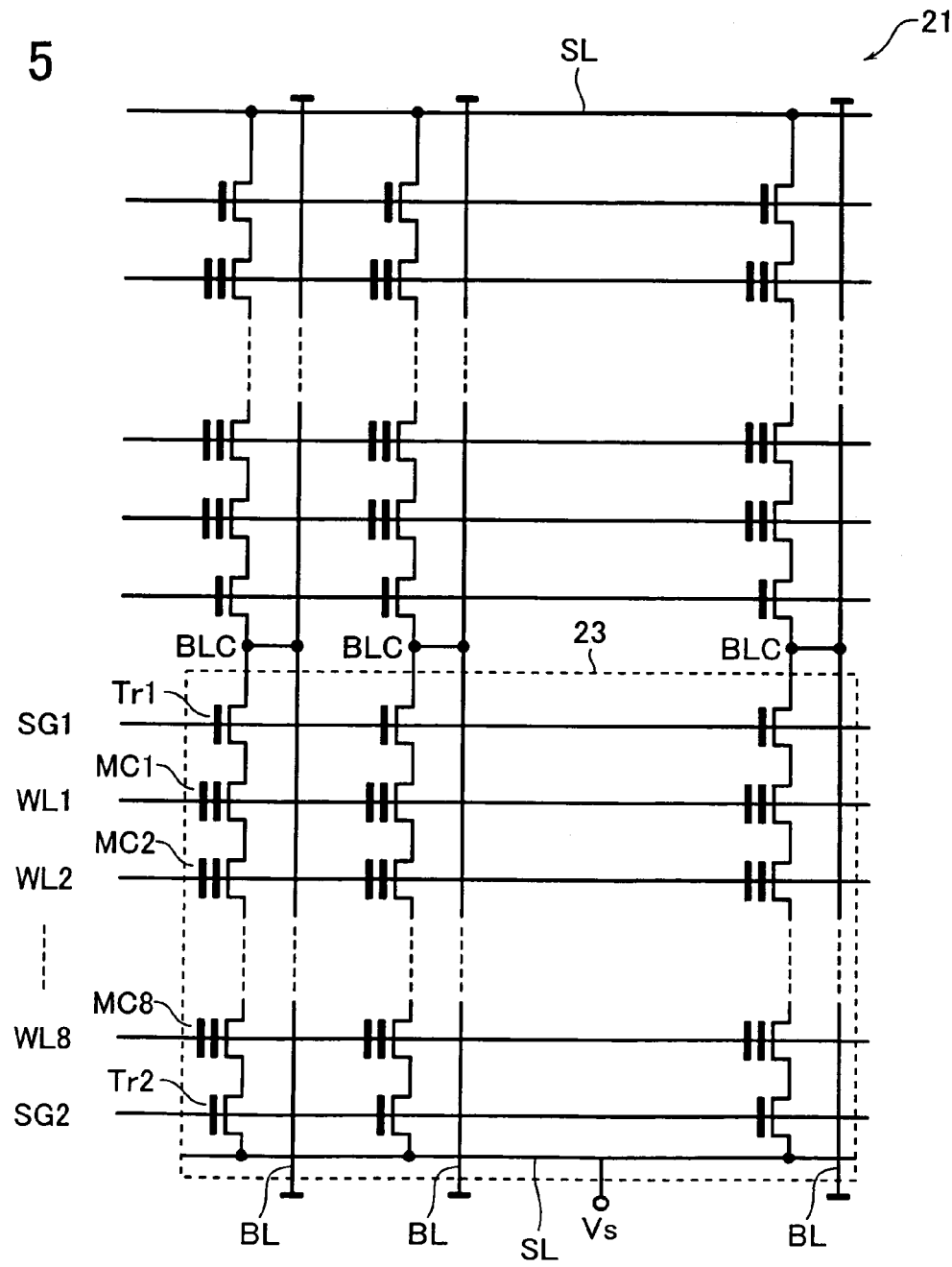
FIG. 5 is an equivalent circuit diagram of part of a memory cell array including the NAND cells of FIG. 4 arranged in matrix.

NAND cells 1 are arranged in matrix to configure a memory cell array. FIG. 5 is an equivalent circuit diagram of part of a memory cell array 21. The word lines WL1-8 are each commonly connected to memory cells on the same row in the memory cell array 21. The selection gate lines SG1-2 also are each commonly connected to memory cells on the same row in the memory cell array 21. A plurality of bit lines BL are each commonly connected to memory cells on the same column in the memory cell array 21.

A group of NAND cells sharing the same word lines and selection gate lines is referred to as a block. The memory cell array 21 is divided into such blocks. A selection gate is employed to select a block. For example, a region surrounded by a dashed line in FIG. 5 corresponds to one block 23. Reading or writing is normally executed to a selected one among a plurality of blocks.

In the NAND-type EEPROM, a plurality of memory cells are contained in a basic unit, and such basic units are arranged in matrix to configure a memory cell array. To such the non-volatile semiconductor memory device, the present invention is effectively applied. The basic unit (for example, one NAND cell) is generally referred to as a memory cell unit. A memory cell array comprising NAND cells is expressed as comprising memory cell units arranged in matrix.

2. Description of Operation of NAND Cell

Erasing NAND cells is described first. Erasing is performed simultaneously to all memory cells in the selected block 23 of NAND cells (FIG. 5). Namely, all word lines in the selected block 23 are set at 0 V, and a high voltage VERA (=about 22 V) is applied to the semiconductor substrate 3 (FIG. 1, or a p-type well 3 if the NAND cells are formed in the p-type well 3). On the other hand, bit lines, a source line, and word lines and all selection gate lines in non-selected blocks are brought into a floating state. Accordingly, in all memory cells in the selected block 23, electrons are released from the floating gates to the semiconductor substrate by tunnel current to shift the threshold voltage of these memory cells to a negative value.

In reading, the selected word line is set at 0 V, and non-selected word lines and the selection gate lines are set at an intermediate voltage for reading, VREAD, slightly higher than the supply voltage. This condition is employed to detect whether current flows in the memory cell connected to the selected word line.

The memory cells to be data-written are all in a "1" data-holding state, that is, the threshold voltages thereof are in a negative state, immediately before data writing.

Writing is performed sequentially from the memory cell MC8 located farthest from the bit line contact BLC, that is, the memory cell closest to the source line SL. In the following description of data writing such as write pulse applying, the present invention is described on an example in which the memory cell MC3 is selected (that is, the word line WL3 is selected). The present invention is though similarly effective if other memory cells MC1, MC2, MC4-8 are selected.

Figure 12:
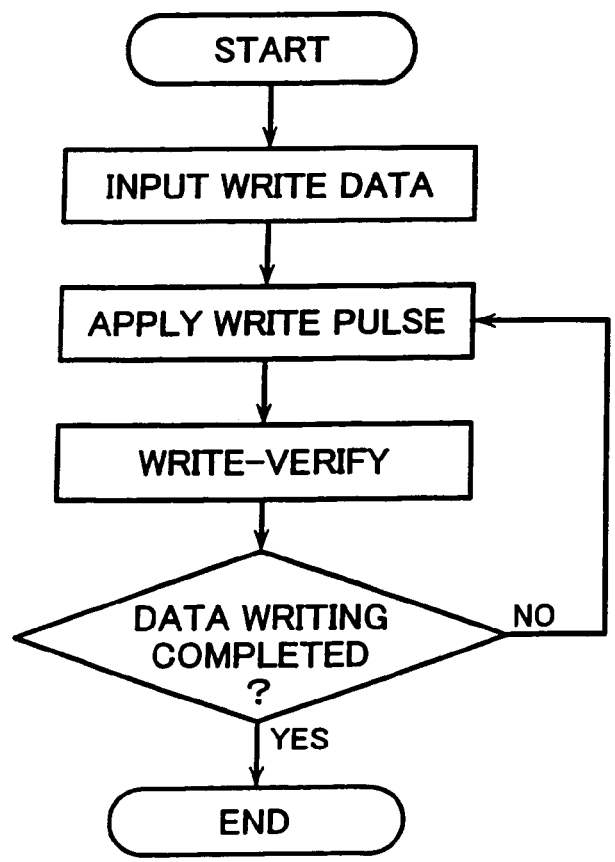
FIG. 12 is a flowchart of writing.

FIG. 12 is a flowchart of writing. In writing, as shown in FIG. 12, after write data ("0" or "1") is input, operations of write pulse applying and write-verify (that is, verify-reading) are repeated until data writing is finished. In all memory cells to be "0"-WRITE, after the threshold voltage reaches a certain value, writing is finished. With respect to write pulse applying in data writing, prior arts, comparative examples, and embodiments of the present invention will be mainly described below.

Prior to describing the operation of the NAND cell according to the embodiment of the present invention, as the premise of understanding the operation, "Prior Art and Comparative Examples (a prior art, a comparative example 1, and a comparative example 2) of Write Pulse Applying to NAND Cell" are described first. Then, "Examples of Write Pulse Applying to NAND Cell According to Various Embodiments of the Invention" are described.

First, the prior art of write pulse applying is described with reference to FIGS. 6-11.

[Prior Art of Write Pulse Applying to NAND Cell]

Figure 6:
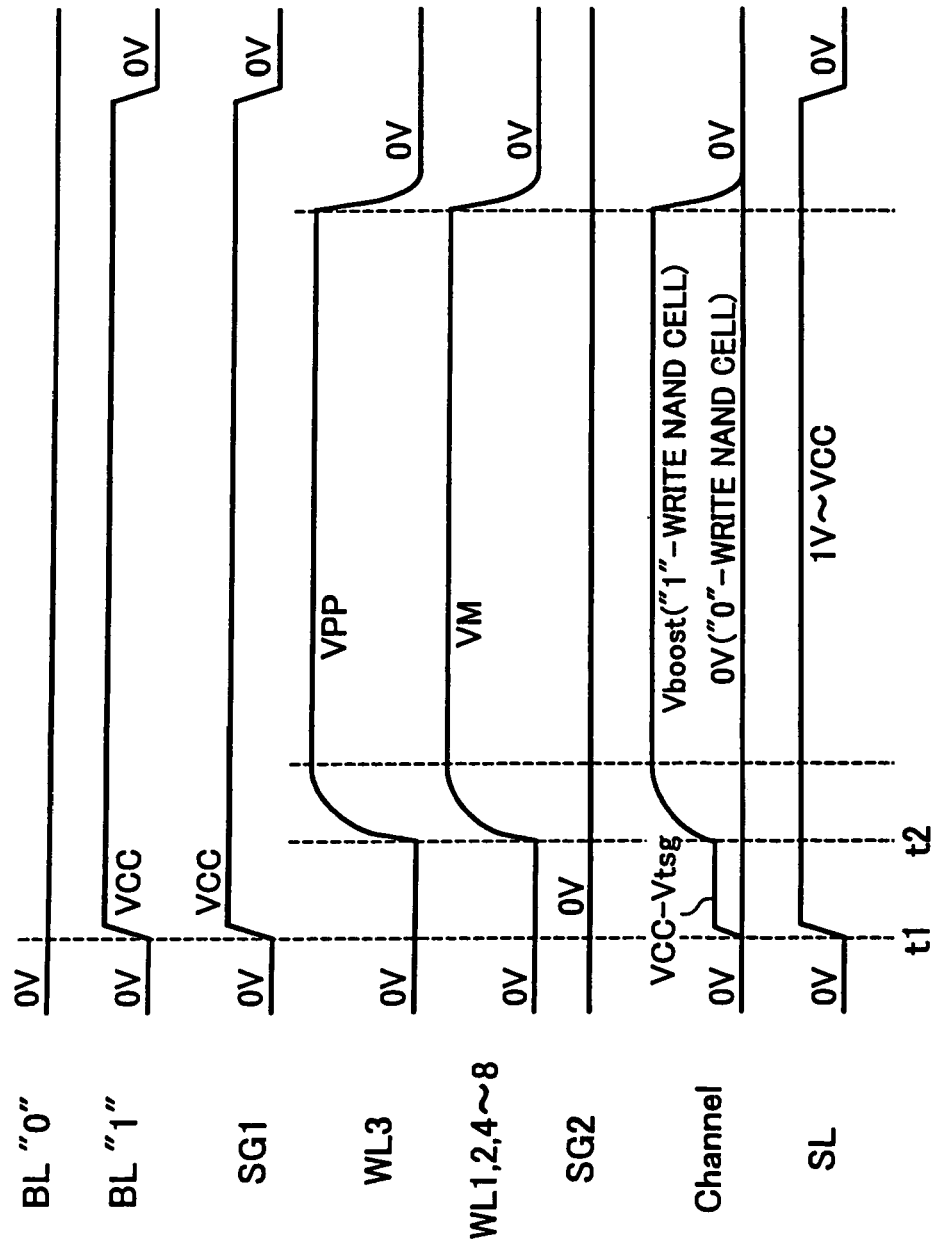
FIG. 6 is a timing chart illustrating an example of write pulse applying to an NAND cell in the prior art.
Figure 7:
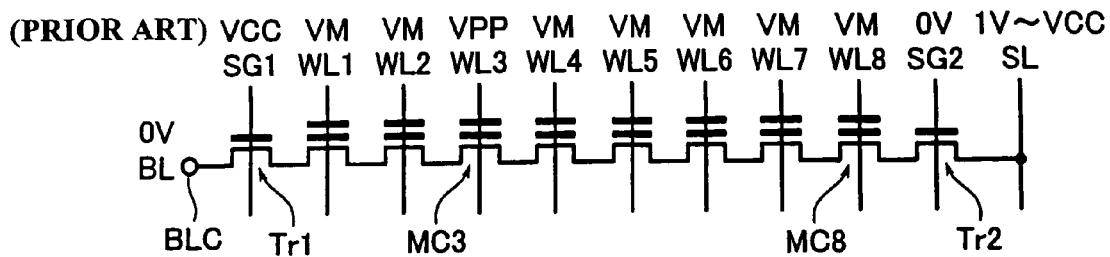
FIG. 7 shows voltages applied to an NAND cell that includes a memory cell to be "0"-WRITE on write pulse applying in the prior art.
Figure 8:
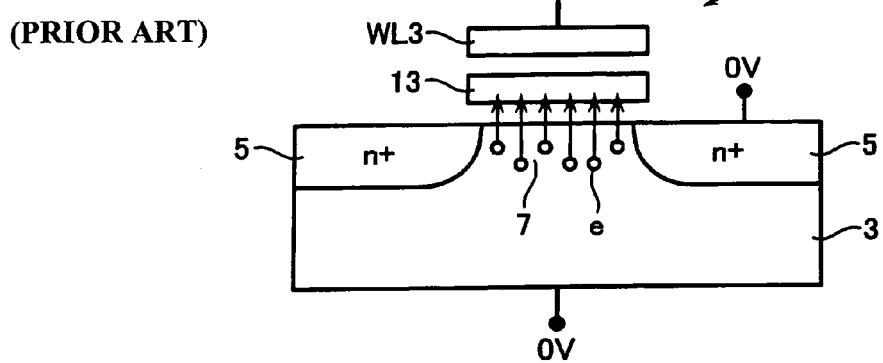
FIG. 8 is a schematic section view of the memory cell to be "0"-WRITE on write pulse applying.
Figure 9:
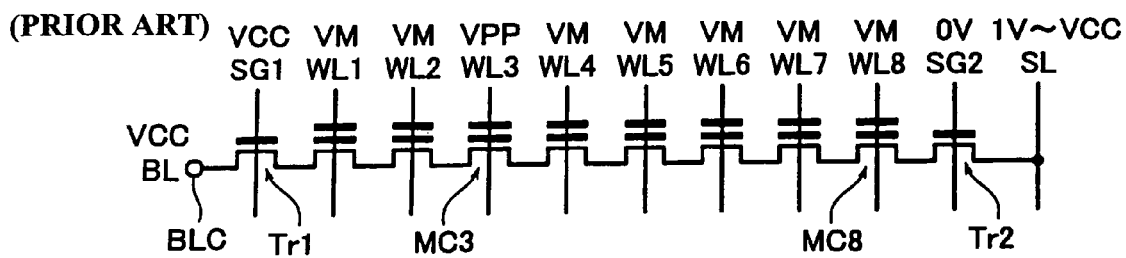
FIG. 9 shows voltages applied to an NAND cell that includes a memory cell to be "1"-WRITE on write pulse applying in the prior art.
Figure 10:
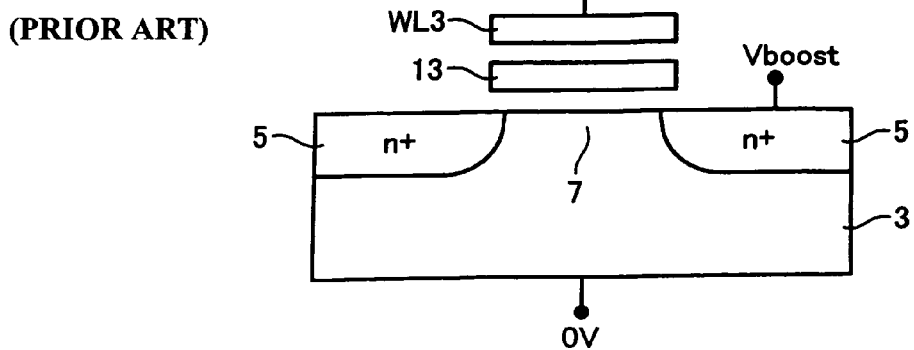
FIG. 10 is a schematic section view of the memory cell to be "1"-WRITE on write pulse applying.
Figure 11:
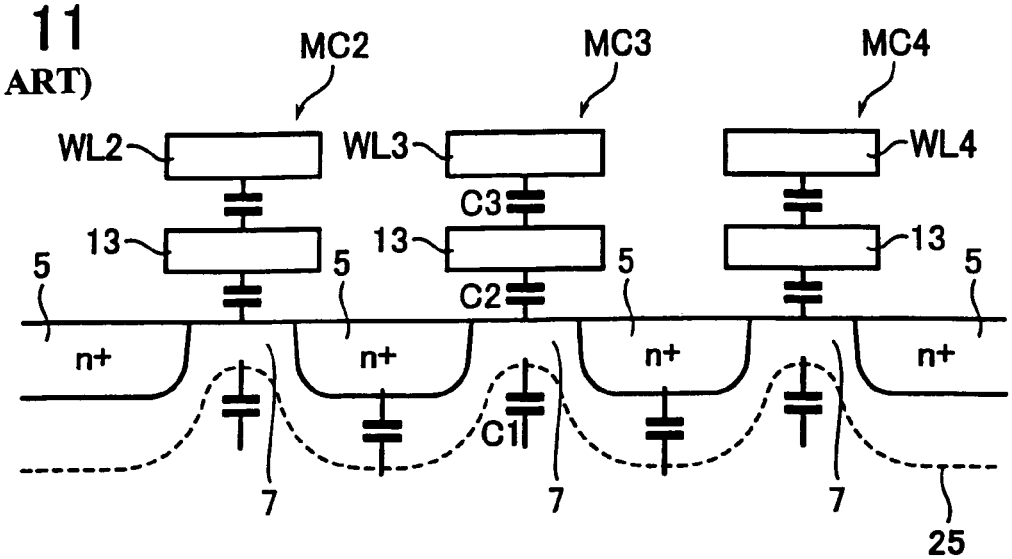
FIG. 11 illustrates capacitive coupling between the channel region in the memory cell to be "1"-WRITE and a word line.

FIG. 6 is a timing chart illustrating the prior art of write pulse applying. FIG. 7 is an equivalent circuit diagram of an NAND cell that includes a memory cell to be "0"-WRITE, and FIG. 8 is a schematic view of the memory cell to be "0"-WRITE. FIG. 9 is an equivalent circuit diagram of an NAND cell that includes a memory cell to be "1"-WRITE, and FIG. 10 is a schematic view of the memory cell to be "1"-WRITE. FIG. 11 illustrates capacitive coupling between the channel region in the memory cell to be "1"-WRITE and a word line. In these figures, the same parts as those already described above are given the same reference numerals and their duplicated descriptions are omitted hereinafter.

FIGS. 6-8 are employed to describe "0"-WRITE to the memory cell MC3. At time t1, VCC (supply voltage) is applied to the selection gate line SG1 to turn on the selection transistor Tr1, and the bitline BL is set at 0V (ground voltage). As the selection gate line SG2 at this time is kept at 0 V, the selection transistor Tr2 remains turned off.

At time t2, charging of each word line starts. Specifically, the word line WL3 to the memory cell MC3 is set to a high voltage (about 18 V), and the remaining word lines are set to an intermediate voltage VM (about 10 V). As the bit line BL has a voltage of 0 V, the voltage is transmitted to the channel region 7 in the selected memory cell or the memory cell MC3. Namely, the potential of Channel (channel region 7) in FIG. 6 is retained at 0 V.

As the word line WL3 and the channel region 7 have a large potential therebetween, electrons "e" are injected into the floating gate 13 of the memory cell MC3 by tunnel current as shown in FIG. 8. As a result, the threshold of the memory cell MC3 is shifted to the positive state ("0"-WRITE state).

On the other hand, "1" writing to the memory cell MC3 is described with reference to FIGS. 6, 9-11 mainly on the difference from the "0" writing. At time t1, the bit line BL is set at VCC (supply voltage). As the selection gate line SG1 has a voltage of VCC, the selection transistor Tr1 is cut off when the voltage at the channel region 7 reaches VCC−$V_{tsg}$ (where $V_{tsg}$ is the threshold voltage of the selection transistor Tr1). Accordingly, Channel (channel region 7) of FIG. 6 is turned into the floating state with the voltage of VCC−$V_{tsg}$.

At time t2, charging of each word line starts, and capacitive coupling between each word line and the channel region 7 boosts the voltage at Channel (channel region 7) from VCC−$V_{tsg}$ to $V_{boost}$ (about 8 V). FIG. 11 illustrates the capacitive coupling, in which C1 denotes a depletion layer capacitance, C2, C3 each an insulator film capacitance, and 25 a depletion layer edge.

Different from "0" writing, as the voltage at the channel region 7 is boosted to $V_{boost}$, the word line WL3 and the channel region 7 have a small potential therebetween. Therefore, no electron is injected by tunnel current into the floating gate 13 of the memory cell MC3 as shown in FIG. 10. Accordingly, the threshold of the memory cell MC3 is kept in the negative stage ("1"-WRITE state).

In the above-described write pulse applying, the source line SL is kept not at 0 V but between 1 V and VCC to improve the cut-off characteristic of the selection transistor Tr2 located close to the source line SL in the NAND cell 1 to be "1"-WRITE. As described above, in the NAND cell 1 to be "1"-WRITE, the channel region in the NAND cell 1 is in the floating state. Accordingly, if a leakage current is present in the selection transistor Tr2, the voltage level at the channel region lowers below $V_{boost}$. This results in an increased risk of erroneous write failure (a failure associated with erroneous write of "0" data in a memory cell to be "1"-WRITE during operation of writing). The setting of the voltage at the source line SL not to 0 V but to a positive voltage improves the cut-off characteristic of the selection transistor Tr2 to greatly reduce the leakage current.

Comparative Example 1 of Write Pulse Applying to NAND Cell

Figure 13:
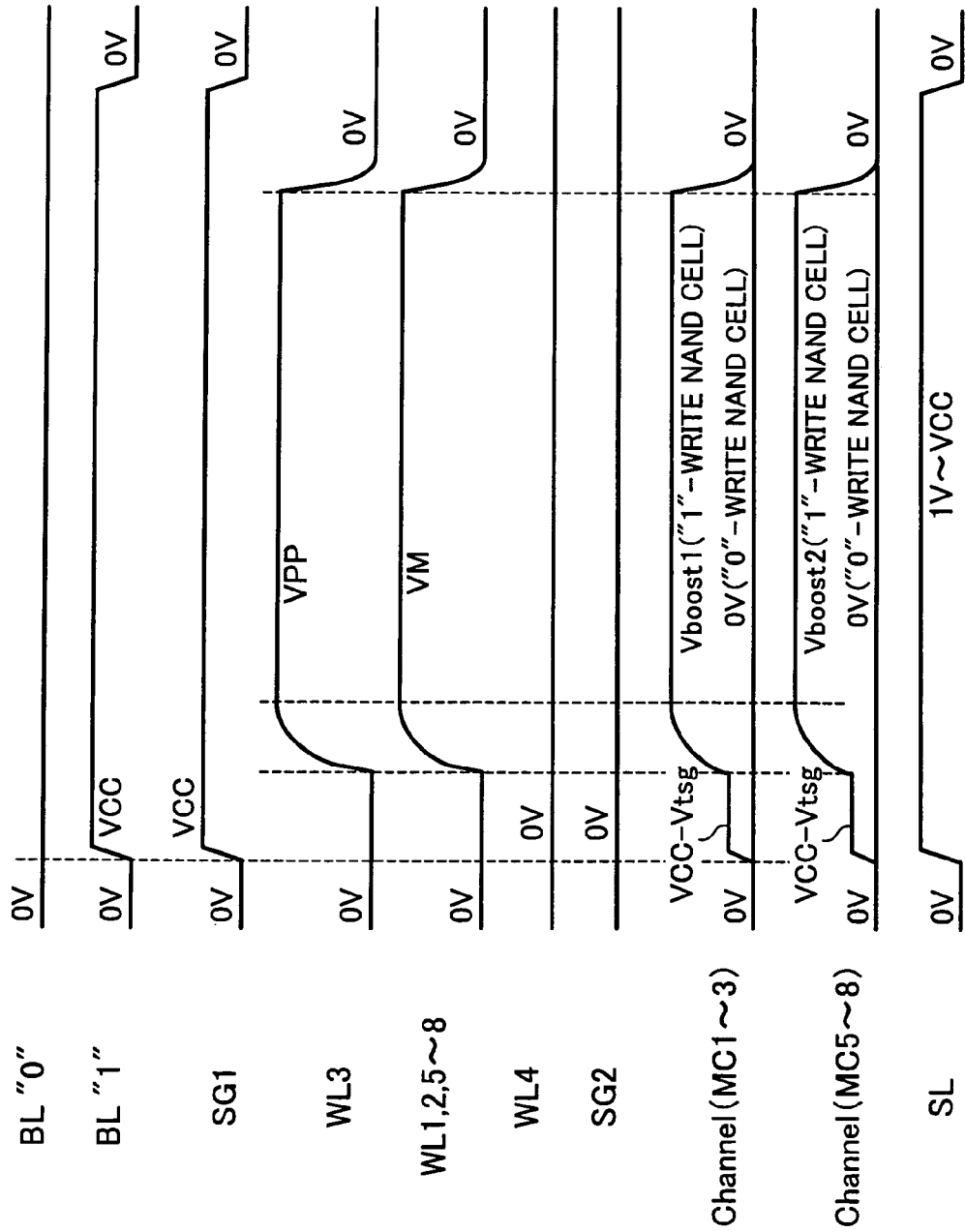
FIG. 13 is a timing chart illustrating write pulse applying according to a comparative example 1.
Figure 14:
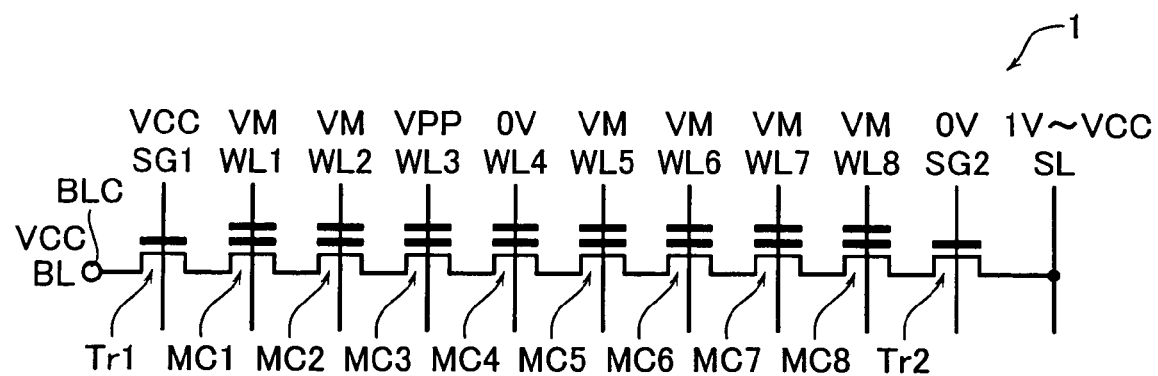
FIG. 14 shows voltages applied to an NAND cell that includes a memory cell to be "1"-WRITE on write pulse applying in the comparative example 1.

FIG. 13 is a timing chart illustrating write pulse applying according to the comparative example 1. FIG. 14 is an equivalent circuit diagram of an NAND cell that includes a memory cell to be "1"-WRITE in the comparative example 1. The comparative example 1 is described with reference to FIGS. 13 and 14 mainly on the difference from the prior art.

As described in "Description of the Related Art", on "1" data writing, the larger the elevation of the voltage at the channel region, the more the risk of electron injection into the floating gate by tunnel current lowers to improve the reliability against the erroneous write failure. To achieve the improvement in the reliability against the erroneous write failure, the voltage at the word line WL4 adjacent to the word line WL on the side close to the source line SL is set to 0 V in the comparative example 1. This is for the purpose of increasing the amount of voltage elevation at the channel region in the selected memory cell MC3 larger than the prior art. The comparative example 1 is described next.

If the word line WL is fixed at 0 V, the memory cell MC4 connected to this word line may be cut off. After the instant of cut-off, the channel regions in the memory cells (MC5-8) located closer to the source line SL than the memory cell MC4 have no continuity with the channel regions in the memory cells (MC1-3) located closer to the bit line contact BLC than the memory cell MC4. As a result, the voltage elevation at the channel region in the memory cell MC3 to be "1"-WRITE is determined from capacitive coupling between the word lines WL1-3 and the channel regions in the memory cells MC1-3 connected to these word lines. Accordingly, the voltage elevation at the channel region in the memory cell MC3 is boosted from $VCC-V_{tsg}$ to $V_{boost1}$.

For example, when the memory cell MC4 connected to the word line WL4 holds "0", the memory cell MC4 always in the off state during operation of the comparative example 1. In this case, the voltage at the channel region in the memory cell MC3 has the following value.

Comparative Example 1 $V_{boost1}=(VCC-V_{tsg})+\alpha\times(VPP+2\times VM)/3$

Prior Art:

$$V_{boost}=(VCC-V_{tsg})+\alpha\times(VPP+7\times VM)/8$$

Therefore, in consideration of "VPP (18 V)>VM (10 V)", $V_{boost1}$ in the comparative example 1 is larger than $V_{boost}$ (FIG. 6) in the prior art. VPP denotes the voltage on the word line WL3; "2×VM" is a voltage obtained by summing the voltages on the word lines WL1-2; and "7×VM" is a voltage obtained by summing the voltages on the word lines WL1, 2, 4-8. In addition, α denotes a ratio in elevation amount of the channel region voltage to the word line voltage.

Thus, when the memory cell MC4 connected to the word line WL4 holds "0", the comparative example 1 can increase the amount of the voltage elevation larger than the prior art at the channel region on "1" writing. This is effective to greatly lower the risk of erroneous write failure.

Even if the memory cell MC4 connected to the word line WL4 holds not "0" data but "1" data, the memory cell MC4 may be cut off (that is, MC4 may be cut off immediately before charging WL to VPP, VM) when the gate of the memory cell MC4 is kept at 0 V and the source/drain thereof at $VCC-V_{tsg}$. In this case, like the memory cell MC4 holds "0" data, the following relation is satisfied.

$$V_{boost1}=(VCC-V_{tsg})+\alpha\times(VPP+2\times VM)/3$$

This is effective to sufficiently elevate the voltage level of $V_{boost1}$ to greatly lower the risk of erroneous write failure.

To the contrary, when the memory cell MC4 connected to the word line WL4 holds "1", and the gate of the memory cell MC4 is kept at 0 V and the source/drain thereof at $VCC-V_{tsg}$, the memory cell MC4 may not be cut off (that is, MC4 may not be cut off immediately before charging WL to VPP, VM). In this case, even the use of the comparative example 1 can not sufficiently increase the amount of improvement in the $V_{boost1}$ level over the prior art. Therefore, it is difficult to greatly improve the reliability against the erroneous write failure. This reason is given below.

If the memory cell MC4 remains turned on at the beginning of charging the word line to VPP, VM, the following relations are found in the comparative example 1.

Before MCI cut off:

$$\Delta V_{boost1}\propto\alpha\times(\Delta VPP+6\times\Delta VM)/8$$

After MC1 cut off:

$$\Delta V_{boost1}\propto\alpha\times(\Delta VPP+2\times\Delta VM)/3$$

Thus, before MC1 is cut off, the amount of voltage $V_{boost1}$ elevation is smaller. Accordingly, the amount of voltage elevation at the channel region in MC3 by capacitive coupling with WL is not much larger than when MC1 holds "0" data (always $\Delta V_{boost1}\propto\alpha\times(\Delta VPP+2\times\Delta VM)/3$). Therefore, a final value of $V_{boost1}$ is not much higher and makes it difficult to improve the reliability greatly.

As the prior art of write pulse applying, "FIG. 10 or 11 in the patent publication 1 (JP-A 10-283788)" described in "Description of the Related Art" may be employed. Also in this case, the beginning of charging word lines in write pulse applying basically has the same timing as that of the operation in "FIG. 13 in the present specification". As a result, it is difficult to achieve a greater improvement in the reliability over the prior art.

Comparative Example 2 of Write Pulse Applying to NAND Cell

Figure 15:
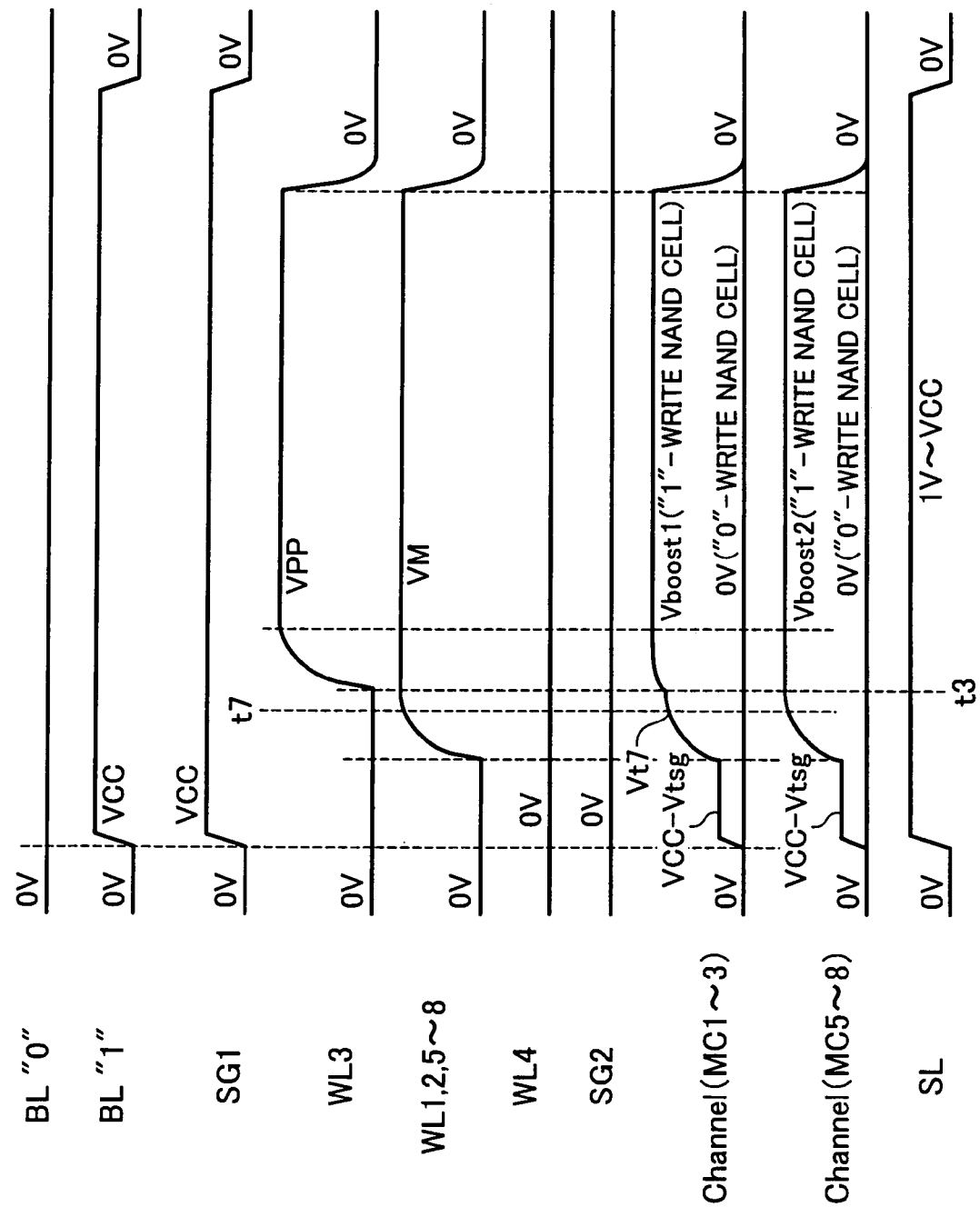
FIG. 15 is a timing chart illustrating write pulse applying according to a comparative example 2.

FIG. 15 is a timing chart illustrating write pulse applying of a comparative example 2. In the comparative example 2, the beginning of charging the word line WL3 (time t3) is determined later than the beginning of charging the remaining word lines. The use of this method can elevate the final value of $V_{boost1}$ higher than the comparative example 1 if the memory cell MC4 remains turned on at the beginning of charging word lines to VPP, VM, as detailed next.

A comparison of the operation in FIG. 13 with that in FIG. 15 is considered on the most critical case for erroneous write failures, that is, where the memory cell MC4 remains turned on at the beginning of charging word lines. In the comparative example 1 of FIG. 13, operations of charging all word lines to be charged (the word lines WL1-3,5-8) are simultaneously started. Therefore, the memory cell MC4 is cut off during the charging of these word lines. To the contrary, in the comparative example 2 of FIG. 15, the beginning of charging the word line WL3 is delayed. Therefore, the memory cell MC4 is cut off during the charging of the word lines WL1, 2, 5-8, followed by the beginning of charging the word line WL3. VPP is higher than VM. In addition, WL3 is brought from 0 V to VPP after the memory cell MC4 turns on. Accordingly, the effect of capacitive coupling due to the charged WL3 can be limited within the channel regions of the memory cells MC1-3 (that is, the effect of the charged WL3 is not dispersed to the channel regions of MC4-8). Thus, $V_{boost1}$ can be elevated higher than the comparative example 1.

The above-described comparative examples 1 and 2 can be employed to achieve an improvement in the reliability against erroneous write failures over the prior art. The embodiments of the present invention can be employed, however, to elevate the voltage much higher than the use of the comparative examples 1 and 2 at the channel in the selected memory cell on write pulse applying.

Description on Embodiments of the Invention

The later-described embodiments of the present invention can be employed to elevate the voltage level at the channel in the selected memory cell greatly higher than the prior art and the comparative examples 1 and 2 in the case where the memory cell MC4 remains turned on at the beginning of charging word lines. Accordingly, it is possible to greatly lower the risk of erroneous write failures more than the prior art and the comparative examples 1 and 2. In the following embodiments, descriptions are mainly given to operations in the case with the highest risk of erroneous write failures where "the memory cell MC4 remains turned on at the beginning of charging the word line". In the case where "the memory cell MC4 remains turned off at the beginning of charging the word line", the use of the comparative examples may achieve data writing with a high reliability, and even the use of the later-described embodiments of the present invention can achieve data writing with a reliability equivalent to or more than when the prior art or the comparative example is employed.

Write Pulse Applying of First Embodiment of the Invention

Figure 16:
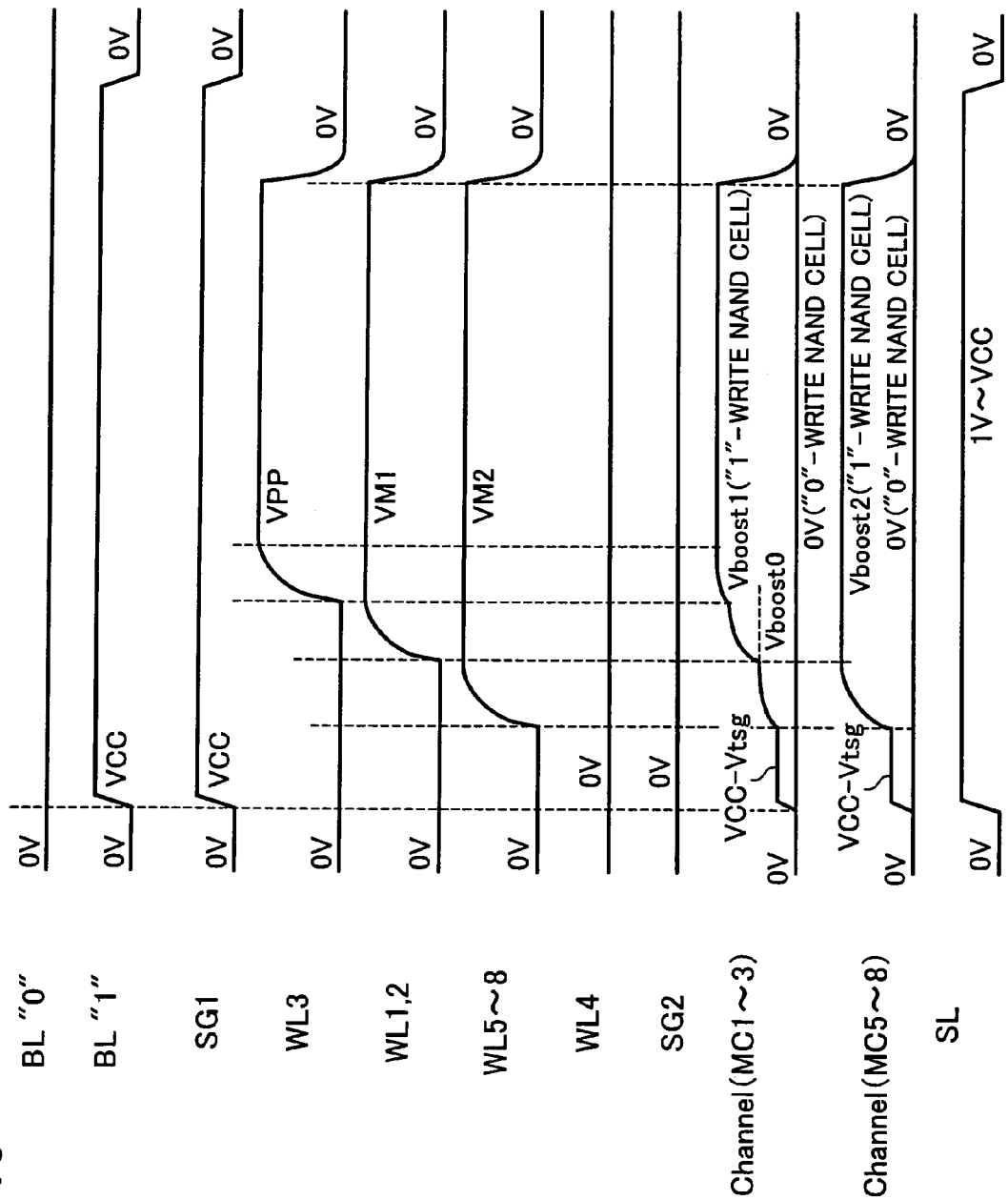
FIG. 16 is a timing chart illustrating write pulse applying to an NAND cell according to a first embodiment of the present invention.

FIG. 16 shows a timing chart of write pulse applying to the NAND cell according to the first embodiment of the present invention.

FIG. 16 differs from FIG. 15 in the timing of charging WL1, 2, 3, 5-8 with the beginning of charging WL1, 2 after the completion of charging WL5-8 and the beginning of charging WL3 after the completion of charging WL1, 2. In this case, even if the memory cell MC4 remains turned on before the beginning of charging WL, capacitive coupling boosts the voltage at the channel region in the memory cell MC4 on charging WL5-8 to turn off the memory cell MC4 before the beginning of charging WL1, 2. Thus, on charging WL1, 2 from 0 V to VM1 and on charging WL3 from 0 V to VPP, the memory cell MC4 always remains turned off to satisfy the following relation:

$$V_{boost1} = V_{boost0} + \alpha \times (VPP + 2 \times VM)/3$$

where $V_{boost0}$ denotes the voltage at the channel region in the memory cell MC4 when the memory cell MC4 turns off; and $V_{boost0} > VCC - V_{tsg}$. The value of $V_{boost1}$ is higher than $V_{boost}$ and $V_{boost1}$ in the prior art and the comparative example. Thus, the operating method shown in FIG. 16 can be employed to greatly lower the risk of erroneous write failure over the prior art and the comparative example.

As described above, in the operation of FIG. 16, the memory cell MC4 remains turned off at the beginning of charging the word lines WL1-3 to VPP, VM. Therefore, the effect of channel voltage elevation due to the capacitive coupling between the word line and the channel region on charging the word lines WL1-3 to VPP, VM is all limited within the channel regions of the memory cells MC1-3. Thus, the voltage of $V_{boost1}$ can be elevated higher than the prior art and the comparative example 1.

Write Pulse Applying of Second Embodiment of the Invention

Figure 17:
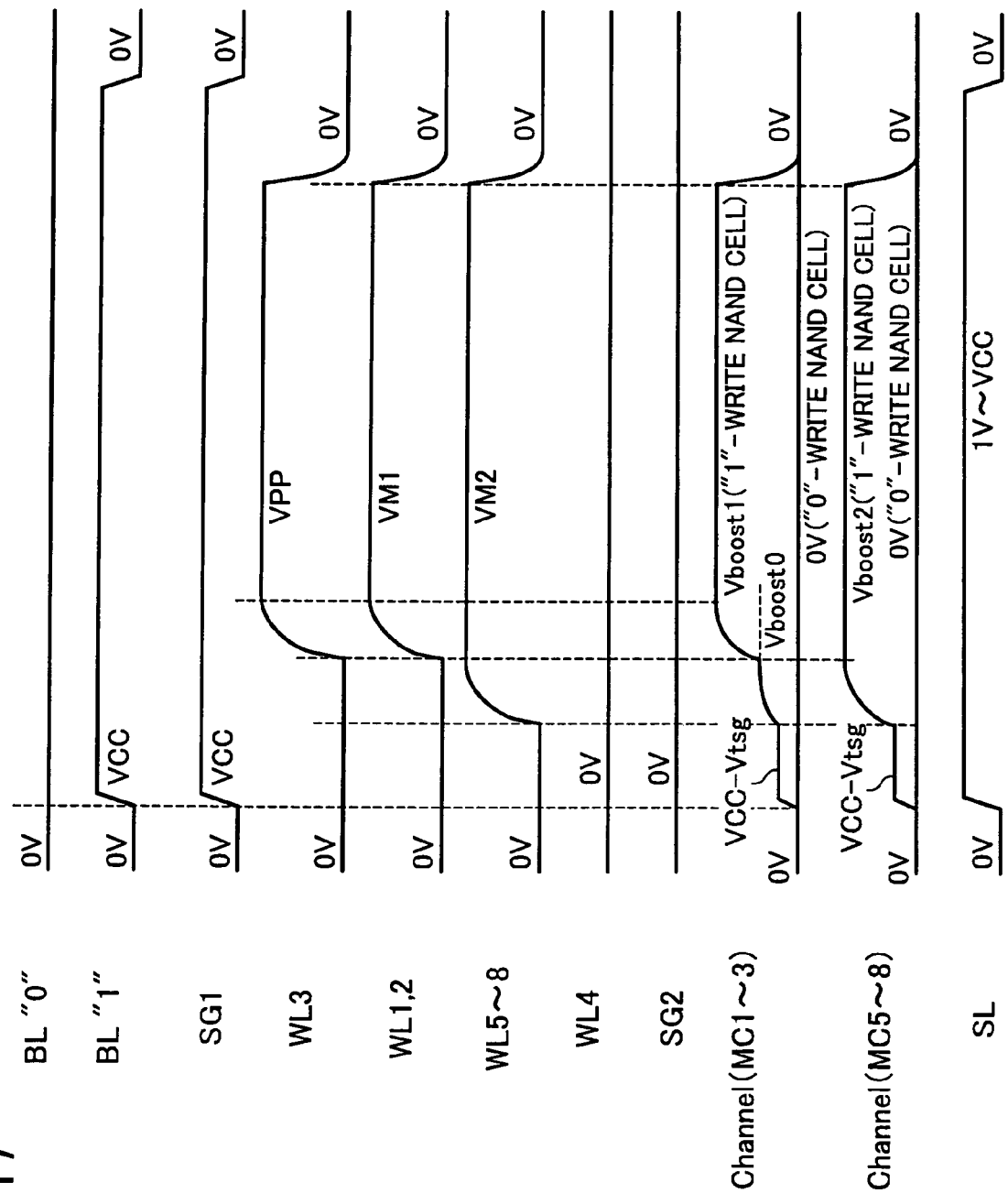
FIG. 17 is a timing chart illustrating write pulse applying to an NAND cell according to a second embodiment of the present invention.

FIG. 17 shows a timing chart of write pulse applying to the NAND cell according to the second embodiment of the present invention.

The write pulse applying of FIG. 17 differs from FIG. 16 in that the timing of charging WL1, WL2 from 0 V to VM1 is same as the timing of charging WL3 from 0 V to VPP. In the operation of FIG. 17 like in the operation of FIG. 16, even when the memory cell MC4 remains turned on before the beginning of charging WL, capacitive coupling on charging WL5-8 boosts the voltage at the channel region of the memory cell MC4. Therefore, the memory cell MC4 turns off before the beginning of charging WL1-3. Thus, on charging WL1, WL2 from 0 V to VM1 and on charging WL3 from 0 V to VPP, the memory cell MC4 always remains turned off. Accordingly, the same value of $V_{boost1}$ as that in the operation of FIG. 16 can be achieved. Thus, the operating method of FIG. 17 can be employed to greatly lower the risk of erroneous write failure over the prior art and the comparative example.

The operation of FIG. 17 is compared with "FIG. 12 and FIG. 13 in the patent publication 1 (JP-A 10-283788)" below.

In "FIG. 12 and FIG. 13 in the patent publication 1", on charging word lines from 0 V to 3 V or 6 V, the selected word line and non-selected word lines (except for a word line adjacent to the source-line side of the selected word) are all charged at the same timing. In this case, the timing of charging from 3 V and 6 V to VPP and VM is earlier on "word lines closer to the source line than the word line adjacent to the source-line side of the selected word line" compared to "the selected word line and word lines closer to the bit line contact than the selected word line". In this operation, if the memory cell MC4 remains turned on at the beginning of charging word lines (the beginning of charging from 0 V to 3 V, 6 V), WL1-3 have been already charged to positive voltages when the memory cell MC4 turns off.

On the other hand, in the operation of "FIG. 16 and FIG. 17 in the present specification", WL1-3 are still at 0 V when the memory cell MC4 turns off, and then they are charged to VPP, VM.

In this case, an increased amount of the voltage on WL1-3 after the memory cell MC4 turns off is larger in the operation of "FIG. 16 and FIG. 17 in the present specification" than "FIG. 12 and FIG. 13 in the patent publication 1". Accordingly, the boosted amount of the voltage at the channel region in the memory cell MC3 due to the increase in the voltage on WL1-3 after the memory cell MC4 turns off is also larger in the operation of "FIG. 16 and FIG. 17 in the present specification" than "FIG. 12 and FIG. 13 in the patent publication 1". Therefore, the operation of "FIG. 16 and FIG. 17 in the present specification" can improve the reliability against erroneous write failures more than "FIG. 12 and FIG. 13 in the patent publication 1".

Write Pulse Applying of Third Embodiment of the Invention

Figure 18:
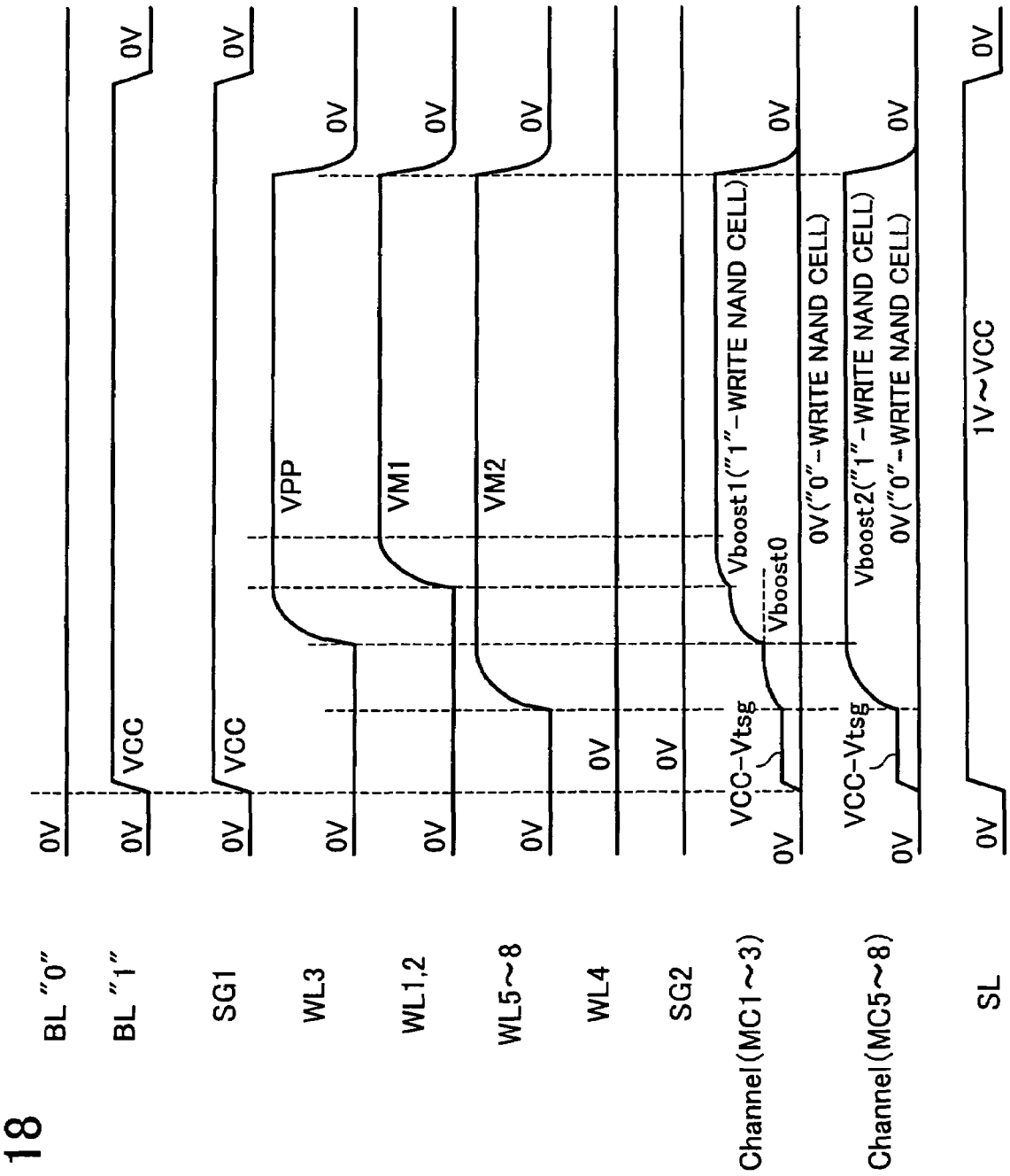
FIG. 18 is a timing chart illustrating write pulse applying to an NAND cell according to a third embodiment of the present invention.

FIG. 18 shows a timing chart of write pulse applying to the NAND cell according to the third embodiment of the present invention.

The write pulse applying of FIG. 18 differs from FIGS. 16 and 17 in that the timing of charging WL1, WL2 from 0 V to VM1 is earlier than the timing of charging WL3 from 0 V to VPP. In the operation of FIG. 18 like in the operations of FIGS. 16 and 17, even when the memory cell MC4 remains turned on before the beginning of charging WL, capacitive coupling on charging WL5-8 boosts the voltage at the channel region of the memory cell MC4. Therefore, the memory cell MC4 turns off immediately before charging WL3. Thus, at the beginning of charging WL3 from 0 V to VPP and at the beginning of charging WL1, WL2 from 0 V to VM1, the memory cell MC4 remains turned off. Accordingly, the same value of $V_{boost1}$ as those in the operations of FIGS. 16 and 17 can be achieved. Thus, the operating method of FIG. 18 can be employed to greatly lower the risk of erroneous write failure over the prior art and the comparative example.

Write Pulse Applying of Fourth Embodiment of the Invention

Figure 19:
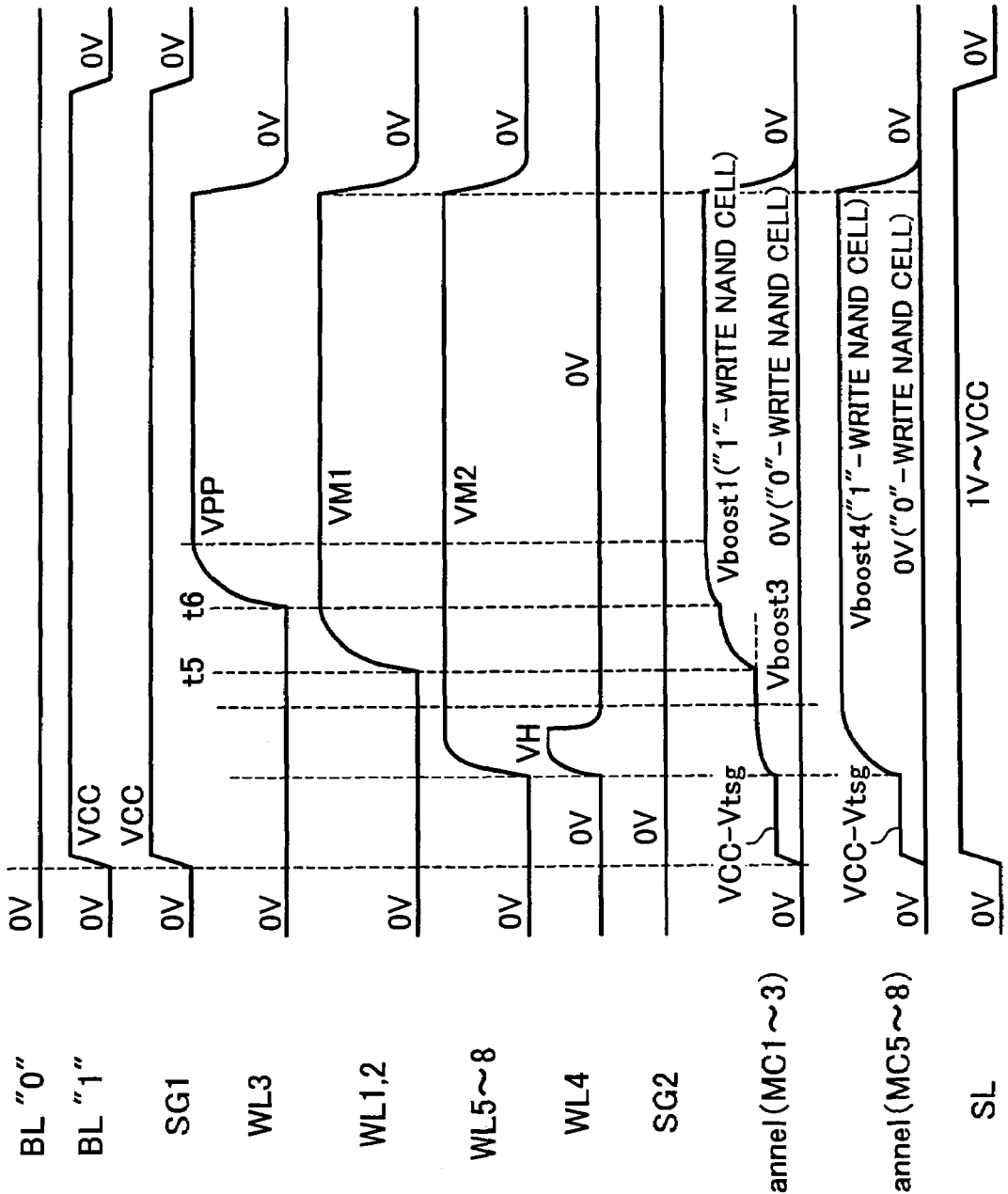
FIG. 19 is a timing chart illustrating write pulse applying to an NAND cell according to a fourth embodiment of the present invention.

FIG. 19 shows a timing chart of writing in the NAND cell applying according to the fourth embodiment of the present invention. In the fourth embodiment, on "1" writing in the memory cell MC3, the operation of FIG. 16 with the beginning of charging the word lines WL1-3 after the completion of charging WL5-8 is performed. Additionally, WL4 is boosted from 0 V to VH on charging WL5-8 and then WL4 is returned to 0 V before the beginning of charging WL1-3. This operation can elevate $V_{boost1}$ higher for the reason described below.

In the operation of FIG. 16, the voltage $V_{boost0}$ at the channel in the selected memory cell MC3 at the beginning of charging WL1, WL2 is determined from the threshold voltage of the memory cell MC4. If the threshold voltage of the memory cell MC4 is positive, MC4 always remains turned off during the write pulse applying, resulting in $V_{boost0}=VCC-V_{tsg}$, and generally $V_{boost0}=VCC-V_{tsg}<V_{boost2}$. If the threshold voltage of the memory cell MC4 is negative, $V_{boost0}$ is set to the higher one of "the maximum value of the voltage transmittable through MC4 in the state of WL4=0 V" and "VCC-$V_{tsg}$", and $V_{boost0}<V_{boost2}$ in this case.

In the operation of FIG. 19, WL4 is kept at VH at the completion of charging WL5-8, and thus current flows from the channel regions of the memory cells MC5-8 to the channel regions of the memory cells MC1-3.

If the VH level is sufficiently high in voltage, the channel region in the memory cell MC4 always remains turned on while WL4 is kept at the VH voltage. As a result, the channel regions in the memory cells MC1-8 are brought into conduction to average the channel regions in the memory cells MC1-8. Subsequently, also after WL4 turns from VH to 0 V, the channel regions in the memory cells MC1-3 and the channel regions in the memory cells MC5-8 have the same potential, resulting in $V_{boost3}=V_{boost4}$. In this case, $V_{boost3}$ corresponds to an averaged voltage of $V_{boost0}$ (in FIG. 16) and $V_{boost2}$ (in FIG. 16), and generally $V_{boost0}<V_{boost3}=V_{boost4}<V_{boost2}$.

If the VH level is not sufficiently high, the memory cell MC4 turns off after current flows from the channel regions of the memory cells MC5-8 to the channel regions of the memory cells MC1-3 when WL4 is kept at the VH voltage. Also in this case, as current flows from the channel regions of the memory cells MC5-8 to the channel regions of the memory cells MC1-3 when WL4 is kept at the VH voltage. Therefore, the voltage at the channel regions in the memory cells MC1-3 immediately before the beginning of charging WL1-3 can be set higher than when WL4 is fixed at 0 V, resulting in $V_{boost0}<V_{boost3}$. If "the VH level is sufficiently high in voltage", it is possible to elevate the voltage of $V_{boost3}$ higher than when "the VH level is not sufficiently high". This characteristic is advantageous to further lower the risk of erroneous write failures. This reason is given below. When "the VH level is sufficiently high in voltage", it is possible to increase the amount of the current flowing from the channel regions of the memory cells MC5-8 to the channel regions of the memory cells MC1-3 when WL4 is given the VH voltage.

As described above, $V_{boost0}<V_{boost3}$ is found from a comparison of FIG. 19 with FIG. 16, the voltage at the channel regions in the memory cells MC1-3 immediately before the beginning of charging WL1-3 is always higher in the operation of FIG. 19 than in the operation of FIG. 16. Therefore, the voltage $V_{boost1}$ at the channel region in the memory cell MC3 after charging WL1-3 can be also higher in the operation of FIG. 19. Thus, the operation of FIG. 19 can be employed to improve the reliability against erroneous write failures.

Write Pulse Applying of Fifth Embodiment of the Invention

Figure 20:
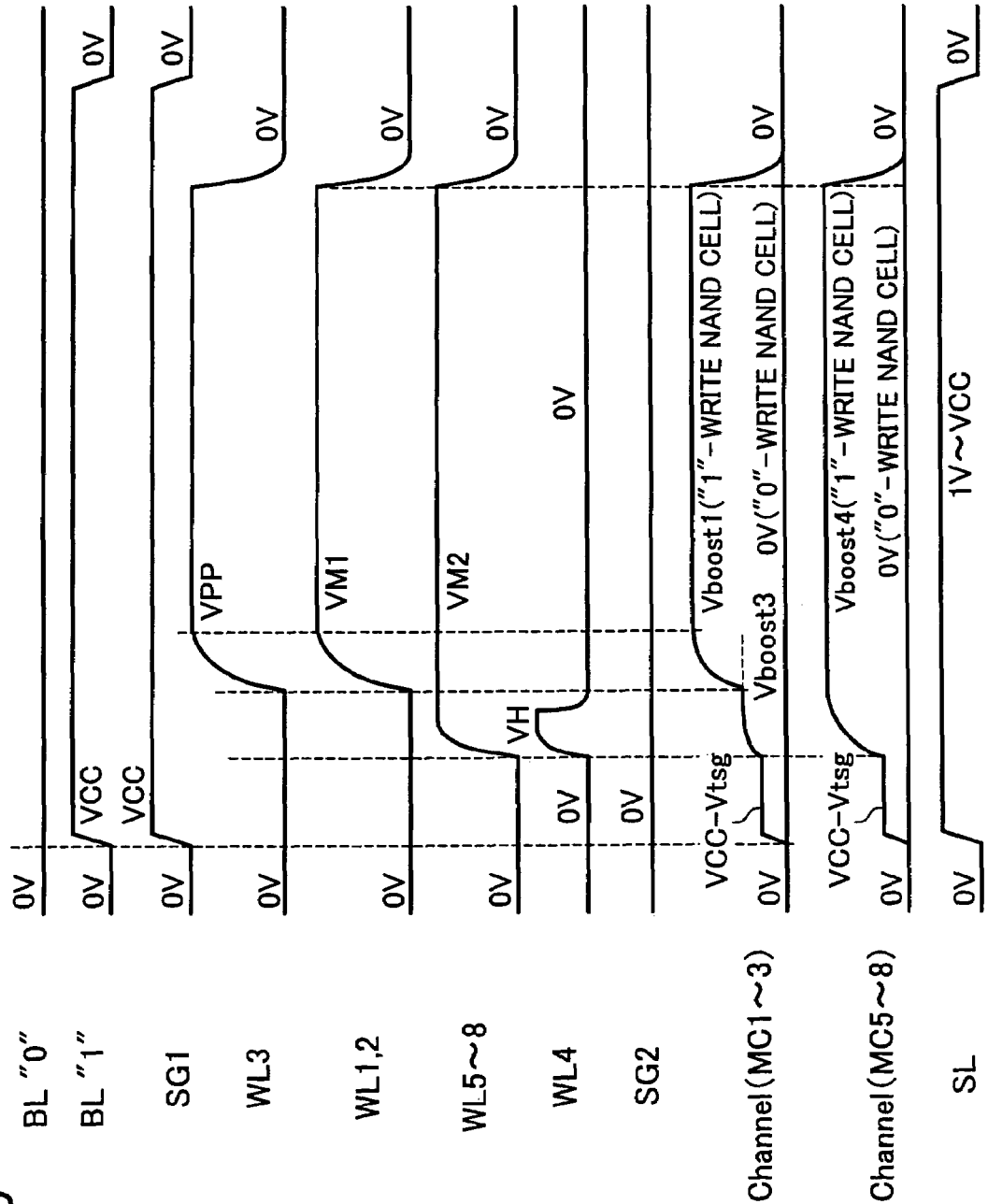
FIG. 20 is a timing chart illustrating write pulse applying to an NAND cell according to a fifth embodiment of the present invention.

FIG. 20 is a timing chart of writing in the NAND cell according to the fifth embodiment of the present invention. The operation of FIG. 20 is altered from the operation of FIG. 19 in that the beginning of charging WL1, WL2 from 0 V to VM1 is equal in timing to the beginning of charging WL3 from 0 V to VPP. Like in the case of FIG. 19, in the operation of FIG. 20, charging WL5-8 is started and WL4 is changed as 0 V→VH→0 V before the beginning of charging WL1-3. Therefore, the voltage immediately before the beginning of charging WL1-3 can be set to the same level as in the operation of FIG. 19. Thus, the operation of FIG. 20 can be employed to improve the reliability against erroneous write failures to the same extent as is achieved with the use of the operation of FIG. 19.

Write Pulse Applying of Sixth Embodiment of the Invention

Figure 21:
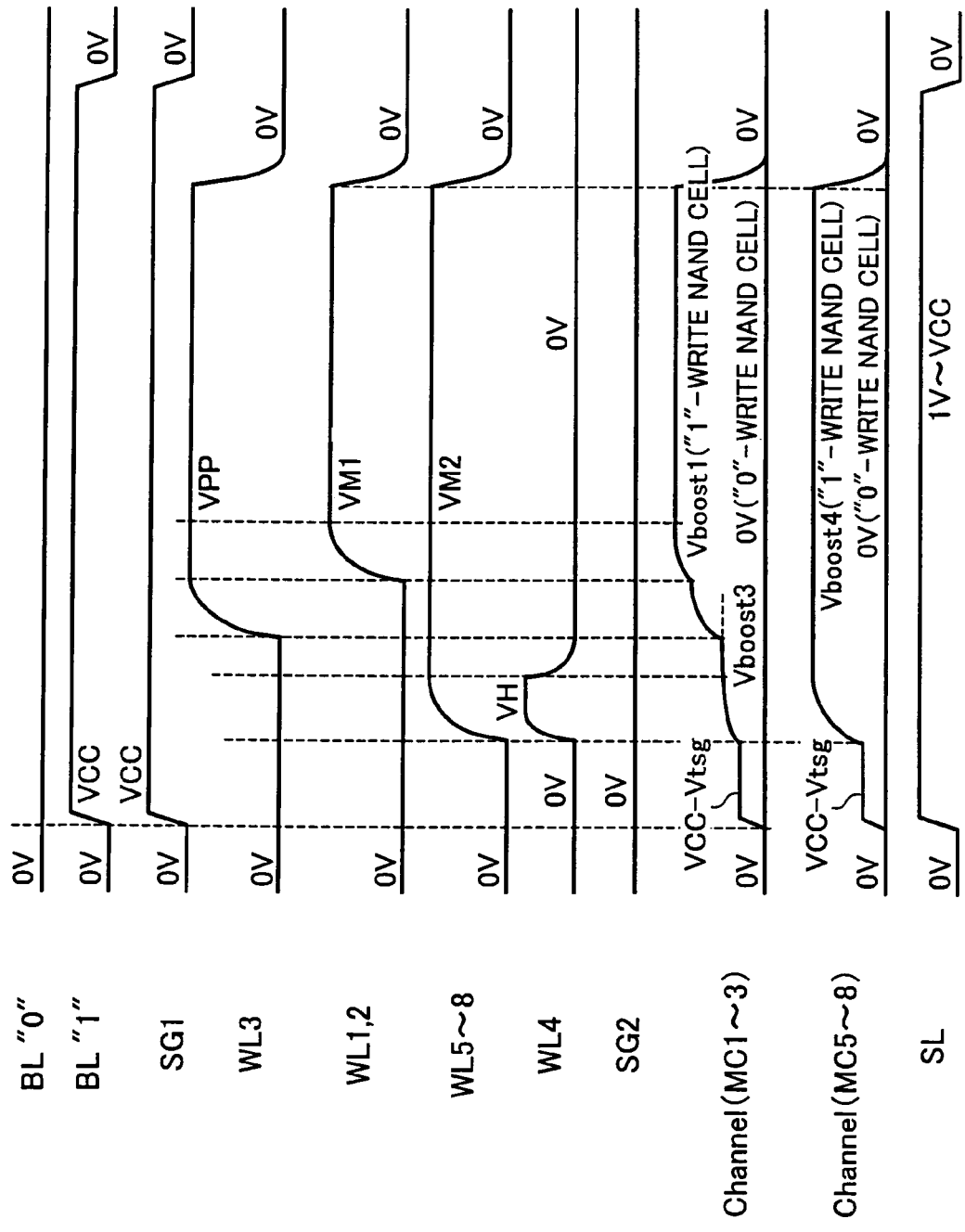
FIG. 21 is a timing chart illustrating write pulse applying to an NAND cell according to a sixth embodiment of the present invention.

FIG. 21 is a timing chart of writing in the NAND cell according to the sixth embodiment of the present invention. The operation of FIG. 21 is altered from the operation of FIG. 19 in that the beginning of charging WL3 from 0 V to VPP is earlier in timing than the beginning of charging WL1, WL2 from 0 V to VM1. Like in the cases of FIGS. 19 and 20, also in the operation of FIG. 21, charging WL5-8 is started and WL4 is changed as 0 V→VH→0 V before the beginning of charging WL1-3. Therefore, the voltage immediately before the beginning of charging WL1-3 can be set to the same level as in the operations of FIGS. 19 and 20. Thus, the operation of FIG. 21 can be employed to improve the reliability against erroneous write failures to the same extent as is achieved with the use of the operations of FIGS. 19 and 20.

Write Pulse Applying of Seventh Embodiment of the Invention

Figure 22:
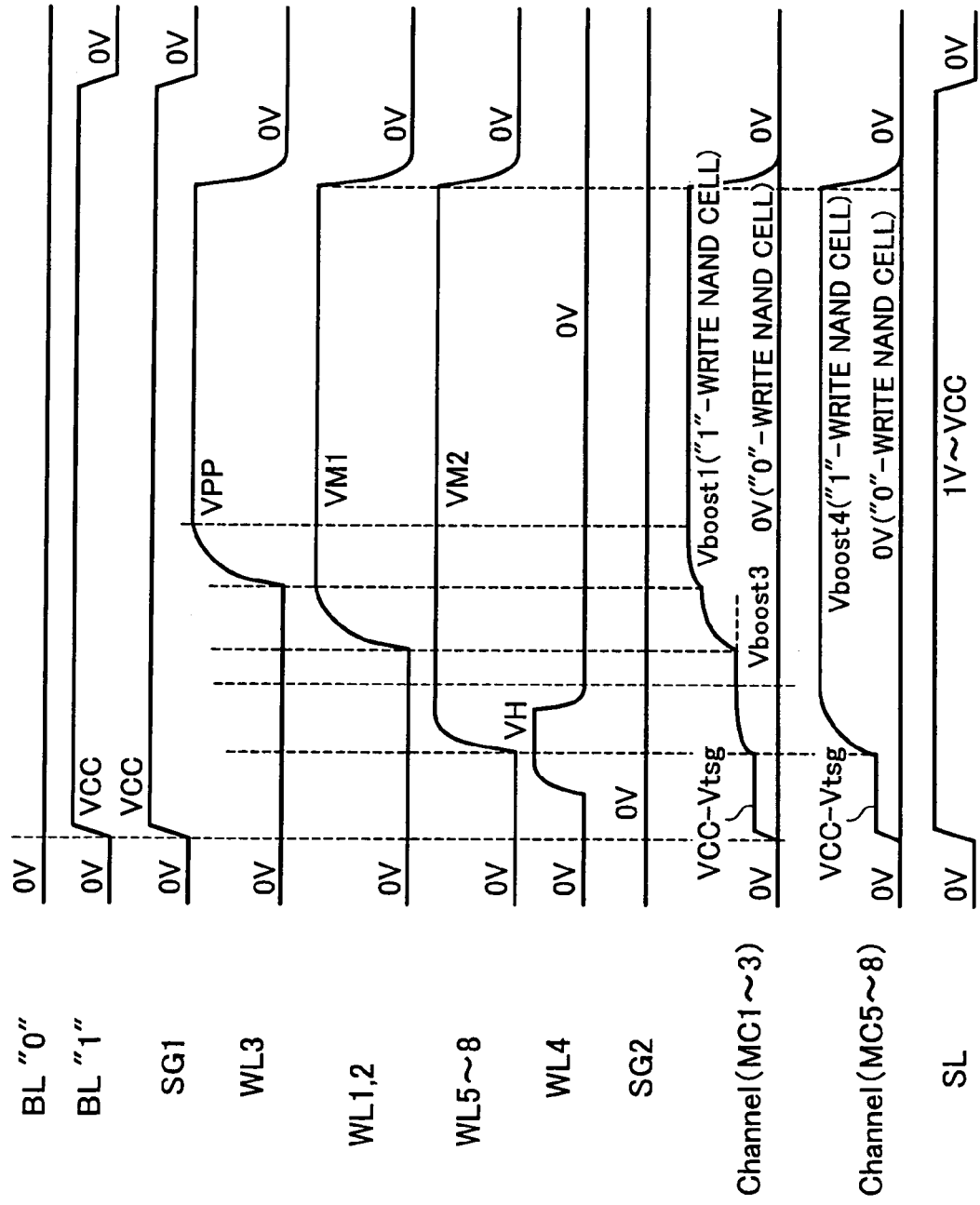
FIG. 22 is a timing chart illustrating write pulse applying to an NAND cell according to a seventh embodiment of the present invention.

FIG. 22 is a timing chart of writing in the NAND cell according to the seventh embodiment of the present invention. The operation of FIG. 22 is different from the operation of FIG. 19 only in timing of the beginning of charging WL4 from 0 V to VH. Even if the beginning of charging WL4 from 0 V to VH is determined earlier in timing than the operation of FIG. 19, as shown in FIG. 22, charging WL5-8 is started and WL4 is changed as 0V→VH→0V before the beginning of charging WL1-3. Therefore, the voltage immediately before the beginning of charging WL1-3 can be set to the same level as in the operations of FIG. 19-21 to improve the reliability against erroneous write failures.

Write Pulse Applying of Eighth Embodiment of the Invention

Figure 23:
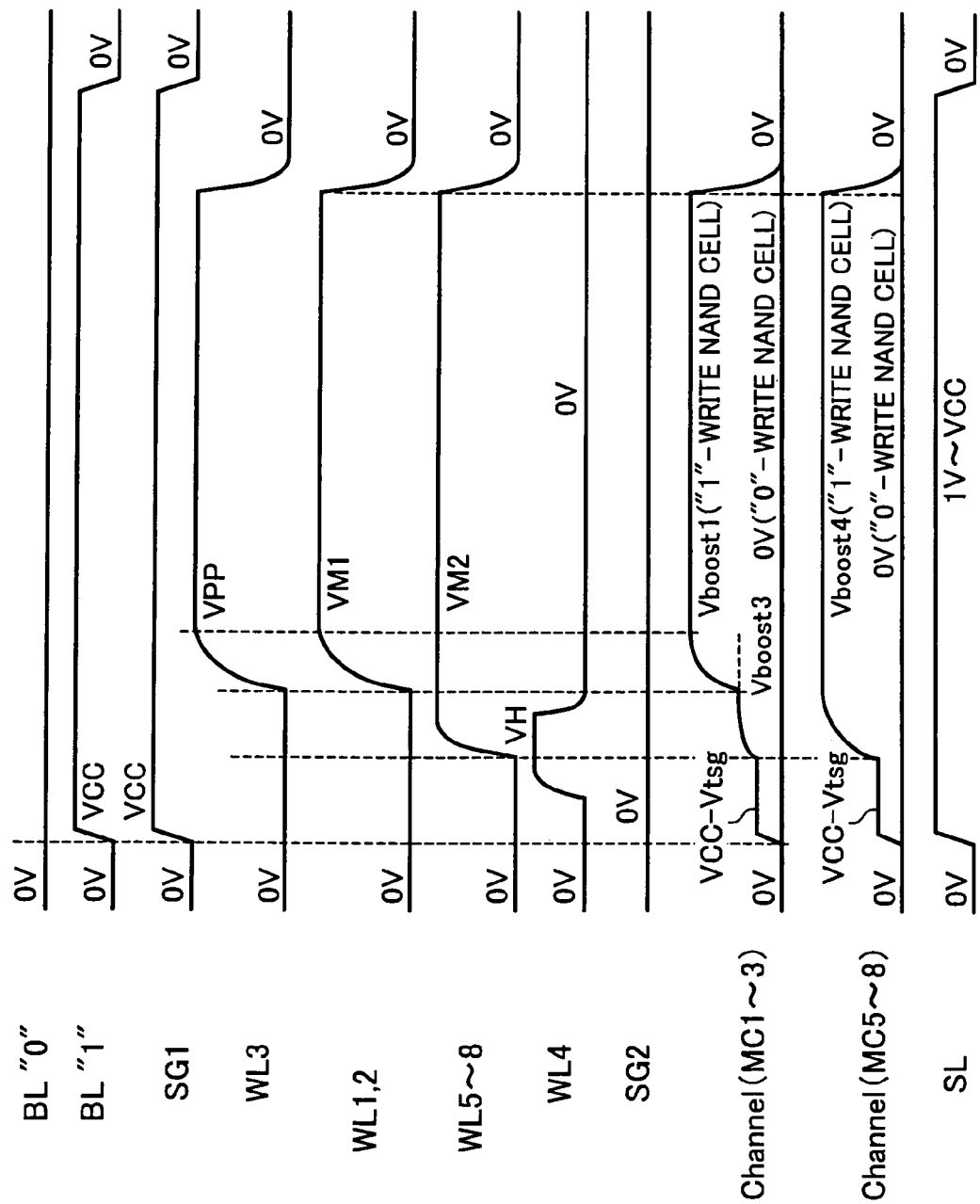
FIG. 23 is a timing chart illustrating write pulse applying to an NAND cell according to an eighth embodiment of the present invention.

FIG. 23 is a timing chart of writing in the NAND cell according to the eighth embodiment of the present invention. The operation of FIG. 23 is altered from the operation of FIG. 20 only in timing of the beginning of charging WL4 from 0 V to VH. Even if the beginning of charging WL4 from 0 V to VH is determined earlier in timing than the operation of FIG. 20, as shown in FIG. 23, charging WL5-8 is started and WL4 is changed as 0 V→VH→0 V before the beginning of charging WL1-3. Therefore, the voltage immediately before the beginning of charging WL1-3 can be set to the same level as in the operations of FIG. 19-22 to improve the reliability against erroneous write failures.

Write Pulse Applying of Ninth Embodiment of the Invention

Figure 24:
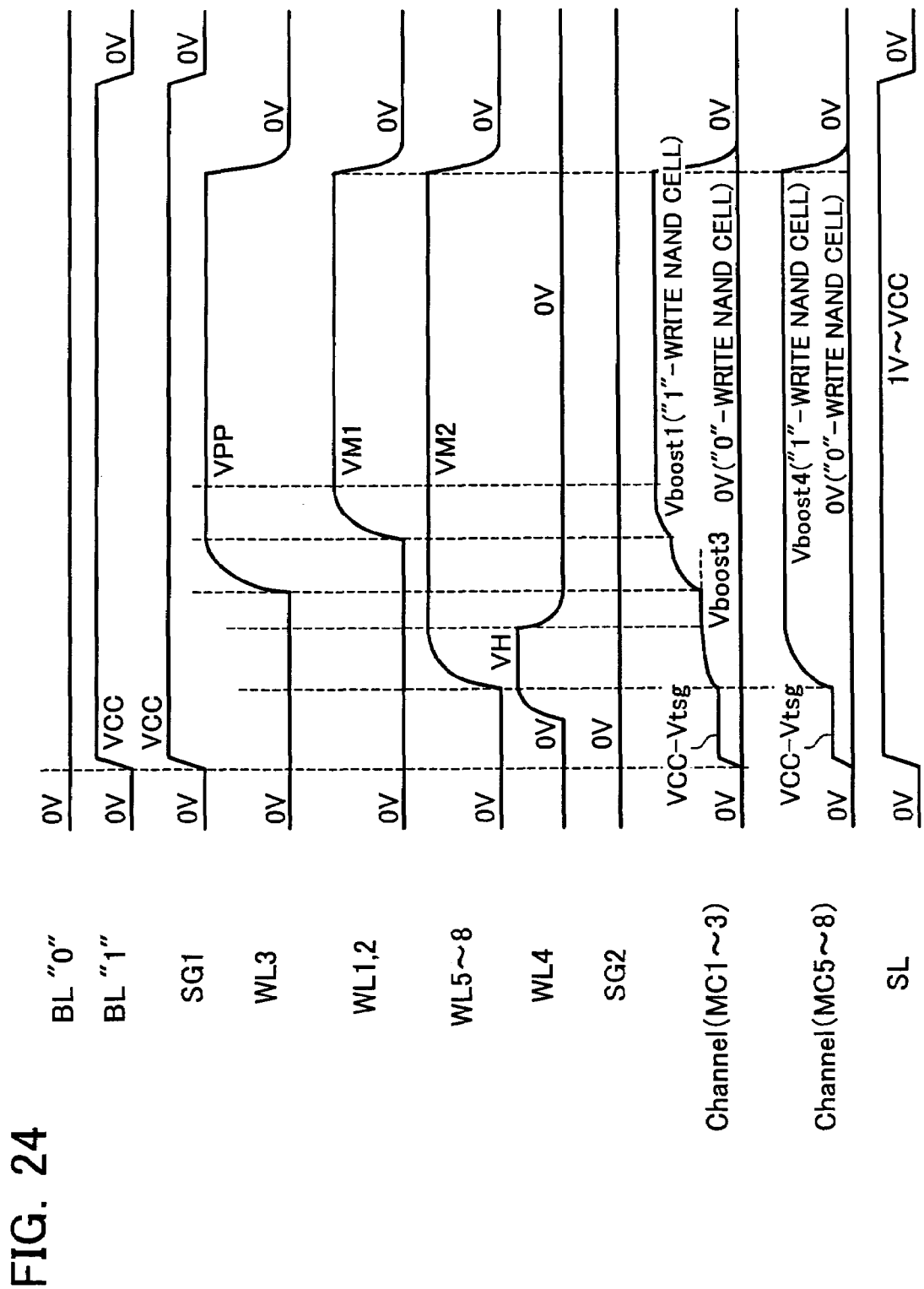
FIG. 24 is a timing chart illustrating write pulse applying to an NAND cell according to a ninth embodiment of the present invention.

FIG. 24 is a timing chart of writing in the NAND cell according to the ninth embodiment of the present invention. The operation of FIG. 24 is different from the operation of FIG. 21 only in timing of the beginning of charging WL4 from 0 V to VH. Even if the beginning of charging WL4 from 0 V to VH is determined earlier in timing than the operation of FIG. 21 as shown in FIG. 24, charging WL5-8 is started and WL4 is changed as 0 V→VH→0 V before the beginning of charging WL1-3. Therefore, the voltage immediately before the beginning of charging WL1-3 can be set to the same level as in the operations of FIG. 19-23 to improve the reliability against erroneous write failures.

Alternatives of the Embodiments

The present invention has been described above with reference to the embodiments though it is not limited to these embodiments but rather can be modified variously. The following description is given to alternatives (1)-(10).

(1) The operations of write pulse applying in the above described various embodiments of the present invention include the operation of changing WL4 as 0V→VH→0V. In this operation, as an exemplary circuit for generating the voltage of VH, a VREAD generator may be employed for the voltage on non-selected word lines in the NAND cell selected for reading. In this case, the VREAD voltage generator can also serve as the VH voltage generator to reduce the number of circuits and achieve a reduced chip area and a simplified circuit design. If a circuit for generating a voltage different from VREAD is employed to generate the voltage on the selection gate line SG1 or SG2 in the NAND cell selected for reading, a VSG1/VSG2 voltage generator can also serve as the VH voltage generator. This is effective to reduce the number of circuits and achieve a reduced chip area and a simplified circuit design. The setting of VH=Supply Voltage easily simplifies the VH voltage generator to reduce the number of circuits and achieve a reduced chip area and a simplified circuit design as well.

(2) In the timing chart of write pulse applying in the above described embodiments, the present invention has been described on the example of charging WL1, WL2 to VM1 and charging WL5-8 to VM2 though it is not limited to these embodiments but rather can be modified variously.

For example, VM1 and VM2 in the embodiments are effective in both cases of (A) VM1=VM2 and (B) VM1≠VM2. The case of (A) requires only a single circuit for generating VM, which is advantageous to reduce the circuit area more than (B). On the other hand, the case of (B) allows setting of two voltages of VM1 and VM2 freely. Accordingly, it has a higher flexibility of voltage adjustment against erroneous write failures than the case of (A) with a single voltage. This is advantageous to increase the reliability of write pulse applying more than the case of (A). As a product, the case of (A) may be employed when a margin of the reliability is large or when a requirement for the reliability is not particularly high. In contrast, the case of (B) may be employed when a margin of the reliability is small or when a requirement for the reliability is high. Such the consideration is extremely effective.

(3) In the above embodiments, the present invention has been described on the example of charging WL1, WL2 to the same voltage VM1 and charging WL5-8 to the same voltage VM2 (or charging all WL1, 2, 5-8 to VM). It is also effective though to apply the present invention to charging WL1 and WL2 to different voltages, and to charging at least one of WL5-8 to a different voltage from others. Like in the above embodiments, also in these cases, highly reliable operations can be achieved over the prior art and the comparative examples. The present invention is also applied to charging one or more of WL1, 2, 5-8 to a voltage other than the intermediate voltage for writing. Like in the above embodiments, also in this case, the reliability against erroneous write failures can be improved over the prior art and the comparative examples.

(4) In the above embodiments, the beginning of charging WL1-3 is shown as later in timing than the completion of charging WL5-8. If the beginning of charging WL1-3 is earlier in timing than the completion of charging WL5-8 but later than the beginning of charging WL5-8, the charged WL5-8 have already caused the voltage elevation on the memory cell channel at the beginning of charging WL1-3. Accordingly, the possibility of the memory cell MC4 having been turned off at the beginning of charging WL1-3 can be raised higher than the conventional operating method. Therefore, on VPP applying, the channel voltage at the memory cell connected to the selected word line can be elevated higher than the operating methods of the prior art and the comparative examples. Thus, the reliability against erroneous write failures can be improved greatly higher than the prior art and the comparative examples.

(5) In the above-described operation of write pulse applying, the working selection gate SG1 has a charged voltage level of VCC. The present invention is also effective in other cases. For example, the present invention is also effective if the working selection gate SG1 has a charged voltage level below VCC and the threshold voltage of the selection transistor Tr1 (FIG. 1) is equal to $V_{tsg}$ or more. In this case, as the selection transistor Tr1 has a gate voltage lower than before, the leakage current through the selection transistor Tr1 can be reduced in the channel region of the NAND cell that contains a memory cell to be "1"-WRITE. Thus, the risk of voltage drop of $V_{boost1}$ due to the leakage current can be lowered.

(6) In the above-described operation of write pulse applying, the voltage on the bit line BL connected to the NAND cell to be "1"-WRITE is equal to VCC. This voltage may be below VCC and above 0 V, however, if it falls within a range that controllably reduces the leakage current through the selection transistor Tr1 after the beginning of charging word lines in the NAND cell that contains a memory cell to be "1"-WRITE. In such the range, "1"-WRITE has no problem on operation. Accordingly, the voltage on the bit line BL connected to the NAND cell to be "1"-WRITE can be set below VCC and above 0 V. In this case, the voltage applied to the bit line BL for "1" writing may be lowered to reduce power consumption.

(7) The case of the voltage on the selection gate SG1 below VCC and above the threshold voltage $V_{tsg}$ of the selection transistor Tr1 (FIG. 1) may be combined with the case of the voltage on the bit line BL below VCC and above 0 V. This is effective to achieve reduction of the leakage current and power consumption at the same time. In particular, it is possible to easily solve the problem on the leakage current, which is concerned about when the bit line voltage drops.

(8) When the voltage at the channel region is set to $V_{boost1}$, electrons are not injected into the floating gate. This operation has been described as "1" writing but may be defined as "0" writing.

(9) In the operation of write pulse applying in the embodiments, only the word line WL4 adjacent to the source-line side of the selected word line is kept at the ground voltage at the beginning of charging the word lines WL1-3 and on applying VM1, VPP voltage, though it is not always required. For example, two word lines WL4, WL5 may be kept at the ground voltage. As such, the present invention is effective when the ground voltage is applied to a plurality of word lines. For example, if two word lines WL4, WL5 are kept at the ground voltage (in this case WL6-8 are kept at the VM2 voltage), non-continuity can be achieved between the channel regions in the memory cells MC1-3 and the channel regions in the memory cells MC6-8 easier than the above embodiments. Accordingly, the possibility of non-continuity between the channel regions in MC1-3 and the channel regions in MC6-8 can be raised before the beginning of charging WL1-3. Thus, data can be written in this case with a higher reliability than the above embodiments.

(10) In the operation of write pulse applying in the above embodiments, WL4 is kept at the ground voltage at the beginning of charging the word lines WL1-3 and on applying VM1, VPP voltage, though it is not always required. It is possible to set WL4 at a higher voltage than the ground voltage if it can turn off the memory cell MC4 at the beginning of charging WL1-3. Also in this case, the present invention is effective to greatly reduce the risk of erroneous write failures over the prior art. For example, even if WL4 is kept at a voltage other than the ground voltage, such as a "supply voltage" or an "intermediate voltage between the ground voltage and the supply voltage", the present invention is effective to achieve the same effects as those of the above embodiments. As an example of the combination with the case of (9), both WL4 and WL5 are kept at the "supply voltage" or the "intermediate voltage between the ground voltage and the supply voltage". Alternatively, WL4 is kept at the "supply voltage" or the "intermediate voltage between the ground voltage and the supply voltage", and WL5 at the ground voltage. In these cases, the present invention is also effective to achieve the same effects as those of the above embodiments.

FIGS. 25-30 show timing charts illustrating write pulse applying according to the tenth through fifteenth embodiments of the present invention, respectively.

Figure 25:
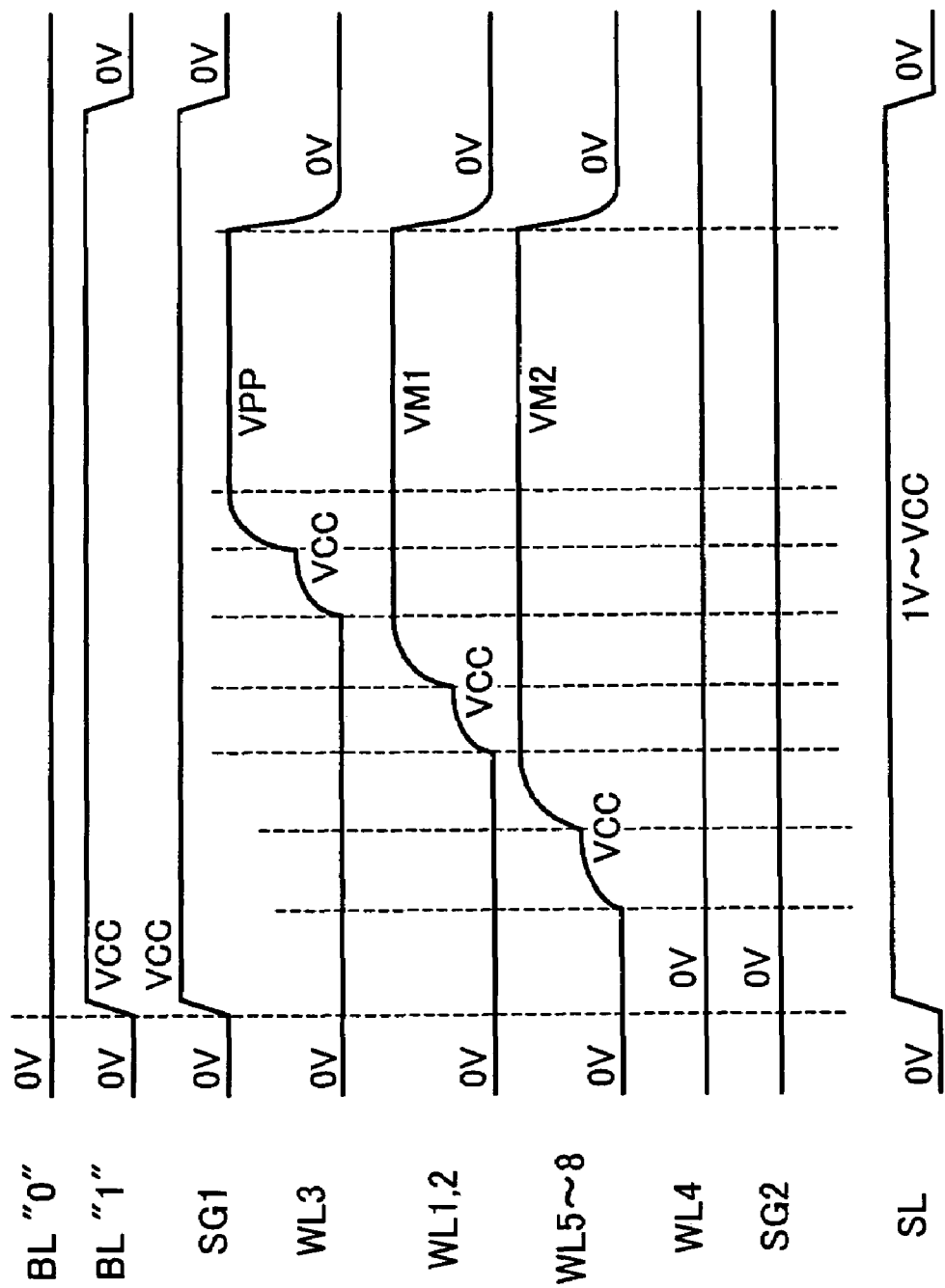
FIG. 25 is a timing chart illustrating write pulse applying to an NAND cell according to a tenth embodiment of the present invention.
Figure 26:
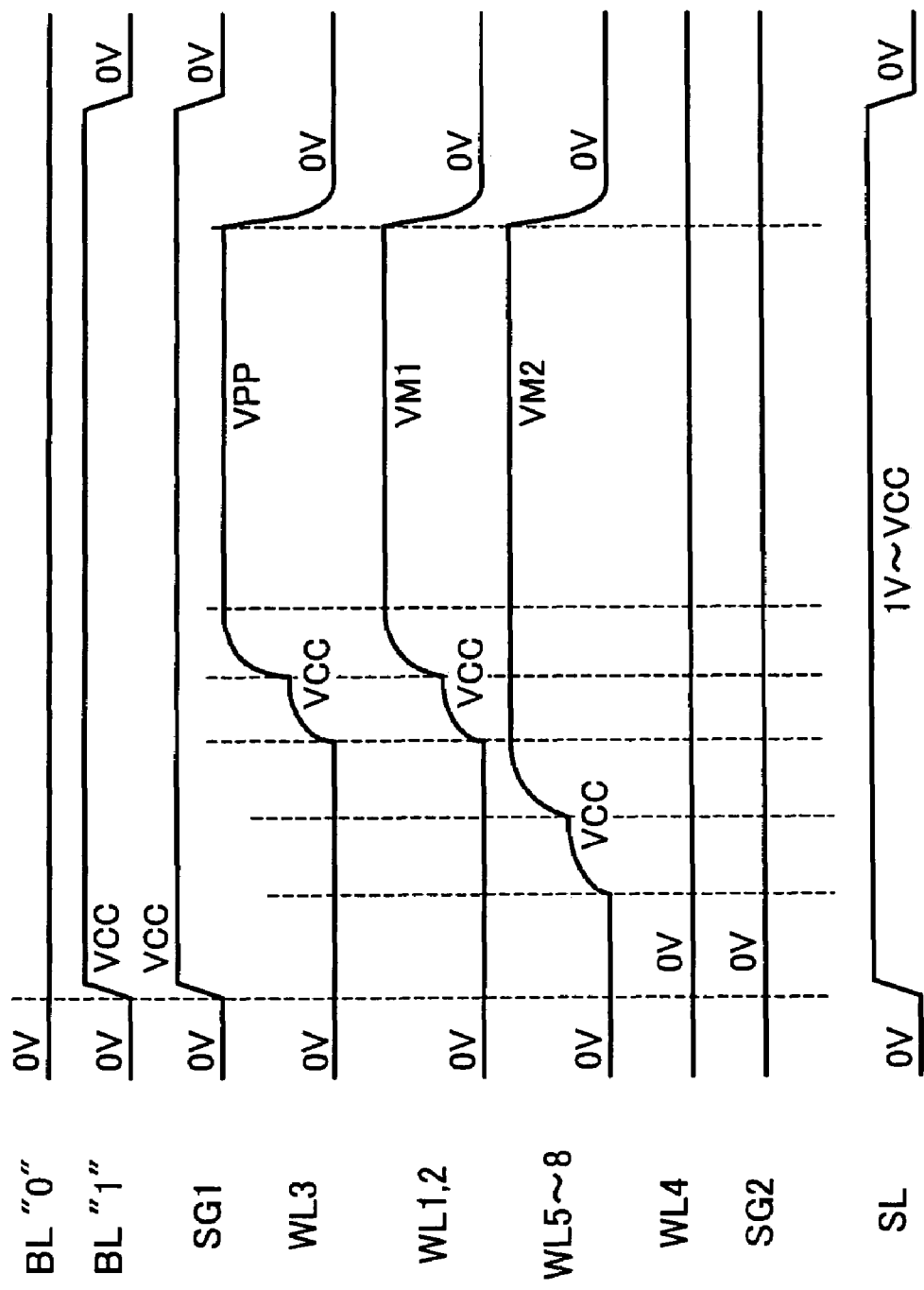
FIG. 26 is a timing chart illustrating write pulse applying to an NAND cell according to an eleventh embodiment of the present invention.
Figure 27:
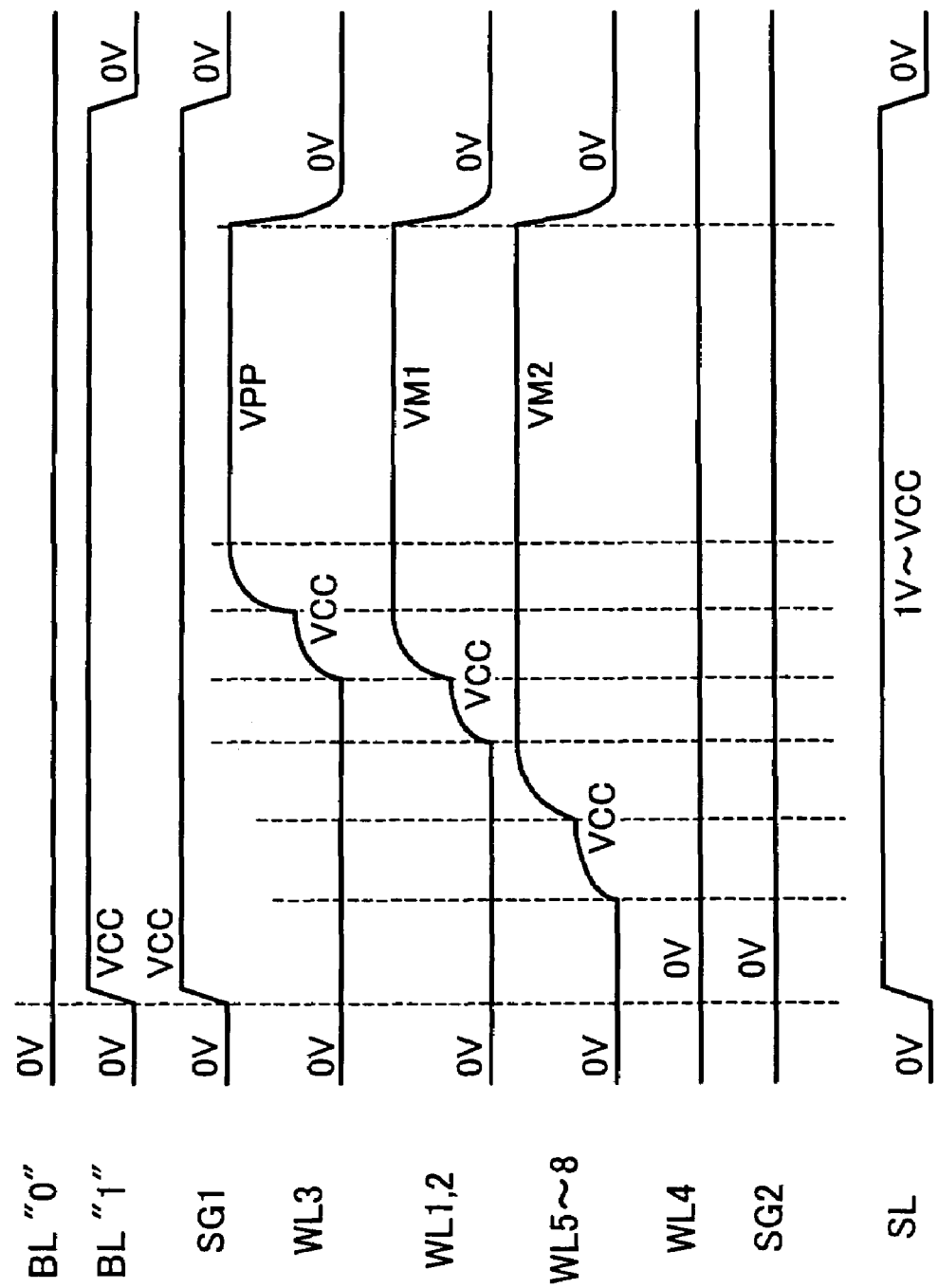
FIG. 27 is a timing chart illustrating write pulse applying to an NAND cell according to a twelfth embodiment of the present invention.

FIGS. 25 and 26 show alternatives of FIGS. 16 and 17, respectively. In operation of word line charging shown in FIGS. 16 and 17, a single charging operation is employed to charge a word line from the ground voltage directly to the high voltage or the intermediate voltage, such as 0 V→VPP, 0 V→VM1, and 0 V→VM2. To the contrary, in FIGS. 25 and 26, a charging operation is once performed as 0V→VCC, and a subsequent charging operation is performed as VCC→VPP, VM1, VM2. After the completion of charging WL5-8 to VM2, charging WL1-3 from 0 V to VM, VPP is started. This operation is similarly found in all FIGS. 16, 17, 25 and 26. In this case, the memory cell MC4 remains turned off at the beginning of charging WL1-3. Therefore, similar to the use of the operation of FIG. 16 or 17, the use of the operation of FIG. 25 or 26 also can achieve data writing with a greatly higher reliability over the prior art. The operation of FIG. 27 is an alternative of the operation of FIG. 16 or 17. Also in the operation of FIG. 27, after the completion of charging WL5-8 to VM2, charging WL1-3 from 0 V to VM, VPP is started. Therefore, similar to FIGS. 25 and 26, the use of FIG. 27 also can achieve data writing with a greatly higher reliability over the prior art and the comparative example.

Figure 28:
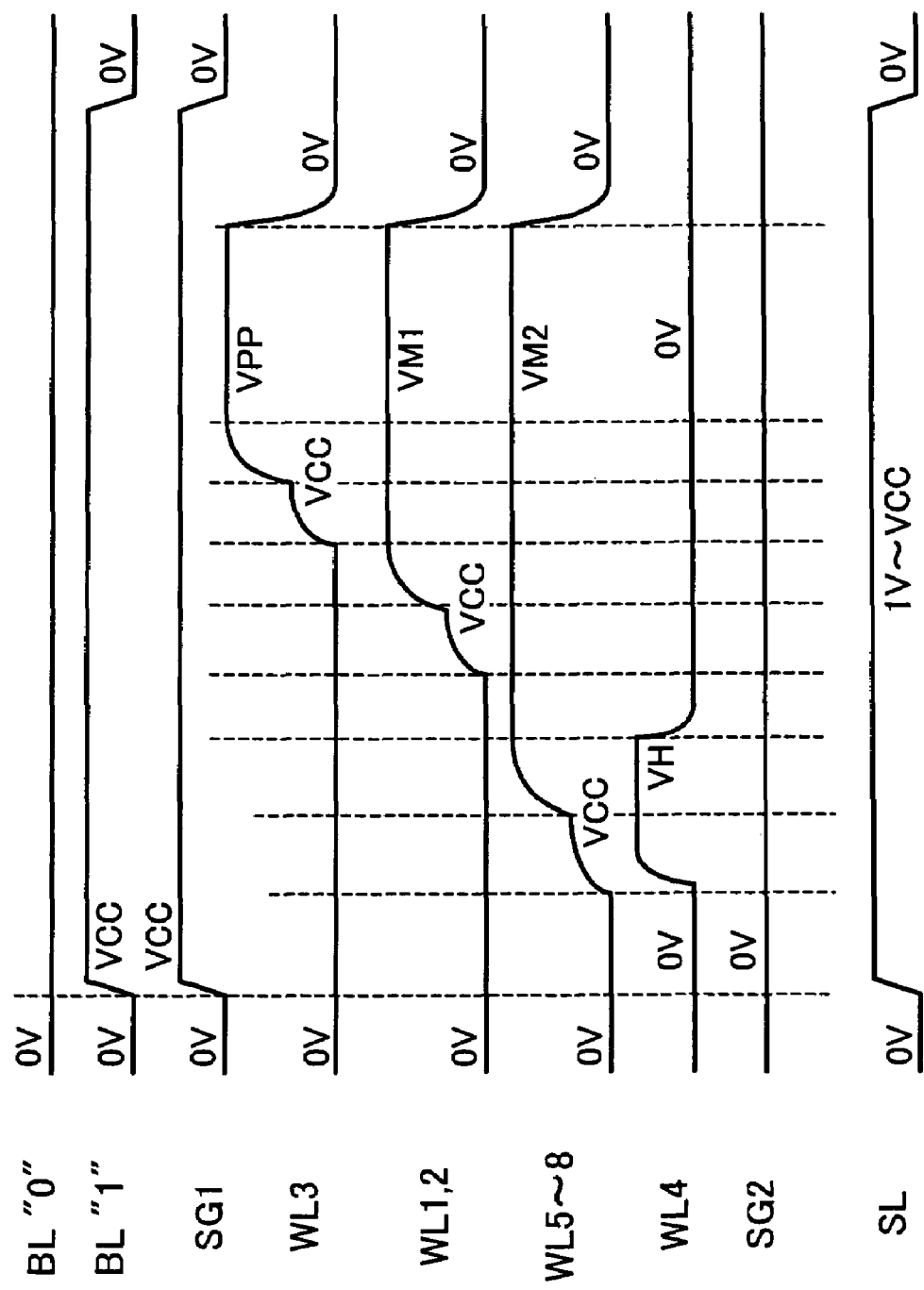
FIG. 28 is a timing chart illustrating write pulse applying to an NAND cell according to a thirteenth embodiment of the present invention.
Figure 29:
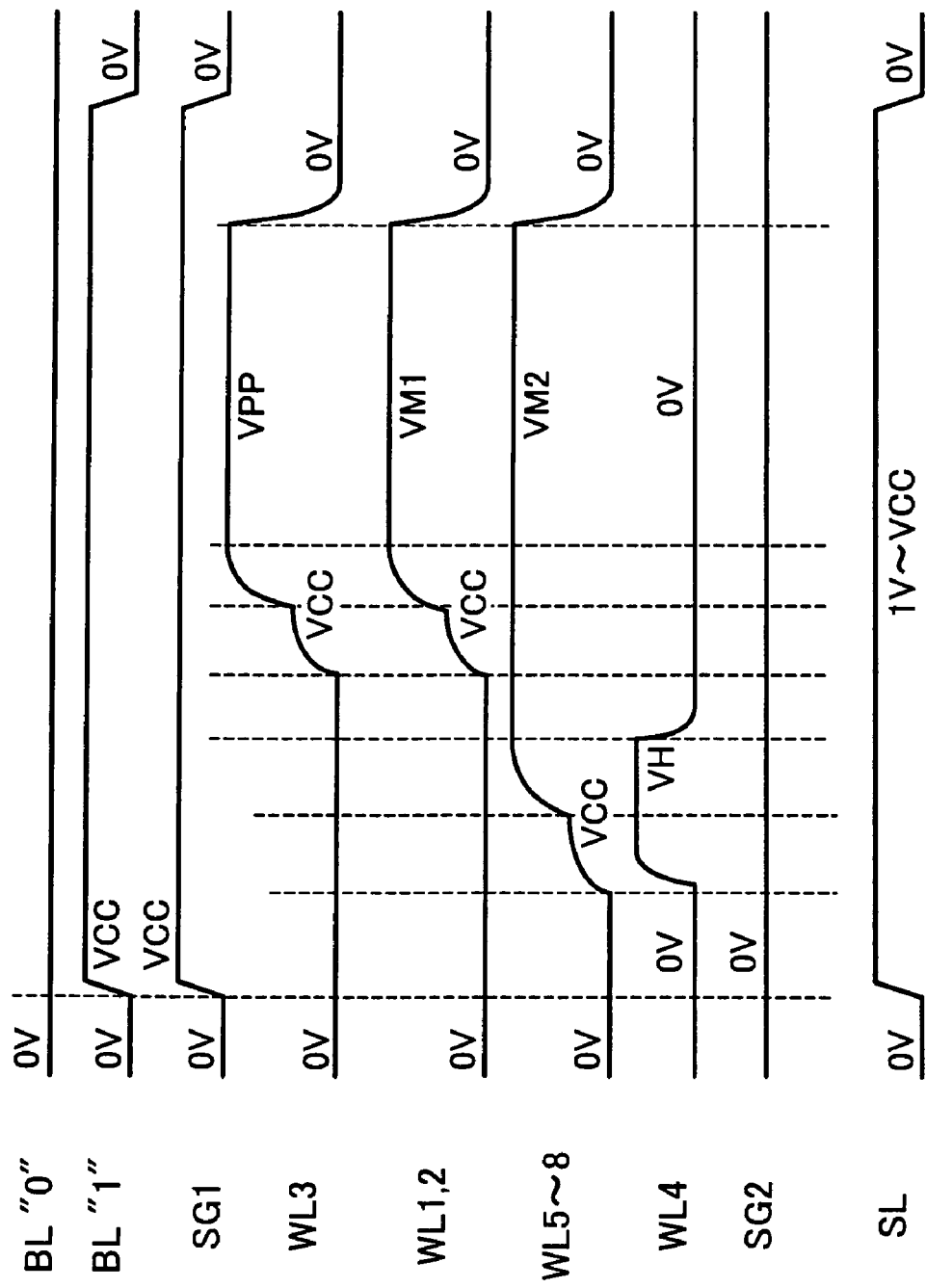
FIG. 29 is a timing chart illustrating write pulse applying to an NAND cell according to a fourteenth embodiment of the present invention.
Figure 30:
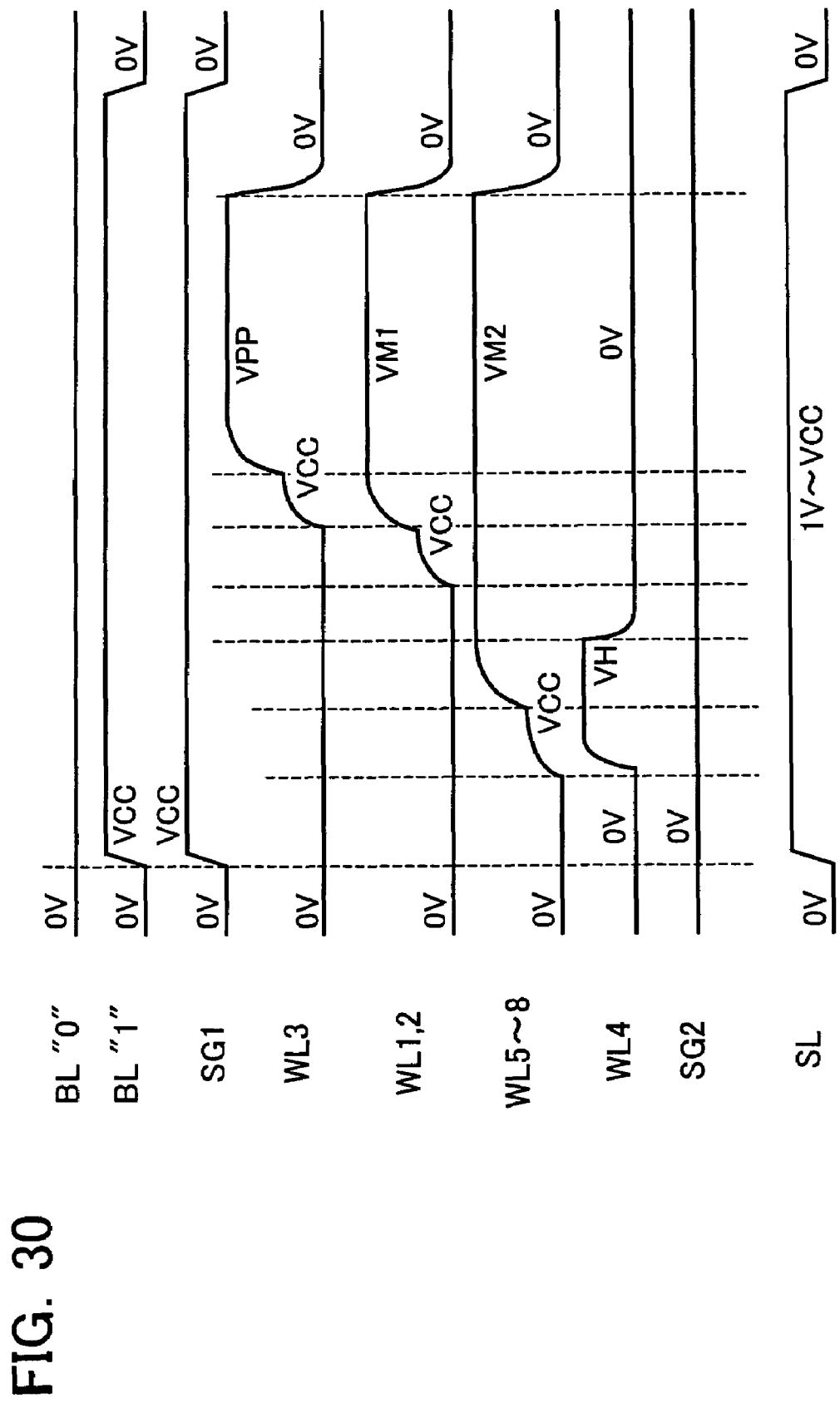
FIG. 30 is a timing chart illustrating write pulse applying to an NAND cell according to a fifteenth embodiment of the present invention.

FIGS. 28 and 29 show alternatives of FIGS. 19 and 20. In operation of word line charging shown in FIGS. 19 and 20, only a single charging operation is employed to charge a word line from the ground voltage to the high voltage or the intermediate voltage, such as 0 V→VPP, 0 V→VM1, and 0 V→VM2. To the contrary, in FIGS. 28 and 29, a charging operation is once performed as 0 V→VCC, and a subsequent charging operation is performed as VCC→VPP, VM1, VM2. After the completion of charging WL5-8 to VM2, charging WL1-3 from 0 V to VM, VPP is started. This operation is similarly found in all FIGS. 19, 20, 28 and 29. Therefore, similar to the use of the operation of FIG. 19 or 20, the use of the operation of FIG. 28 or 29 also can achieve data writing with a greatly higher reliability over the prior art and the comparative example. The operation of FIG. 30 is an alternative of the operation of FIG. 28 or 29. Also in the operation of FIG. 30, after the completion of charging WL5-8 to VM2, charging WL1-3 from 0 V to VM, VPP is started. Therefore, similar to FIGS. 28 and 29, the use of FIG. 30 also can achieve data writing with a greatly higher reliability over the prior art and the comparative example.

As shown in FIGS. 25-30, in operation of word pulse applying, the use of the method of charging word lines once to VCC and then to VM, VPP provides a characteristic that enables a booster to have a reduced area. In general, when a boosted voltage higher than the supply voltage is required in a chip, a booster is employed to generate the boosted voltage. If a word line is charged from the ground voltage directly to the boosted voltage, such as 0 V→VM1, VPP, an increased amount of the word line voltage by the booster is as large as VM1, VPP, requiring an extremely higher booster performance with a resultant larger circuit area. On the other hand, the use of the methods of FIGS. 25-30 requires no booster to charge a word line from 0 V to VCC. Accordingly, an increased amount of the word line voltage by the booster is as small as (VM−VCC), (VPP−VCC), requiring no higher booster performance, resulting in a reduced circuit area of the booster for generating the VM or VPP voltage.

In operation of word pulse applying in the above embodiments, a method of charging a word line from the ground voltage directly to VM, VPP may be employed to omit the operation of charging once to VCC. This characteristic is advantageous to simplify the operation, achieve the circuit design easily, and reduce the logic circuit area.

Preferably, either the method of charging from the ground voltage directly to VM, VPP or the method of charging once to VCC and then to VM, VPP may be selected as the operation of word line charging in word pulse applying, in consideration of the above characteristics in the methods.

Thus, as the operation of word line charging, the present invention is effective at either the case of charging from the ground voltage to VPP, VM through a single operation or the case of charging once to another voltage such as the supply voltage during charging from the ground voltage to VPP, VM. In a word, after completion of VM-charging a word line to be VM-charged among word lines closer to the source line than the selected word line, VM-charging a word line to be VM-charged among word lines closer to the bit line contact than the selected word line and VPP-charging the selected word line are started to achieve highly reliable data writing.

The number of the memory cells contained in the NAND cell (serially connected) in the above embodiments is exemplified as equal to 8. The present invention is though similarly effective to other cases, for example, where the number of the memory cells contained in the NAND cell 1 is equal to 3, 4, 16, 32 or 64, as is in the above embodiments, needless to say.

The present invention has been described with reference to the embodiments though it can be modified variously without departing from the scope and spirit thereof.

3. Description of General Configuration and Circuitry of NAND-Type EEPROM

Figure 31:
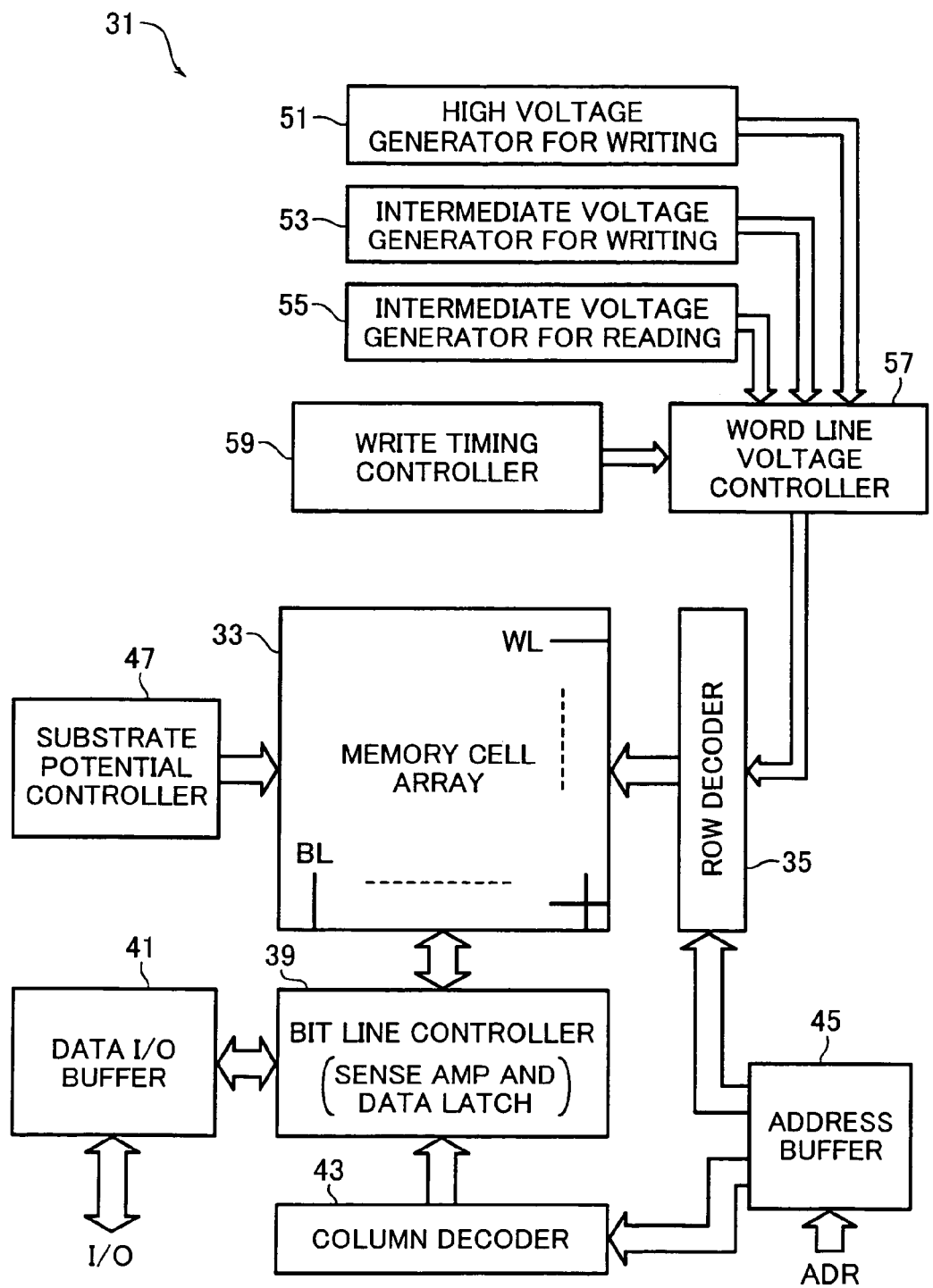
FIG. 31 shows a general configuration of an NAND-type EEPROM according to the embodiment of the present invention.

FIG. 31 is a block diagram showing a general configuration of an NAND-type EEPROM 31 according to the embodiment of the present invention. The NAND-type EEPROM 31 includes blocks, each of which is described below. A memory cell array 33 is structured to include NAND cells 1 of FIG. 4 arranged in matrix. A row decoder 35 selectively controls the word lines and selection gate lines located in the memory cell array 33.

A bit line controller 39 controls the bit lines in the memory cell array 33 for data reading, write pulse applying, write-verify reading and erase-verify reading. The bit line controller 39 is mainly composed of CMOS flip-flops to perform data latching for data writing, sensing for bit line voltage reading, sensing on write-verify, and latching rewrite data. The bit line controller 39 receives/sends data I/O via a data I/O buffer 41 and receives a signal input from a column decoder 43.

An address signal is fed via an address buffer 45 to the column decoder 43 and the row decoder 35. A substrate potential controller 47 is employed to control the potential on the p-type substrate (or p-type well) in which the memory cell array 33 is formed.

A high voltage generator 51 for writing, an intermediate voltage generator 53 for writing, and an intermediate voltage generator 55 for reading are employed to generate a high voltage for writing (VPP), an intermediate voltage for writing (VM) and an intermediate voltage for reading (VREAD), respectively. A word line voltage controller 57 operates on the basis of these voltages and provides output voltages (such as VPP, VM, VREAD, VCC and the ground voltage) applied to the word lines and the selection gate lines in the selected block 23 (FIG. 5). A write timing controller 59 is employed to control timing of the voltages output from the word line voltage controller 57.

The voltage VH (positive voltage) applied to the adjacent word line is described now. An example of the VH voltage generator is a combined use with the voltage VREAD generator, that is, with the generator of generating the intermediate voltage for reading applied to word lines not-selected for reading on data reading. In this case, it is possible to reduce the number of circuits to achieve a reduced chip area and a simplified circuit design.

If the voltage VSG1 (or VSG2) applied to the selection gate line SG1 (or SG2) is different from VREAD on data reading, another example of the VH voltage generator is a combined use with the VSG1 (or VSG2) generator. Also in this case, it is possible to reduce the number of circuits to achieve a reduced chip area and a simplified circuit design.

A yet another example of the VH voltage is the supply voltage. This example can simplify the VH voltage generator. Also in this case, it is possible to reduce the number of circuits to achieve a reduced chip area and a simplified circuit design.

Figure 32:
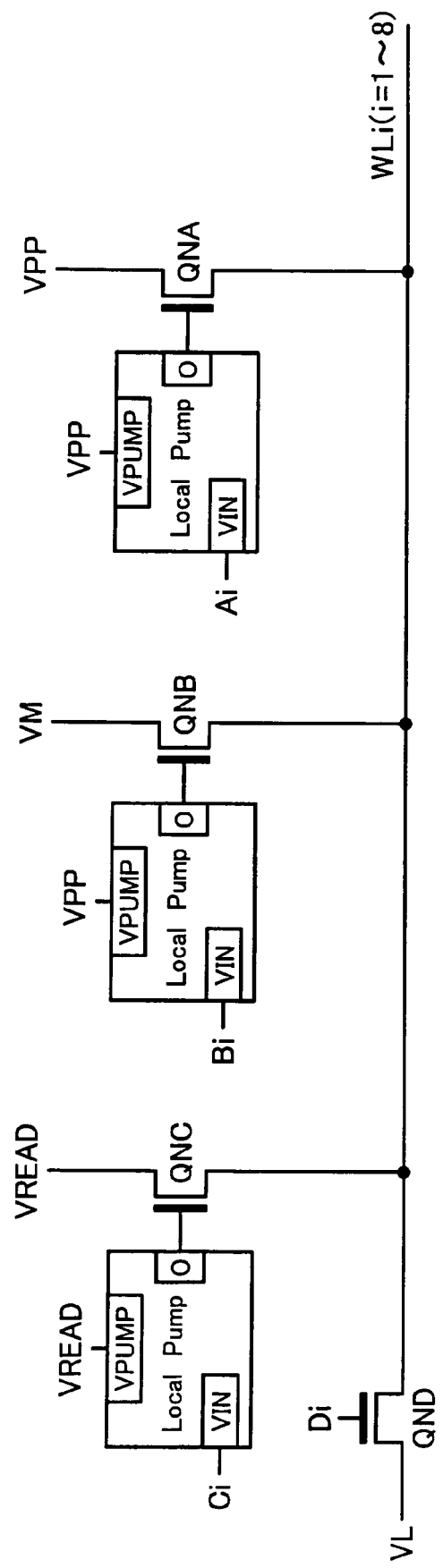
FIG. 32 shows a configuration example of a word line voltage controller according to the embodiment of the present invention.
Figure 33:
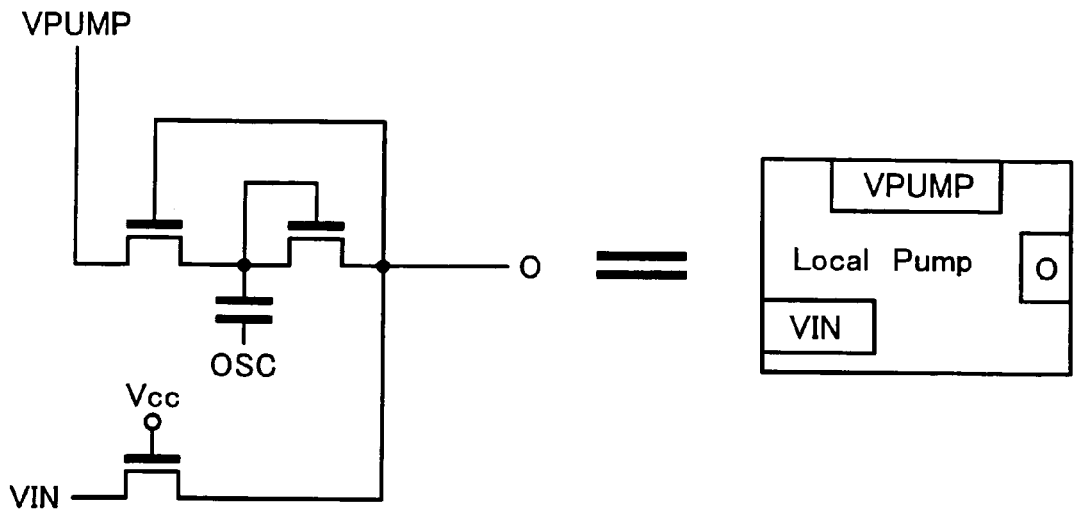
FIG. 33 shows a configuration example of a "Local Pump" circuit in FIG. 32.
Figure 34:
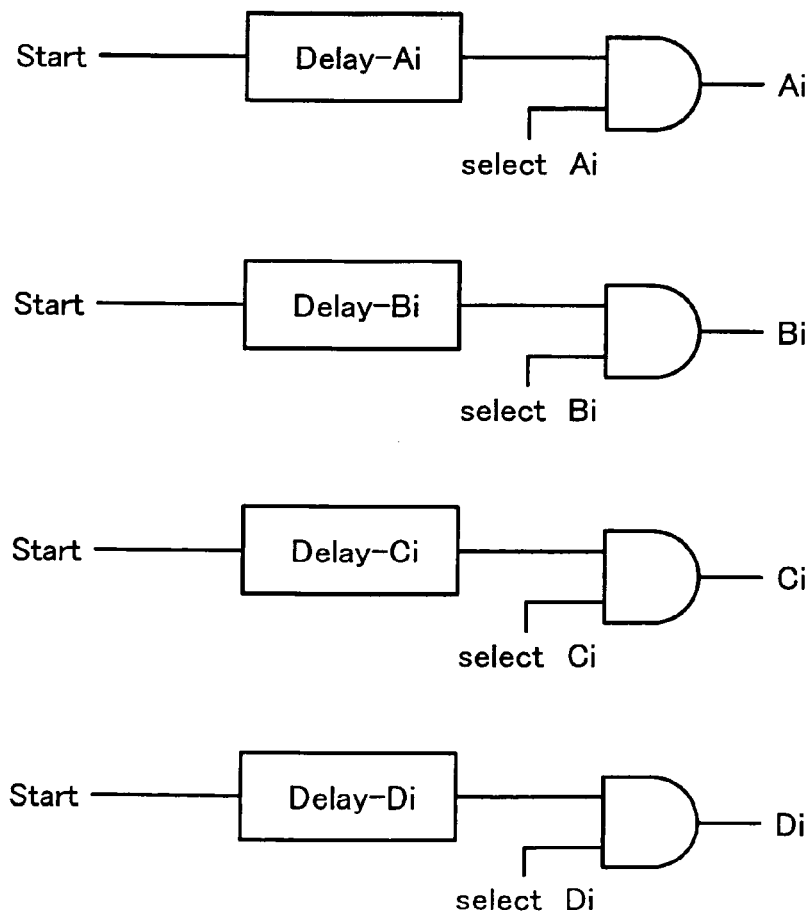
FIG. 34 shows a configuration example of a write timing controller according to the embodiment of the present invention.

FIG. 32 shows a configuration example of the word line voltage controller 57 in FIG. 31, and FIG. 34 shows a configuration example of the write timing controller 59 in FIG. 31. FIG. 33 shows a configuration example of a "Local Pump" circuit in FIG. 32. Rectangular "VPUMP", "VIN" and "O" terminals in the "Local Pump" circuit in FIG. 32 correspond to "VPUMP", "VIN" and "O" nodes in the circuit of FIG. 33, respectively. Signals Ai, Bi, Ci and Di in FIG. 32 are generated from a circuit, for example, as shown in FIG. 34.

The circuits of FIGS. 32 and 34 are embodiments of circuits applied to achieve the operations of FIGS. 6, 13, 15-18, 25-27. The timings of the signals Ai, Bi, Ci and Di are employed to control the word line voltages.

In FIG. 32, any one of the signals Ai, Bi, Ci and Di is generally at the high level during the operation of writing. When the signal Ai is at the high level, a voltage equal to or more than [VPP+$V_{tna}$] is applied to a gate of an N-type MOS transistor QNA (where $V_{tna}$ is the threshold voltage of QNA) to transfer a VPP voltage to a word line WLi node (i=1-8). Similarly, when the signal Bi is at the high level, a VM voltage is transferred to a word line WLi through an N-type MOS transistor QNB. When Ci is at the high level, a VREAD voltage is transferred to a word line WLi through an N-type MOS transistor QNC. When Di is at the high level, a VL voltage is transferred to a word line WLi through an N-type MOS transistor QND. The VL voltage is set to a voltage not below 0 V and not above VCC. The VL voltage is transferred to a word line WLi through the N-type MOS transistor QND when the voltage on the word line WLi is set to the voltage not below 0 V and not above VCC. The circuit of FIG. 32 is provided per WLi. Thus, a total of 8 such circuits are provided for WL1-8 to allow a voltage setting per WLi.

The circuit of FIG. 33 receives inputs of a signal VIN, a signal OSC and a voltage VPUMP thereto and provides an output voltage on the output node "O". The signal OSC becomes an oscillating signal when the circuit operates. When VIN is at the high level, a voltage higher than VCC is provided on the output node. When VIN is at the low level (for example, 0 V), the voltage of VIN is directly transferred to the output node "O", without the influence of the oscillating signal OSC, to turn off the NMOS transistors (corresponding to QNA, QNB, QNC in FIG. 32) that receive the output voltage.

The circuit of FIG. 34 is one embodiment of the circuit for generating the signals Ai, Bi, Ci and Di of FIG. 32, in which [Delay-Ai], [Delay-Bi], [Delay-Ci], and [Delay-Di] are delay circuits. Signals "select Ai", "select Bi", "select Ci", and "select Di" have a changeable "high/low level" based on the selected word line WLi and the operation mode (such as writing, erasing and reading). At the beginning of operation (for example, the beginning of writing), the signal "Start" turns in the high level. Then, when a respective delay time set per signal elapsed, a required one of the signals Ai, Bi, Ci and Di acts to achieve the operations of FIGS. 6, 13, 15-18. Similar to the circuit of FIG. 32, the circuit of FIG. 34 is also provided per WLi and employed to control the timing and voltage per WLi.

Figure 35:
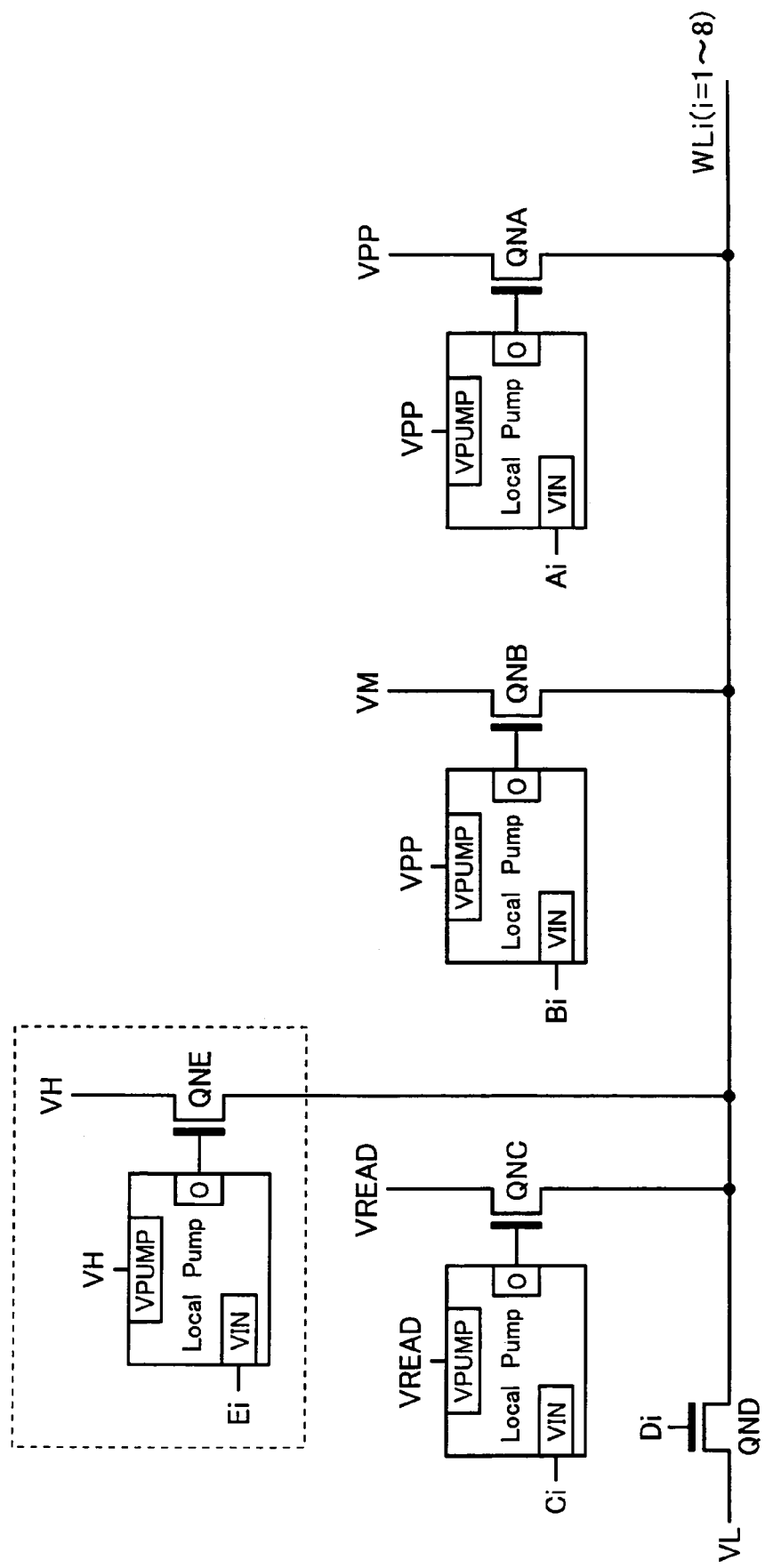
FIG. 35 shows another configuration example of the word line voltage controller according to the embodiment of the present invention.
Figure 36:
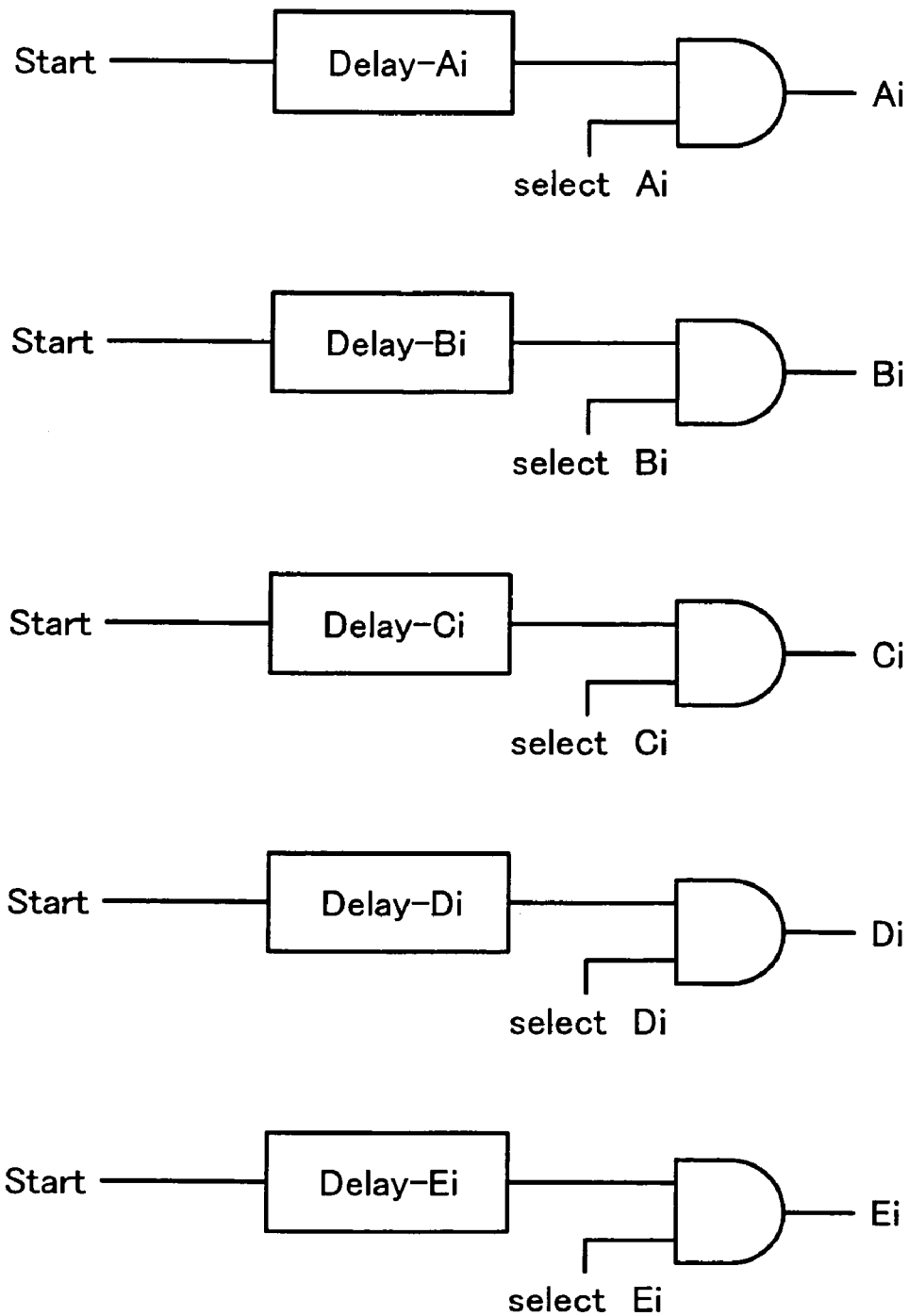
FIG. 36 shows another configuration example of the write timing controller according to the embodiment of the present invention.

FIG. 35 shows one embodiment of the word line voltage controller 57 to achieve the operations of FIGS. 19-24, 28-30. FIG. 36 shows one embodiment of the write timing controller 59 to achieve the operations of FIGS. 19-24, 28-30. FIG. 32 differs from FIG. 35 in a circuit surrounded by the dashed line in FIG. 35. The addition of the circuit surrounded by the dashed line is required because there is a need for charging/discharging WLi to/from VH voltage in FIGS. 19-24. Similarly, FIG. 36 differs from FIG. 34 only in an additional circuit for generating a signal Ei in FIG. 36. This is because a control signal for charging/discharging WLi to/from VH voltage is required in FIG. 35. Like FIGS.

32 and 34, it is also required to provide the circuits of FIGS. 35 and 36 per WLi to control the timing and voltage per WLi. Although only VM is shown in FIGS. 32 and 35 as the intermediate voltage for writing, such a circuitry is similarly effective in another case that separately provides a circuit for VM1 and a circuit for VM2. Alternatively, such an operation is similarly effective to apply VM1 or VM2 to the portion of VM in FIGS. 32 and 35 depending on the location of WL.

The following description is given to one embodiment that employs a specified circuitry example of the high voltage generator for writing and the intermediate voltage generator for writing shown in FIG. 31.

Figure 37A:
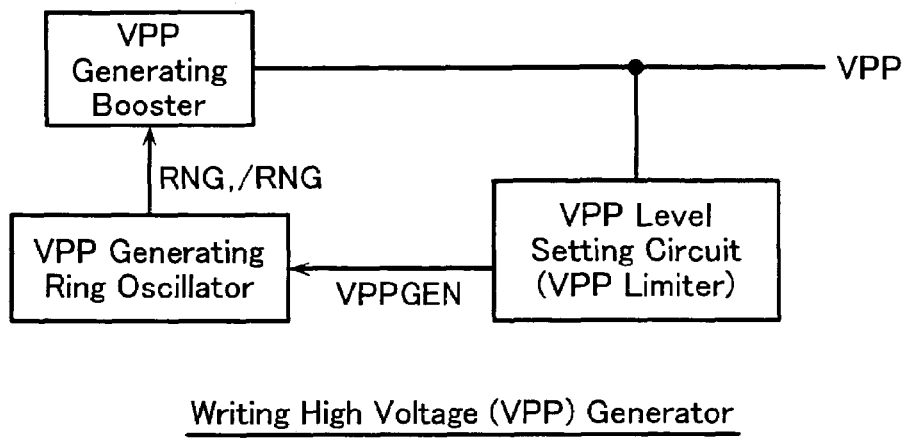
FIG. 37A is a schematic diagram showing a circuitry example of a writing high voltage generator according to the embodiment of the present invention.
Figure 37B:
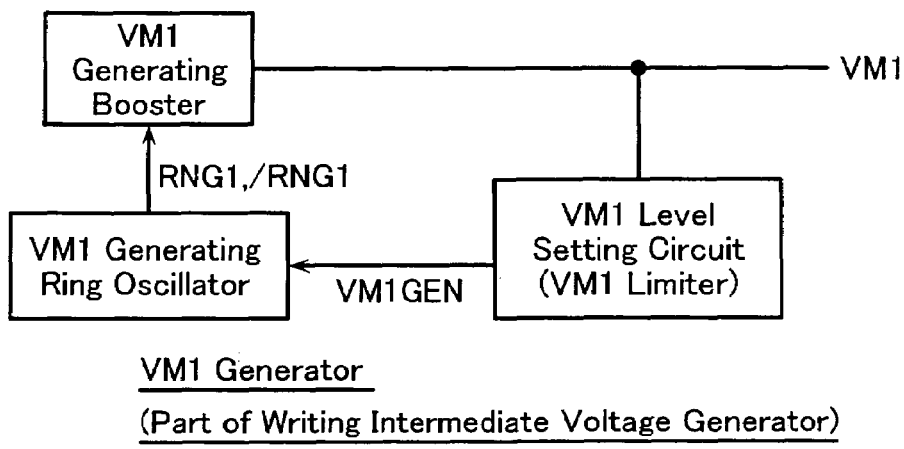
FIG. 37B is a schematic diagram showing a circuitry example of a writing intermediate voltage generator (VM1 generator) according to the embodiment of the present invention.
Figure 37C:
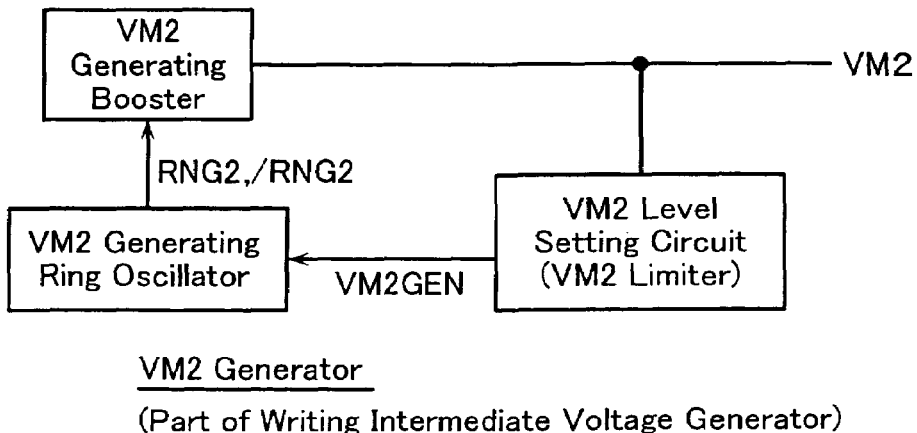
FIG. 37C is a schematic diagram showing a circuitry example of a writing intermediate voltage generator (VM2 generator) according to the embodiment of the present invention.

FIGS. 37A-C are schematic diagrams showing a circuitry example of such the writing high-voltage generator and the writing intermediate voltage generator in FIG. 31. FIG. 37A shows a circuitry example of the writing high voltage generator. FIGS. 37B and C correspond to circuitry examples of the writing intermediate voltage generator. For example, if VM1 is different in voltage from VM2, the circuits in FIG. 37B and FIG. 37C are combined to configure the writing intermediate voltage generator shown in FIG. 31. In this case, FIG. 37B shows a VM1 generator, and FIG. 37C shows a VM2 generator.

In the circuitry of FIG. 37A, the writing high voltage generator comprises three circuits: a VPP generating booster; a VPP level setting circuit (VPP limiter); and a VPP generating ring oscillator. The VPP level setting circuit is operative to change the level of an output signal VPPGEN based on a VPP level (for example, whether VPP is higher or lower than a target voltage). (For example, if VPP is higher than the target voltage, the signal VPPGEN is changed to a low level. In contrast, if VPP is lower than the target voltage, the signal VPPGEN is changed to a high level.) The VPP generating ring oscillator is controlled on operation by the signal VPPGEN output from the VPP level setting circuit (for example, controlled to provide an oscillated signal from the VPP generating ring oscillator or not). As a result, the output signals RNG and /RNG vary depending on the signal VPPGEN (for example, they vary so as to provide the oscillated signal or not). As a result, the three circuits of the VPP generating booster, the VPP level setting circuit (VPP limiter) and the VPP generating ring oscillator can control VPP to reach the target voltage.

Figure 38A:
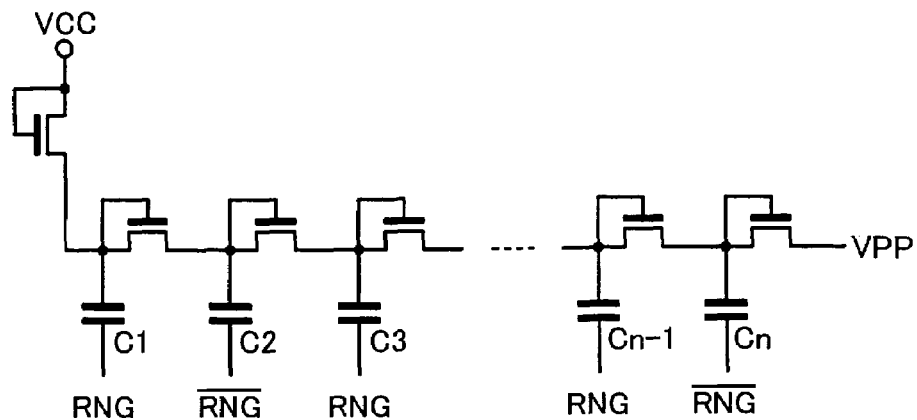
FIG. 38A is an illustrative diagram of the writing high voltage generator according to the embodiment of the present invention (part 1)
Figure 38B:
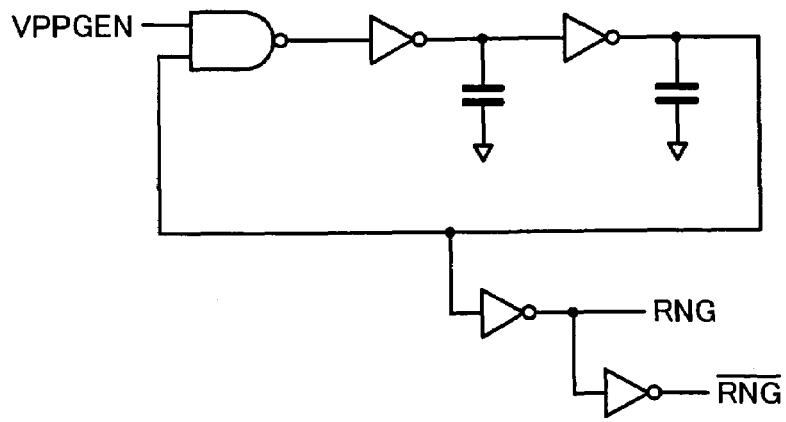
FIG. 38B is an illustrative diagram of the generator (part 2)
Figure 38C:
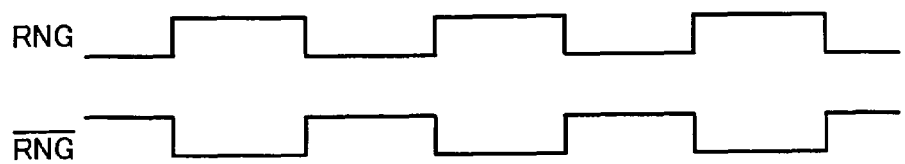
FIG. 38C is an illustrative diagram of the generator (part 3)
Figure 38D:
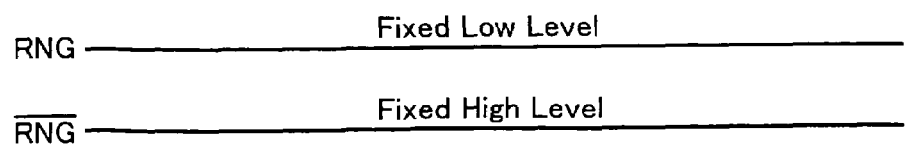
FIG. 38D is an illustrative diagram of the generator (part 4)
Figure 38E:
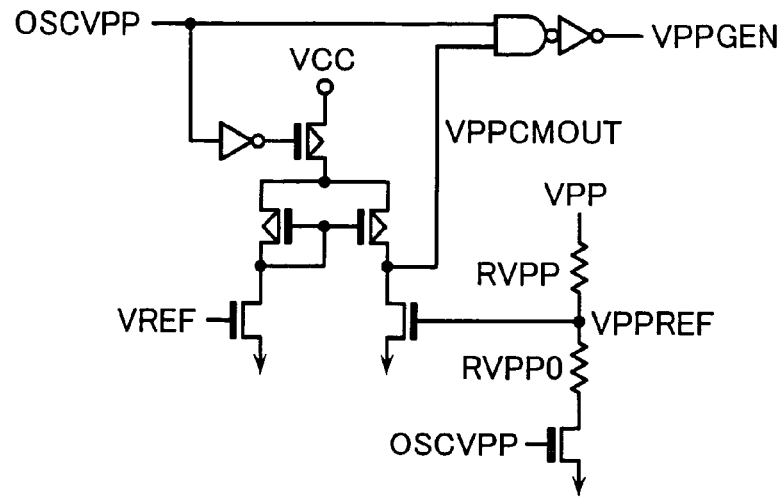
FIG. 38E is an illustrative diagram of the generator (part 5)
Figure 38F:
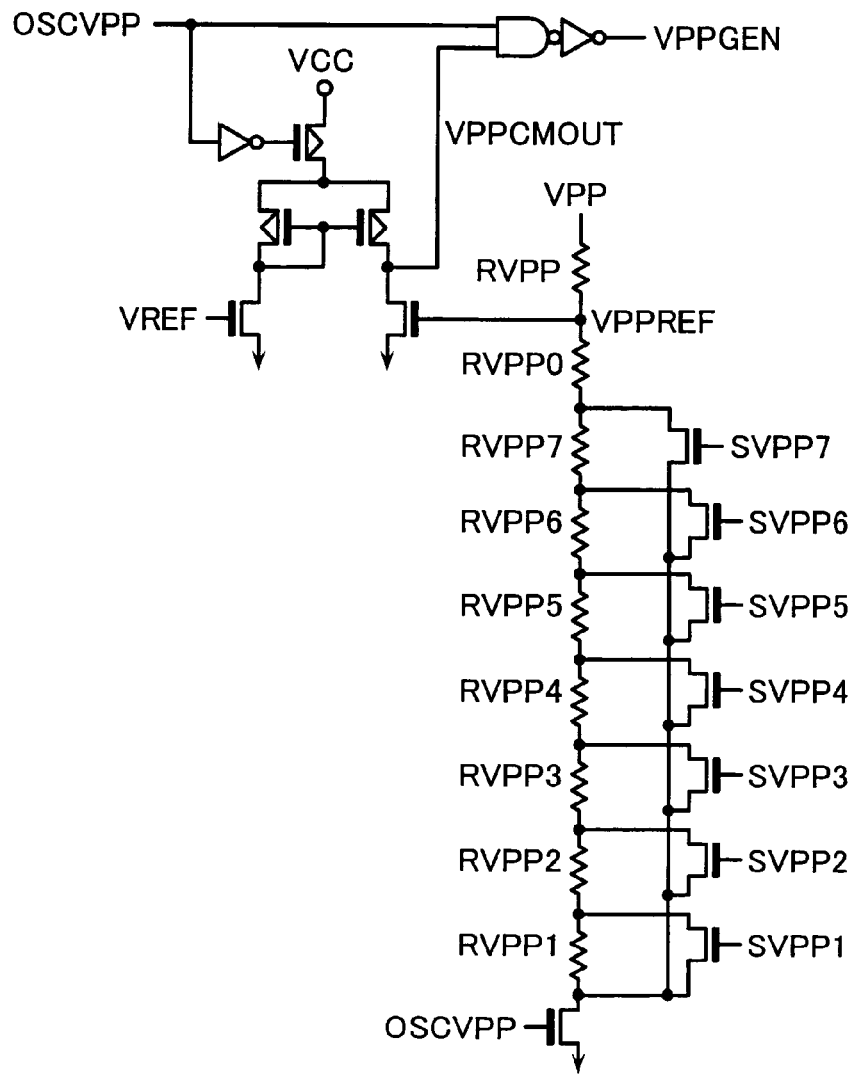
FIG. 38F is an illustrative diagram of the generator (part 6)

FIG. 38A shows a circuitry example of the VPP generating booster. FIG. 38B shows a circuitry example of the VPP generating ring oscillator. FIGS. 38C-D show waveforms of the signals RNG and /RNG in examples when VPP is lower than the target voltage and when VPP is higher than the target voltage. FIGS. 38E-F show two types of circuitry examples of the VPP level setting circuit.

A combination of the circuits in FIGS. 38A, B and E configures the circuit in FIG. 37A that has the following circuit operation.

The VPP generating booster in FIG. 38A has such a circuitry that comprises a plurality of drain-gate-connected transistors connected in serial between VCC and VPP, and a plurality of capacitors connected to respective connection nodes. During operation of the VPP generating booster, the signals RNG and /RNG are turned into opposite-phased oscillated signals, for example. Accordingly, positive charges are transferred from VCC to VPP to provide VPP with a boosted voltage higher than VCC.

The VPP generating ring oscillator in FIG. 38B controls the output signals RNG and /RNG to become oscillated signals having opposite phases to each other (corresponding to the waveforms in FIG. 38C) when the input signal VPPGEN is at the high level. As a result, a boosted voltage is output from the VPP generating booster to elevate the VPP level. It also controls the output signals RNG and /RNG to be fixed at the low level and the high level respectively (corresponding to the waveforms in FIG. 38D) when the input signal VPPGEN is at the low level. As a result, the output of the boosted voltage from the VPP generating booster is halted to stop elevation of the VPP level.

The VPP level setting circuit in FIG. 38E receives a signal OSCVPP (normally kept at a high level during normal writing), a reference voltage VREF, and a supply voltage VCC. A VPPREF level is a voltage level determined relative to the VPP level from a ratio between resistances RVPP and RVPP0 (as VPPREF=VPP×RVPP0/(RVPP+RVPP0)). If the VPP level is higher than a target voltage, the VPPREF level becomes higher than the VREF level. Thus, VPPCMOUT becomes the low level, and accordingly a signal VPPGEN also becomes the low level. As a result, the output of the boosted voltage from the VPP generating booster is halted to stop elevation of the VPP level as described above. If the VPP level is lower than the target voltage, the VPPREF level becomes lower than the VREF level. Thus, VPPCMOUT becomes the high level, and accordingly the signal VPPGEN also becomes the high level. As a result, the boosted voltage is output from the VPP generating booster to elevate the VPP level as described above. In this way, the control is given to the circuit of FIG. 38E to achieve VPPREF=VREF. Therefore, the use of the circuits shown in FIGS. 38A, B and E can control the VPP level as follows:

$VPP$ level=$[VREF \times (RVPP+RVPP0)/RVPP0]$

In FIG. 38F, seven resistors (corresponding to resistances RVPP1-RVPP7) and seven transistors (corresponding to transistors with gate input signals SVPP1-SVPP7) are added to the circuit in FIG. 38E. The use of the circuit in FIG. 38F instead of the circuit in FIG. 38E allows the voltage levels of the signals SVPP1-SVPP7 to change the setting of the VPP level. For example, when SVPP6 is at the high level and SVPP7 is at the low level, the transistor with the gate input signal SVPP6 shorts the lower end of the resistor with the resistance RVPP7 to the ground voltage. Therefore, substantially only two resistors (resistors with resistances RVPP0 and RVPP7) are connected between VPPREF and the ground voltage to determine the VPP level setting as:

$VPP$ level=$[VREF \times (RVPP+RVPP0+RVPP7)/(RVPP0+RVPP7)]$

When SVPP5 is at the high level and SVPP6 and SVPP7 are at the low level, the transistor with the gate input signal SVPP5 shorts the lower end of the resistor with the resistance RVPP6 to the ground voltage. Therefore, substantially only three resistors (resistors with resistances RVPP0, RVPP7 and RVPP6) are connected between VPPREF and the ground voltage to determine the VPP level setting as:

$VPP$ level=$[VREF \times (RVPP+RVPP0+RVPP7+RVPP6)/(RVPP0+RVPP7+RVPP6)]$

In the circuitry of FIG. 37B, the VM1 generator comprises three circuits: a VM1 generating booster, a VM1 level setting circuit (VM1 limiter), and a VM1 generating ring oscillator. The VM1 level setting circuit is operative to change the level of an output signal VM1GEN based on a VM1 level (for example, whether VM1 is higher or lower than a target voltage). (For example, if VM1 is higher than the target voltage, the signal VM1GEN is changed to a low level. In contrast, if VM1 is lower than the target voltage, the signal VM1GEN is changed to a high level.) The VM1 generating ring oscillator is controlled on operation by the signal VM1GEN output from the VM1 level setting circuit (for example, controlled to provide an oscillated signal from the VM1 generating ring oscillator or not). As a result, the output signals RNG1 and /RNG1 vary depending on the signal VM1GEN (for example, they vary so as to provide the oscillated signal or not). As a result, the three circuits of the VM1 generating booster, the VM1 level setting circuit (VM1 limiter) and the VM1 generating ring oscillator can control VM1 to reach the target voltage.

Figure 39A:
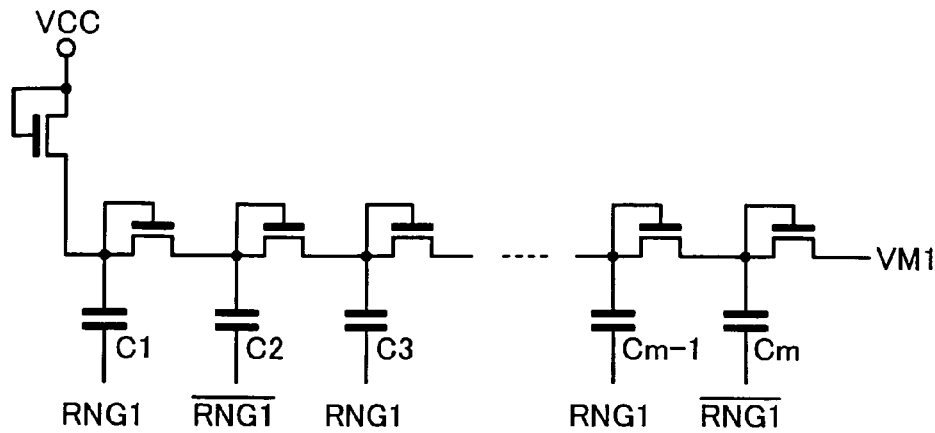
FIG. 39A is an illustrative diagram of the writing intermediate voltage VM1 generator according to the embodiment of the present invention (part 1)
Figure 39B:
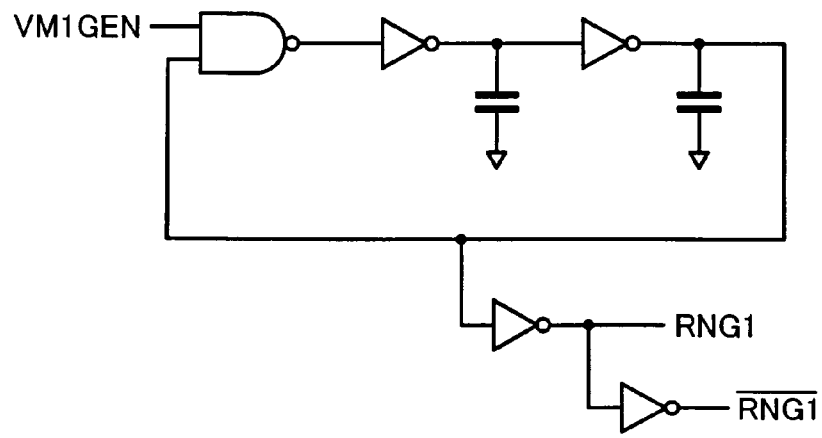
FIG. 39B is an illustrative diagram of the VM1 generator (part 2)
Figure 39C:
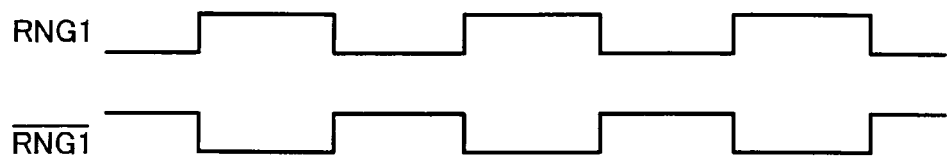
FIG. 39C is an illustrative diagram of the VM1 generator (part 3)
Figure 39D:
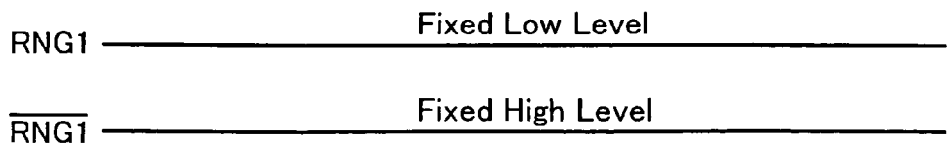
FIG. 39D is an illustrative diagram of the VM1 generator (part 4)
Figure 39E:
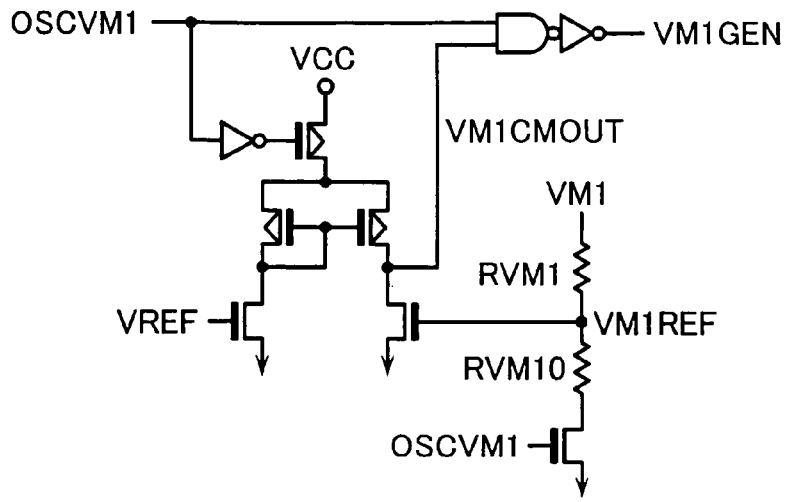
FIG. 39E is an illustrative diagram of the VM1 generator (part 5)
Figure 39F:
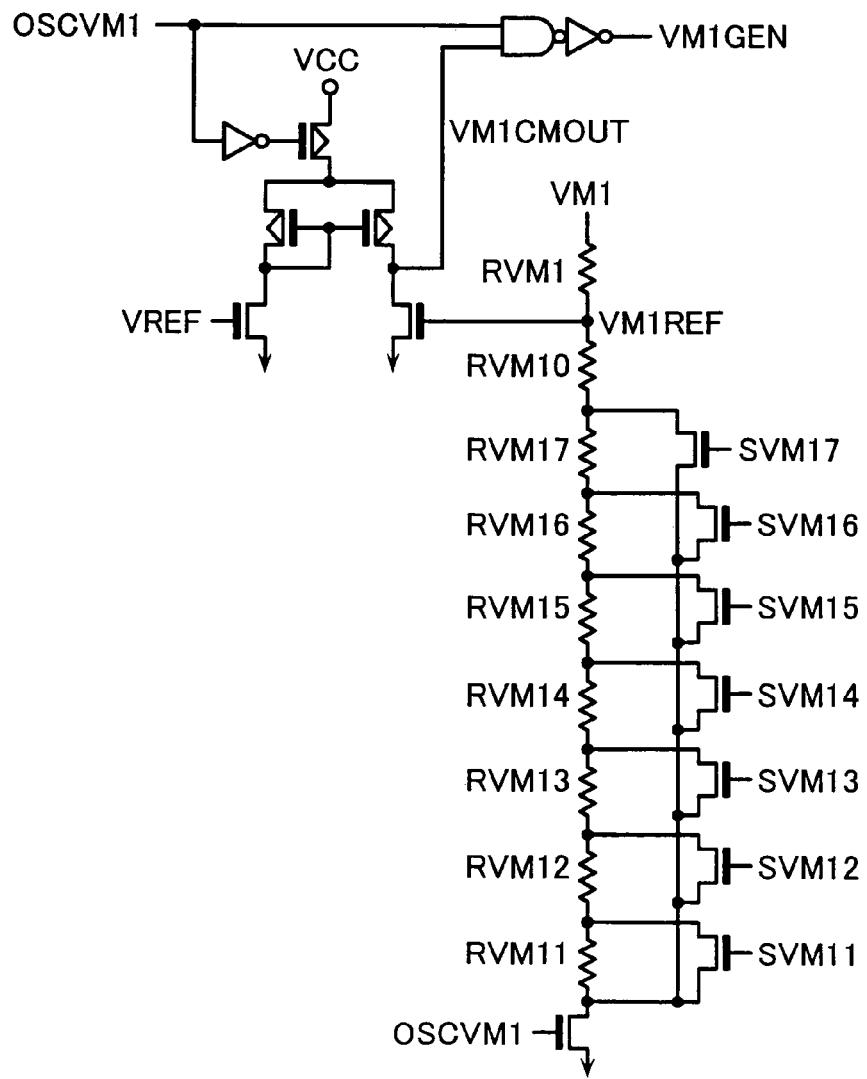
FIG. 39F is an illustrative diagram of the VM1 generator (part 6)

FIG. 39A shows a circuitry example of the VM1 generating booster. FIG. 39B shows a circuitry example of the VM1 generating ring oscillator. FIGS. 39C-D show waveforms of the signals RNG1 and /RNG1 in examples when VM1 is lower than the target voltage and when VM1 is higher than the target voltage. FIGS. 39E-F show two types of circuitry examples of the VM1 level setting circuit.

A combination of the circuits in FIGS. 39A, B and E configures the circuit in FIG. 37B that has the following circuit operation.

The VM1 generating booster in FIG. 39A has such a circuitry that comprises a plurality of drain-gate-connected transistors connected in serial between VCC and VM1, and a plurality of capacitors connected to respective connection nodes. During operation of the VM1 generating booster, the signals RNG1 and /RNG1 are turned into opposite-phased oscillated signals, for example. Accordingly, positive charges are transferred from VCC to VM1 to provide VM1 with a boosted voltage higher than VCC.

The VM1 generating ring oscillator in FIG. 39B controls the output signals RNG1 and /RNG1 to become oscillated signals having opposite phases to each other (corresponding to the waveforms in FIG. 39C) when the input signal VM1GEN is at the high level. As a result, a boosted voltage is output from the VM1 generating booster to elevate the VM1 level. It also controls the output signals RNG1 and /RNG1 to be fixed at the low level and the high level respectively (corresponding to the waveforms in FIG. 39D) when the input signal VM1GEN is at the low level. As a result, the output of the boosted voltage from the VM1 generating booster is halted to stop elevation of the VM1 level.

The VM1 level setting circuit in FIG. 39E receives a signal OSCVM1 (normally kept at a high level during normal writing), a reference voltage VREF, and a supply voltage VCC. A VM1REF level is a voltage level determined relative to the VM1 level from a ratio between resistances RVM1 and RVM10 (as VM1REF=VM1× RVM10/(RVM1+RVM10)). If the VM1 level is higher than a target voltage, the VM1REF level becomes higher than the VREF level. Thus, VM1CMOUT becomes the low level, and accordingly a signal VM1GEN also becomes the low level. As a result, the output of the boosted voltage from the VM1 generating booster is halted to stop elevation of the VM1 level as described above. If the VM1 level is lower than the target voltage, the VM1REF level becomes lower than the VREF level. Thus, VM1CMOUT becomes the high level, and accordingly the signal VM1GEN also becomes the high level. As a result, the boosted voltage is output from the VM1 generating booster to elevate the VM1 level as described above. In this way, the control is given to the circuit of FIG. 39E to achieve VM1REF=VREF. Therefore, the use of the circuits shown in FIGS. 39A, B and E can control the VM1 level as follows:

$$VM1\ \text{level}=[VREF\times(RVM1+RVM10)/RVM10]$$

In FIG. 39F, seven resistors (corresponding to resistances RVM11-RVM17) and seven transistors (corresponding to transistors with gate input signals SVM11-SVM17) are added to the circuit in FIG. 39E. The use of the circuit in FIG. 39F instead of the circuit in FIG. 39E allows the voltage levels of the signals SVML1-SVM17 to change the setting of the VM level. For example, when SVM16 is at the high level and SVM17 is at the low level, the transistor with the gate input signal SVM16 shorts the lower end of the resistor with the resistance RVM17 to the ground voltage. Therefore, substantially only two resistors (resistors with resistances RVM10 and RVM17) are connected between VM1REF and the ground voltage to determine the VM1 level setting as:

$$VM1\ \text{level}=[VREF\times(RVM1+RVM10+RVM17)/(RVM10+RVM17)]$$

When SVM15 is at the high level and SVM16 and SVM17 are at the low level, the transistor with the gate input signal SVM15 shorts the lower end of the resistor with the resistance RVM16 to the ground voltage. Therefore, substantially only three resistors (resistors with resistances RVM10, RVM17 and RVM16) are connected between VM1REF and the ground voltage to determine the VM1 level setting as:

$$VM1\ \text{level}=[VREF\times(RVM1+RVM10+RVM17+RVM16)/(RVM10+RVM17+RVM16)]$$

In the circuitry of FIG. 37C, the VM2 generator comprises three circuits: a VM2 generating booster, a VM2 level setting circuit (VM2 limiter), and a VM2 generating ring oscillator. The VM2 level setting circuit is operative to change the level of an output signal VM2GEN based on a VM2 level (for example, whether VM2 is higher or lower than a target voltage). (For example, if VM2 is higher than the target voltage, the signal VM2GEN is changed to a low level. In contrast, if VM2 is lower than the target voltage, the signal VM2GEN is changed to a high level.) The VM2 generating ring oscillator is controlled on operation by the signal VM2GEN output from the VM2 level setting circuit (for example, controlled to provide an oscillated signal from the VM2 generating ring oscillator or not). As a result, the output signals RNG2 and /RNG2 vary depending on the signal VM2GEN (for example, they vary so as to provide the oscillated signal or not). As a result, the three circuits of the VM2 generating booster, the VM2 level setting circuit (VM2 limiter) and the VM2 generating ring oscillator can control VM2 to reach the target voltage.

Figure 40A:
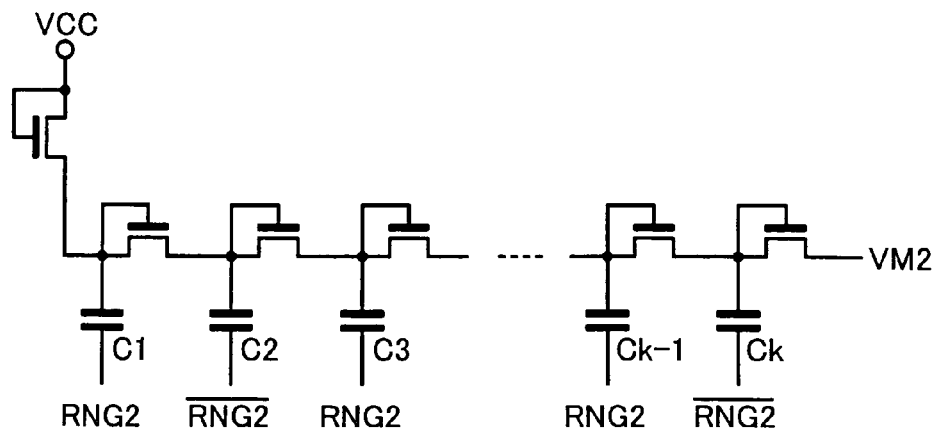
FIG. 40A is an illustrative diagram of the writing intermediate voltage VM2 generator according to the embodiment of the present invention (part 1)
Figure 40B:
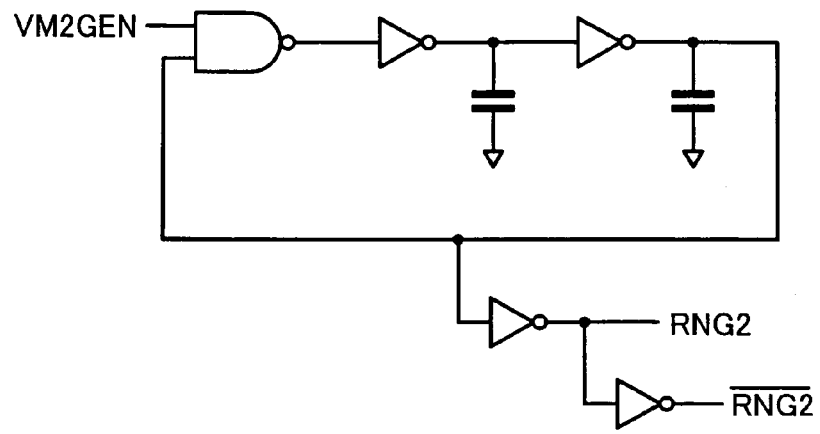
FIG. 40B is an illustrative diagram of the VM2 generator (part 2)
Figure 40C:
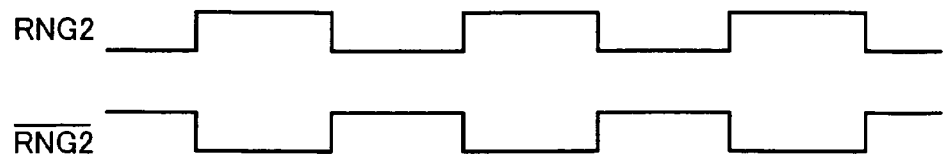
FIG. 40C is an illustrative diagram of the VM2 generator (part 3)
Figure 40D:
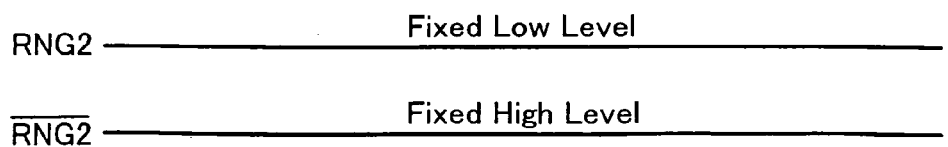
FIG. 40D is an illustrative diagram of the VM2 generator (part 4)
Figure 40E:
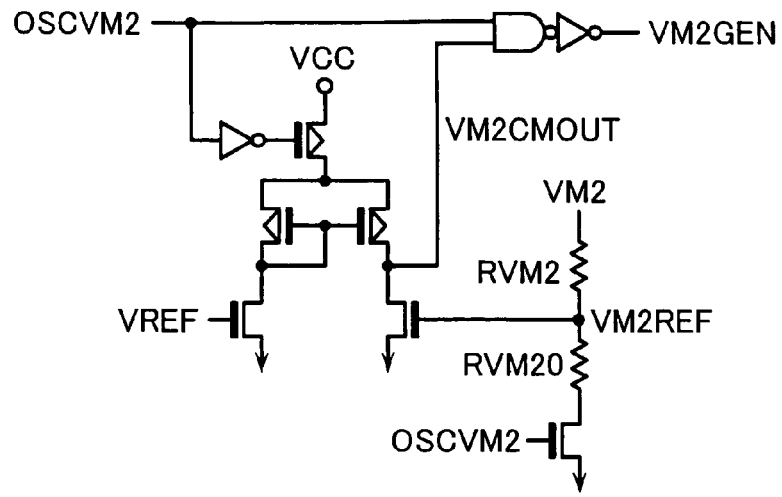
FIG. 40E is an illustrative diagram of the VM2 generator (part 5)
Figure 40F:
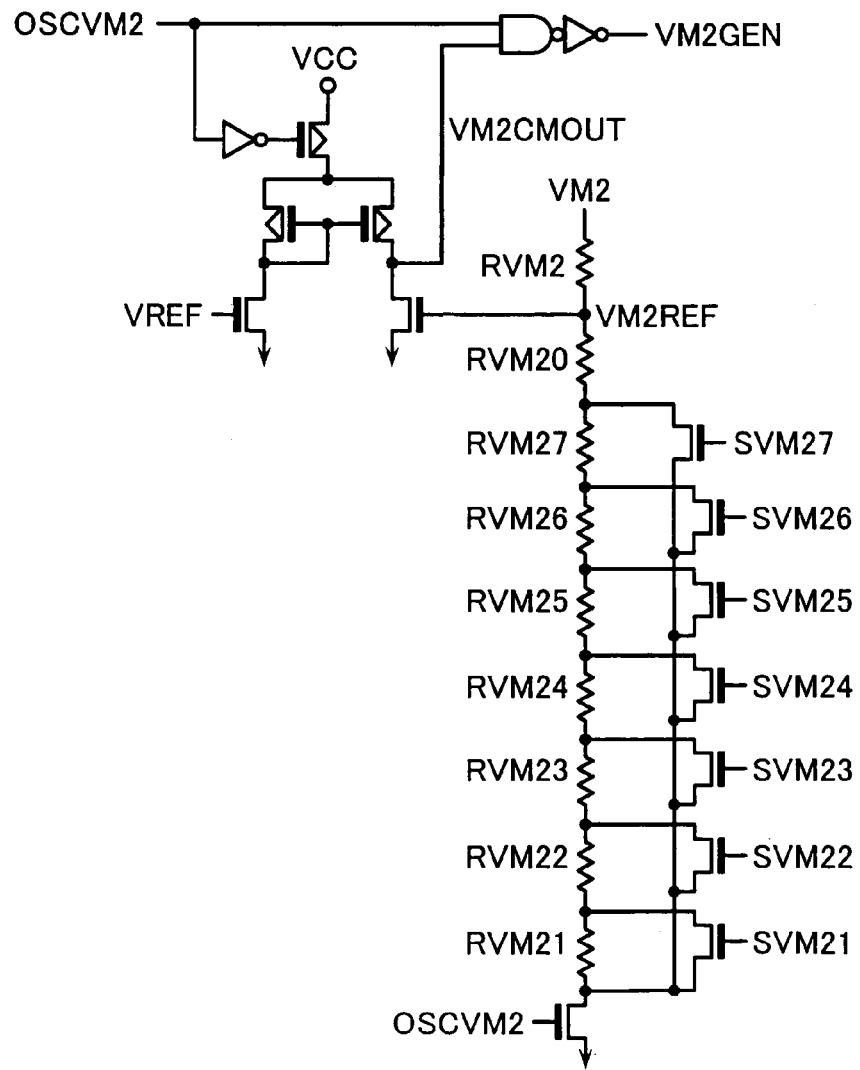
FIG. 40F is an illustrative diagram of the VM2 generator (part 6)

FIG. 40A shows a circuitry example of the VM2 generating booster. FIG. 40B shows a circuitry example of the VM2 generating ring oscillator. FIGS. 40C-D show waveforms of the signals RNG2 and /RNG2 in examples when VM2 is lower than the target voltage and when VM2 is higher than the target voltage. FIGS. 40E-F show two types of circuitry examples of the VM2 level setting circuit.

A combination of the circuits in FIGS. 40A, B and E configures the circuit in FIG. 37C that has the following circuit operation.

The VM2 generating booster in FIG. 40A has such a circuitry that comprises a plurality of drain-gate-connected transistors connected in serial between VCC and VM2, and a plurality of capacitors connected to respective connection nodes. During operation of the VM2 generating booster, the signals RNG2 and /RNG2 are turned into opposite-phased oscillated signals, for example. Accordingly, positive charges are transferred from VCC to VM2 to provide VM2 with a boosted voltage higher than VCC.

The VM2 generating ring oscillator in FIG. 40B controls the output signals RNG2 and /RNG2 to become oscillated signals having opposite phases to each other (corresponding to the waveforms in FIG. 40C) when the input signal VM2GEN is at the high level. As a result, a boosted voltage is output from the VM2 generating booster to elevate the VM2 level. It also controls the output signals RNG2 and /RNG2 to be fixed at the low level and the high level respectively (corresponding to the waveforms in FIG. 40D) when the input signal VM2GEN is at the low level. As a result, the output of the boosted voltage from the VM2 generating booster is halted to stop elevation of the VM2 level.

The VM2 level setting circuit in FIG. 40E receives a signal OSCVM2 (normally kept at a high level during normal writing), a reference voltage VREF, and a supply voltage VCC. A VM2REF level is a voltage level determined relative to the VM2 level from a ratio between resistances RVM2 and RVM20 (as VM2REF=VM2× RVM20/(RVM2+RVM20)). If the VM2 level is higher than a target voltage, the VM2REF level becomes higher than the VREF level. Thus, VM2CMOUT becomes the low level, and accordingly a signal VM2GEN also becomes the low level. As a result, the output of the boosted voltage from the VM2 generating booster is halted to stop elevation of the VM2 level as described above. If the VM2 level is lower than the target voltage, the VM2REF level becomes lower than the VREF level. Thus, VM2CMOUT becomes the high level, and accordingly the signal VM2GEN also becomes the high level. As a result, the boosted voltage is output from the VM2 generating booster to elevate the VM2 level as described above. In this way, the control is given to the circuit of FIG. 40E to achieve VM2REF=VREF. Therefore, the use of the circuits shown in FIGS. 40A, B and E can control the VM2 level as follows:

VM2 level=[VREF×(RVM2+RVM20)/RVM20]

In FIG. 40F, seven resistors (corresponding to resistances RVM21-RVM27) and seven transistors (corresponding to transistors with gate input signals SVM21-SVM27) are added to the circuit in FIG. 40E. The use of the circuit in FIG. 40F instead of the circuit in FIG. 40E allows the voltage levels of the signals SVM21-SVM27 to change the setting of the VM2 level. For example, when SVM26 is at the high level and SVM27 is at the low level, the transistor with the gate input signal SVM26 shorts the lower end of the resistor with the resistance RVM27 to the ground voltage. Therefore, substantially only two resistors (resistors with resistances RVM20 and RVM27) are connected between VM2REF and the ground voltage to determine the VM2 level setting as:

VM2 level=[VREF×(RVM2+RVM20+RVM27)/ (RVM20+RVM27)]

When SVM25 is at the high level and SVM26 and SVM27 are at the low level, the transistor with the gate input signal SVM25 shorts the lower end of the resistor with the resistance RVM26 to the ground voltage. Therefore, substantially only three resistors (resistors with resistances RVM20, RVM27 and RVM26) are connected between VM2REF and the ground voltage to determine the VM2 level setting as:

VM2 level=[VREF×(RVM2+RVM20+RVM27+ RVM26)/(RVM20+RVM27+RVM26)]

The following description is given to the operation of writing in the NAND-type EEPROM.

As shown in FIG. 12, in the NAND-type EEPROM, operations of write pulse applying and write-verify are repeated alternately until data writing is finished after write data is input. In this operational scheme, a method is used to elevate the level of the writing high voltage VPP per increase in the number of operations of write pulse applying and write-verify that are repeated alternately (hereinafter referred to as "the number of write loops") generally as shown in FIG. 41.

Figure 41A:
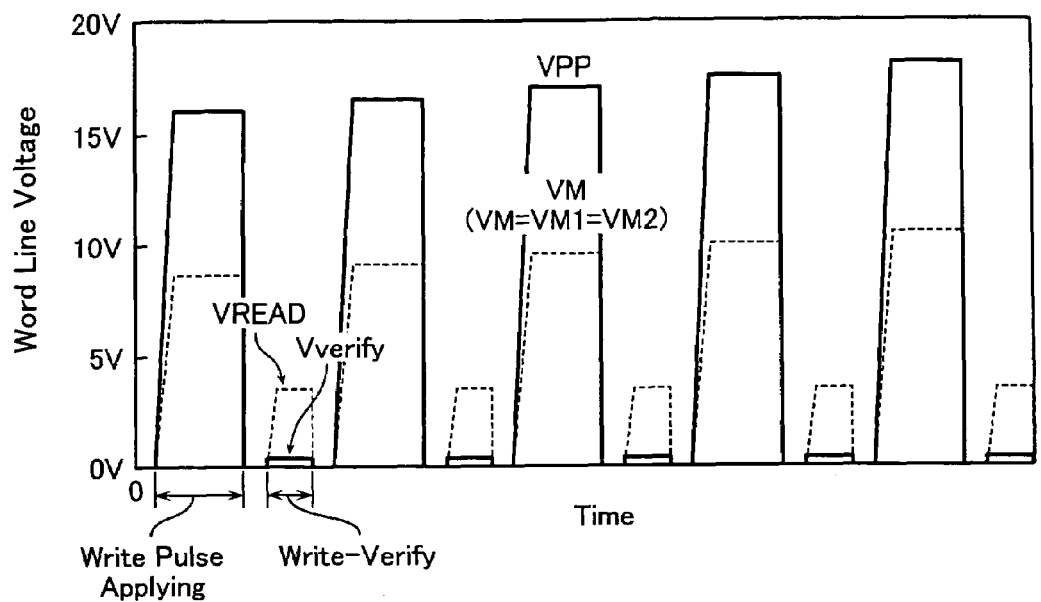
FIG. 41A shows word line waveforms during an operation of data writing according to the embodiment of the present invention (part 1)

When the writing scheme shown in FIG. 6 is employed, a method is generally used to also elevate the level of the writing intermediate voltage VM per increase in the number of write loops, similar to VPP. This is advantageous because the higher the writing intermediate voltage, the higher the voltages $V_{boost}$, $V_{boost0-2}$ at the channel in the memory cell in the "1"-WRITE NAND cell. Accordingly, it is possible to lower the risk of the erroneous write failure that writes the WL voltage VPP in the "1"-WRITE NAND cell. The waveforms of the selected and non-selected word lines during the operation of write pulse applying in this case are shown in FIG. 41A. FIG. 41A shows the waveforms of the selected and non-selected word lines during not only the operation of write pulse applying but also the operation of write-verify. On the other hand, the writing schemes shown in FIG. 13 and FIG. 15 may be employed. In this case, such a method is generally used that sets the writing intermediate voltage VM at a fixed valued regardless of the number of write loops as shown in FIG. 41B for the following reason.

Figure 42A:
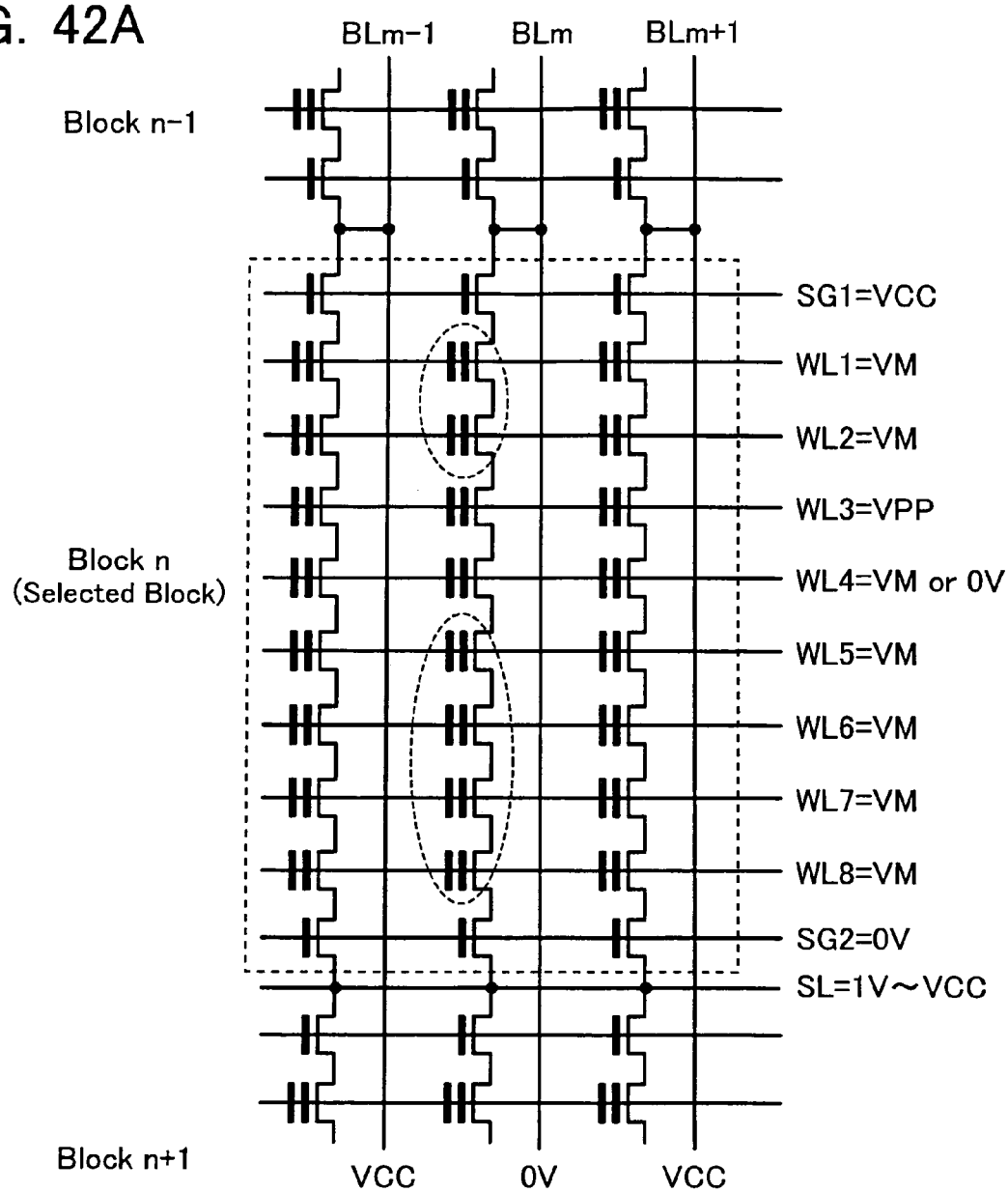
FIG. 42A is an illustrative diagram of a first cause of the erroneous write failure (part 1)
Figure 42B:
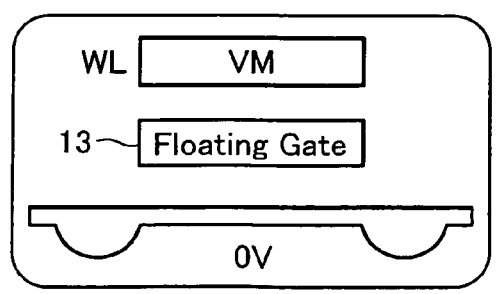
FIG. 42B is an illustrative diagram of the first cause (part 2)
Figure 43A:
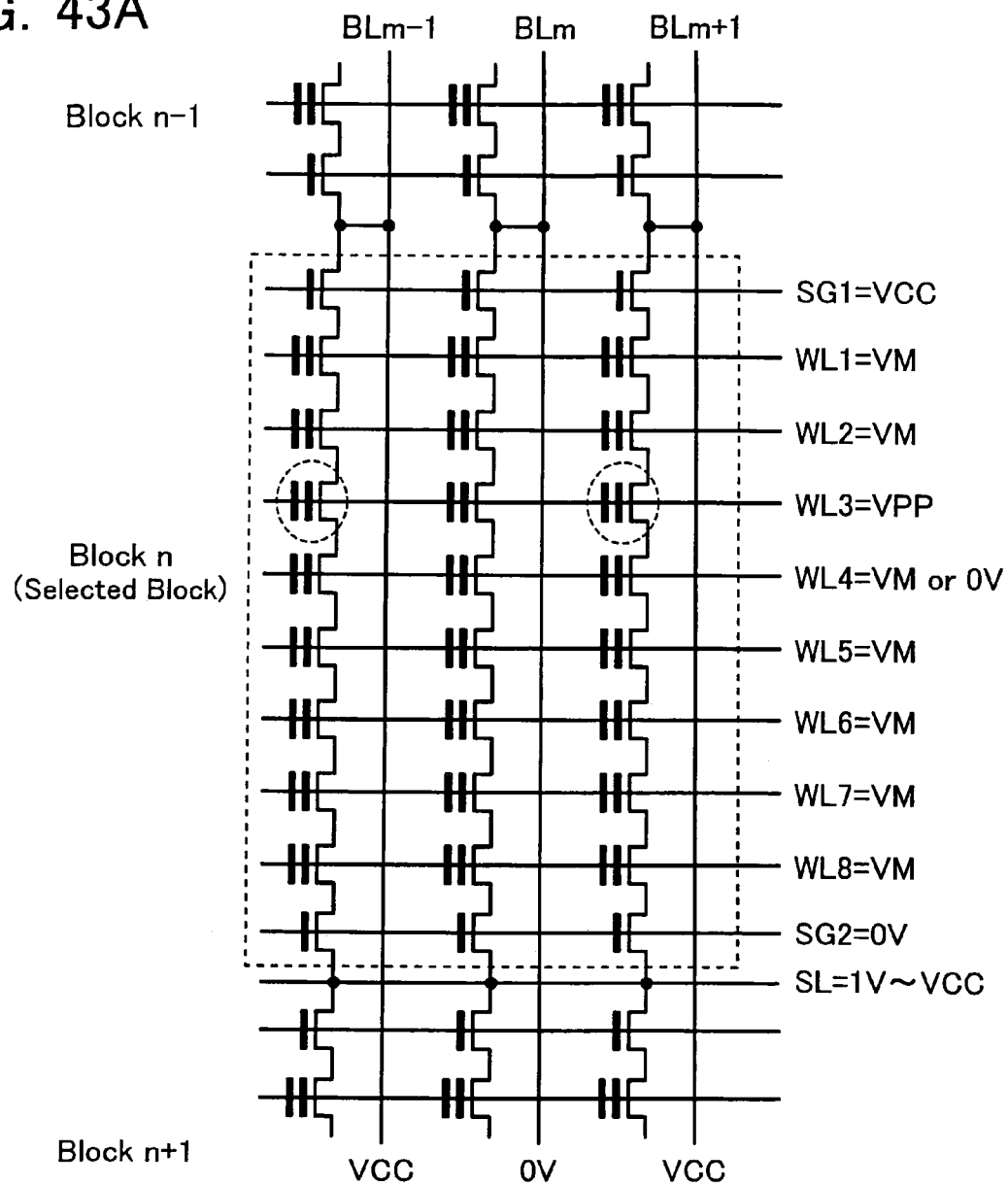
FIG. 43A is an illustrative diagram of a second cause of the erroneous write failure (part 1)
Figure 43B:
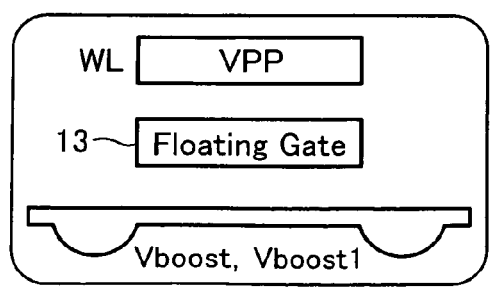
FIG. 43B is an illustrative diagram of the second cause (part 2)
Figure 44:
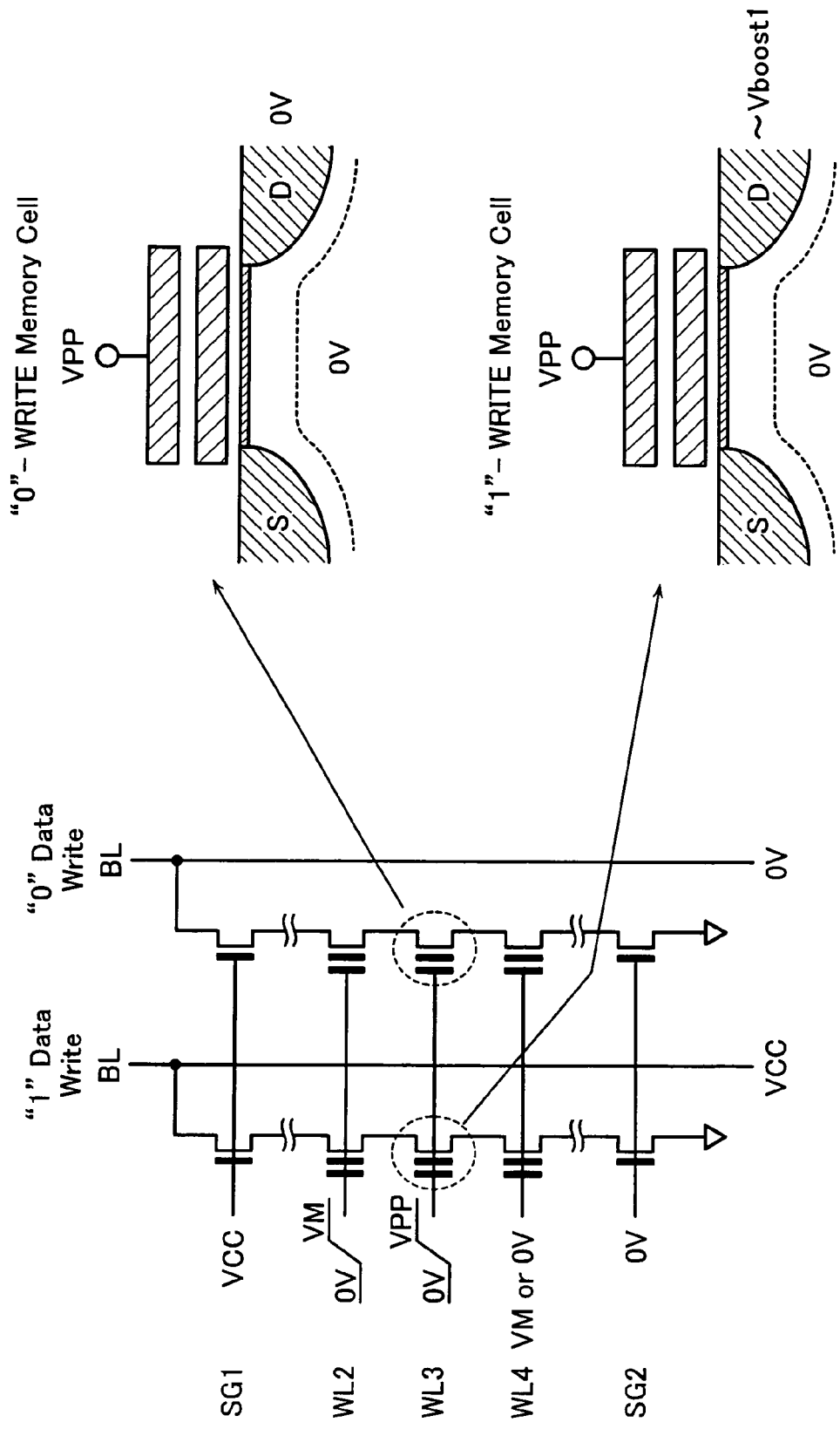
FIG. 44 is another illustrative diagram of the second cause of the erroneous write failure.

An erroneous write failure is a problem caused during the operation of NAND writing that erroneously writes "0" data in a "1"-WRITE memory cell as described above. There are two major causes of the erroneous write failure. One is found in applying "<I>WL Voltage=VM, Memory Cell Channel Voltage=Voltage Stress of 0 V" to memory cells (for example, corresponding to the memory cells connected to WL1, WL2, WL4-8 in FIG. 7) as shown in FIG. 42A and FIG. 42B. This voltage stress is applied to non-selected cells in the "0"-WRITE NAND cell. Another cause of the erroneous write failure is found in applying "<II>WL Voltage=VPP, Memory Cell Channel Voltage Voltage Stress of $V_{boost}$ (or $V_{boost1}$)" to memory cells (for example, corresponding to the memory cell MC3 in FIG. 9 and the memory cell MC3 in FIG. 14) as shown in FIG. 43A, FIG. 43B and FIG. 44. This voltage stress is applied to the selected memory cell in the "1" WRITE NAND cell. As described above, in the writing scheme in FIG. 6, the voltage level of $V_{boost}$ is relatively low (that is, the channel voltage level at the "1" WRITE memory cell is relatively low). Therefore, the erroneous write failure is higher in risk in the case <II> than <I>. Accordingly, the method of increasing the level of the writing intermediate voltage every write loop as shown in FIG. 41A is widely used. On the other hand, in the writing scheme of FIG. 13 or FIG. 15, relative to the same writing intermediate voltage, the voltage $V_{boost1}$ can be made higher than the voltage $V_{boost}$ of FIG. 6. Therefore, the erroneous write failure is higher in risk in the case <I> than <II>. Accordingly, the method of fixing the level of the writing intermediate voltage regardless of the number of write loops as shown in FIG. 41B is widely used.

Figure 41B:
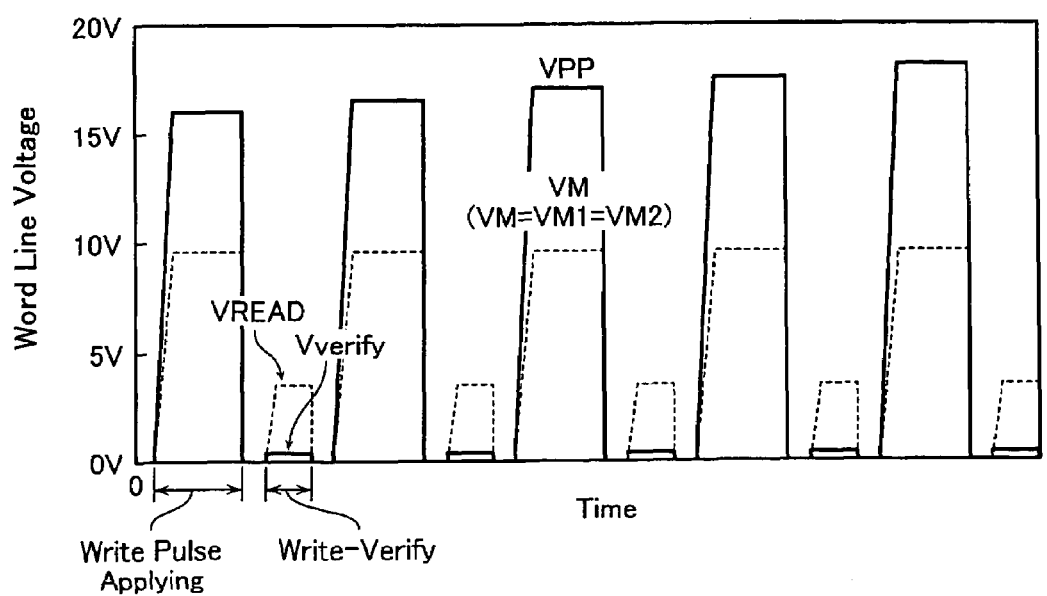
FIG. 41B shows the word line waveforms during the same operation (part 2)

An operational scheme having the writing scheme of FIG. 13 or FIG. 15 combined with the method of FIG. 41B is extremely effective to further improve the reliability. Highly reliable chips will be demanded on the market possibly in the future.

Figure 45A:
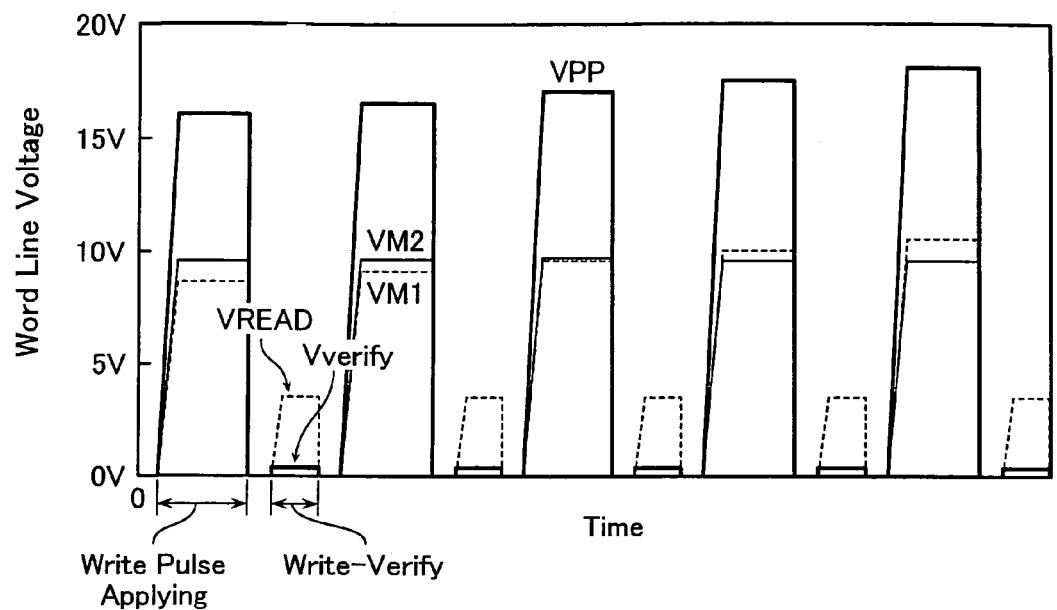
FIG. 45A shows another word line waveforms during an operation of data writing according to the embodiment of the present invention (part 1)
Figure 45B:
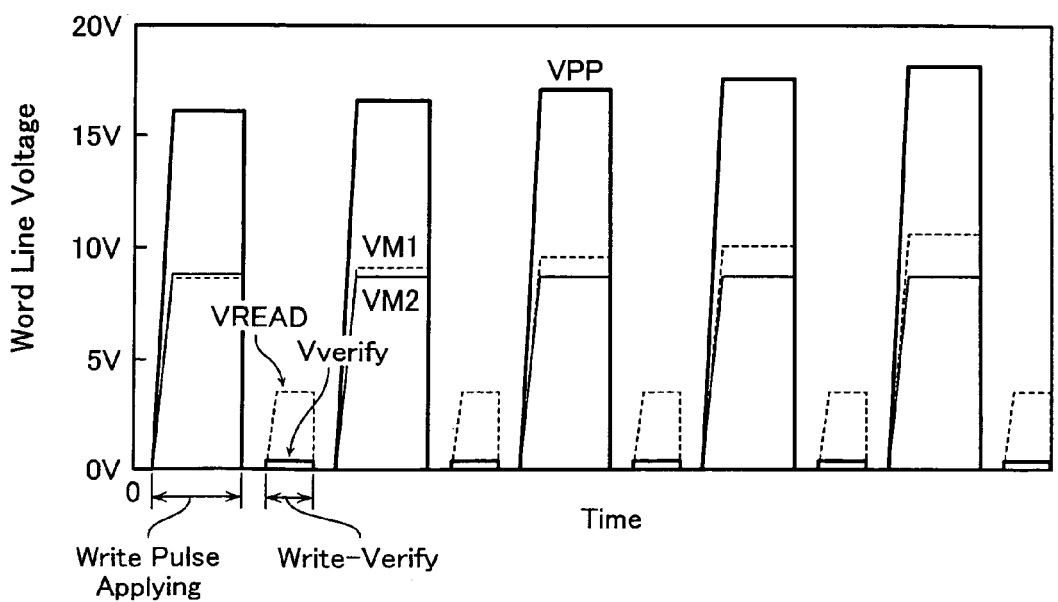
FIG. 45B shows the word line waveforms during the same operation (part 2)

The use of an operational scheme shown in FIG. 45A and FIG. 45B makes it possible to achieve a highly reliable writing operation compared to the operational scheme shown in FIG. 41A or FIG. 41B. For the use of the operational scheme in FIG. 45A and FIG. 45B, VM1 and VM2 are separately employed as two types of writing intermediate voltages. Accordingly, the timings in FIGS. 13 and 15 are altered to those shown in FIGS. 46 and 47. The following advantage can be provided through the use of the scheme shown in FIG. 45 combined with FIGS. 46 and 47.

Figure 46:
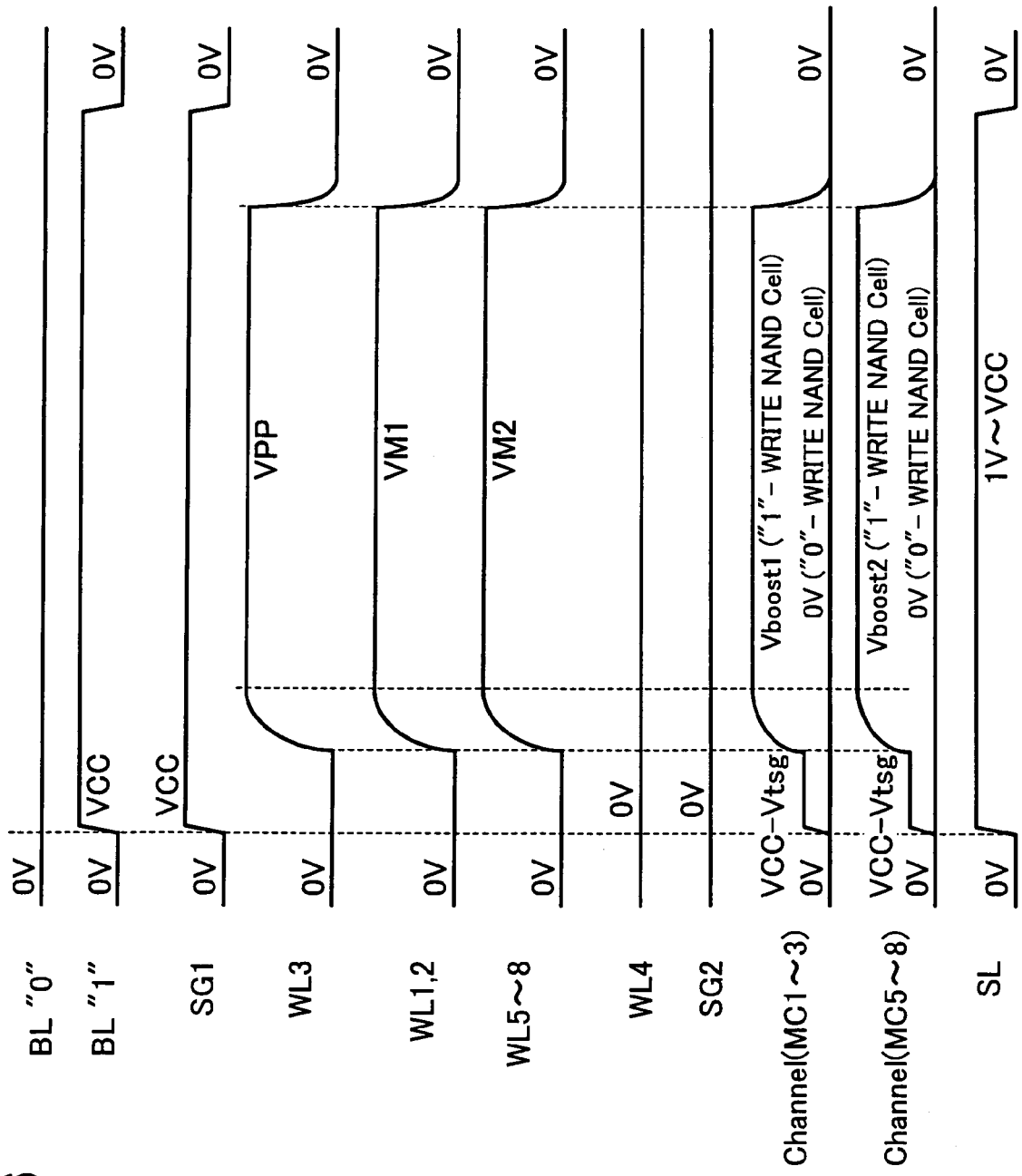
FIG. 46 is a timing chart illustrating an operation of write pulse applying to the NAND cell according to the embodiment of the present invention.
Figure 47:
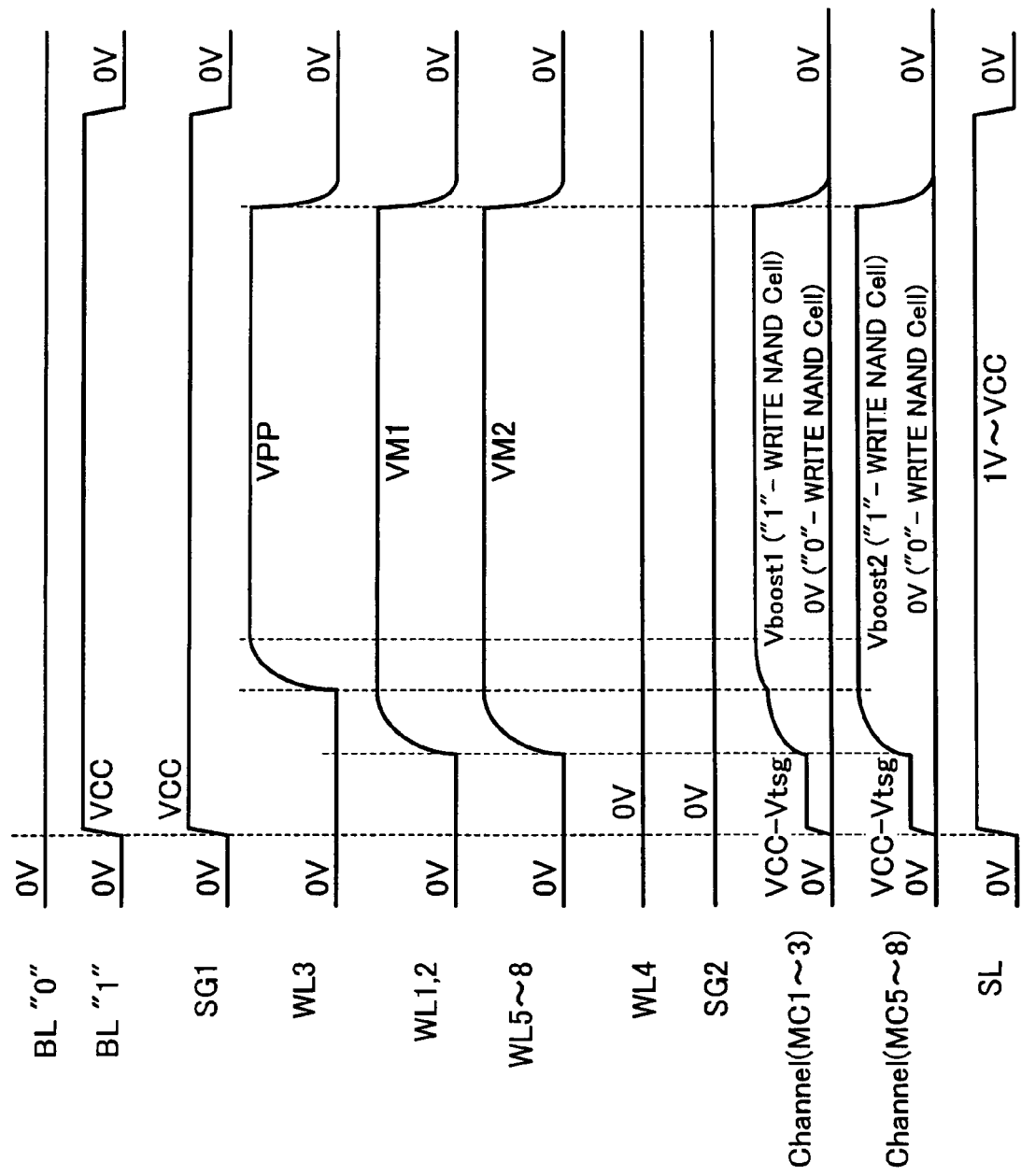
FIG. 47 is a timing chart illustrating another operation of applying write pulses to the NAND cell according to the embodiment of the present invention.

For prevention of an erroneous write failure from occurring when the scheme of FIG. 46 or FIG. 47 is employed, it is important to turn off the memory cell MC4 associated with 0V-fixed WL in the "1"-WRITE NAND cell as described above. A primary object for applying VM2 to WL in the "1"-WRITE NAND cell to elevate the channel voltage $V_{boost2}$ at MC5-8 is to turn off the memory cell MC4 reliably. In a word, a voltage level is sufficient as the VM2 level if it can be set to turn off the memory cell MC4 reliably. (Namely, it is not required to set the voltage level at a higher one. In addition, the voltage level has a constant value almost independent of the number of write loops.) If the voltage level is set higher, it causes a problem because the risk to the above stress of <I> is increased. Accordingly, it is preferable to keep the VM2 voltage at a constant value independent of the number of write loops. On the other hand, a primary object for applying VM1 to WL1 and WL2 is to elevate the channel voltage $V_{boost1}$ at the selected memory cell in relation to the VPP-applied WL in the "1"-WRITE NAND cell. When the VPP voltage level increases every write loop as shown in FIG. 45, it is also preferable to elevate the VM1 voltage level per increase in the number of write loops to reduce the voltage stress of <II>. Therefore, as shown in FIG. 45A or 45B, it is preferable to elevate the VM1 voltage per increase in the number of write loops and keep the VM2 voltage at a constant value independent of the number of write loops. FIG. 45A differs from FIG. 45B only in relation between the VM1 level and the VM2 level. VM1 is a level determined by optimization relative to the voltage stress of <II>, and VM2 is a level determined with the minimum voltage that can turn off the memory cell MC4. Accordingly, depending on the memory cell characteristic and the setting of the number of write loops, there are various possible relations between the VM1 and VM2 levels, which may make FIG. 45A optimal and otherwise-FIG. 45B optimal.

In the above embodiments the waveforms in FIG. 45A and FIG. 45B are exemplified to describe the invention though the present invention is not limited to the above embodiments but rather can be modified variously. An embodiment is described in detail in relation to the waveform examples in FIG. 45. In the below described "selected WL waveform" and "VM-applied, non-selected WL waveform" (for example, FIGS. 48A-D, 49A-D, 50A-X, 51A-X and 52A-X), the waveforms during the operation of write-verify are omitted for simplification of the drawings. In practice, however, positive voltages are applied to the selected WL and the non-selected WL respectively during the operation of write-verify as shown in FIG. 45, needless to say.

Figure 48A:
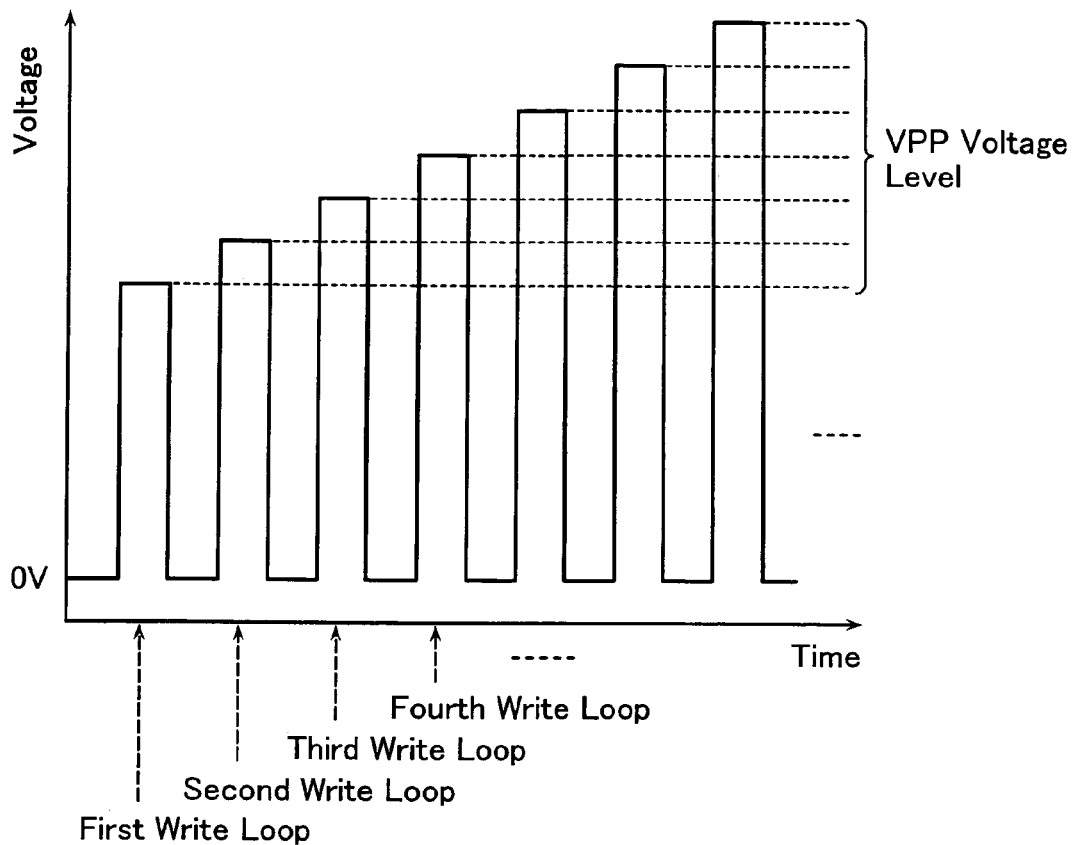
FIG. 48A shows another word line waveforms during an operation of data writing according to the embodiment of the present invention (part 1)
Figure 48B:
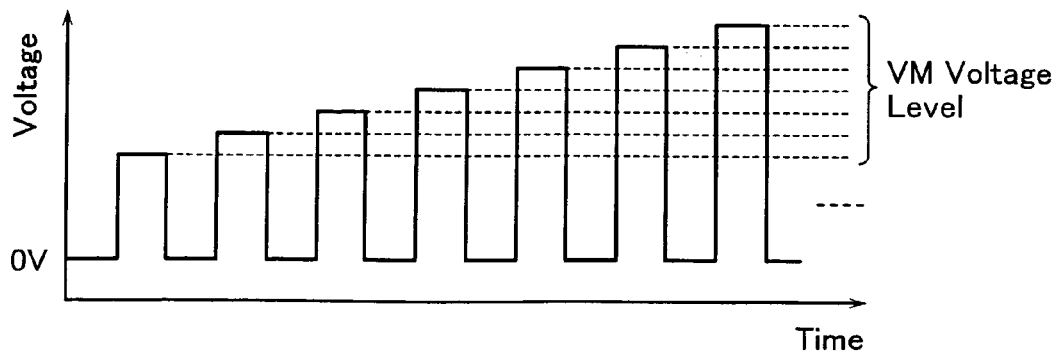
FIG. 48B shows the word line waveforms during the same operation (part 2)
Figure 48C:
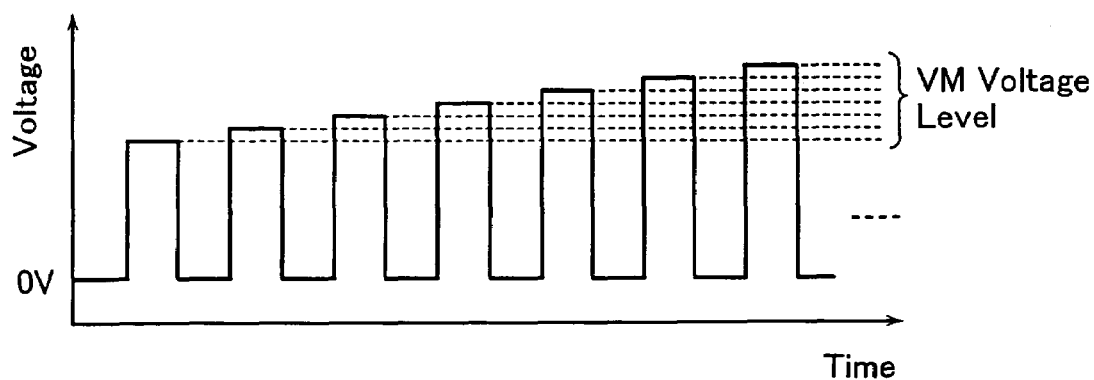
FIG. 48C shows the word line waveforms during the same operation (part 3)
Figure 48D:
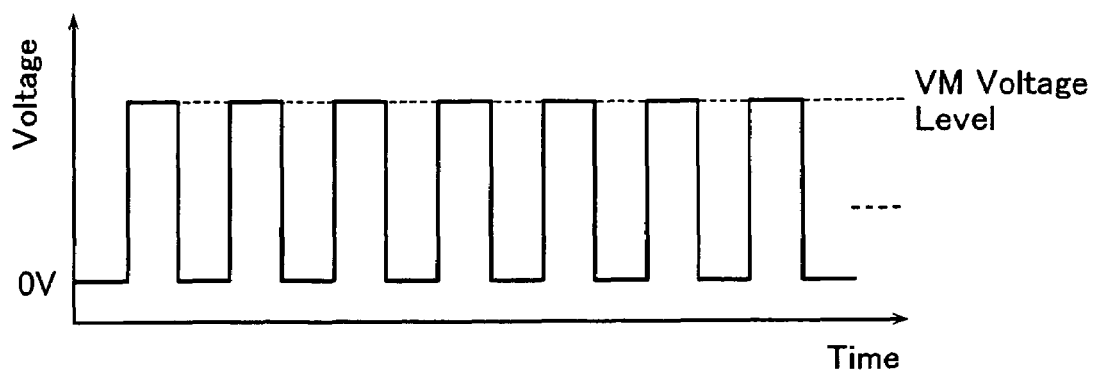
FIG. 48D shows the word line waveforms during the same operation (part 4)

FIG. 48A shows an example of VPP waveform on data writing. FIGS. 48B-D show examples of VM waveform on data writing. In FIG. 48A, like the waveform in FIG. 45, the VPP level rises in accordance with increase in the number of write loops. Accordingly, the VPP level, which is applied to the selected word line during write pulse applying, also rises in accordance with increase in the number of write loops. FIG. 48B shows a waveform example in the case where the VM level (also applicable to VM1 and VM2) rises in accordance with increase in the number of write loops. In this case, the VM level, which is applied to at least part of the non-selected word lines during write pulse applying, also rises in accordance with increase in the number of write loops. FIG. 48C is similar to FIG. 48B except that the amount of increase in the VM level per write loop is smaller in FIG. 48C than in FIG. 48B. FIG. 48D shows a waveform example in the case where the VM level is kept unchanged regardless of increase in the number of write loops.

Figure 49A:
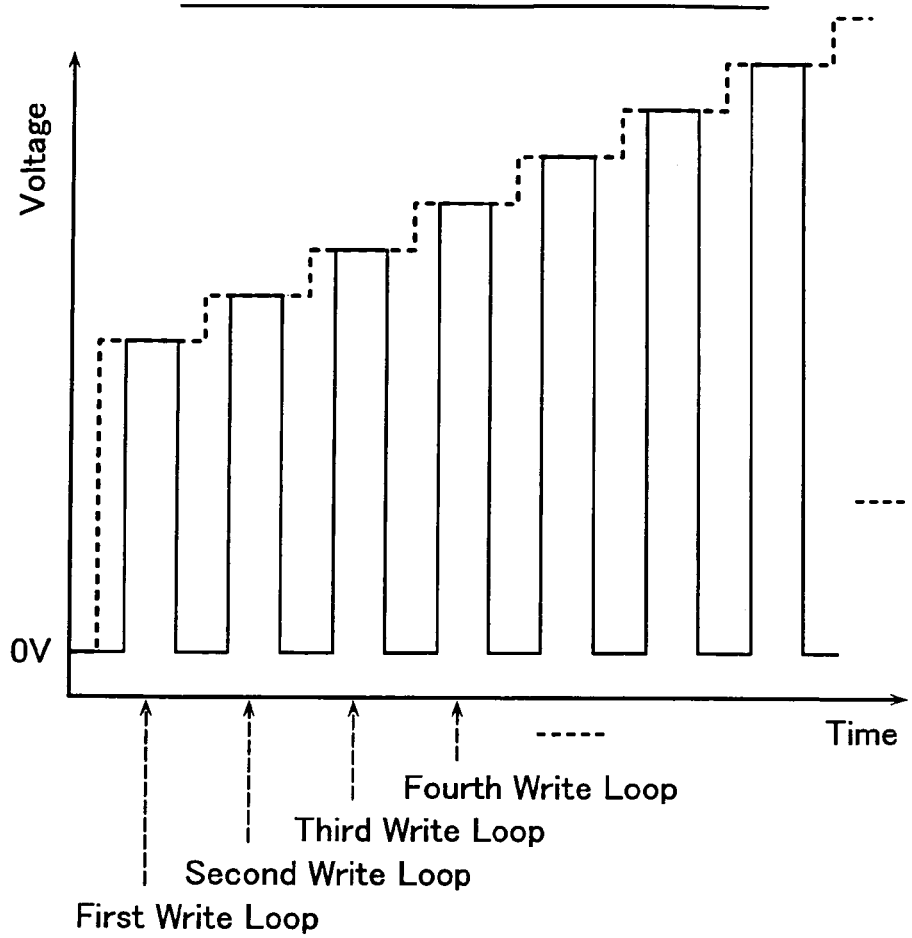
FIG. 49A shows another waveforms of the word line and the writing high and intermediate voltages during an operation of data writing according to the embodiment of the present invention (part 1)
Figure 49B:
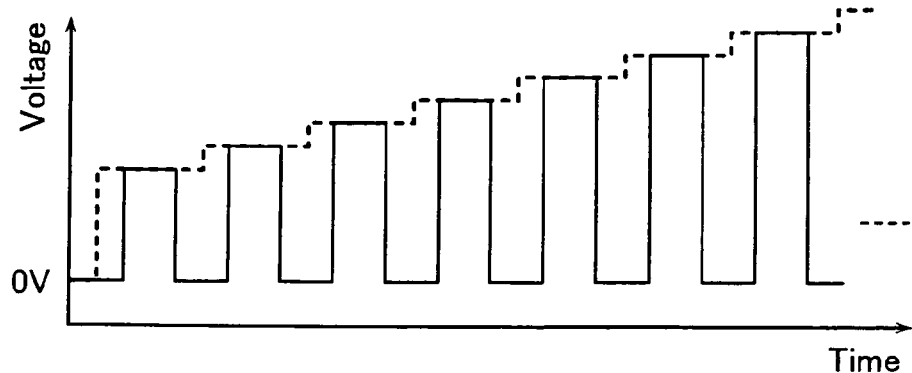
FIG. 49B shows the waveforms during the same operation (part 2)
Figure 49C:
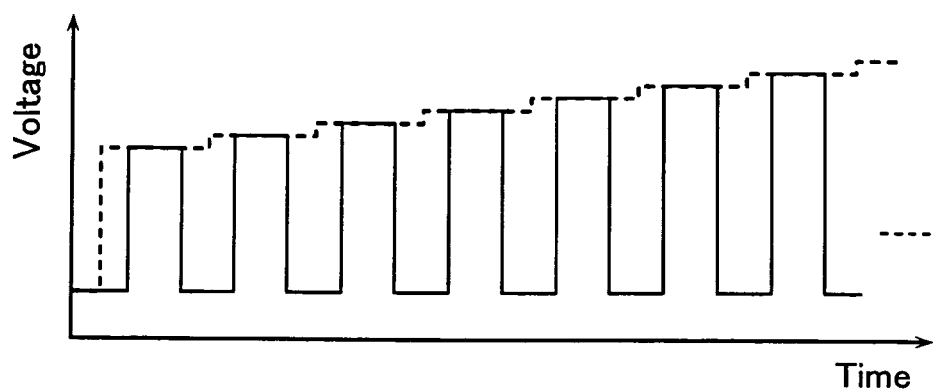
FIG. 49C shows the waveforms during the same operation (part 3)

FIGS. 49A-D show waveforms resulted from superimposition of the VPP or VM waveform on the waveforms in FIGS. 48A-D. In FIG. 49A, the waveform similar to that in FIG. 48A (the waveform depicted with the solid line in the figure) is superimposed on the VPP waveform (the waveform depicted with the dashed line in the figure). Similarly, in FIGS. 49B-D, the waveform similar to that in each of FIG. 48B-D (the waveform depicted with the solid line in the figure) is superimposed on the VM waveform (the waveform depicted with the dashed line in the figure). If it is intended to elevate the VPP level per increase in the number of write loops as shown in FIG. 49A, a method may be employed to change (or elevate) the VPP level during a period of time other than the period of applying VPP to the selected WL. This method is effective to achieve a stable writing operation because it can stabilize the VPP level during the period of applying VPP to the selected WL. Similarly, if it is intended to elevate the VM level per increase in the number of write loops as shown in FIGS. 49B-C, a method may be employed to change (or elevate) the VM level during a period of time other than the period of applying VM to at least part of the non-selected WL. This method is effective to achieve a stable writing operation because it can stabilize the VM level during the period of applying VM to the non-selected WL.

FIG. 50 shows the selected WL waveforms and the VM-applied, non-selected WL waveforms in the operation of write pulse applying per write loop in the operational scheme of FIG. 46.

Figure 50A:
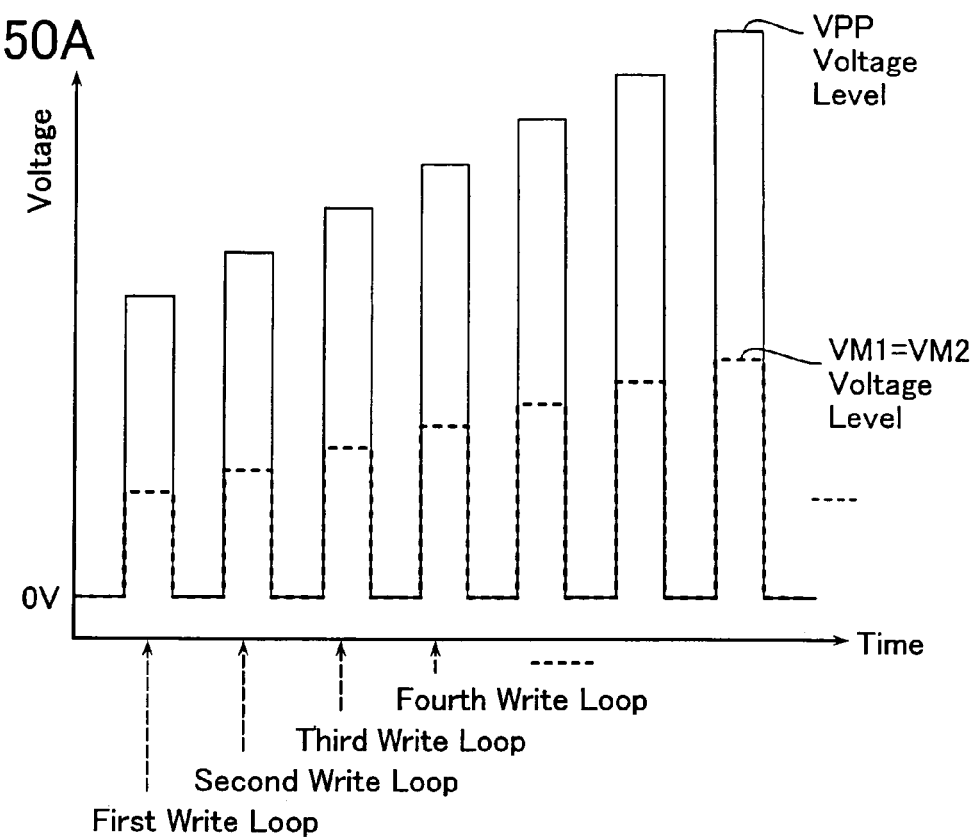
FIG. 50A shows yet another word line waveforms during an operation of data writing according to the embodiment of the present invention (part 1)

FIG. 50A corresponds to FIG. 41A in the same operation. As VM1=VM2=VM, it shows a generally used conventional method, which is also applicable to FIG. 6 or FIG. 13 similarly as in the case of FIG. 46.

Figure 50B:
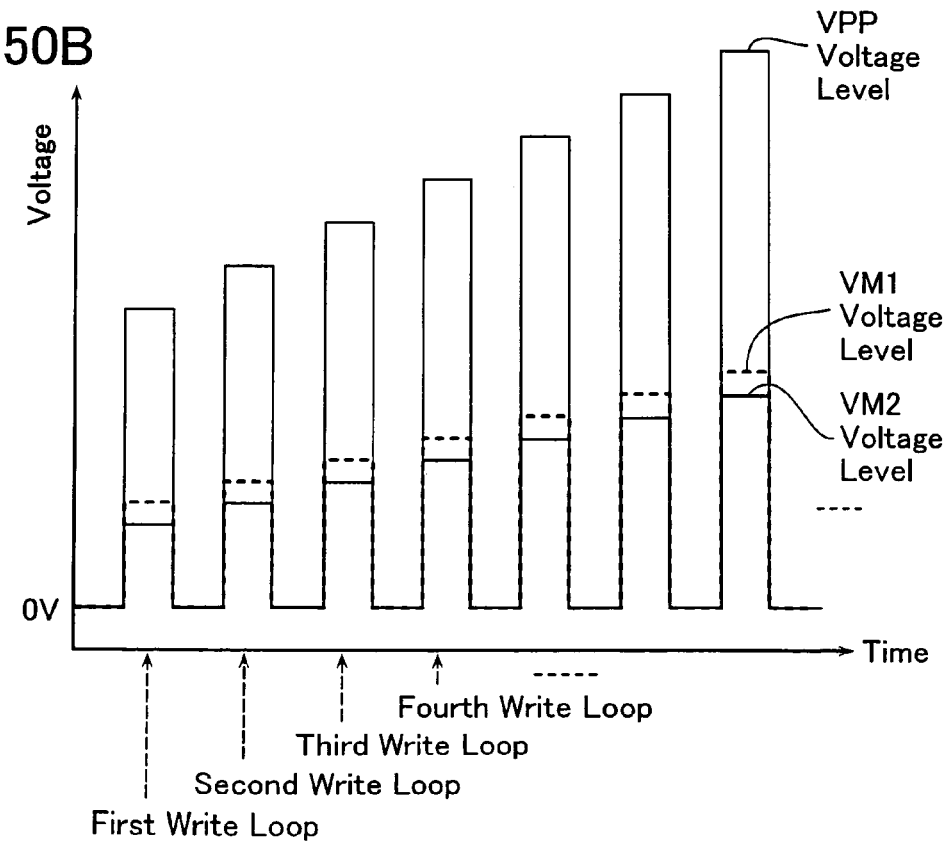
FIG. 50B shows the word line waveforms during the same operation (part 2)

FIG. 50B shows waveforms in the case where VM1 differs in level from VM2 and both the VM1 and VM2 levels are elevated almost similarly in accordance with increase in the number of write loops. In this case, as the voltage levels of VM1 and VM2 can be optimized separately, the flexibility for voltage setting can be made higher than the case of FIG. 50A. In addition, the reliability against the erroneous write failure can be improved higher than the case of FIG. 50A.

Figure 50C:
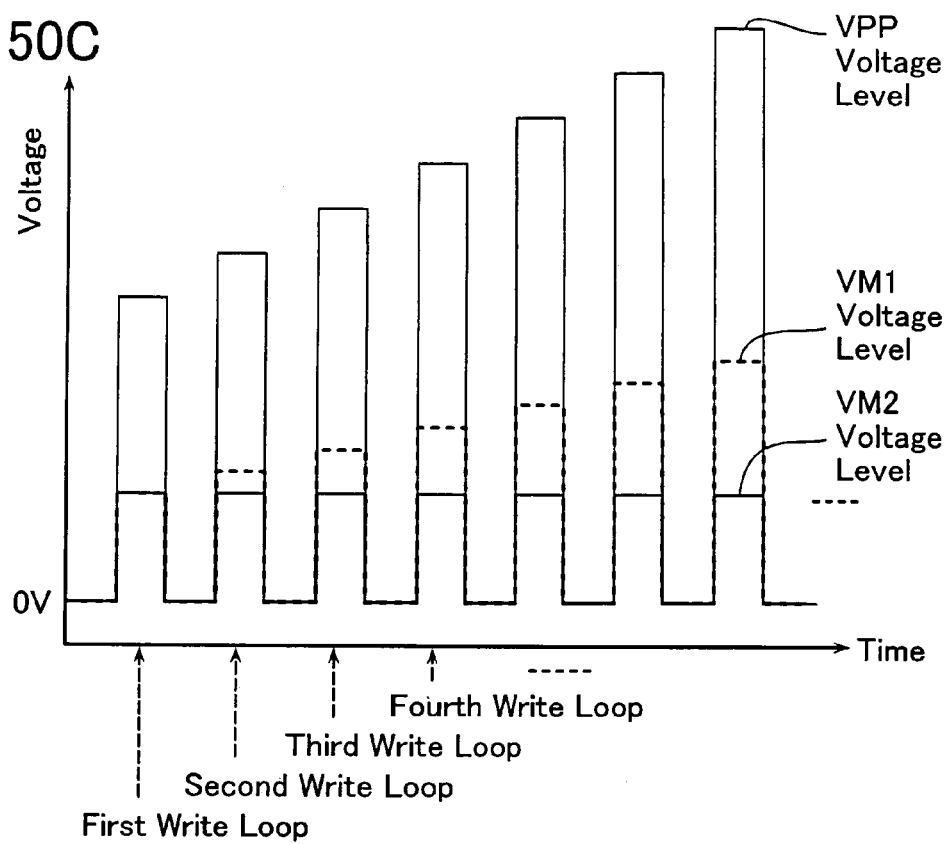
FIG. 50C shows the word line waveforms during the same operation (part 3)
Figure 50D:
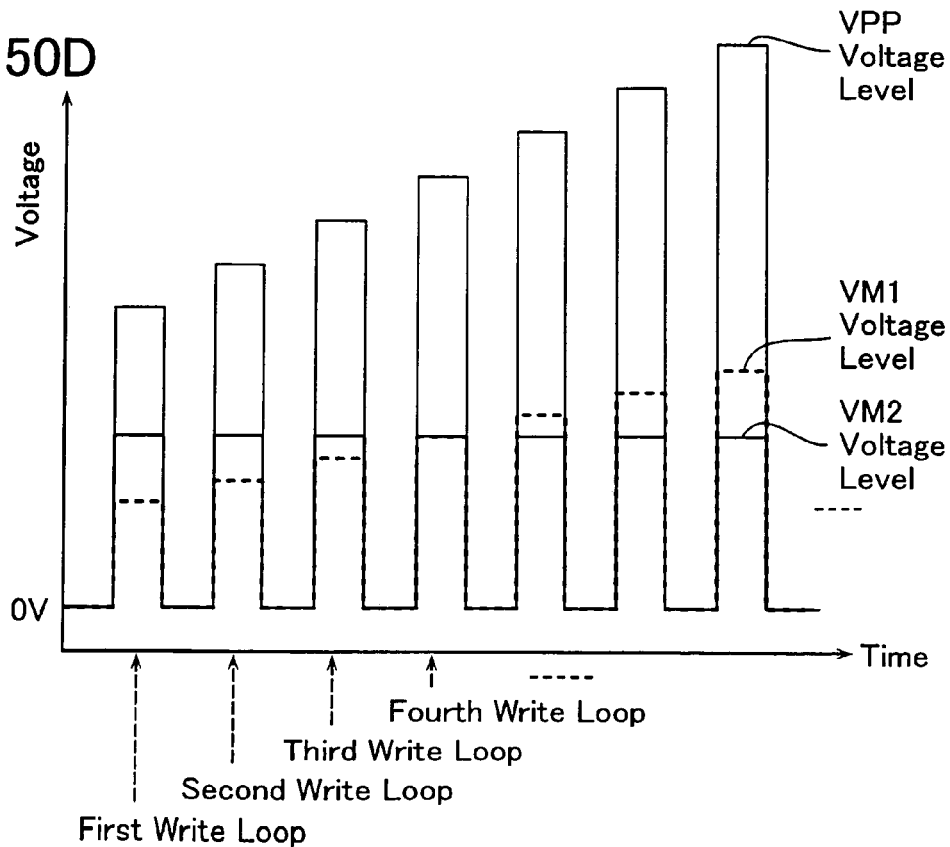
FIG. 50D shows the word line waveforms during the same operation (part 4)
Figure 50I:
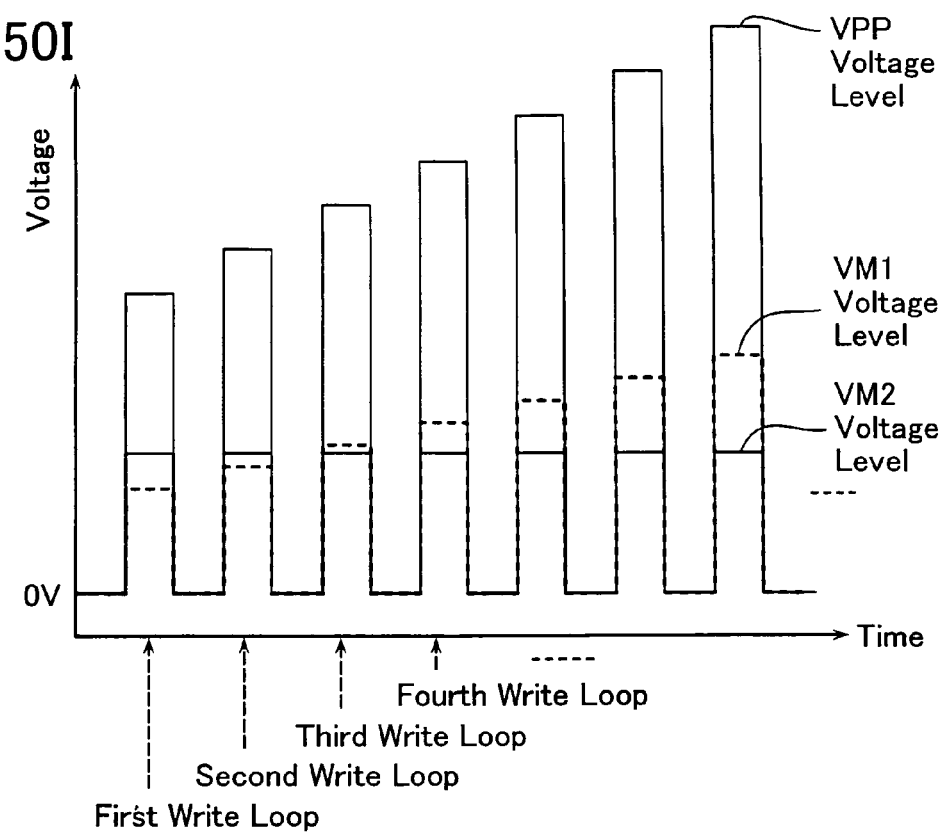
FIG. 50I shows the word line waveforms during the same operation (part 9)

FIG. 50C and FIG. 50D respectively correspond to FIG. 45B and FIG. 45A in the same operation. Both methods have a common point in that the VM1 level rises in accordance with increases in the number of write loops but the VM2 level remains unchanged independent of the number of write loops. FIG. 50C differs from FIG. 50D in the write loop that achieves VM1=VM2, which is first in the operation of FIG. 50C and forth in the operation of FIG. 50D. FIGS. 50C-D are advantageous as described above with reference to FIGS. 45A-B. The primary object of the VM2 voltage is to cut off the memory cell MC4 in the "1"-WRITE NAND cell. Accordingly, the optimal voltage for the reliability of the VM2 setting level is a constant one independent of the number of write loops. In contrast, the primary object of the VM1 voltage is to set a higher channel voltage at the selected memory cell MC3 in the "1"-WRITE NAND cell. Accordingly, it is optimal for the reliability to set the VM1 level higher in accordance with the elevated VPP level resulted from increase in the number of write loops. Therefore, the use of the method of FIGS. 50C-D makes it possible to improve the reliability higher than the method of FIG. 50A.

Figure 49D:
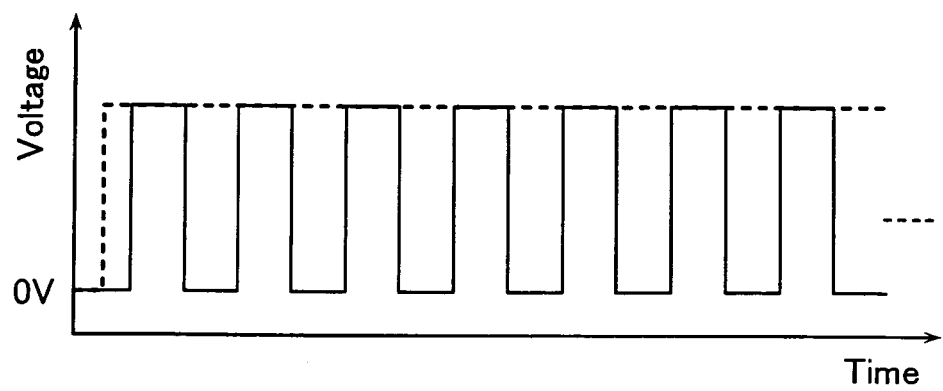
FIG. 49D shows the waveforms during the same operation (part 4)

Like the method of FIGS. 50C-D, the level of VM1 is elevated in accordance with increase in the number of write loops and VM2 has a constant value independent of the number of write loops also in a method of FIGS. 50E-I. Therefore, this method has the same advantage as that of FIGS. 50C-D. The operation in FIGS. 50C-I corresponds to the case where the waveforms of FIG. 49A are applied to the selected WL and the VPP level, the waveforms of FIG. 49B are applied to the VM1-applied, non-selected WL and the VM1 level, and the waveforms of FIG. 49D are applied to the VM2-applied, non-selected WL and the VM2 level.

Figure 50J:
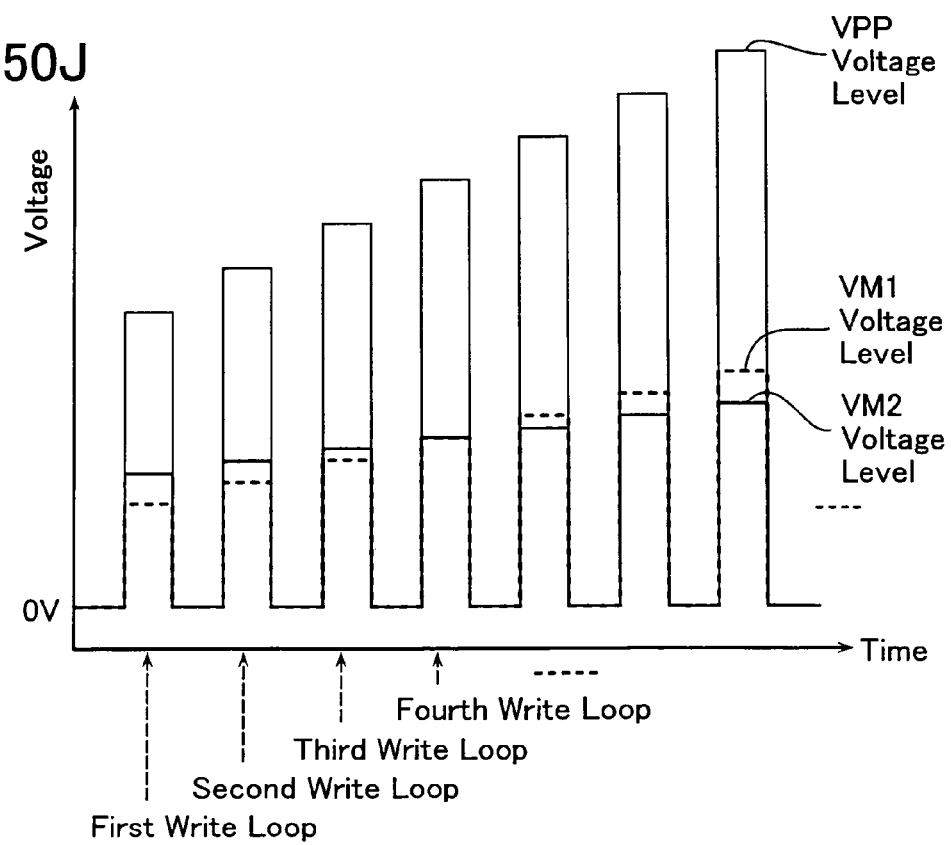
FIG. 50J shows the word line waveforms during the same operation (part 10)
Figure 50K:
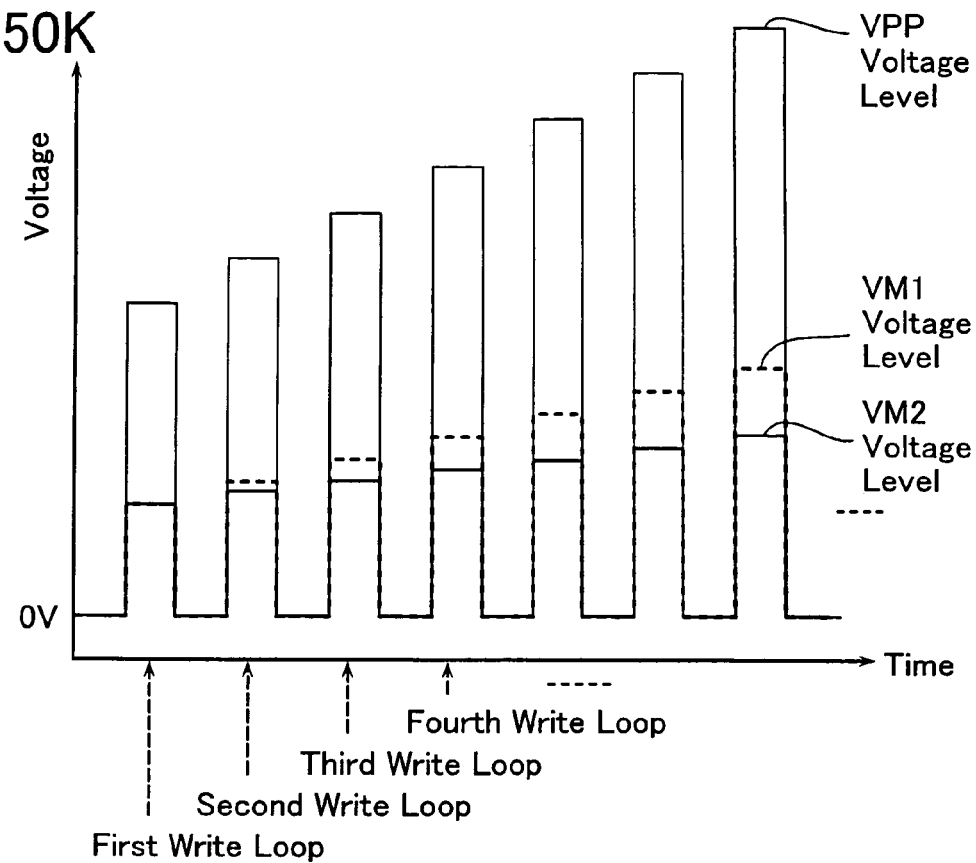
FIG. 50K shows the word line waveforms during the same operation (part 11)
Figure 50L:
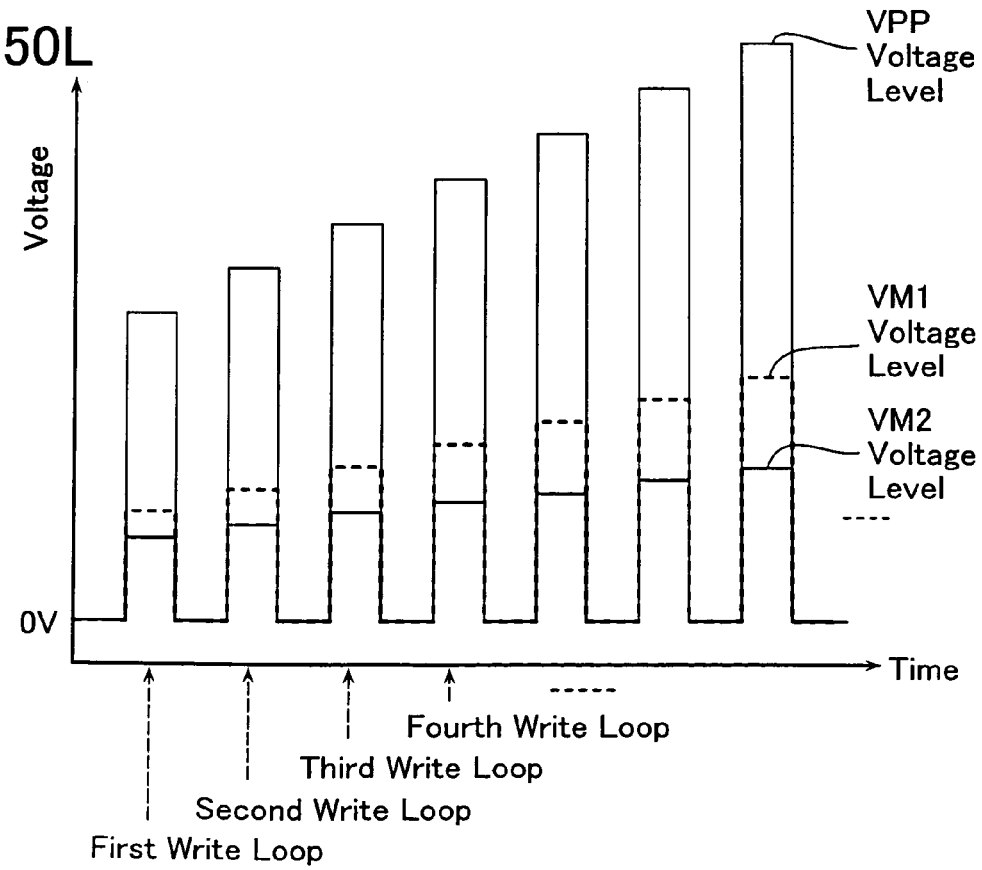
FIG. 50L shows the word line waveforms during the same operation (part 12)

FIGS. 50J-L show an embodiment in which both the levels of VM1 and VM2 are elevated in accordance with increase in the number of loops. The operation in FIGS. 50J-L corresponds to the case where the wave forms of FIG. 49A are applied to the selected WL and the VPP level, the waveforms of FIG. 49B are applied to the VM1-applied, non-selected WL and the VM1 level, and the waveforms of FIG. 49D are applied to the VM2-applied, non-selected WL and the VM2 level. The use of the method of FIGS. 50J-L also makes it possible to optimize the voltage levels of VM1 and VM2 separately. In addition, it is possible to optimize the amount of voltage level elevated per write loop separately for VM1 and VM2. Therefore, the reliability can be improved higher than the use of the method of FIG. 50A. In particular, VM2 may be smaller than VM1 in the amount of voltage level elevated per write loop. This case is not required to place an unnecessarily large voltage stress on the VM2-applied memory cell. Nevertheless, the channel voltage at the selected memory cell in the "1"-WRITE NAND cell can be set to an optimal value per loop (the amount of VM1 level elevated per loop can be set sufficiently large in accordance with VPP). Accordingly, this case is advantageous to realize highly reliable chips.

FIG. 50M shows an example of waveforms in the case where both VM1 and VM2 are independent of the number of write loops and the VM1 and VM2 levels are constant. Also in this case, VM1 and VM2 can be optimized separately. Accordingly, this case can be made higher in reliability than the case where VM1=VM2 and the voltage level is constant independent of the number of write loops.

Figure 50O:
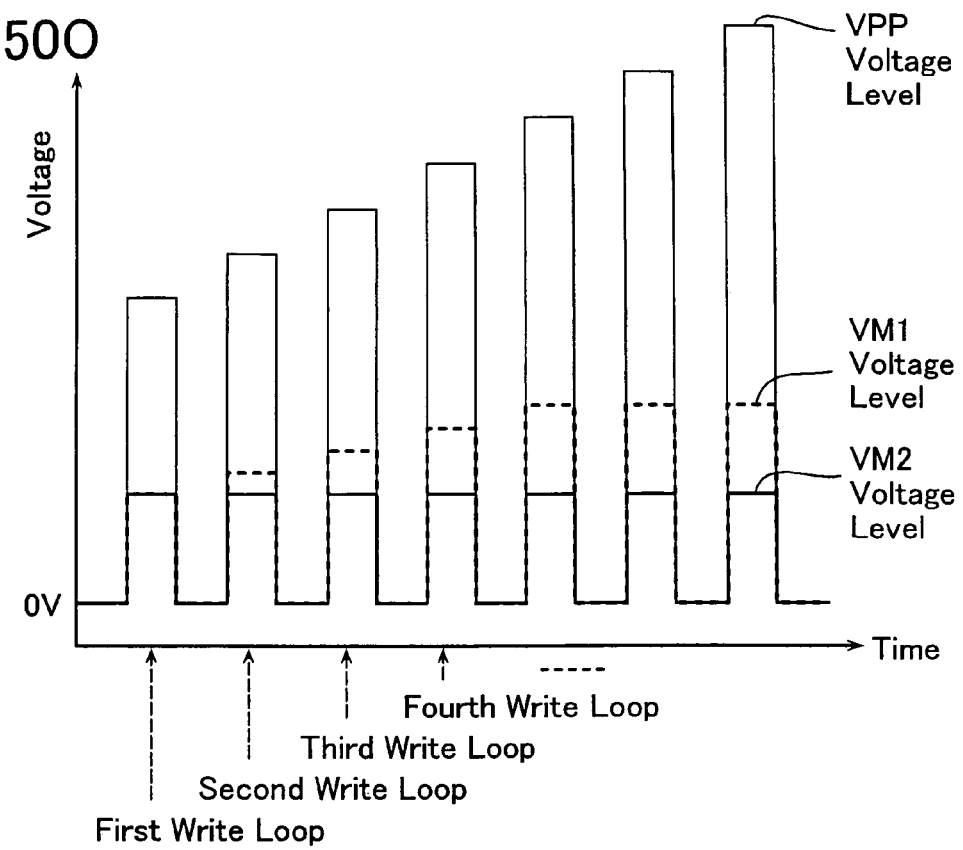
FIG. 50O shows the word line waveforms during the same operation (part 15)

FIGS. 50N-O show a method that gradually elevates the VM1 level until the fifth write loop and maintains the same VM1 level as that at the fifth write loop from on the sixth write loop. In this method, the VM2 level is maintained constant regardless of the number of write loops. In consideration of the above voltage stress of <I>, there may be an upper limit that prevents the VM1 level and the VM2 level from exceeding a certain value. If the VM1 level reaches the upper limit at the fifth write loop, it is preferable to keep the upper limit from on the sixth write loop. The operational method of FIGS. 50N-O is optimal for such the case.

Figure 50P:
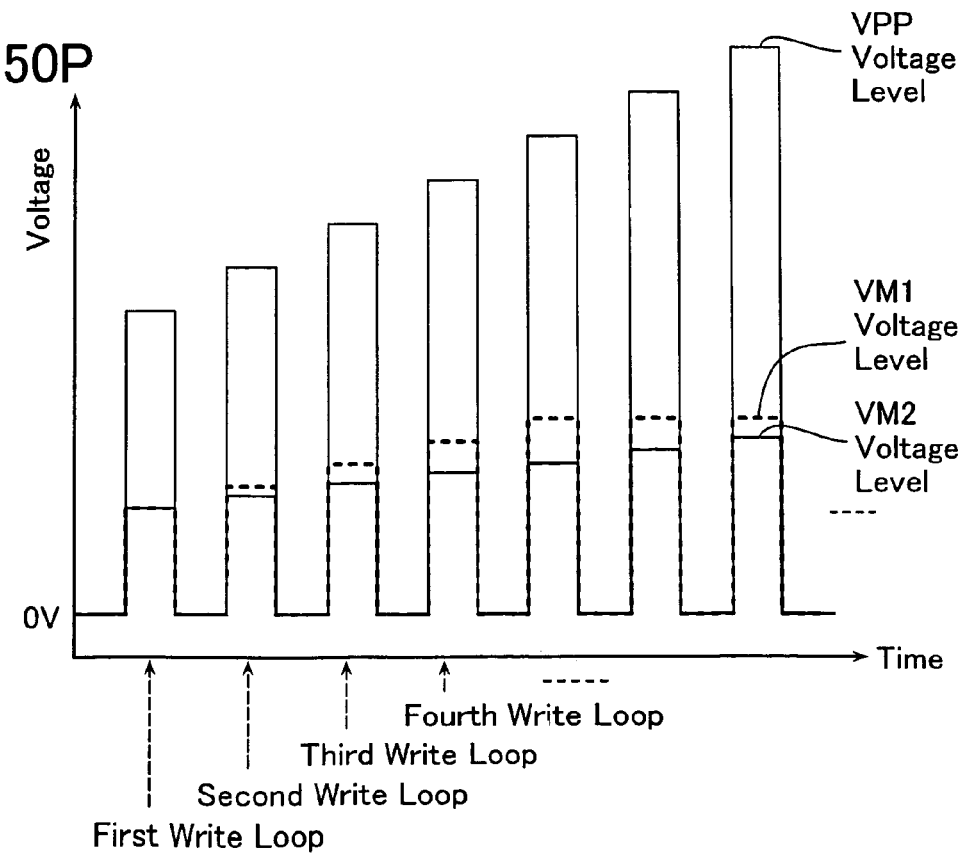
FIG. 50P shows the word line waveforms during the same operation (part 16)
Figure 50Q:
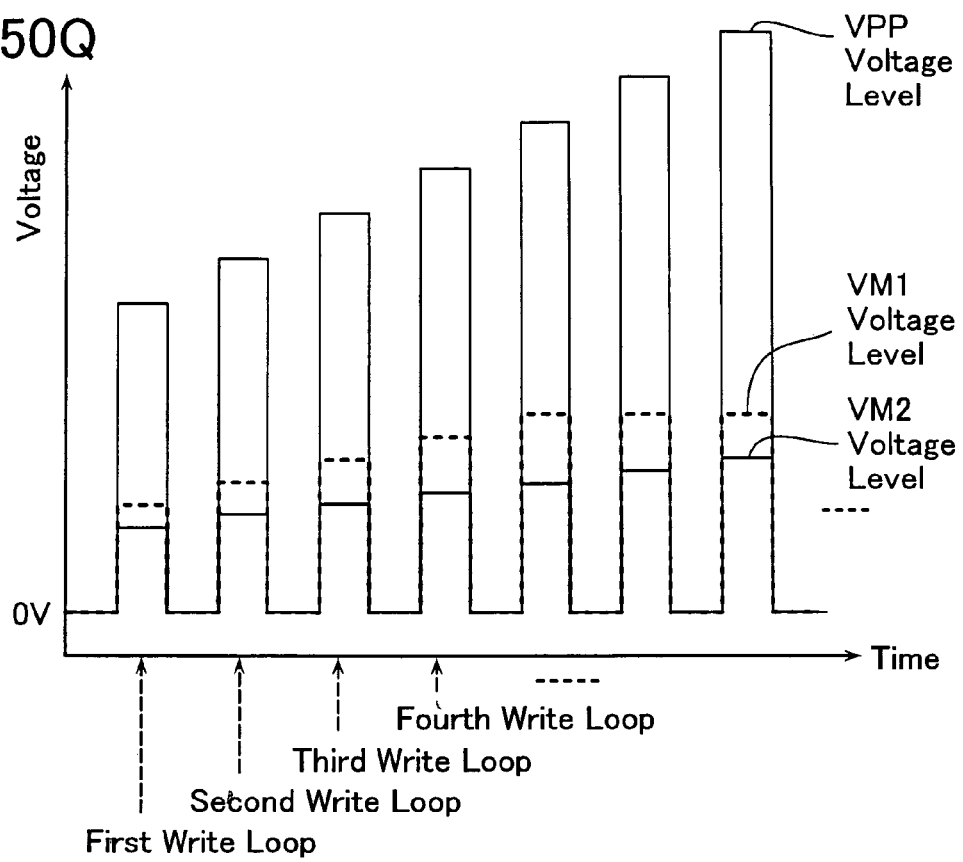
FIG. 50Q shows the word line waveforms during the same operation (part 17)

FIGS. 50P-Q show waveforms in the case where the VPP level in FIGS. 50K-L is kept at a constant value from on the fifth write loop. This case is also effective to achieve the same advantage as that in the case of FIGS. 50N-O.

Figure 50R:
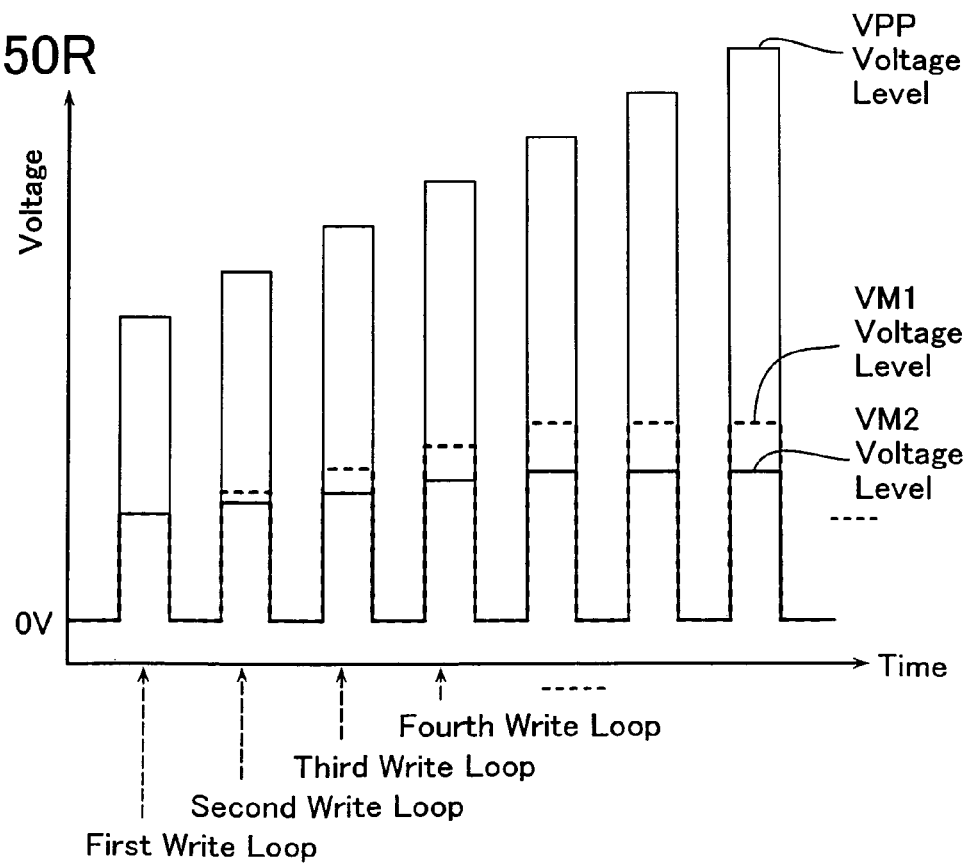
FIG. 50R shows the word line waveforms during the same operation (part 18)
Figure 50S:
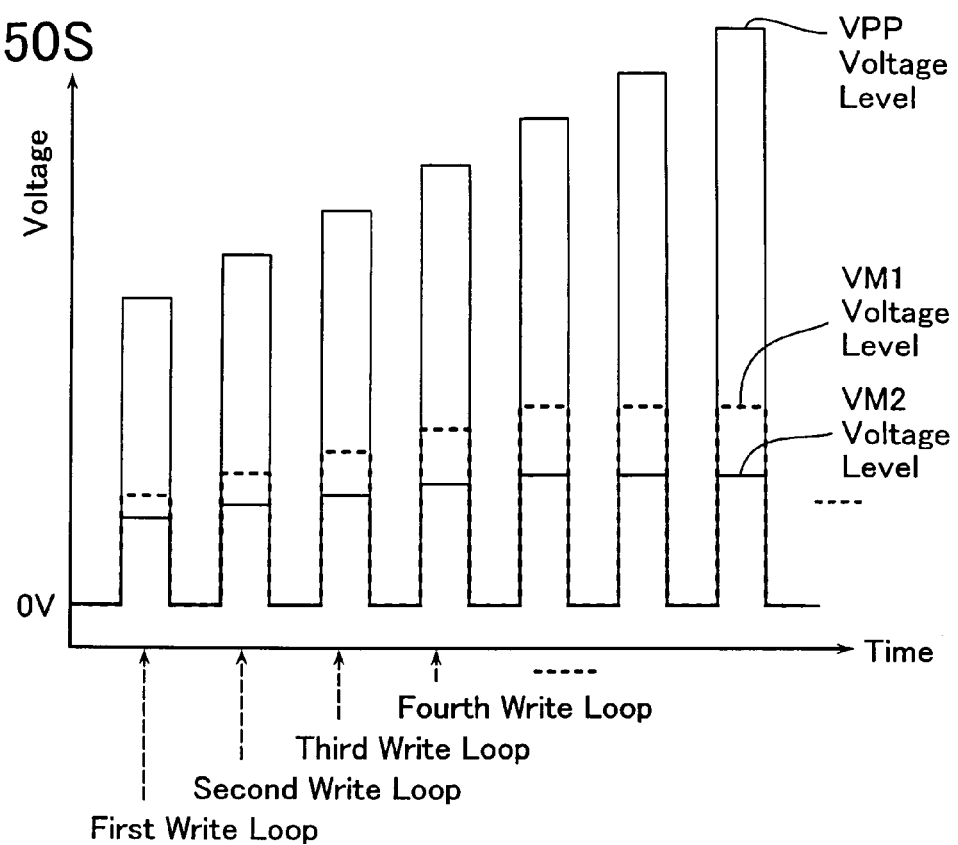
FIG. 50S shows the word line waveforms during the same operation (part 19)
Figure 50T:
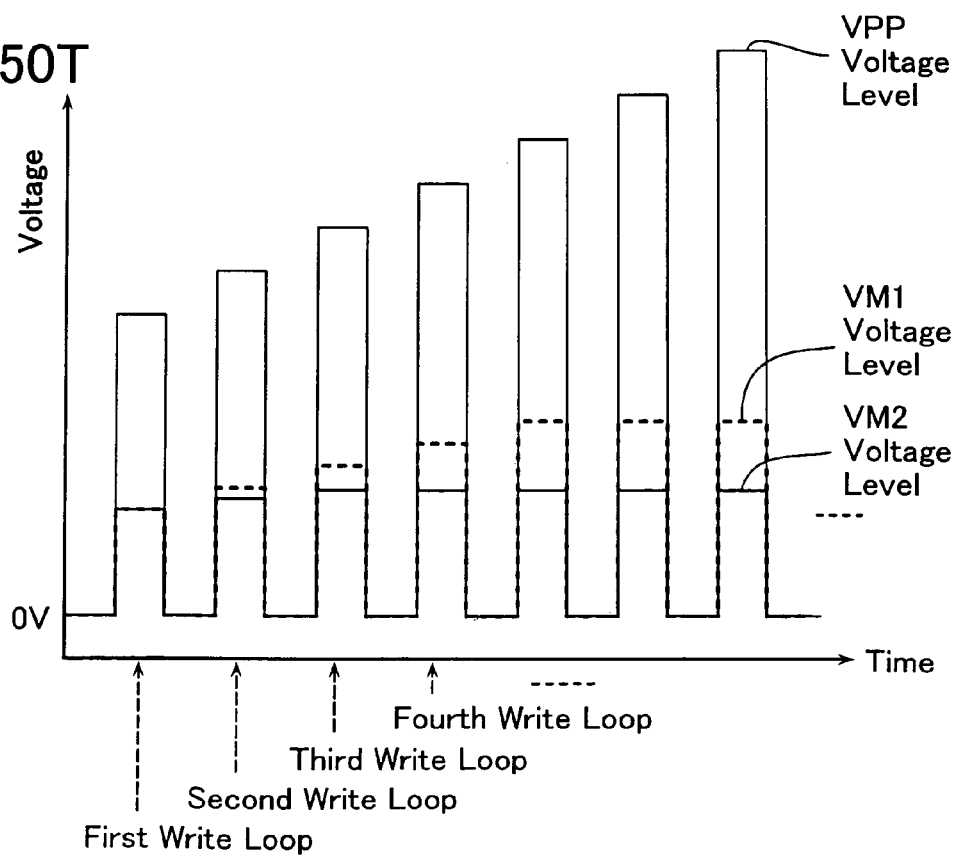
FIG. 50T shows the word line waveforms during the same operation (part 20)
Figure 50U:
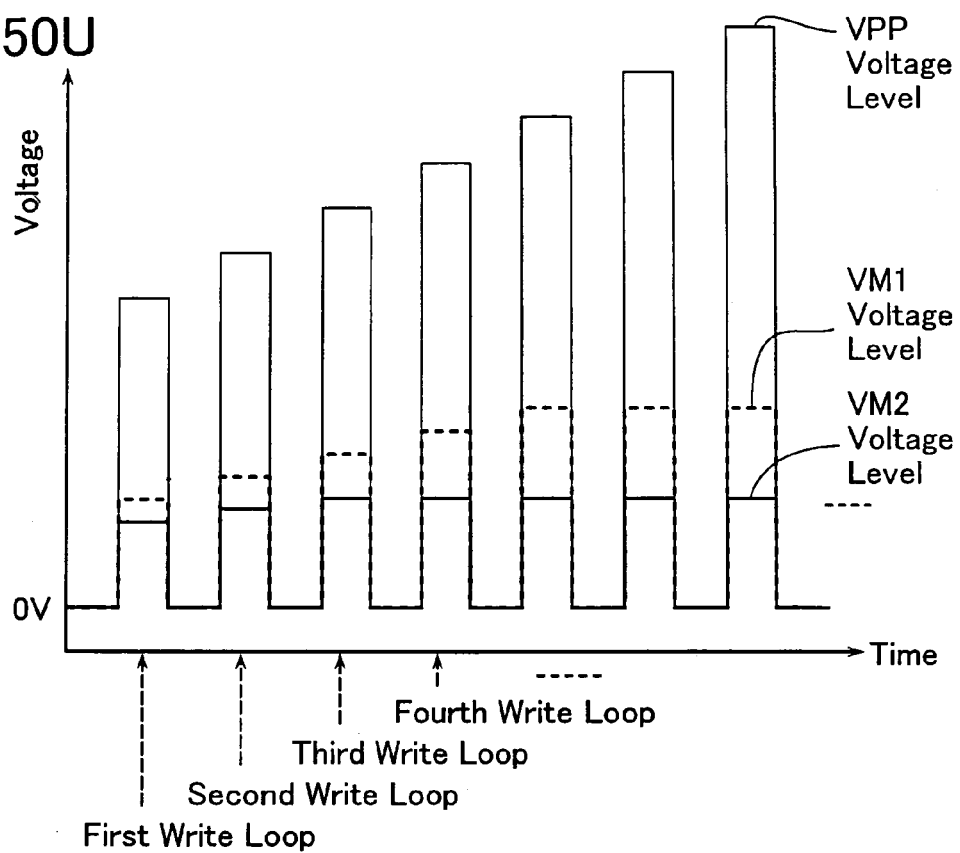
FIG. 50U shows the word line waveforms during the same operation (part 21)

FIGS. 50R-S show waveforms in the case where not only VM1 but also VM2 is kept at a constant value from on the fifth write loop in FIGS. 50K-L. FIGS. 50T-U show waveforms in the case where VM1 is kept at a constant value from on the fifth write loop and VM2 is kept at a constant value from on the third write loop in FIGS. 50K-L. This case is also effective to achieve the same advantage as that in the case of FIGS. 50N-O.

Figure 50V:
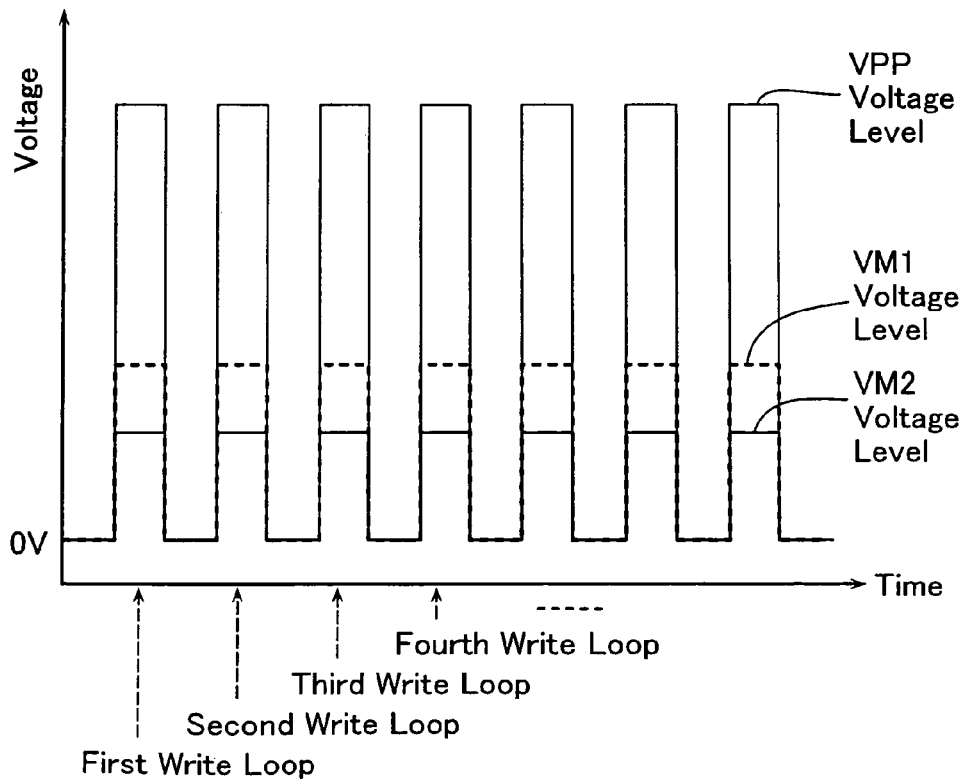
FIG. 50V shows the word line waveforms during the same operation (part 22)

FIG. 50V shows waveforms in the case where VPP, VM1 and VM2 are all kept at constant values regardless of the number of write loops. Also in this case, the values of VM1 and VM2 can be optimized separately compared with the case of VM1=VM2, and highly reliable chips can be realized than the case of VM1=VM2.

Figure 50W:
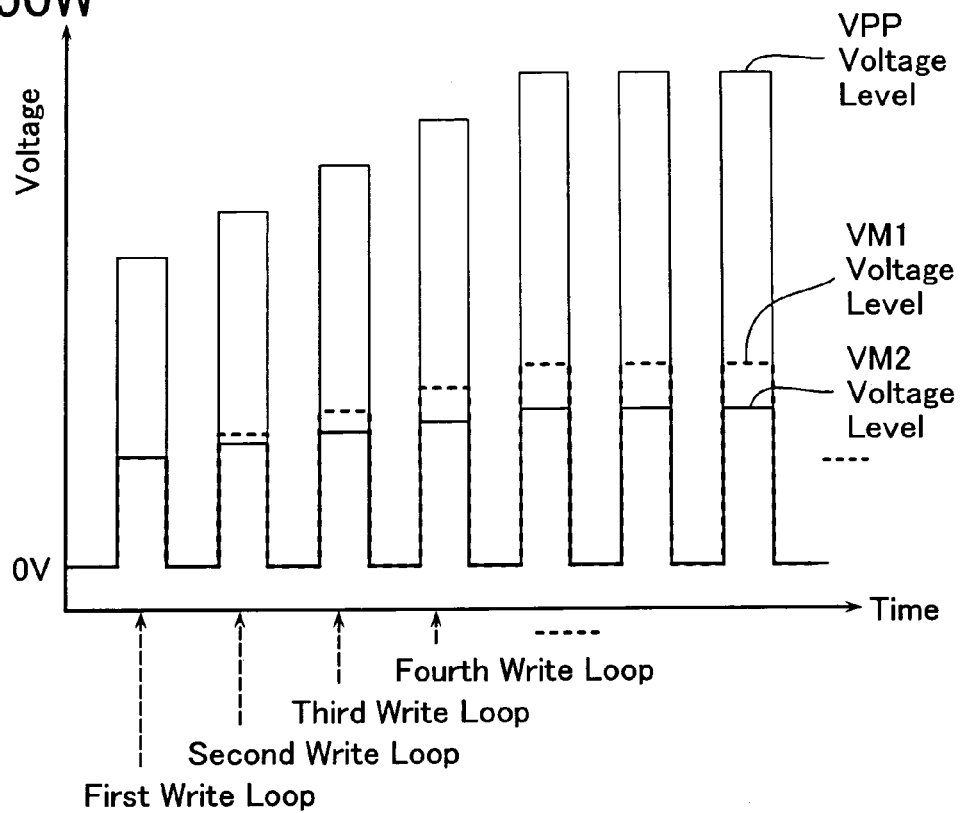
FIG. 50W shows the word line waveforms during the same operation (part 23)
Figure 50X:
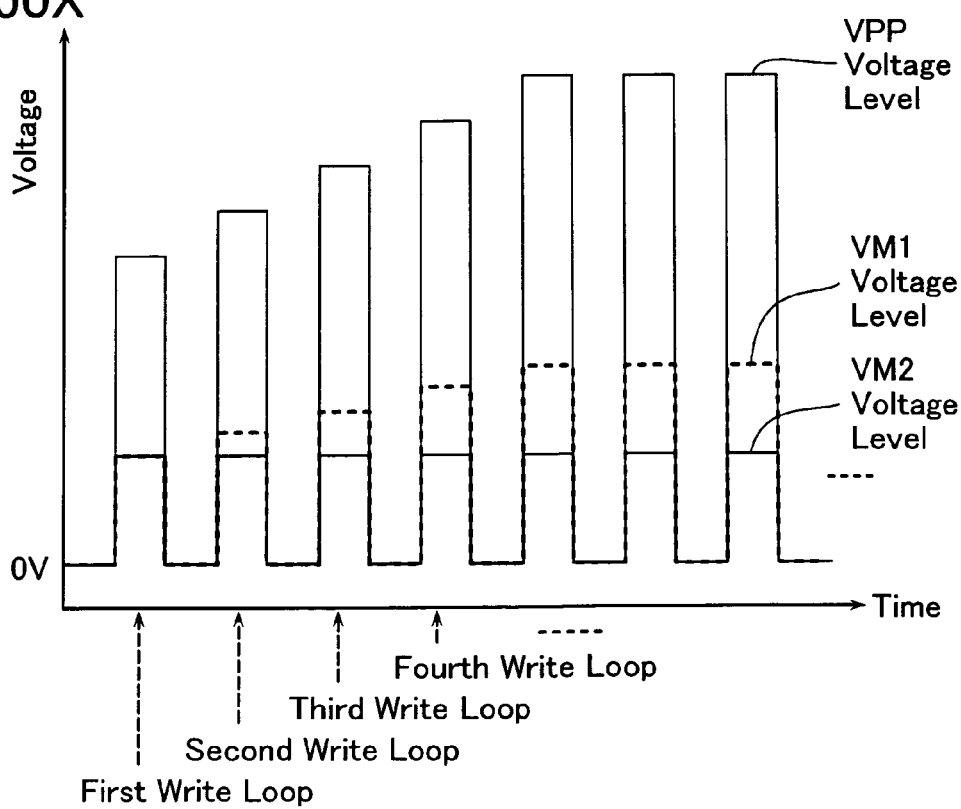
FIG. 50X shows the word line waveforms during the same operation (part 24)
Figure 51A:
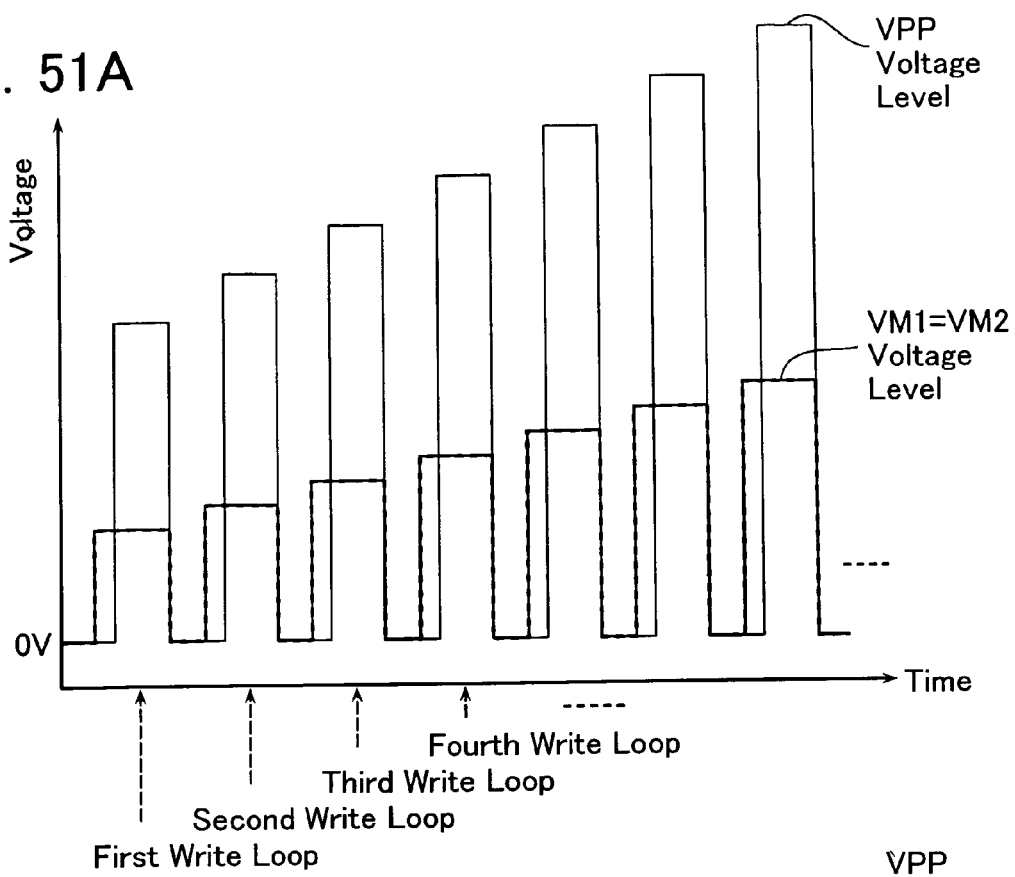
FIG. 51A shows still yet another word line waveforms during an operation of data writing according to the embodiment of the present invention (part 1)
Figure 51B:
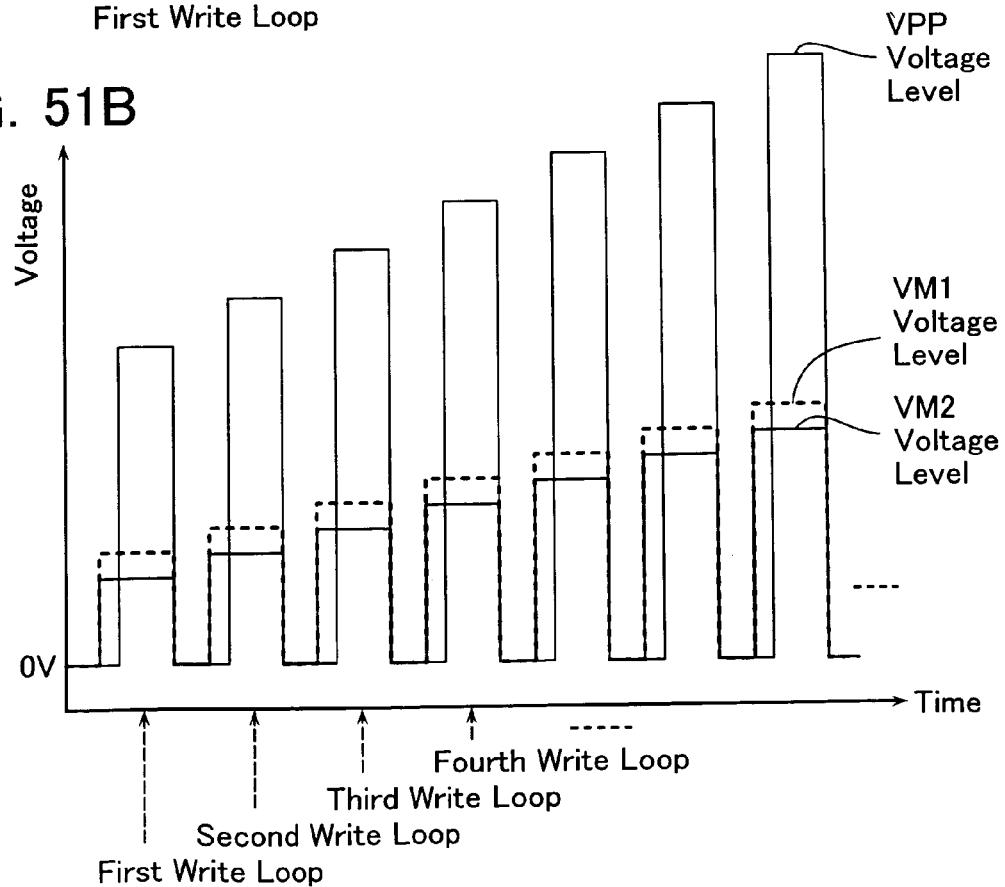
FIG. 51B shows the word line waveforms during the same operation (part 2)
Figure 51I:
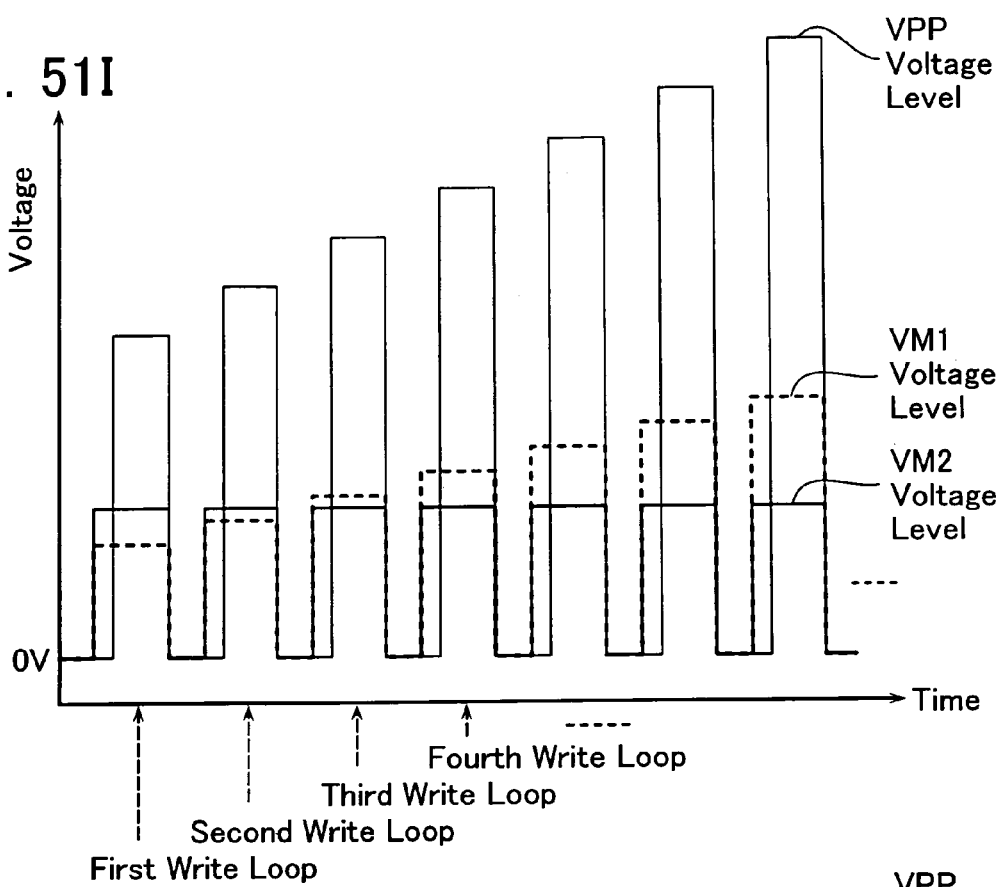
FIG. 51I shows the word line waveforms during the same operation (part 9)
Figure 51J:
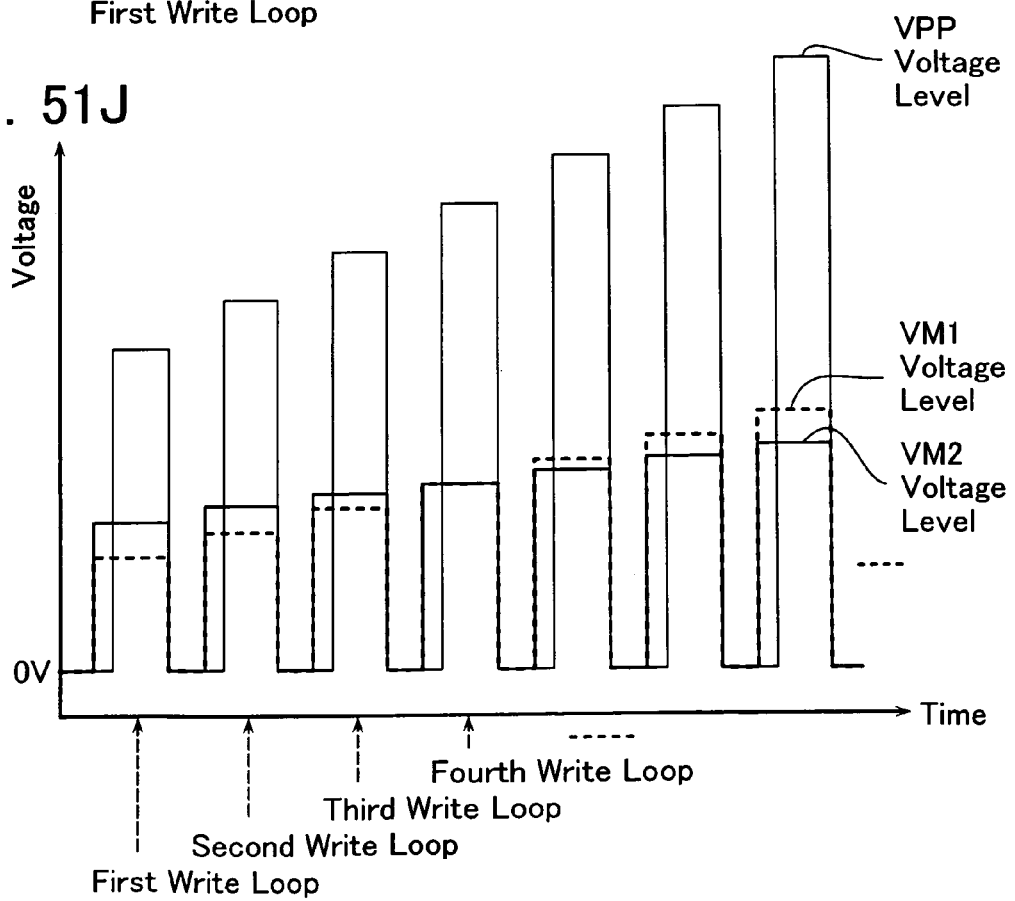
FIG. 51J shows the word line waveforms during the same operation (part 10)
Figure 51K:
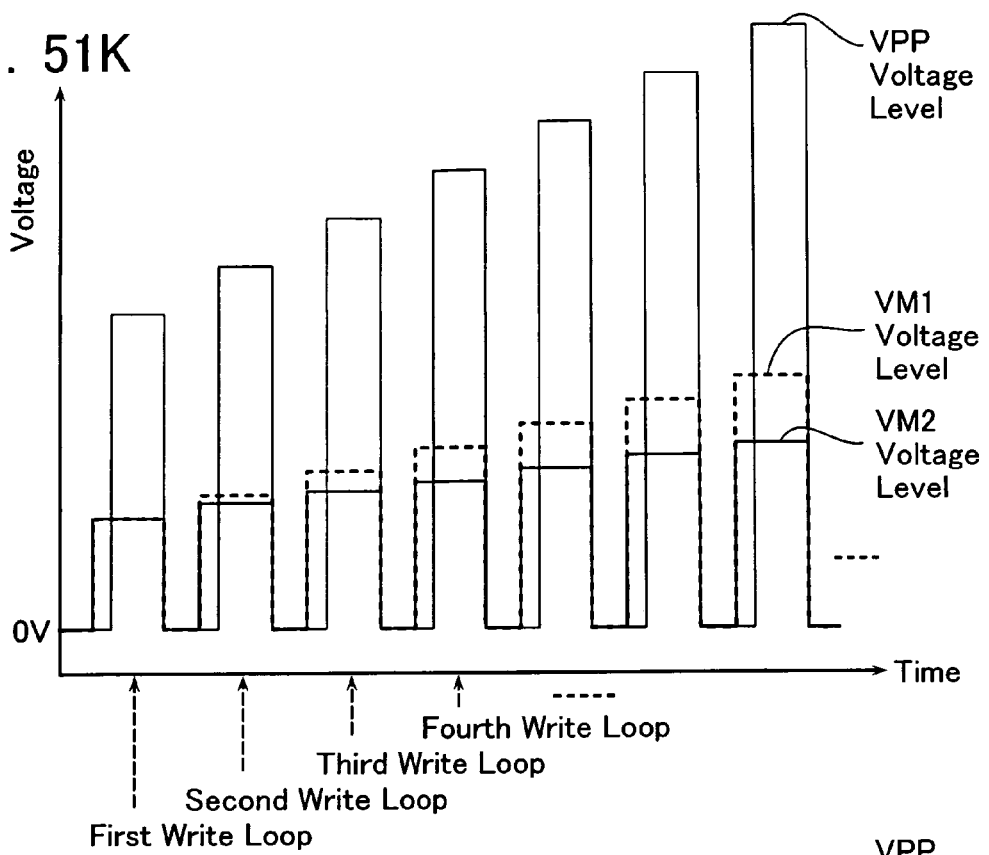
FIG. 51K shows the word line waveforms during the same operation (part 11)
Figure 51L:
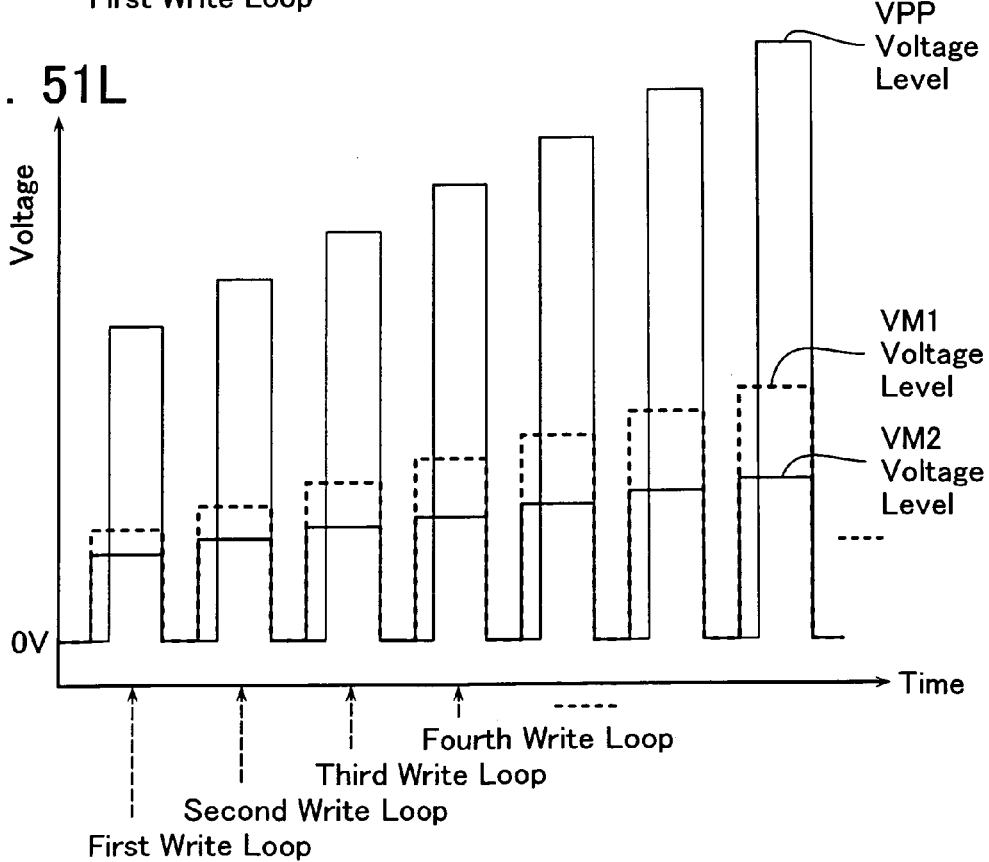
FIG. 51L shows the word line waveforms during the same operation (part 12)
Figure 51M:
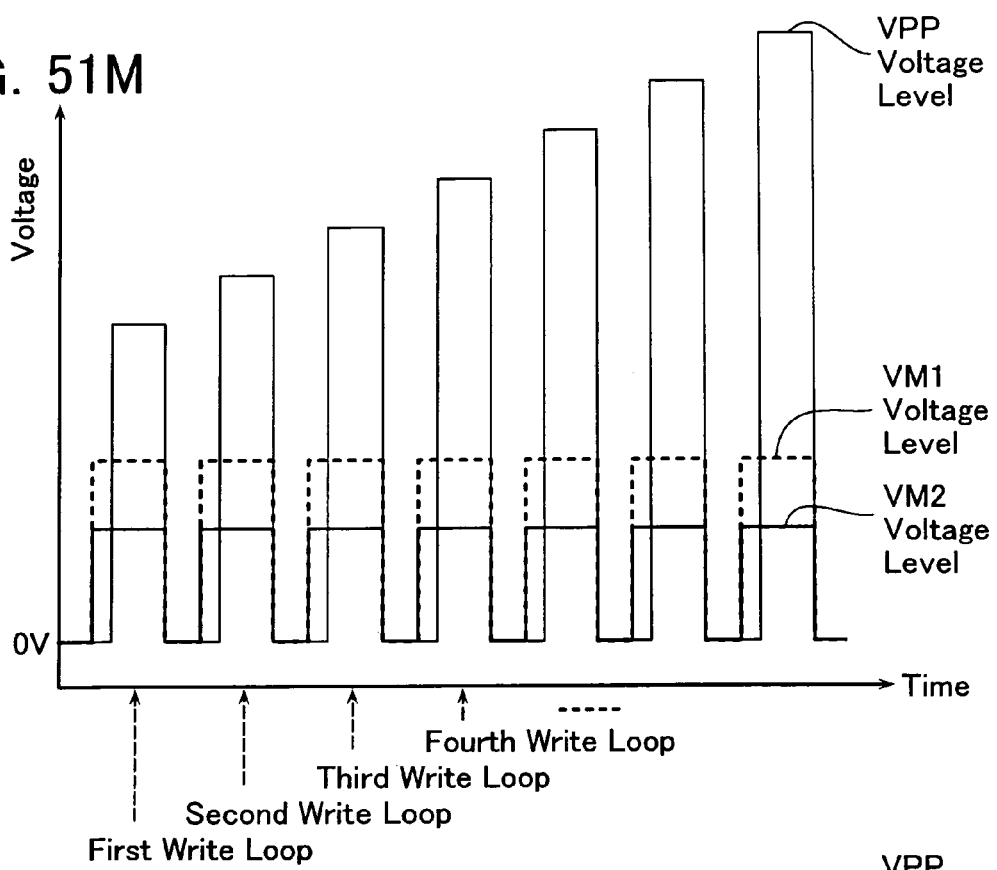
FIG. 51M shows the word line waveforms during the same operation (part 13)
Figure 51N:
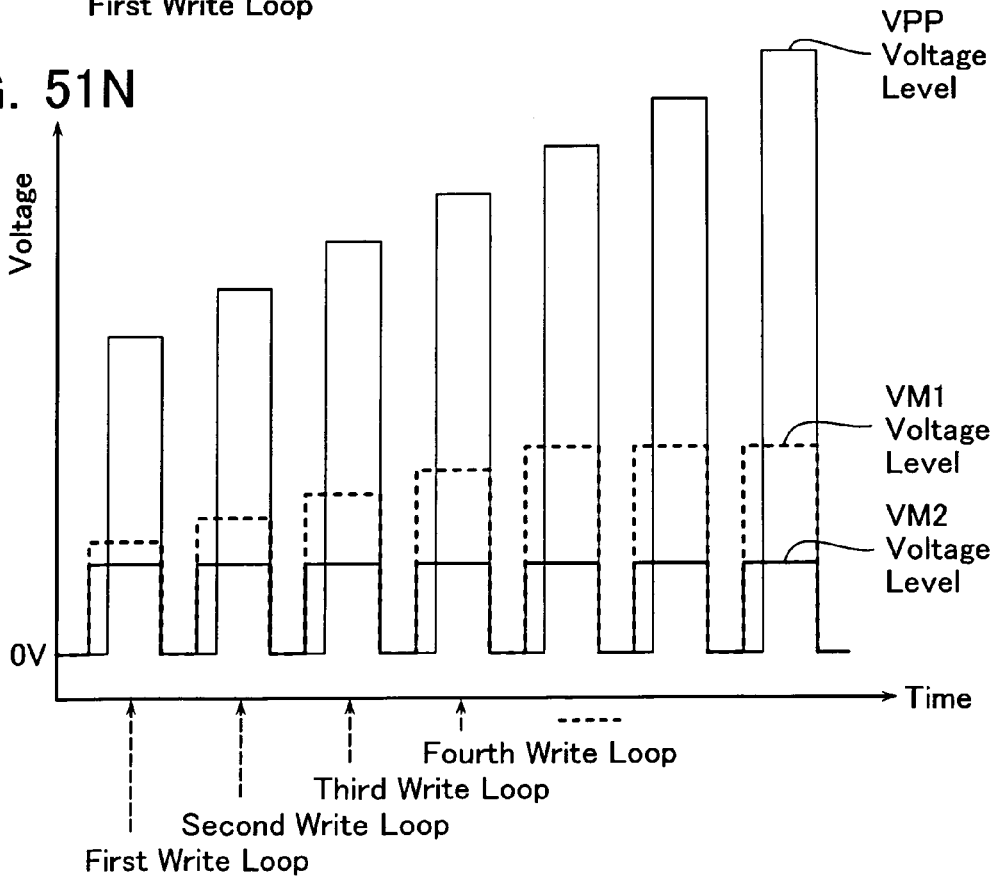
FIG. 51N shows the word line waveforms during the same operation (part 14)
Figure 51O:
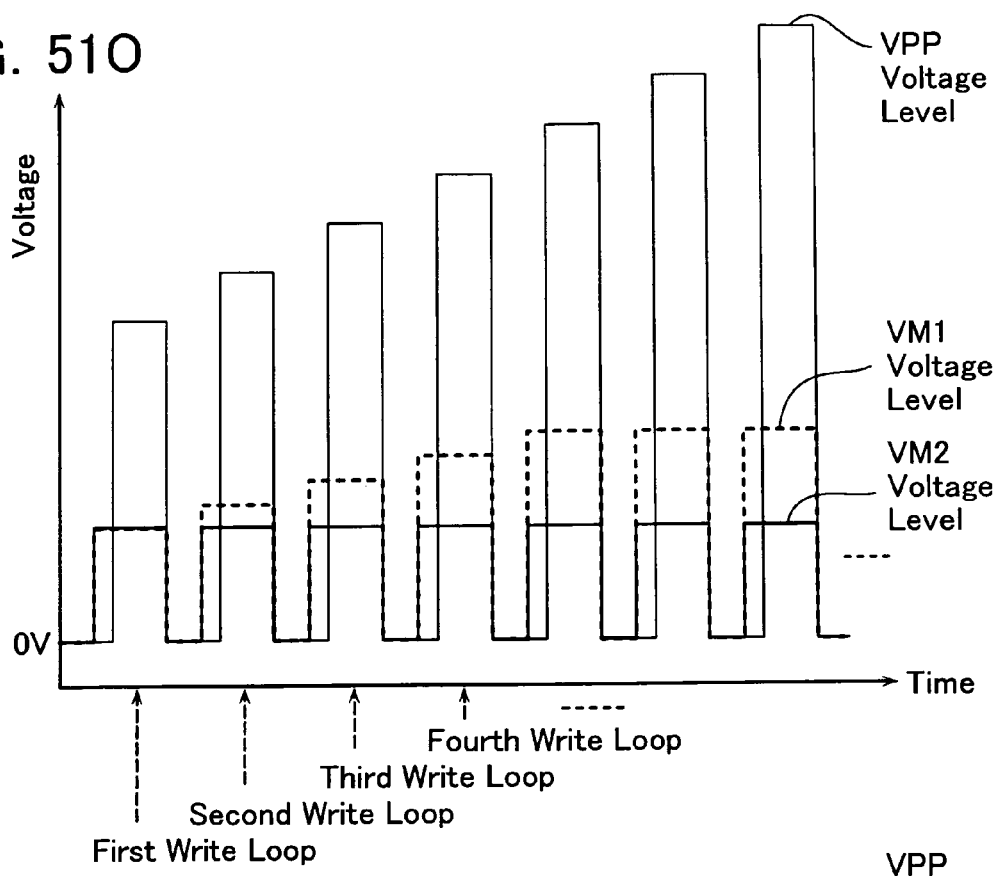
FIG. 51O shows the word line waveforms during the same operation (part 15)
Figure 51P:
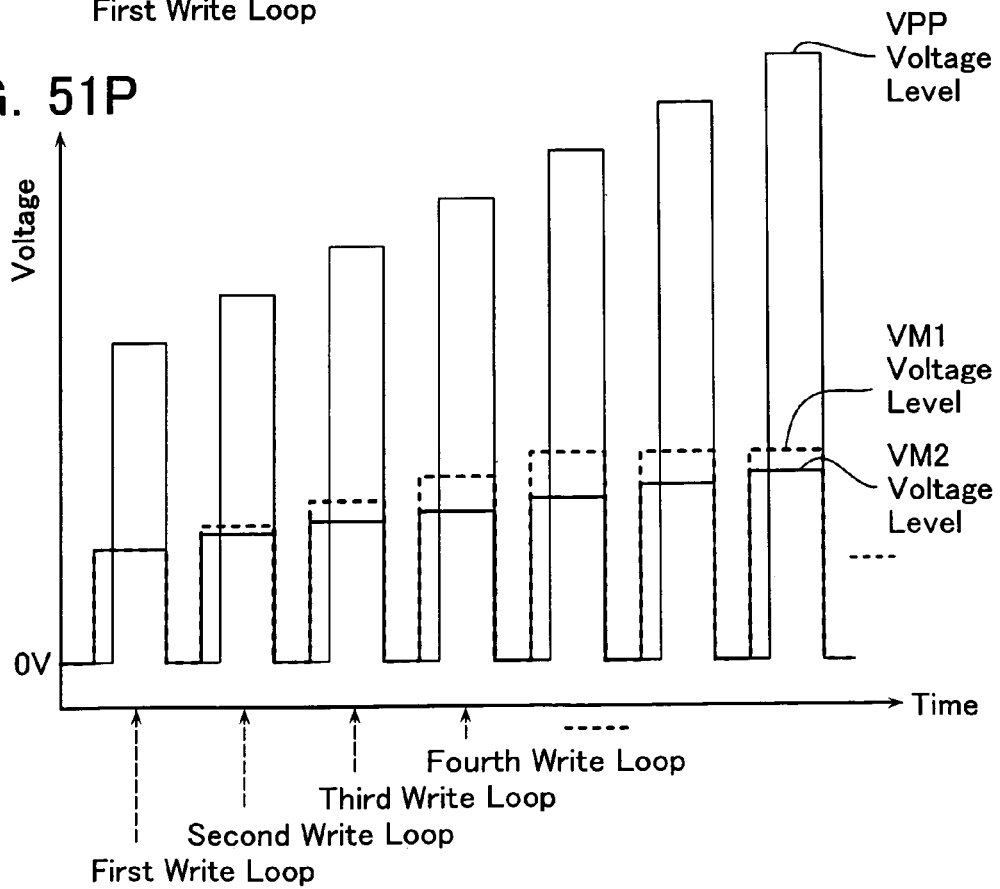
FIG. 51P shows the word line waveforms during the same operation (part 16)
Figure 51Q:
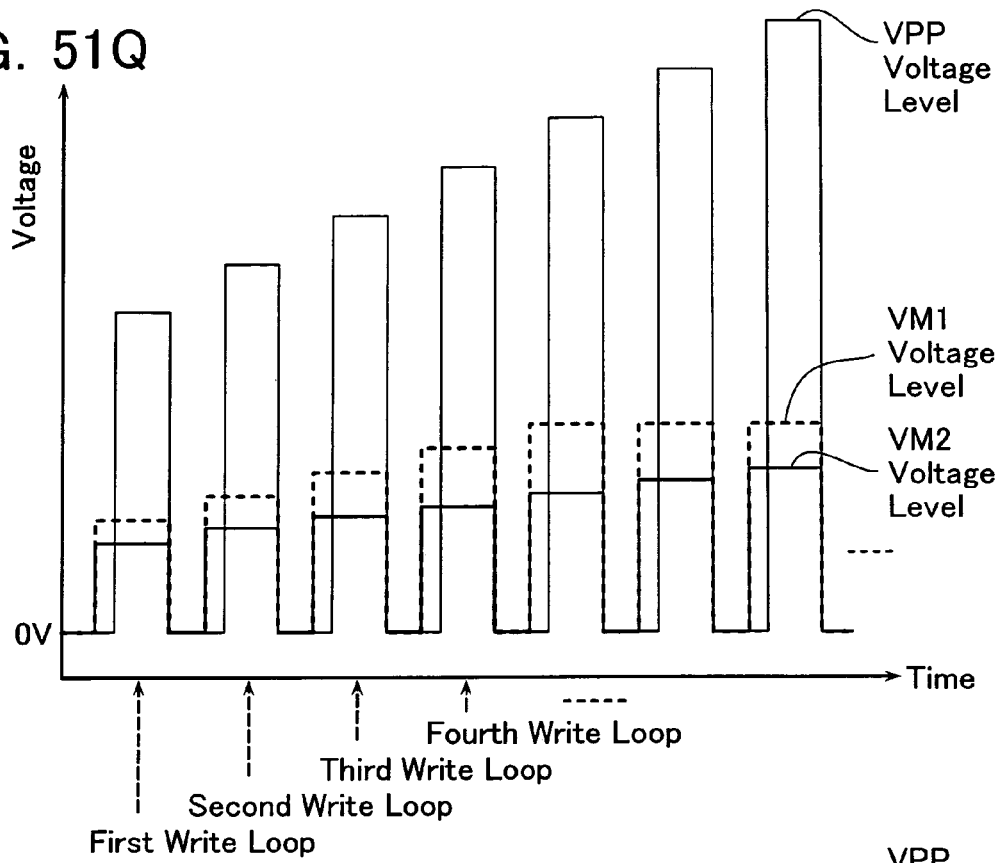
FIG. 51Q shows the word line waveforms during the same operation (part 17)
Figure 51R:
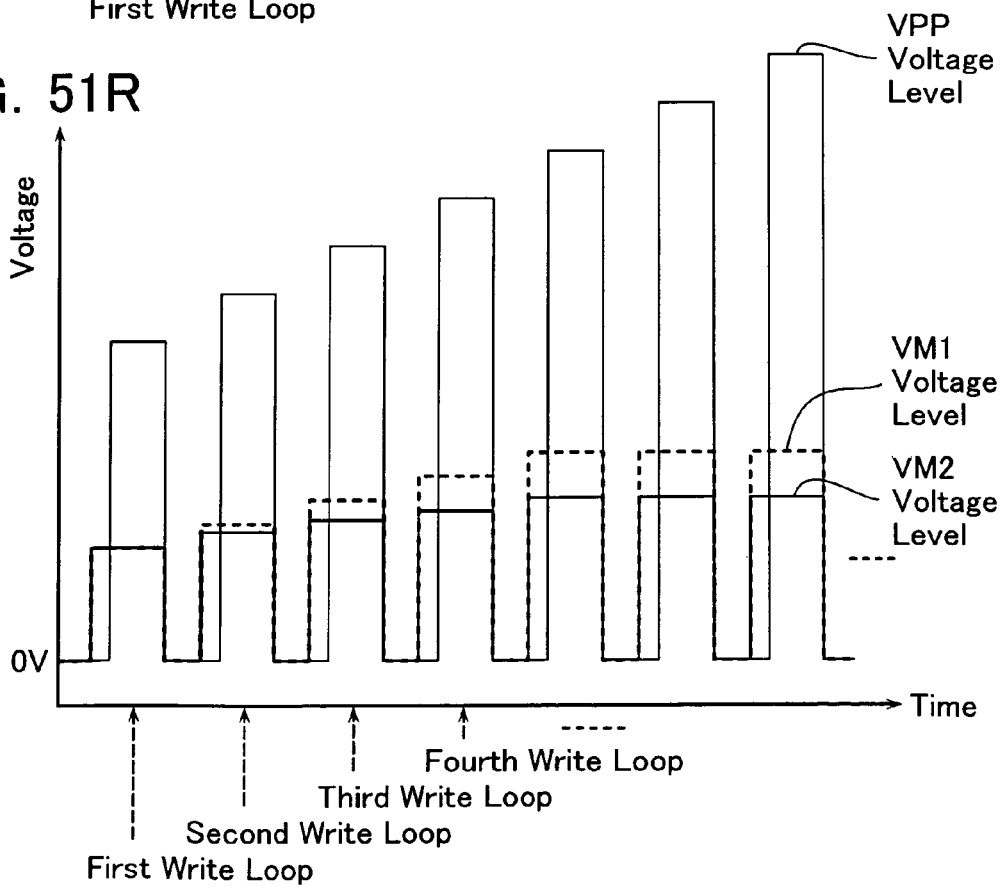
FIG. 51R shows the word line waveforms during the same operation (part 18)
Figure 51S:
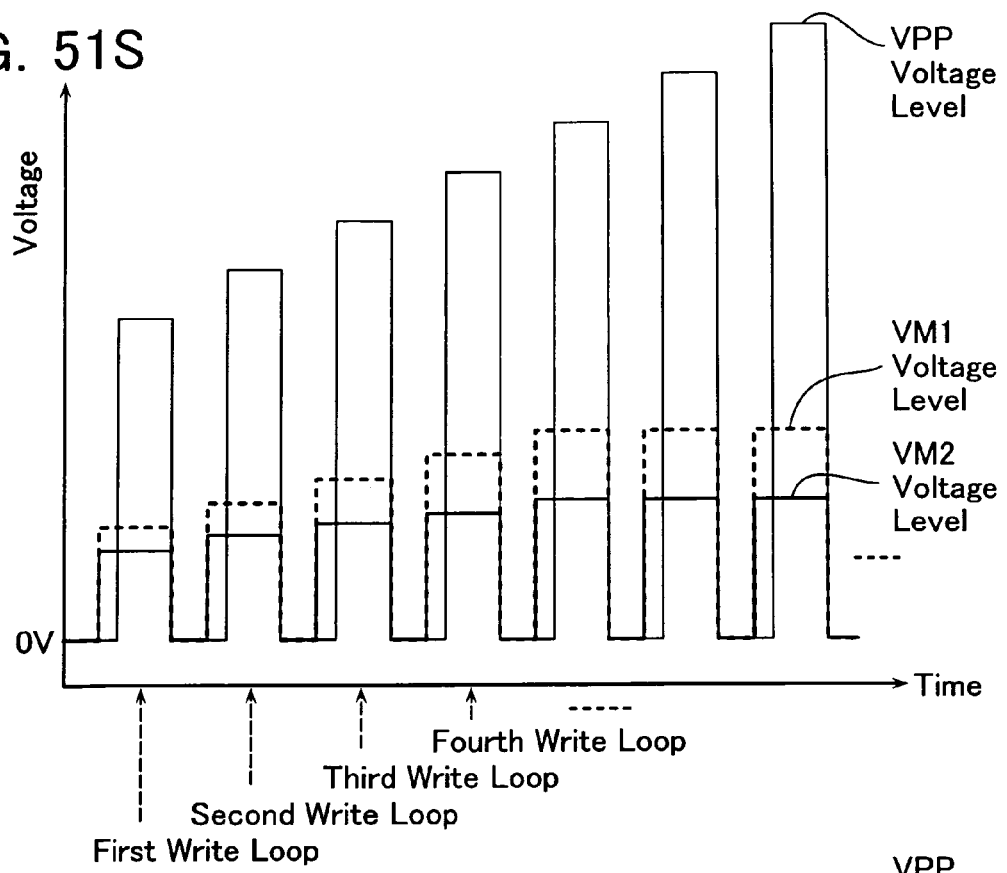
FIG. 51S shows the word line waveforms during the same operation (part 19)
Figure 51T:
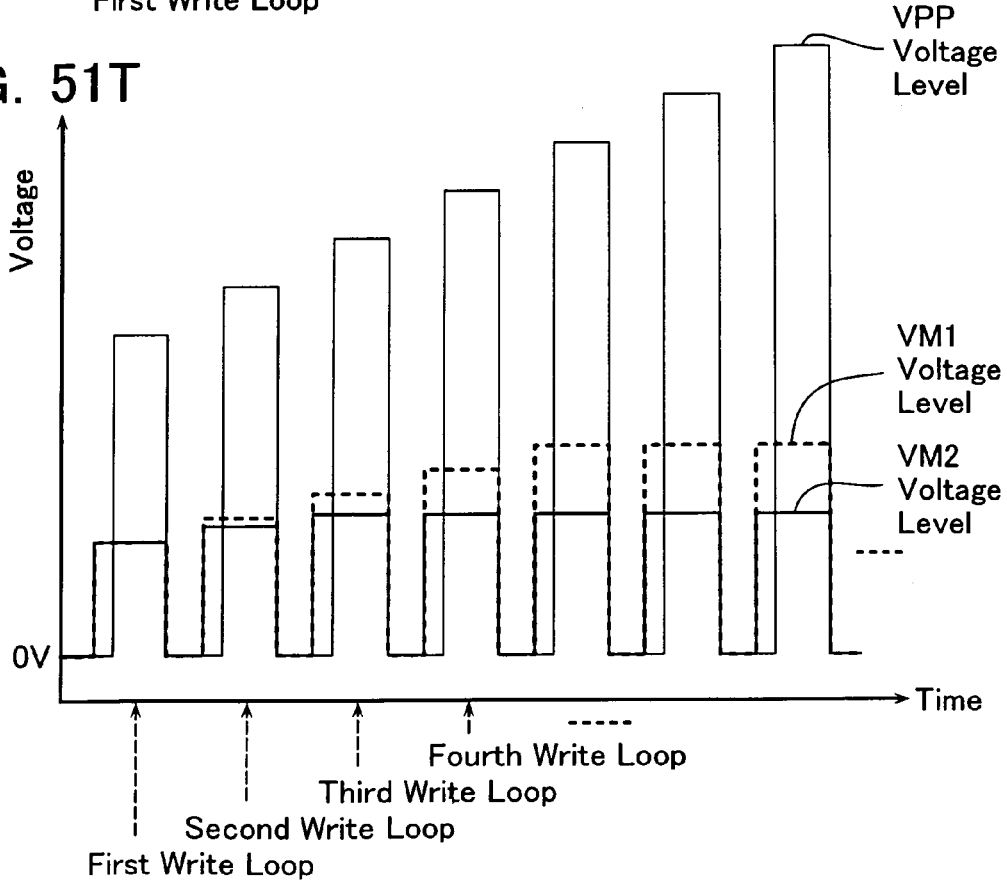
FIG. 51C shows the word line waveforms during the same operation (part 3)
FIG. 51D shows the word line waveforms during the same operation (part 4)
FIG. 51E shows the word line waveforms during the same operation (part 5)
FIG. 51F shows the word line waveforms during the same operation (part 6)
FIG. 51G shows the word line waveforms during the same operation (part 7)
FIG. 51H shows the word line waveforms during the same operation (part 8)
Figure 51U:
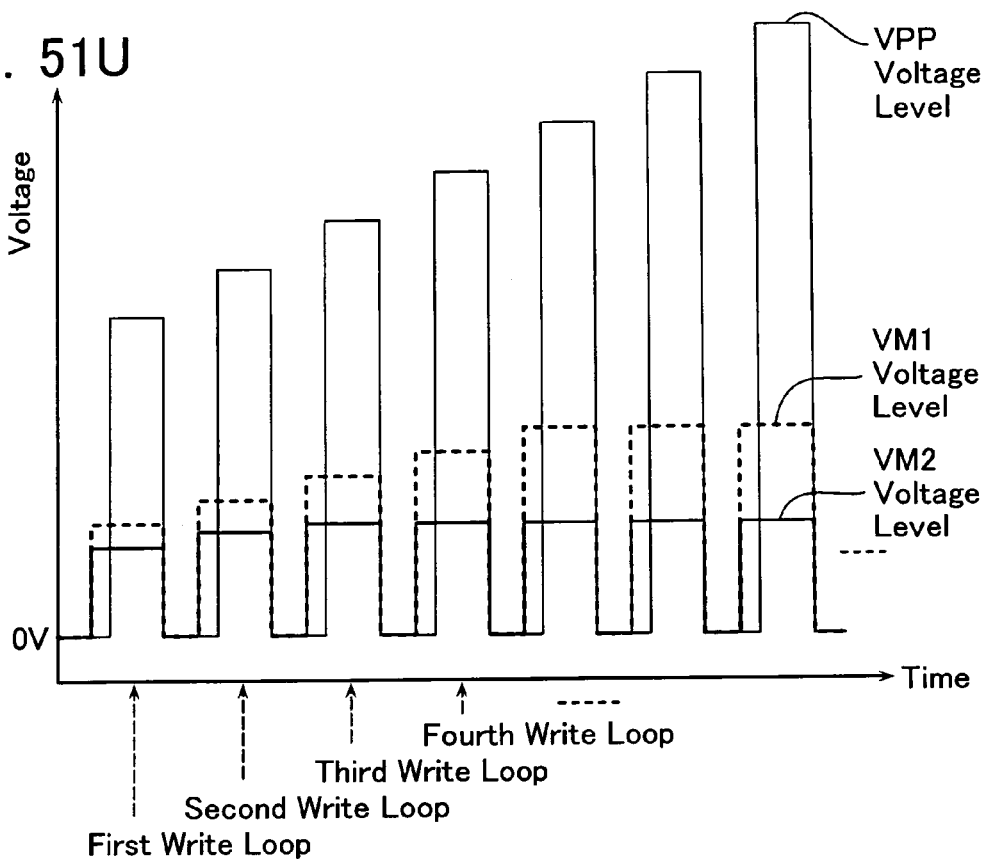
Figure 51V:
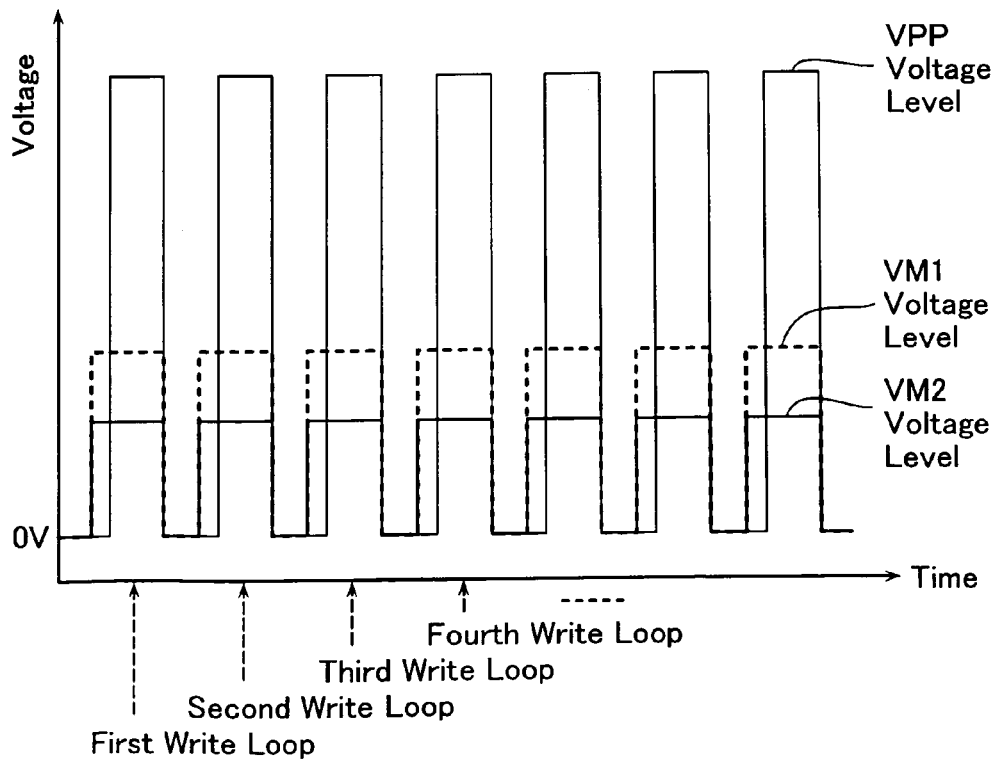
Figure 51W:
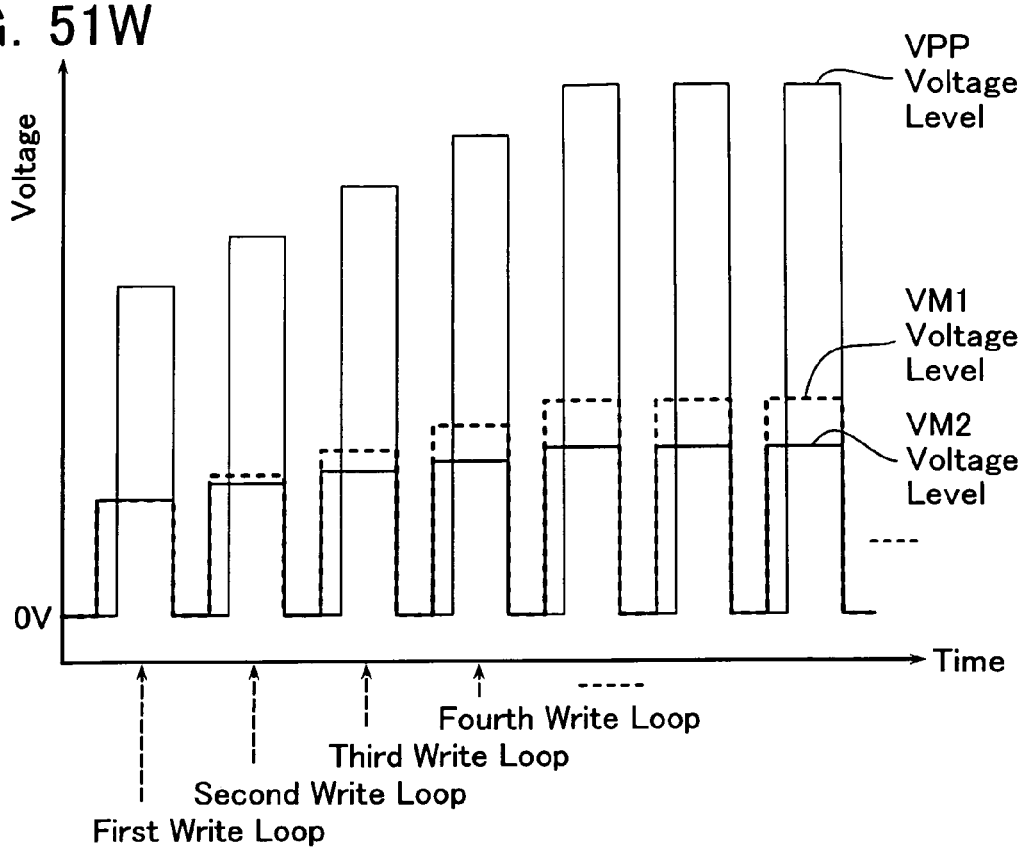
Figure 51X:
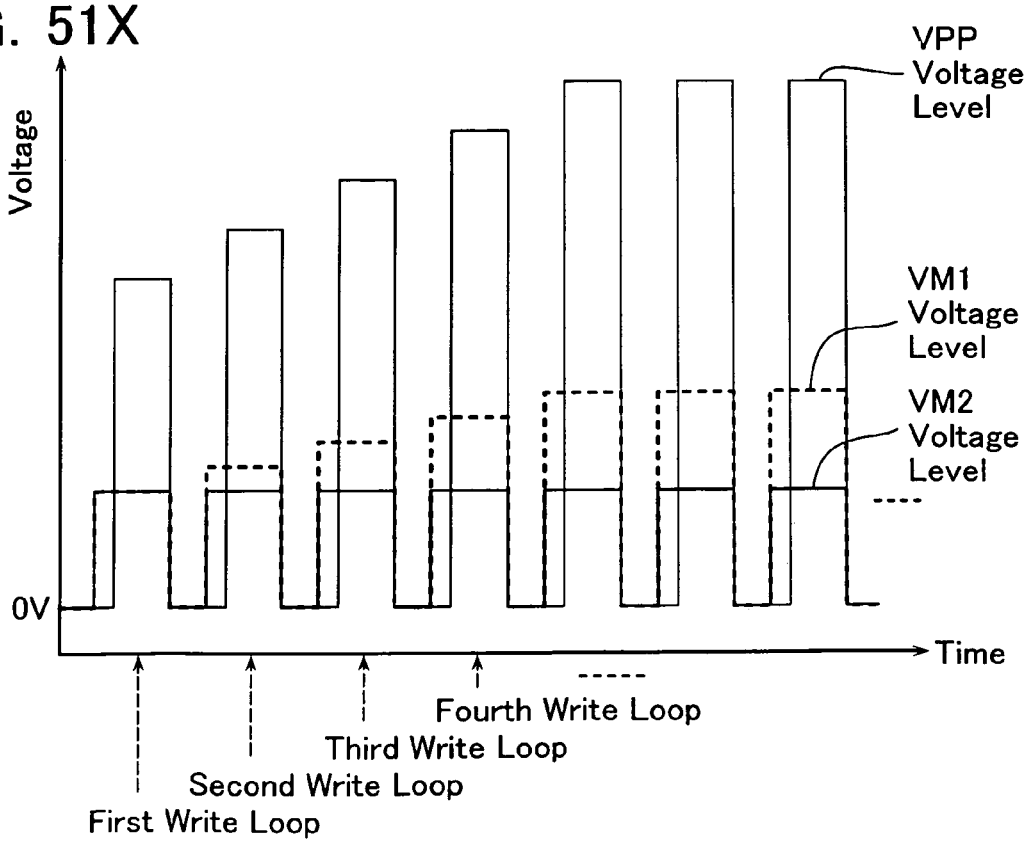

FIGS. 50W-X show waveforms in the case where, in addition to the VM1 and VM2 levels, the VPP level is also kept at a constant value from on the fifth write loop. In general, the VM1 and VM2 (particularly VM1) levels are optimized for voltage level relative to the VPP level. Accordingly, if the VPP level is kept constant from on the fifth write loop, it is optimal for the reliability to keep VM1 and VM2 unchanged. In this case, the method of FIGS. 50W-X is optimal.

As described above, examples of the waveforms on the selected WL and the VM1, VM2-applied, non selected WL per write loop during the operation of write pulse applying are shown in FIG. 50 while the writing scheme of FIG. 46 is employed as an example. The use of the writing scheme of FIG. 47 turns the waveforms of FIGS. 50A-X into those of FIGS. 51A-X. The operations of FIGS. 51A-X have the same characteristics as those described about FIGS. 50A-X. In addition, the operation of FIG. 15 (the second comparative example) can achieve an excellent effect on the reliability over the operation of FIG. 13 (the first comparative example) (the relation between FIG. 15 and FIG. 13 is considered substantially equivalent to the relation between FIG. 47 and FIG. 46).

FIG. 52 and FIG. 53 show examples of waveforms in the cases where the writing schemes of FIG. 16 (the first embodiment of the present invention) and FIG. 17 (the second embodiment of the present invention) instead of the writing scheme of FIG. 46 are employed in FIG. 50. FIGS. 52A-X correspond to the waveforms of FIGS. 50A-X and have the same characteristics as the waveforms of FIGS. 50A-X, respectively. FIGS. 53A-X also correspond to the waveforms of FIGS. 50A-X and have the same characteristics as the waveforms of FIGS. 50A-X, respectively. In addition, the writing schemes of FIG. 16 (the first embodiment of the present invention) and FIG. 17 (the second embodiment of the present invention) are higher in reliability against the erroneous write failure than the operational methods of FIGS. 13 and 15 as described above. (That is, they are higher in reliability against the erroneous write failure than the operational methods of FIGS. 46 and 47.) Accordingly, the operations of FIGS. 52 and 53 are more effective to improve the reliability against the erroneous write failure than the operations of FIGS. 50 and 51. Through the operation of FIG. 52, not only the use of the operational method of FIG. 16 but also the use of the operational method of FIG. 19 or 22 instead of FIG. 16 can realize the waveforms of FIG. 52. This case is similarly effective as the use of the operational method of FIG. 16. Similarly, the use of the operational method of FIG. 20 or 23 instead of FIG. 17 can realize the waveforms of FIG. 53. This case is similarly effective as the use of the operational method of FIG. 17. The operations of FIGS. 18, 21 and 24-30 instead of FIG. 46 may be applied to the operation of FIG. 50. This case is similarly effective as those of FIGS. 52 and 53.

In the above embodiments the description is given to the voltage levels of VPP, VM1, VM2 and VM though voltage levels themselves in actual chips may fluctuate slightly based on variations in supply voltages, temperatures and processes even if voltage setting levels are identical. In practical circuit designs, it is effective to design circuits so that values of the voltage setting levels for VPP, VM1, VM2 and VM (that is, target setting voltages on circuit designs)

become the levels of the selected WL and VM1, VM2-applied, non-selected WL in the waveforms of FIGS. 45 and 50-53.

Examples of circuits configured to realize voltage setting for such the levels of VPP, VM1 and VM2 are shown in FIGS. 38E-F, FIGS. 39E-F and FIGS. 40E-F. The voltage level control signal and associated VPP waveform and word line waveforms in these circuit examples are shown in FIG. 54.

FIG. 54A shows waveforms in the case where the VPP setting level and the setting level for the selected word line during write pulse applying rise in accordance with increase in the number of write loops. FIG. 54A is an example resulted from the use of the circuit of FIG. 38F, in which the resistance between VPPREF and the ground voltage in FIG. 38F is reduced in accordance with increase in the number of write loops. Accordingly, the VPP level rises in accordance with increase in the number of write loops.

FIG. 54B shows waveforms in the case where the VM1 setting level and the setting level for the VM1-applied word line during write pulse applying rise in accordance with increase in the number of write loops. FIG. 54B is an example resulted from the use of the circuit of FIG. 39F, in which the resistance between VM1REF and the ground voltage in FIG. 39F is reduced in accordance with increase in the number of write loops. Accordingly, the VM1 level rises in accordance with increase in the number of write loops.

FIG. 54C shows waveforms in the case where the VM2 setting level and the setting level for the VM2-applied word line during write pulse applying rise in accordance with increase in the number of write loops. FIG. 54C is an example resulted from the use of the circuit of FIG. 40F, in which the resistance between VM2REF and the ground voltage in FIG. 40F is reduced in accordance with increase in the number of write loops. Accordingly, the VM2 level rises in accordance with increase in the number of write loops.

FIG. 54D shows waveforms in the case where the VM2 setting level and the setting level for the VM2-applied word line during write pulse applying are kept unchanged independent of the number of write loops. The VM2 waveform of FIG. 54D may be realized in the circuit of FIG. 40E. The circuit of FIG. 40E keeps the VM2 level unchanged because the resistance between VPPREF and the ground voltage is always equal to RVPP0. Even the use of the circuit of FIG. 40F may realize the waveform of FIG. 54D if the levels of signals SVM21-SVM27 during write pulse applying are each fixed independent of the number of write loops.

Similarly, the use of the circuit of FIG. 38E can realize the waveforms with the constant VPP level independent of the number of write loops. Even the use of the circuit of FIG. 38F may realize the waveform with the constant VPP level independent of the number of write loops if the levels of signals SVPP1-SVPP7 during write pulse applying are each fixed independent of the number of write loops.

Further, the use of the circuit of FIG. 39E can similarly realize the waveforms with the constant VM1 level independent of the number of write loops. Even the use of the circuit of FIG. 39F may realize the waveform with the constant VM1 level independent of the number of write loops if the levels of signals SVM11-SVM17 during write pulse applying are each fixed independent of the number of write loops.

FIG. 54E shows waveforms in the case where the VM1 setting level and the setting level for the VM1-applied word line during write pulse applying rise in accordance with increase in the number of write loops until the fifth write loop. In this case, the VM1 setting level and the setting level for the VM1-applied word line during write pulse applying are made constant (equal to the same value of VM1 at the fifth write loop) from on the sixth write loop. FIG. 54E corresponds to the example of waveforms when the circuit of FIG. 39F is employed.

FIG. 54F shows waveforms in the case where the VM2 setting level and the setting level for the VM2-applied word line during write pulse applying rise in accordance with increase in the number of write loops until the fifth write loop. In this case, the VM2 setting level and the setting level for the VM2-applied word line during write pulse applying are made constant (equal to the same value of VM2 at the fifth write loop) from on the sixth write loop. FIG. 54F corresponds to the example of waveforms when the circuit of FIG. 40F is employed.

In FIG. 54G, the VM1 waveform and the VM1-applied word line waveform during write pulse applying are same as those in FIG. 54E. These VM1 waveform and the VM1-applied word line waveform during write pulse applying can also be realized by applying the SVM11-SVM17 waveforms of FIG. 54G to the circuit of FIG. 39F.

In FIG. 54H, the VM2 waveform and the VM2-applied word line waveform during write pulse applying are same as those in FIG. 54F. These VM2 waveform and the VM2-applied word line waveform during write pulse applying can also be realized by applying the SVM21-SVM27 waveforms of FIG. 54H to the circuit of FIG. 40F.

In FIG. 54I, the VM1 waveform and the VM1-applied word line waveform during write pulse applying are same as those in FIG. 54B. These VM1 waveform and the VM1-applied word line waveform during write pulse applying can also be realized by applying the SVM11-SVM17 waveforms of FIG. 54I to the circuit of FIG. 39F.

In FIG. 54J, the VM2 waveform and the VM2-applied word line waveform during write pulse applying are same as those in FIG. 54C. These VM2 waveform and the VM2-applied word line waveform during write pulse applying can also be realized by applying the SVM21-SVM27 waveforms of FIG. 54J to the circuit of FIG. 40F.

As described above, the use of the circuits of FIGS. 38E-F, FIGS. 39E-F and FIGS. 40E-F can realize the waveforms of VPP, VM1 and VM2 in FIGS. 50-53.

FIG. 55 shows a flowchart of an operation to change the level of VPP, VM1 or VM2 in accordance with increase in the number of write loops.

FIGS. 55A, C and E show operations in the cases where the writing intermediate voltage has the VM level only, and the VPP level is changed in accordance with increase in the number of write loops while the VM level is kept unchanged independent of the number of write loops. The operations of changing the VPP level are performed at different timings in FIGS. 55A, C and E while any of these operations can be employed to realize the similar selected word line waveform during write pulse applying.

FIGS. 55B, D and F show operations in the cases where the the VPP level is changed in accordance with increase in the number of write loops while the VM1 and VM2 levels are kept unchanged independent of the number of write loops. The operations of changing the VPP level are performed at different timings in FIGS. 55B, D and F while any of the operations can be employed to realize the similar selected word line waveform during write pulse applying, such as the waveform of FIG. 50M.

FIGS. 55G, I and K show operations in the cases where the VPP and VM1 levels are changed in accordance with increase in the number of write loops while the VM2 level is kept unchanged independent of the number of write loops. The operations of changing the VPP and VM1 levels are performed at different timings in FIGS. 55G, I and K while any of the operations can be employed to realize such the waveform as FIG. 50C.

FIGS. 55H, J and L show operations in the cases where the VPP, VM1 and VM2 levels are changed in accordance with increase in the number of write loops. The operations of changing the VPP, VM1 and VM2 levels are performed at different timings in FIGS. 55H, J and L while any of the operations can be employed to realize such the waveform as FIG. 50K.

The present invention is not limited to the above embodiments but can be modified variously.

4. Applications to Other Non-Volatile Semiconductor Memory Devices, Electronic Cards and Electronic Devices Applications to other non-volatile semiconductor memory devices are described first. In the above embodiments, the present invention has been described on the example of NAND cell-type EEPROM that employs the NAND cell as a memory cell unit. The present invention is not limited only in this example but rather applicable to other devices that employ memory cell units other than the NAND cells, specifically DINOR cell-type EEPROM and AND cell-type EEPROM that employ DINOR cells and AND cells, respectively, as memory cell units. FIG. 56 shows an equivalent circuit diagram of a memory cell array in the DINOR cell-type EEPROM. FIG. 57 shows an equivalent circuit diagram of a memory cell array in the AND cell-type EEPROM.

The DINOR cell-type EEPROM is detailed in "H. Onoda et al., IEDM Tech. Digest, 1992, pp. 588-602", and the AND cell-type EEPROM in "H. Kume et al., IEDM Tech. Digest, 1992, pp. 991-993". The embodiments of the present invention have been described taking the electrically rewritable non-volatile semiconductor memory cell as the example. The present invention is also available in other devices, for example, it is similarly applicable to other semiconductor memory devices.

As an embodiment, an electronic card using the non-volatile semiconductor memory devices according to the above-described embodiments of the present invention and an electronic device using the card will be described bellow.

FIG. 58 shows an electronic card according to this embodiment and an arrangement of an electronic device using this card. This electronic device is a digital still camera 101 as an example of the portable electronic device. The electronic card is a memory card 119 used as a recording medium of the digital still camera 101. The memory card 119 incorporates an IC package PK1 in which the non-volatile semiconductor memory device or the memory system according to the above-described embodiment is integrated or encapsulated.

The case of the digital still camera 101 accommodates a card slot 102 and a circuit board (not shown) connected to this card slot 102. The memory card 119 is detachably inserted into the card slot 102 of the digital still camera 101. When inserted in the slot 102, the memory card 119 is electrically connected to electric circuits on the circuit board.

If this electronic card is a non-contact type IC card, it is electrically connected to the electric circuits on the circuit board by radio signals when inserted in or approached to the card slot 102.

FIG. 59 shows a basic arrangement of the digital still camera. Light from an object is converged by a lens 103 and input to an image pickup device 104. The image pickup device 104 is, for example, a CMOS sensor and photoelectrically converts the input light into, for example, an analog output signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., of NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, the analog amplifier (AMP), the A/D converter (A/D), and the camera signal processing circuit 105.

To capture an image, an operator presses an operation button such as a shutter button 112. In response to this operation, the microcomputer 111 controls a memory controller 113 to write the output signal from the camera signal processing circuit 105 into a video memory 114 as a frame image. The frame image written in the video memory 114 is compressed on the basis of a predetermined compression format by a compressing/stretching circuit 115. The compressed image is recorded, via a card interface 116, on the memory card 119 inserted in the card slot.

To reproduce a recorded image, an image recorded on the memory card 119 is read out via the card interface 116, stretched by the compressing/stretching circuit 115, and written into the video memory 114. The written image is input to the video signal processing circuit 106 and displayed on the display 108 or another image apparatus in the same manner as when the image is monitored.

In this arrangement, mounted on the circuit board 100 are the card slot 102, the image pickup device 104, the analog amplifier (AMP), the A/D converter (A/D), the camera signal processing circuit 105, the video signal processing circuit 106, the display signal processing circuit 107, the video driver 109, the microcomputer 111, the memory controller 113, the video memory 114, the compressing/stretching circuit 115, and the card interface 116.

The card slot 102 is not mounted on the circuit board 100 necessarily, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electronic card according to this embodiment can be used in portable electronic devices such as the digital still camera explained above. However, the electronic card can also be used in various apparatus such as those shown in FIGS. 60A to 60J, as well as in portable electronic devices. That is, the electronic card can also be used in a video camera shown in FIG. 60A, a television set shown in FIG. 60B, an audio apparatus shown in FIG. 60C, a game apparatus shown in FIG. 60D, an electronic musical instrument shown in FIG. 60E, a cell phone shown in FIG. 60F, a personal computer shown in FIG. 60G, a personal digital assistant (PDA) shown in FIG. 60H, a voice recorder shown in FIG. 60I, and a PC card shown in FIG. 60J.

While the present invention has been particularly shown and described with reference to the embodiments, it will be understood by those skilled in the art that various changes in form and detail may be made without departing from the spirit, scope, and teachings of the invention.

What is claimed is:

1. A non-volatile semiconductor memory device, comprising:
   a memory cell array of memory cell units each including data-rewritable non-volatile memory cells and first and second selection transistors;
   a plurality of word lines each commonly connected to said memory cells on the same row in said memory cell array;
   a first gate line commonly connected to gates of said first selection transistors on the same row in said memory cell array; and
   a second gate line commonly connected to gates of said second selection transistors on the same row in said memory cell array,
   wherein in write pulse applying during data writing, a high voltage for writing is applied to a selected word line, a first intermediate voltage for writing is applied to at least one of non-selected word lines, and a second intermediate voltage for writing is applied to at least one of non-selected word lines,
   wherein the beginning of charging a first word line as one of said non-selected word lines located between said selected word line and said first selection gate line from a first voltage to said first intermediate voltage for writing is followed by the beginning of charging a second word line as one of said non-selected word lines located between said selected word line and said second selection gate line from a second voltage to said second intermediate voltage for writing,
   said first voltage being lower than a supply voltage, said second voltage being lower than said supply voltage, and said first and second intermediate voltages being higher than said supply voltage,
   and wherein the second intermediate voltage at a first period when the high voltage for writing is applied to the selected word line is substantially equal to the first intermediate voltage at a second period before the high voltage for writing is applied to the selected word line.

2. The non-volatile semiconductor memory device according to claim 1, wherein said first selection transistor is connected to a source line.

3. The non-volatile semiconductor memory device according to claim 1, wherein said second selection transistor is connected to a bit line.

4. The non-volatile semiconductor memory device according to claim 1, wherein said first intermediate voltage for writing and said second intermediate voltage for writing are different in voltage level.

5. The non-volatile semiconductor memory device according to claim 1, wherein said first intermediate voltage for writing and said second intermediate voltage for writing are substantially equal in voltage level.

6. The non-volatile semiconductor memory device according to claim 1, wherein said first voltage is the ground voltage.

7. The non-volatile semiconductor memory device according to claim 1, wherein in said charging said first word line to said first intermediate voltage for writing, said first word line is charged from the first voltage once to a third voltage and then from said third voltage to said first intermediate voltage for writing, said first voltage being the ground voltage, and said third voltage is higher than said first voltage and lower than said first intermediate voltage for writing.

8. The non-volatile semiconductor memory device according to claim 1, wherein said first voltage is the ground voltage.

9. The non-volatile semiconductor memory device according to claim 1, wherein in said charging said second word line to said second intermediate voltage for writing, said second word line is charged from said second voltage once to a fourth voltage and then from said fourth voltage to said second intermediate voltage for writing, said second voltage being the ground voltage, and said fourth voltage being higher than said second voltage and lower than said second intermediate voltage.

10. The non-volatile semiconductor memory device according to claim 1, wherein in charging said selected word line to said high voltage for writing, said selected word line is charged from the ground voltage to said high voltage for writing.

11. The non-volatile semiconductor memory device according to claim 1, wherein in charging said selected word line to said high voltage for writing, said selected word line is charged from the ground voltage once to a fifth voltage and then from said fifth voltage to said high voltage for writing, said fifth voltage being higher than the ground voltage and lower than said high voltage for writing.

12. The non-volatile semiconductor memory device according to claim 1, wherein on applying said high voltage for writing to said selected word line, a word line adjacent to the source-line side of said selected word line is set at a sixth voltage substantially equal to or lower than said supply voltage.

13. The non-volatile semiconductor memory device according to claim 12, wherein said sixth voltage is substantially equal to the ground voltage.

14. The non-volatile semiconductor memory device according to claim 12, wherein said sixth voltage is substantially equal to said supply voltage.

15. The non-volatile semiconductor memory device according to claim 1, wherein on applying said high voltage for writing to said selected word line, a word line located between said selected word line and said bit line contact has a voltage setting level equal to said second intermediate voltage for writing.

16. The non-volatile semiconductor memory device according to claim 1, wherein on applying said high voltage for writing to said selected word line, all word lines located between said word line adjacent to the source-line side of said selected word line and said source line have a voltage setting level substantially equal to said first intermediate voltage for writing.

17. The non-volatile semiconductor memory device according to claim 1, wherein data writing into said word lines is performed sequentially from a word line closer to said source line to a word line closer to said bit line contact.

18. The non-volatile semiconductor memory device according to claim 1, wherein said first and second intermediate voltages for writing are higher than a supply voltage.

19. A non-volatile semiconductor memory device, comprising:
a memory cell array of data-rewritable non-volatile memory cells or memory cell units containing said memory cells; and
a plurality of word lines each commonly connected to said memory cells on the same row in said memory cell array,
wherein in write pulse applying during data writing, a high voltage for writing is applied to a selected word line, a first intermediate voltage for writing is applied to at least one of non-selected word lines, and a second intermediate voltage for writing is applied to at least one of non-selected word lines,
wherein the beginning of charging a first word line as one of said non-selected word lines located between said selected word line and a source line from a first voltage to said first intermediate voltage for writing is followed by the beginning of charging a second word line as one of said non-selected word lines located between said selected word line and a bit line contact from a second voltage to said second intermediate voltage for writing, said first voltage being lower than a supply voltage, said second voltage being lower than said supply voltage, and said first and second intermediate voltages being higher than said supply voltage, and
wherein the second intermediate voltage at a first period when the high voltage for writing is applied to the selected word line is substantially equal to the first intermediate voltage at a second period before the high voltage for writing is applied to the selected word line.

20. A non-volatile semiconductor memory device, comprising:
a memory cell array of data-rewritable, non-volatile memory cells or memory cell units containing said memory cells; and
a plurality of word lines each commonly connected to said memory cells on the same row in said memory cell array,
wherein a first word line as one of non-selected word lines located between a selected word line and a bit line contact is charged from a first voltage to a first intermediate voltage for writing, a second word line as one of said non-selected word lines located between said selected word line and a source line is charged from a second voltage to a second intermediate voltage for writing,
wherein charge timing of said first word line to said first intermediate voltage for writing is different from charge timing of said second word line to said second intermediate voltage for writing, said first voltage being lower than a supply voltage, said second voltage being lower than said supply voltage, and said first and second intermediate voltages being higher than said supply voltage, and
wherein the second intermediate voltage at a first period when a high voltage for writing is applied to the selected word line is substantially equal to the first intermediate voltage at a second period before the high voltage for writing is applied to the selected word line.

* * * * *